(12) United States Patent
Takaya et al.

(10) Patent No.: US 6,908,960 B2
(45) Date of Patent: Jun. 21, 2005

(54) COMPOSITE DIELECTRIC MATERIAL, COMPOSITE DIELECTRIC SUBSTRATE, PREPREG, COATED METAL FOIL, MOLDED SHEET, COMPOSITE MAGNETIC SUBSTRATE, SUBSTRATE, DOUBLE SIDE METAL FOIL-CLAD SUBSTRATE, FLAME RETARDANT SUBSTRATE, POLYVINYLBENZYL ETHER RESIN COMPOSITION, THERMOSETTIN

(75) Inventors: Minoru Takaya, Tokyo (JP); Hisashi Kobuke, Tokyo (JP); Toshikazu Endo, Tokyo (JP); Seiji Takahara, Tokyo (JP); Toshiyuki Abe, Tokyo (JP); Hiroshige Ohkawa, Tokyo (JP); Masami Sasaki, Tokyo (JP); Kenichi Kawabata, Tokyo (JP)

(73) Assignee: TDK Corporation, Tokyo (JP)

( * ) Notice: Subject to any disclaimer, the term of this patent is extended or adjusted under 35 U.S.C. 154(b) by 620 days.

(21) Appl. No.: 09/748,261

(22) Filed: Dec. 27, 2000

(65) Prior Publication Data

US 2002/0132898 A1 Sep. 19, 2002

(30) Foreign Application Priority Data

| Dec. 28, 1999 | (JP) | ............................................ | 11-373353 |
| Dec. 28, 1999 | (JP) | ............................................ | 11-373804 |
| Dec. 28, 1999 | (JP) | ............................................ | 11-373805 |
| Dec. 28, 1999 | (JP) | ............................................ | 11-373806 |
| Dec. 28, 1999 | (JP) | ............................................ | 11-375732 |
| Dec. 28, 1999 | (JP) | ............................................ | 11-375753 |
| Mar. 13, 2000 | (JP) | ............................................ | 2000-68364 |
| Mar. 13, 2000 | (JP) | ............................................ | 2000-68366 |
| Apr. 21, 2000 | (JP) | ......................................... | 2000-121629 |
| May 19, 2000 | (JP) | ......................................... | 2000-147591 |

(51) Int. Cl.$^7$ ............................................... C08K 3/40

(52) U.S. Cl. ........................ 524/494; 428/432; 428/461; 524/413; 524/434; 524/435; 524/436; 524/445

(58) Field of Search ................................. 524/413, 434, 524/435, 436, 445, 494; 428/432, 461

(56) References Cited

U.S. PATENT DOCUMENTS 4,774,316 A * 9/1988 Godschalx et al. ......... 528/205

FOREIGN PATENT DOCUMENTS

| EP | 0 258 695 | 3/1988 |
| EP | 0 260 443 | 3/1988 |
| EP | 0 878 984 | 11/1998 |
| EP | 0 953 608 | 11/1999 |
| JP | 2-120040 | 5/1990 |
| JP | 3-190912 | 8/1991 |
| JP | 8-069712 | 3/1996 |
| JP | 9-031006 | 2/1997 |
| JP | 10-270255 | 10/1998 |
| JP | 11-192620 | 7/1999 |
| WO | WO 88/07562 | 10/1988 |
| WO | WO 91/05002 | 4/1991 |
| WO | WO 92/11580 | 7/1992 |

* cited by examiner

Primary Examiner—Edward J. Cain
(74) Attorney, Agent, or Firm—Oblon, Spivak, McClelland, Maier & Neustadt, P.C.

(57) ABSTRACT

A composite dielectric material comprising a resin resulting from a polyvinylbenzyl ether compound and a dielectric ceramic powder dispersed therein is useful in the high-frequency region. A composite magnetic material comprising a polyvinylbenzyl ether compound and a magnetic powder is also provided as well as a flame retardant material comprising a polyvinylbenzyl ether compound and a flame retardant. These materials may be used in the fabrication of substrates, prepreg sheets, coated metal foils, molded items, and metal foil-clad substrates.

32 Claims, 64 Drawing Sheets

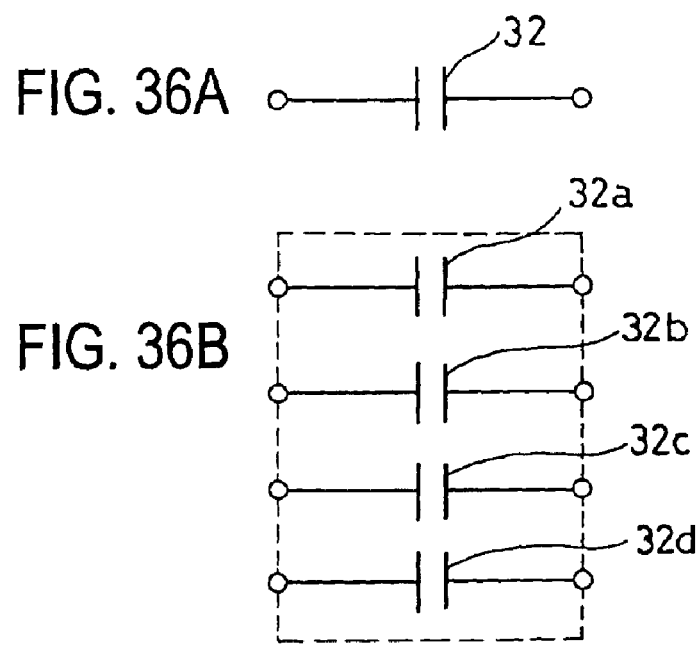
FIG. 36A
FIG. 36B
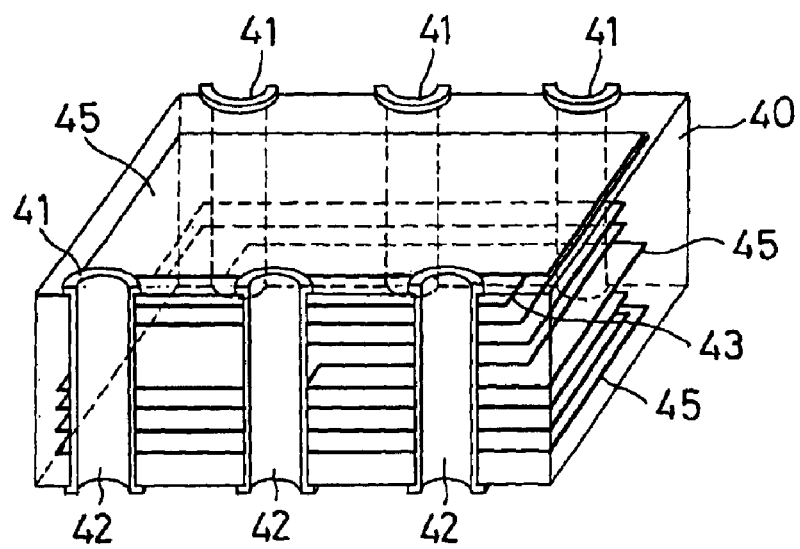
FIG. 37

FIG. 60
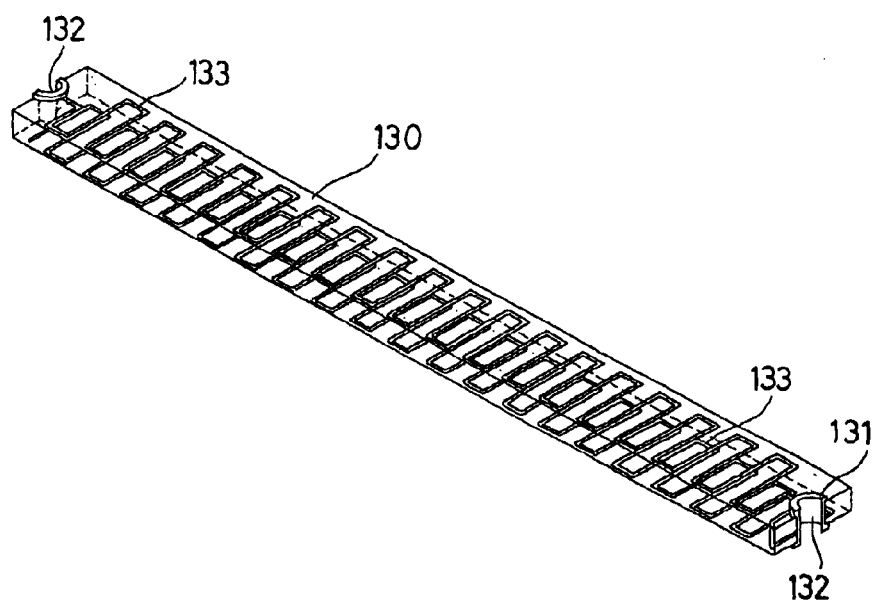
FIG. 61A
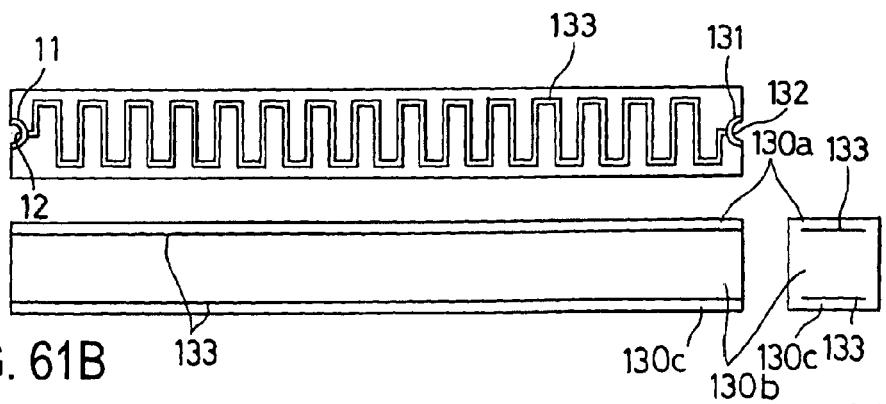
FIG. 61B
FIG. 61C

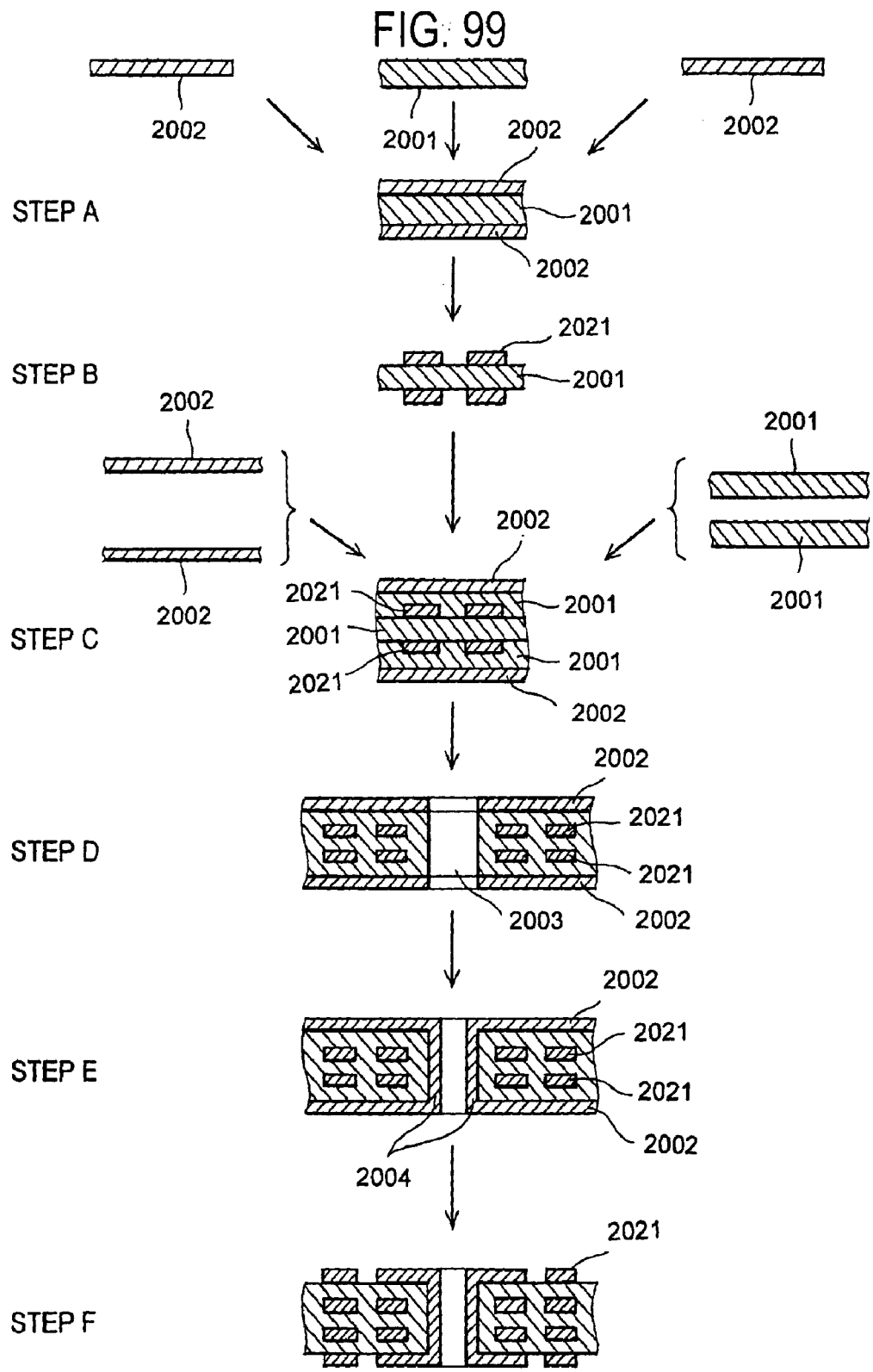

COMPOSITE DIELECTRIC MATERIAL, COMPOSITE DIELECTRIC SUBSTRATE, PREPREG, COATED METAL FOIL, MOLDED SHEET, COMPOSITE MAGNETIC SUBSTRATE, SUBSTRATE, DOUBLE SIDE METAL FOIL-CLAD SUBSTRATE, FLAME RETARDANT SUBSTRATE, POLYVINYLBENZYL ETHER RESIN COMPOSITION, THERMOSETTIN

This invention relates to composite dielectric materials having a relatively high Q and a relatively high dielectric constant and suitable for use in electronic parts such as strip lines, impedance matching circuits, delay circuits and antennas.

BACKGROUND OF THE INVENTION

With the diversified advance of the electronic technology, there are diversified performance requirements of concern for insulating materials intended for use in electronic devices. In particular, printed wiring boards have been used in a very wide range of application, and the performance requirements on substrates thereof have been diversified. Under the circumstances, there are many different requirements regarding dielectric characteristics.

Low-dielectric constant printed wiring boards have been developed with a focus placed on high speed propagation, high characteristic impedance, size reduction or cross-talk reduction. On the other hand, high-dielectric constant substrates are needed to meet such demands as the formation of delay circuits in high frequency and microwave circuits and other wiring boards, matching of the characteristic impedance of wiring boards in low impedance circuits, miniaturization of wiring patterns, and fabrication of hybrid circuit devices on substrates having a capacitive effect.

As the information communication system advances, mobile communication and satellite communication systems such as automotive radiotelephones and digital mobile phones now become of great interest, which use a high frequency band of the order of megahertz to gigahertz as the frequency band of radio wave. While communication instruments used in these communication means are in rapid progress, attempts have been made for the size reduction and high density packaging of casings and electronic parts. Similar requirements are imposed on the antennas used in the communication instruments. Planar antennas having micro-strip lines formed on dielectric substrates are used as high-frequency antennas.

The dielectric substrates used in these applications should have a high dielectric constant and a low loss so that the planar antennas can be reduced in size.

Electronic parts such as strip lines, impedance matching circuits, delay circuits and antennas should have high Q values because satisfactory characteristics are not available with low Q values. On the other hand, in the fabrication of resonators using strip lines, a high dielectric constant is necessary for size reduction purposes because the length of strip lines is in proportion to $1/\sqrt{\in}$ wherein $\in$ is a dielectric constant.

Capacitors having an increased capacitance are generally produced by spreading the area of opposed electrodes, increasing the number of layers, or reducing the distance between layers. These approaches increase the size or thickness of substrates or parts.

For such capacitors, a high dielectric constant is necessary for size reduction purposes.

As one suitable dielectric material, JP-A 9-31006 discloses a polyvinylbenzyl ether compound of a specific structure in the cured state. This compound fails to achieve a high dielectric constant in the high-frequency band. There is a need to have a material satisfying such properties.

In the prior art relating to such applications, high dielectric constant substrates are proposed which are obtained by stacking and molding prepreg sheets which are, in turn, obtained by adding a ceramic powder having a high dielectric constant to an epoxy resin (for laminates or printed circuit boards) or a polyphenylene ether resin (which is a low dielectric constant resin), impregnating glass fabric or glass non-woven fabric therewith, followed by drying.

However, the dielectric dissipation factor cannot be reduced merely by adding a high-frequency ceramic powder having a high dielectric constant to conventional thermosetting resins as typified by epoxy resins for prior art laminates or printed circuit boards. Where high dielectric constant fillers are added to polyphenylene ether resins which are low dielectric constant resins, the dielectric dissipation factor becomes low. However, the amount of the filler added must be increased in order to provide a high dielectric constant, which gives rise to problems including difficulty to drill and machine the laminate and substantial dimensional variances.

JP-A 9-31006 discloses a resin obtained by polymerizing or curing a polyvinylbenzyl ether compound of a specific structure, the resin exhibiting dielectric characteristics which are satisfactory and constant over a wide frequency region and least dependent on temperature and moisture absorption as well as heat resistance. Since this resin has a low dielectric constant and a low dissipation factor, it fails to fulfil the requirement in some applications where a high dielectric constant is needed.

The substrates used in the fabrication of electronic parts and circuit boards include composite substrates which are obtained by mixing a molding material with ferrite powder, molding the mixture into plates, and treating the plates as by electroplating, for example, composite ferrite substrates molded from composite ferrite substrates materials comprising a liquid crystal polymer and ferrite. Also included are copper-clad laminates using prepreg sheets formed from ferrite powder-free, glass cloth-reinforced epoxy resins or phenolic resins.

However, in the case of the molded plates treated as by plating, it is difficult to mold thin-wall plates of large planar dimensions. The copper-clad laminates which are free from ferrite powder, that is, lack magnetic material have the problem that in forming devices, parts and circuits utilizing magnetic characteristics, a ferrite material must be separately applied or a ferrite member must be mounted. The copper-clad laminates which are free from ferrite powder do not have magnetic shielding effects by themselves and are not suitable in magnetic shielding purposes.

JP-A 58-158813 discloses an electrical laminate comprising a base impregnated with a laminate-forming resin containing a metal oxide having both magnetic and electrically insulating properties. Illustrative examples are combinations of phenolic resin with kraft paper, which are poor in heat resistance and strength required for thinning purposes. The content of ferrite powder is below 50 wt % of the entire composition, failing to provide satisfactory magnetic properties required as a magnetic material.

JP-A 59-176035 discloses a composite fiber material for absorbing electromagnetic waves, comprising fiber layers disposed one on top of the other and joined by a matrix consisting of a resin and a curing agent wherein a filler for absorbing electromagnetic waves is contained in each layer such that its concentration is graded from the outside to the inside. Since the filler is distributed so as to give a compositional grading, the prepreg manufacture is cumbersome.

JP-A 2-120040 discloses a copper-clad laminate for absorbing electromagnetic waves, which is obtained by impregnating glass fiber woven fabric with a thermosetting resin, drying to form a prepreg, and placing copper foil on the prepreg, followed by laminating press, wherein an electromagnetic wave-absorbing material is mixed and dispersed in the thermosetting resin so that electromagnetic noise of a selected frequency is absorbed. Since PZT powder is used in illustrative examples, the resulting laminates are not suitable in magnetic property-utilizing applications and magnetic shielding purposes.

JP-A 11-192620 discloses a prepreg obtained by kneading ferrite powder and an epoxy resin in a solvent to form a slurry paste, and impregnating glass cloth with the paste, followed by drying, and a composite magnetic substrate obtained by laminating press of the prepreg. Since the epoxy resin used as the base of the prepreg has a high dielectric constant, the resulting composite magnetic substrate naturally has a high dielectric constant and high dissipation factor. Because of a relatively high percent water absorption, the substrate is likely to undergo a pattern peeling phenomenon and changes of dielectric constant and dissipation factor during solder flow and dipping steps.

JP-A 10-79593 discloses a prepreg obtained by impregnating glass cloth with a magnetic paint comprising a soft magnetic powder and a thermosetting resin, and a printed wiring board. Since an epoxy resin used as the base of the prepreg has a high dielectric constant, the resulting composite magnetic substrate naturally has a high dielectric constant and high dissipation factor. Because of a relatively high percent water absorption, the substrate is likely to undergo a pattern peeling phenomenon and changes of dielectric constant and dissipation factor during solder flow and dipping steps.

Polyvinylbenzyl ether compounds are combustible and so, safety becomes a problem when they are applied to multilayer substrates and electronic parts. It remains unsolved to manufacture multilayer substrates and electronic parts that clear UL-94, V-0 rating.

JP-A 9-31006 discloses a polyvinylbenzyl ether compound and a method for preparing the same. This polyvinylbenzyl ether compound in the cured state has dielectric characteristics which are satisfactory and constant over a wide frequency region and least dependent on temperature and moisture absorption, as well as good heat resistance.

It is described in JP-A 9-31006 that the polyvinylbenzyl ether compound is prepared by reacting a polyphenol with a vinylbenzyl halide in a polar neutral solvent in the presence of an alkali metal hydroxide as a dehydrochlorination agent, or in a water/organic solvent mixture in the presence of a phase transfer catalyst (e.g., quaternary ammonium salt) and an alkali metal hydroxide as a dehydrochlorination agent at a temperature of up to 100° C. The polyvinylbenzyl ether compound thus obtained is directly polymerized or cured into a cured product. The cured product of polyvinylbenzyl ether compound obtained by this procedure, however, does not have the desired dissipation factor and are not suitable for use in the high-frequency application. The transmission loss of a signal is represented by the product of frequency, square root of dielectric constant, and dissipation factor, which means that a lower dissipation factor among dielectric characteristics becomes desirable as the frequency becomes higher.

Commonly known high-frequency electronic parts and multilayer substrates include those obtained by stacking multiple layers of sintered ferrite or sintered ceramics and molding them into the substrate shape. This has been a common practice because the multilayer substrates resulting from these materials have the great advantage of size reduction.

However, since sintered ferrite material has the problem that the frequency response of magnetic permeability $\mu$ among magnetic characteristics merely extends up to about 500 MHz, its use in a high-frequency band of the order of gigahertz is limited. The material has a large dielectric constant and suffers from a lowering of high-frequency characteristics under the influence of stray capacity.

Besides, simply using sintered ceramics encounters difficulty in achieving a dielectric constant of 4 or less. A further lowering of dielectric constant is desired in order to enhance high-frequency characteristics.

For enhancing high-frequency characteristics, JP-A 9-76341, 11-192620 and 8-69712 disclose substrates of composite materials comprising a ceramic magnetic material such as sintered ferrite or ceramic dielectric material and an organic resin material. Nevertheless, there is yet available no material that meets the desired high-frequency characteristics.

Where heterogeneous materials such as sintered ferrite and sintered ceramic are contained in a common multilayer substrate as multiple layers, there arises the problem that cracks often occur due to the difference of coefficient of linear expansion.

SUMMARY OF THE INVENTION

A first object of the invention is to provide a consolidated composite dielectric material which has a relatively high Q and relatively high dielectric constant, is used in an application where such properties are required, for example, such electronic parts as strip lines, impedance matching circuits, delay circuits, and antennas, and can be adapted so as to meet the required properties.

A second object of the invention is to provide a consolidated composite dielectric material which has a high dielectric constant, is used in an application where such properties are required, for example, such electronic parts as capacitor-built-in circuit boards, hybrid parts and capacitors, and can be adapted so as to meet the required properties.

A third object of the invention is to provide a composite dielectric substrate which is suitable for use in the high-frequency region, exhibits dielectric characteristics for the intended purpose as typified by a high dielectric constant and a low dissipation factor in the high-frequency region, as well as a prepreg, coated copper foil and molded sheet for use in preparing the composite dielectric substrate.

A fourth object of the invention is to provide (1) a composite magnetic substrate and a prepreg having a low dielectric constant and low dissipation factor; (2) a composite magnetic substrate and a prepreg having high heat resistance, typically a high glass transition temperature and high decomposition initiation temperature; (3) a composite magnetic substrate and a prepreg having a low water pickup and a minimized change of dielectric constant and dissipation factor; (4) a composite magnetic substrate and a prepreg which have close adhesion to a metal foil such as copper foil and a reduced thickness, and can be manufactured by a conventional substrate manufacturing process; (5) a composite magnetic substrate and a prepreg having a constant dielectric constant and dissipation factor up to a frequency band of the order of gigahertz; and (6) a composite magnetic substrate and a prepreg having minimized temperature dependency of dielectric constant and dissipation factor.

A fifth object of the invention is to provide a flame retardant substrate and prepreg having improved flame retardance, and good electrical characteristics at high frequencies for use in electronic parts and circuit substrates.

A sixth object of the invention is to provide a thermosetting polyvinylbenzyl ether resin composition which in the cured state exhibits dielectric characteristics that are satisfactory and constant over a wide frequency region and less dependent on temperature and moisture pickup, and maintains unchanged the physical properties of the polyvinylbenzyl ether compound featuring heat resistance; which using an additive type flame retardant to be post added, can be made flame retardant without considerations on reaction conditions and cure stresses. It is also intended to provide such a thermosetting polyvinylbenzyl ether resin composition which has improved high-frequency dielectric characteristics in that the Q value is increased, without increasing the dielectric constant, in a high-frequency region of 100 MHz to 10 GHz.

A seventh object of the invention is to provide a method for preparing a thermosetting polyvinylbenzyl ether resin composition which in the cured state exhibits dielectric characteristics that are satisfactory and constant over a wide frequency region and less dependent on temperature and moisture pickup, which maintains unchanged the physical properties of the polyvinylbenzyl ether compound featuring heat resistance, which allows the dielectric dissipation factor to be significantly reduced (to give a high Q value), and which can be used at a low loss in a high-frequency region of 100 MHz to 10 GHz.

An eighth object of the invention is to provide a thermosetting polyvinylbenzyl ether resin composition which in the cured state exhibits dielectric characteristics that are satisfactory and constant over a wide frequency region and less dependent on temperature and moisture pickup. The composition yields a composite dielectric material which takes advantage of the properties of dielectric powder and the polyvinylbenzyl ether compound featuring heat resistance, and when aged under high-temperature conditions or high-temperature, high-humidity conditions, experiences a minimized change of dielectric constant and dissipation factor (i.e., Q). The composite dielectric material experiences a minimized change of dielectric constant and dissipation factor (i.e., Q) even under high-temperature conditions as encountered during reflow. Also provided is a thermosetting polyvinylbenzyl ether resin composition from which the composite dielectric material is obtained. It is also contemplated to render the material flame retardant.

A ninth object of the invention is to provide high-frequency electronic parts having improved high-frequency characteristics and hence, improved overall electrical characteristics, using any one of resin substrates having improved high-frequency characteristics, magnetic substrates having improved high-frequency characteristics, and dielectric substrates having improved high-frequency characteristics.

The above and other objects are achieved by the invention which is defined below.

(1) A composite dielectric material comprising a resin and a ceramic powder dispersed therein, wherein the resin results from a polyvinylbenzyl ether compound, the content of the ceramic powder is from 10 vol % to less than 70 vol % based on the ceramic powder and the polyvinylbenzyl ether compound combined, and the composite dielectric material has a Q of at least 250 and a dielectric constant of at least 3 at a frequency of at least 500 MHz.

(2) The composite dielectric material of (1) which has been prepared by curing a mixture of the polyvinylbenzyl ether compound and the ceramic powder.

(3) The composite dielectric material of (1) or (2) wherein the polyvinylbenzyl ether compound has the following formula (1):

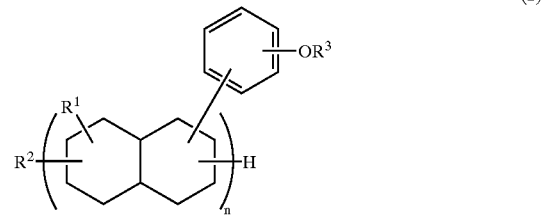

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number of 2 to 4.

(4) The composite dielectric material of any one of (1) to (3) wherein the ceramic powder to be dispersed has a Q of 250 to 50,000 and a dielectric constant of 2.5 to 300 at a frequency of 1 to 15 GHz.

(5) The composite dielectric material of any one of (1) to (4) wherein the ceramic powder is at least one ceramic based on a composition selected from the group consisting of $TiO_2$, $CaTiO_3$, $SrTiO_3$, $BaO—Nd_2O_3—TiO_2$, $Bi_2O_3—BaO—Nd_2O_3—TiO_2$, $BaTi_4O_9$, $Ba_2Ti_9O_{20}$, $Ba_2(Ti, Sn)_9O_{20}$, $MgO—TiO_2$, $ZnO—TiO_2$, $MgO—SiO_2$, and $Al_2O_3$ base compositions.

(6) A composite dielectric material comprising a resin and a ceramic powder dispersed therein, wherein the resin results from a polyvinylbenzyl ether compound, the ceramic powder is at least one ceramic based on a composition selected from the group consisting of $BaTiO_3$, $(Ba,Pb)TiO_3$, $Ba(Ti, Zr)O_3$, and $(Ba,Sr)TiO_3$ base compositions, the content of the ceramic powder is from 30 vol % to less than 70 vol % based on the ceramic powder and the polyvinylbenzyl ether compound combined, and the composite dielectric material has a dielectric constant of at least 10 in a high-frequency band of at least 10 MHz.

(7) The composite dielectric material of (6) which has been prepared by curing a mixture of the polyvinylbenzyl ether compound and the ceramic powder.

(8) The composite dielectric material of (6) or (7) wherein the polyvinylbenzyl ether compound has the above formula (1).

(9) The composite dielectric material of any one of (6) to (8) wherein the ceramic powder to be dispersed has a dielectric constant of 90 to 100,000 at a frequency of 100 kHz to 10 MHz.

(10) A composite dielectric substrate comprising a resin and a dielectric ceramic powder dispersed therein, wherein the resin results from a polyvinylbenzyl ether compound, the content of the dielectric ceramic powder is from 10 to 65 vol % based on the dielectric ceramic powder and the polyvinylbenzyl ether compound combined, and the composite dielectric substrate is used in a high-frequency region of at least 100 MHz.

(11) The composite dielectric substrate of (10) which has been prepared by molding and curing a mixture of the polyvinylbenzyl ether compound and the ceramic powder.

(12) The composite dielectric substrate of (10) or (11) wherein the polyvinylbenzyl ether compound has the above formula (1).

(13) The composite dielectric substrate of any one of (10) to (12) wherein the dielectric ceramic powder has a mean particle size of 0.5 to 100 μm.

(14) A prepreg which has been prepared by dispersing a polyvinylbenzyl ether compound and a dielectric ceramic powder in a solvent to form a slurry, applying the slurry to a cloth base, and drying, wherein the content of the dielectric ceramic powder is from 10 to 65 vol % based on the dielectric ceramic powder and the polyvinylbenzyl ether compound combined.

(15) The prepreg of (14) wherein the cloth base is glass cloth.

(16) The prepreg of (14) or (15) wherein the polyvinylbenzyl ether compound has the above formula (1).

(17) The prepreg of any one of (14) to (16) wherein the dielectric ceramic powder has a mean particle size of 0.5 to 100 μm.

(18) A composite dielectric substrate which has been prepared by heating and compressing the prepreg of any one of (14) to (17), the substrate being used in a high-frequency region of at least 100 MHz.

(19) A double side metal-clad composite dielectric substrate which has been prepared by placing the prepreg of any one of (14) to (17) between a pair of metal foils, followed by laminating press.

(20) A double side metal-clad composite dielectric substrate which has been prepared by dispersing a polyvinylbenzyl ether compound and a dielectric ceramic powder in a solvent to form a slurry, applying the slurry onto a metal foil, drying the coating to form the coated metal foil, and placing a cloth base between a pair of the coated metal foils such that the coating is in contact with the cloth base, followed by laminating press, wherein the content of the dielectric ceramic powder is from 10 to 65 vol % based on the dielectric ceramic powder and the polyvinylbenzyl ether compound combined.

(21) The substrate of (20) wherein the cloth base is glass cloth.

(22) The substrate of (20) or (21) wherein the polyvinylbenzyl ether compound has the above formula (1).

(23) The substrate of any one of (20) to (22) wherein the dielectric ceramic powder has a mean particle size of 0.5 to 100 μm.

(24) A coated metal foil to be used in the composite dielectric substrate of any one of (20) to (23).

(25) The coated metal foil of (24) wherein the metal foil is copper foil.

(26) A composite dielectric substrate which has been prepared by dispersing a polyvinylbenzyl ether compound and a dielectric ceramic powder in a solvent to form a slurry, followed by drying and compression, wherein the content of the dielectric ceramic powder is from 10 to 65 vol % based on the dielectric ceramic powder and the polyvinylbenzyl ether compound combined, and the composite dielectric substrate is used in a high-frequency region of at least 100 MHz.

(27) A double side metal-clad composite dielectric substrate which has been prepared by dispersing a polyvinylbenzyl ether compound and a dielectric ceramic powder in a solvent to form a slurry, drying and molding the slurry into a molded sheet, and placing the molded sheet between a pair of metal foils, followed by laminating press, wherein the content of the dielectric ceramic powder is from 10 to 65 vol % based on the dielectric ceramic powder and the polyvinylbenzyl ether compound combined.

(28) The substrate of (26) or (27) wherein the polyvinylbenzyl ether compound has the above formula (1).

(29) The substrate of any one of (26) to (28) wherein the dielectric ceramic powder has a mean particle size of 0.5 to 100 μm.

(30) A molded sheet to be used in the composite dielectric substrate of any one of (26) to (29).

(31) The composite dielectric substrate of any one of (19) to (23) and (27) to (29) wherein the metal foil is copper foil.

(32) A composite dielectric substrate of multilayer construction which has been prepared by laminating press of the prepreg of any one of (14) to (17), the coated metal foil of (24) or (25), the molded sheet of (30), or the composite dielectric substrate of any one of (18) to (23) and (27) to (31).

(33) The composite dielectric substrate of any one of (19) to (23) and (27) to (32), for use in a high-frequency region of at least 100 MHz.

(34) A composite magnetic substrate comprising a magnetic powder dispersed in a polyvinylbenzyl ether compound.

(35) The composite magnetic substrate of (34) wherein the polyvinylbenzyl ether compound has the above formula (1).

(36) The composite magnetic substrate of (34) or (35) wherein the magnetic powder is of a ferromagnetic metal or ferrite.

(37) The composite magnetic substrate of any one of (34) to (36) wherein the magnetic powder has a mean particle size of 0.01 to 100 μm.

(38) The composite magnetic substrate of any one of (34) to (37) wherein the content of the magnetic powder is 50 to 90 wt % based on the magnetic powder and the polyvinylbenzyl ether compound combined.

(39) A prepreg which has been prepared by dispersing a polyvinylbenzyl ether compound and a magnetic powder in a solvent to form a slurry, applying the slurry to a glass cloth, and drying.

(40) A prepreg which has been prepared by dispersing a polyvinylbenzyl ether compound and a magnetic powder in a solvent to form a slurry, applying the slurry to a metal foil, and drying.

(41) A substrate which has been prepared by laminating press the prepreg of (39).

(42) A double side metal foil-clad substrate which has been prepared by placing metal foils on opposite surfaces of the prepreg of (39), followed by laminating press.

(43) A double side metal foil-clad substrate which has been prepared by placing two plies of the prepreg of (40) on opposite surfaces of glass cloth such that the metal foils are positioned outside, followed by laminating press.

(44) A prepreg which has been prepared by mixing a polyvinylbenzyl ether compound and a magnetic powder at a temperature of not lower than the melting point of the polyvinylbenzyl ether compound, and molding the resulting solid mixture under pressure.

(45) A substrate which has been prepared by laminating press the prepreg of (44).

(46) A double side metal foil-clad substrate which has been prepared by placing metal foils on opposite surfaces of the prepreg of (44), followed by laminating press.

(47) A multilayer substrate which has been prepared by stacking at least two plies of the prepreg or substrate of any one of (44) to (46), followed by laminating press.

(48) A flame retardant substrate comprising a polyvinylbenzyl ether compound and a flame retardant dispersed therein.

(49) The flame retardant substrate of (48) wherein the polyvinylbenzyl ether compound has the above formula (1).

(50) The flame retardant substrate of (48) or (49) wherein the flame retardant is a halogenated phosphate.

(51) The flame retardant substrate of any one of (48) to (50) wherein the content of the flame retardant is 40 to 60 wt % based on the flame retardant and the polyvinylbenzyl ether compound combined.

(52) A prepreg which has been prepared by dispersing a polyvinylbenzyl ether compound and a flame retardant in a solvent to form a slurry, applying the slurry to a glass cloth, and drying.

(53) A prepreg which has been prepared by dispersing a polyvinylbenzyl ether compound and a flame retardant in a solvent to form a slurry, applying the slurry to a metal foil, and drying.

(54) A substrate which has been prepared by laminating press the prepreg of (52).

(55) A double side metal foil-clad composite dielectric substrate which has been prepared by placing metal foils on opposite surfaces of the prepreg of (52), followed by laminating press.

(56) A double side metal foil-clad substrate which has been prepared by placing two plies of the prepreg of (53) on opposite surfaces of glass cloth such that the metal foils are positioned outside, followed by laminating press.

(57) A prepreg which has been prepared by mixing a polyvinylbenzyl ether compound and a flame retardant at a temperature of not lower than the melting point of the polyvinylbenzyl ether compound, and molding the resulting solid mixture under pressure.

(58) A substrate which has been prepared by laminating press the prepreg of (57).

(59) A double side metal foil-clad substrate which has been prepared by placing metal foils on opposite surfaces of the prepreg of (57), followed by laminating press.

(60) A multilayer substrate which has been prepared by stacking at least two plies of the prepreg or substrate of any one of (52) to (59), followed by laminating press.

(61) A flame retardant polyvinylbenzyl ether resin composition comprising a polyvinylbenzyl ether compound and an additive type flame retardant or a mixture of an additive type flame retardant and a flame retardant adjuvant.

(62) The flame retardant polyvinylbenzyl ether resin composition of (61) wherein the additive type flame retardant is a brominated aromatic flame retardant which is present in an amount of 5 to 70% by weight based on the polyvinylbenzyl ether compound.

(63) The flame retardant polyvinylbenzyl ether resin composition of (61) wherein the flame retardant adjuvant is an inorganic flame retardant, and a mixture of the brominated aromatic flame retardant and the inorganic flame retardant is present in an amount of 5 to 70% by weight based on the polyvinylbenzyl ether compound.

(64) The flame retardant polyvinylbenzyl ether resin composition of any one of (61) to (63) wherein the polyvinylbenzyl ether compound has the above formula (1).

(65) The flame retardant polyvinylbenzyl ether resin composition of (61), (63) or (64) wherein the flame retardant adjuvant is an inorganic flame retardant which has been surface treated with a coupling agent.

(66) A method for preparing a thermosetting polyvinylbenzyl ether resin composition, comprising the step of dissolving a polyvinylbenzyl ether compound in a solvent capable of dissolving the compound.

(67) A method for preparing a thermosetting polyvinylbenzyl ether resin composition, comprising the steps of dissolving a polyvinylbenzyl ether compound in a solvent capable of dissolving the compound, removing the solvent from the polyvinylbenzyl ether compound, and obtaining a composition containing the thus treated polyvinylbenzyl ether compound.

(68) The method of (66) or (67) wherein the composition cures into a product having a low dielectric dissipation factor.

(69) The method of any one of (66) to (68) wherein the solvent has a dielectric constant of 2 to 16.

(70) The method of any one of (66) to (69) wherein the polyvinylbenzyl ether compound has the above formula (1).

(71) A thermosetting polyvinylbenzyl ether resin composition which is obtained by the method of any one of (66) to (70) and cures into a product having a Q of at least 250 at a frequency of 2 GHz.

(72) A thermosetting polyvinylbenzyl ether resin composition comprising a polyvinylbenzyl ether compound and a dielectric powder which has been surface treated with a coupling agent.

(73) The composition of (72) wherein the coupling agent is an alkoxysilane or organic functional silane having a pyrolysis initiation temperature of at least 250° C.

(74) The composition of (72) or (73) wherein the polyvinylbenzyl ether compound has the above formula (1).

(75) The composition of any one of (72) to (74) wherein the dielectric powder has been surface treated with 0.1 to 6% by weight based on the dielectric powder of the coupling agent.

(76) The composition of any one of (72) to (75) further comprising a flame retardant.

(77) A composite dielectric material which is obtained by curing the thermosetting polyvinylbenzyl ether resin composition of any one of (72) to (75) whereby the dielectric powder is dispersed in a resin resulting from the polyvinylbenzyl ether compound.

(78) A composite dielectric material which is obtained by curing the thermosetting polyvinylbenzyl ether resin composition of (76) whereby the dielectric powder is dispersed in a resin resulting from the polyvinylbenzyl ether compound and the composite dielectric material is flame retarded.

(79) An electronic part comprising an organic dielectric layer containing at least a polyvinylbenzyl ether compound, a composite magnetic layer having a magnetic powder dispersed in a polyvinylbenzyl ether compound, or a composite dielectric layer having a dielectric powder dispersed in a polyvinylbenzyl ether compound.

(80) The electronic part of (79) wherein the polyvinylbenzyl ether compound has the above formula (1).

(81) The electronic part of (79) or (80) further comprising at least one layer containing at least reinforcing fibers.

(82) The electronic part of any one of (79) to (81) comprising at least one organic dielectric layer containing the polyvinylbenzyl ether compound and having a dielectric constant of 2.6 to 3.5 and a dielectric dissipation factor of 0.0025 to 0.005.

(83) The electronic part of any one of (79) to (81) comprising at least one first composite dielectric layer having a dielectric powder dispersed in a polyvinylbenzyl ether compound, the dielectric powder having a dielectric constant of 20 to 10,000 and a dielectric dissipation factor of 0.01 to 0.001, and the first composite dielectric layer having a dielectric constant of 5 to 20 and a dielectric dissipation factor of 0.0025 to 0.0075.

(84) The electronic part of any one of (79) to (81) comprising at least one second composite dielectric layer having a dielectric powder dispersed in a polyvinylbenzyl ether compound, the dielectric powder having a dielectric constant of 20 to 10,000 and a dielectric dissipation factor of 0.01 to 0.0001 and being present in an amount of 40 to 65 vol %, and the second composite dielectric layer having a dielectric constant of 10 to 40 and a dielectric dissipation factor of 0.0075 to 0.025.

(85) The electronic part of any one of (79) to (81) comprising at least one composite magnetic layer having a magnetic powder dispersed in a polyvinylbenzyl ether compound, the magnetic powder being present in an amount of 25 to 65 vol %, and the composite magnetic layer having a magnetic permeability of 3 to 20.

(86) The electronic part of any one of (79) to (85) wherein at least any one layer contains at least one flame retardant.

As previously discussed, JP-A 9-31006 discloses polyvinylbenzyl ether compounds which are blended with various fillers and reinforcing fibers to form molding materials and composite materials. Alumina, titanium dioxide, and barium titanate whiskers are exemplified as the filler while the amount of filler blended is described nowhere.

Composite dielectric organic materials can be prepared by dispersing dielectric powder in polyvinylbenzyl ether compounds and curing the compounds. The composite dielectric organic materials thus prepared were observed to change their dielectric constant and dissipation factor at high temperature and high humidity. The cause was found to reside in the interfacial bond between the polyvinylbenzyl ether compound and the dielectric powder which was deficient when the dielectric powder was used without pretreatment.

BRIEF DESCRIPTION OF THE DRAWINGS

FIG. 36 is equivalent circuit diagrams of the capacitors.

FIGS. 37 to 39 illustrate a balun transformer as one exemplary electronic part of the invention.

FIGS. 60 to 62 illustrate an antenna as one exemplary electronic part of the invention.

FIGS. 98 and 99 illustrate steps of a process for forming a multilayer substrate.

DESCRIPTION OF THE PREFERRED EMBODIMENTS

Figure 1:
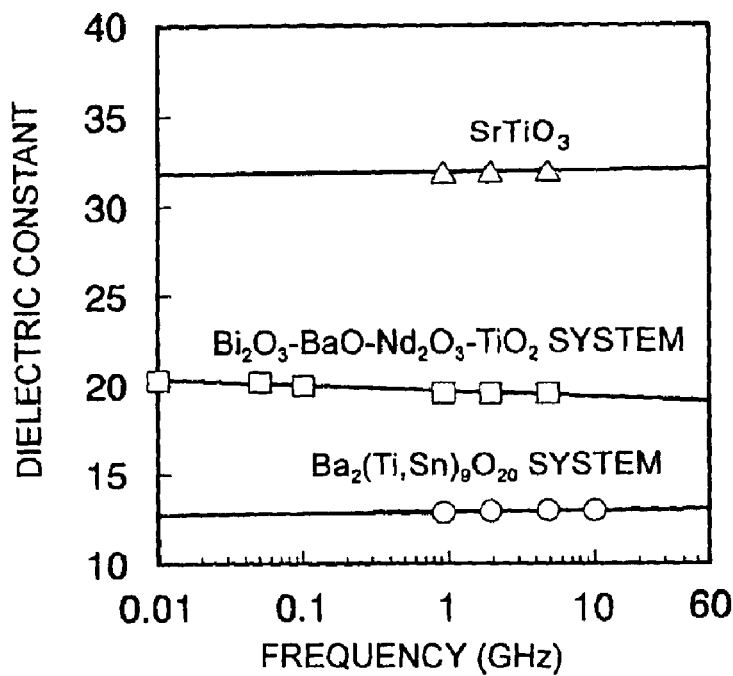
FIG. 1 is graph showing the dielectric constant versus frequency of a composite dielectric material according to a first embodiment of the invention.

In the first embodiment of the invention, the composite dielectric material has a ceramic powder dispersed in a resin resulting from a polyvinylbenzyl ether compound. The composite dielectric material has a Q of at least 250, preferably 250 to 500 and a dielectric constant $\in$ of at least 3, preferably 5 to 40, at a high frequency of at least 500 MHz, preferably 1 to 60 GHz. The composite dielectric material exhibits a Q of at least 50, preferably 200 to 500 and a dielectric constant $\in$ of at least 3, preferably 5 to 40, over a high-frequency band of at least 500 MHz, preferably from 1 to 60 GHz.

By virtue of relatively high values of Q and $\in$ in the high-frequency band, the composite dielectric material is suited for use in an application where such properties are required, for example, such electronic parts as strip lines, impedance matching circuits, delay circuits, and antennas, enabling the size reduction of such parts.

By properly selecting the type and amount of ceramic to be dispersed, a composite dielectric material having the desired properties for a particular application or purpose is obtained.

In the second embodiment, the composite dielectric material has a ceramic powder dispersed in a resin resulting from a polyvinylbenzyl ether compound. The composite dielectric material has a dielectric constant $\in$ of at least 10, preferably 10 to 50 in a high-frequency band of at least 10 MHz, preferably from 100 MHz to 10 GHz.

By virtue of relatively high values of $\in$ in the high-frequency band, the composite dielectric material is suited for use in an application where such properties are required, for example, such electronic parts as capacitor-built-in circuit boards, hybrid parts and capacitors, enabling the size reduction of such parts.

By properly selecting the type and amount of ceramic to be dispersed, a composite dielectric material having the desired properties for a particular application or purpose is obtained.

In the third embodiment, the composite dielectric substrate is obtained by properly combining a prepreg obtained by dispersing a dielectric ceramic powder in a polyvinylbenzyl ether compound to form a slurry, and applying the slurry to a cloth base such as glass cloth, followed by drying, the polyvinylbenzyl ether compound being polymerized or cured into a base resin, a coated metal foil obtained by applying the slurry to a metal foil such as copper foil, followed by drying, a lamination pressed sheet obtained by drying and lamination pressing the slurry, a metal foil such as copper foil, and a cloth base such as glass cloth; and lamination pressing the combination. Depending on the combination, the substrate may or may not have metal foils such as copper foils on opposite surfaces, and even a multilayer structure can be formed.

The composite dielectric substrate of the third embodiment is suitable for use in a high-frequency region of at least 100 MHz, preferably at least 500 MHz, especially 1 to 60 GHz. In the high-frequency region, the substrate has a dielectric constant of about 4 to 40 and a Q of about 40 to 500. It is thus possible to control $\in$ and Q over a wide range.

A choice of a composite dielectric substrate having the desired dielectric characteristics for a particular purpose is possible.

In the fourth embodiment, the composite magnetic substrate material has a magnetic powder dispersed in a polyvinylbenzyl ether compound. With this construction, the composite magnetic substrate material has a low dielectric constant and is suitable for use in a high-frequency band of at least 100 MHz, preferably from 100 MHz to 10 GHz. The content of magnetic powder can be increased to such a level that the composite magnetic substrate material is suitable for use in an application utilizing magnetic characteristics and for magnetic shielding purposes. Additionally, the composite magnetic substrate material has a high strength. When a substrate is formed using the composite magnetic substrate material, bonding and patterning of copper foil are possible without the aid of a nonmagnetic layer or adhesive, and a multilayer structure can be realized. Such patterning and multiple layer stacking can be carried out by the same process as the conventional substrate manufacturing process, achieving a cost reduction and an improvement in working. The substrate thus obtained has a high strength and improved high-frequency characteristics.

In the fifth embodiment, the flame retardant substrate material has a flame retardant dispersed in a polyvinylbenzyl ether compound. With this construction, the substrate material is flame retardant, has a low dielectric constant and is suitable for use in a high-frequency band of at least 100 MHz, preferably from 100 MHz to 10 GHz. Additionally, the substrate has a high strength. When a substrate is formed using the flame retardant substrate material, bonding and patterning of copper foil are possible without the aid of an adhesive, and a multilayer structure can be realized. Such patterning and multiple layer stacking can be carried out by the same process as the conventional substrate manufacturing process, achieving a cost reduction and an improvement in working. The substrate thus obtained has a high strength and improved high-frequency characteristics.

In the sixth embodiment, the resin composition is intended to render flame retardant a resin resulting from polymerization or curing of a polyvinylbenzyl ether compound. This resin composition contains a polyvinylbenzyl ether compound and an additive type flame retardant or both an additive type flame retardant and a flame retardant adjuvant. The additive type flame retardant has little influence on curing conditions and is easy to handle because it need not take into account reaction conditions. As compared with reactive type flame retardants, the additive type flame retardant avoids differential shrinkage upon curing under different conditions, resulting in a less variance among products.

In the seventh embodiment, the method for preparing a polyvinylbenzyl resin composition by dissolving a polyvinylbenzyl ether compound in a solvent capable of dissolving the compound and preferably, thereafter removing the solvent, yielding a solvent-treated polyvinylbenzyl ether compound. In the thus obtained polyvinylbenzyl ether compound, the solvent may have been completely removed or part of the solvent may be left behind. Using the solvent-treated polyvinylbenzyl ether compound, a thermosetting polyvinylbenzyl ether resin composition is prepared. The use of the solvent-treated polyvinylbenzyl ether compound ensures that the corresponding composition in the cured state has improved dielectric characteristics over a wide frequency region, especially a high-frequency region of from 100 MHz to 10 GHz, as compared with the use of untreated polyvinylbenzyl ether compound. In particular, a high Q value (i.e., low dissipation factor) in the high-frequency region is obtained. It is believed that the molecular arrangement of the polyvinylbenzyl ether compound is disintegrated or loosened by the interacting solvent or other factors, and this accounts for a high Q value in the cured state.

In the eighth embodiment, the thermosetting polyvinylbenzyl ether resin composition contains a polyvinylbenzyl ether compound and a dielectric powder which has been surface treated with a coupling agent. Curing the resin composition yields a composite dielectric material. Since the dielectric powder which has been surface treated with a coupling agent is used in the composite dielectric material, the interface between the dielectric powder and the resin material is improved and their bond becomes tight. Then, even when aged under high-temperature conditions or high-temperature, high-humidity conditions, the composite dielectric material experiences minimal changes of dielectric constant and dissipation factor (i.e., Q). Especially when an alkoxysilane or organic functional silane coupling agent having a pyrolysis initiation temperature of at least 250° C. is used, the composite dielectric material experiences minimal changes of dielectric constant and dissipation factor even under high-temperature conditions as typified by the reflow temperature.

In the ninth embodiment, the electronic part of the composite resin type has an organic dielectric layer containing at least a polyvinylbenzyl ether compound, a composite magnetic layer having a magnetic powder dispersed in a polyvinylbenzyl ether compound, or a composite dielectric layer having a dielectric powder dispersed in a polyvinylbenzyl ether compound, all as defined above. This construction ensures ease of adjustment of a dielectric constant and a lowering of dielectric constant, allowing the electronic part to be used in a high-frequency region of at least 100 MHz, preferably from 100 MHz to 10 GHz. The composite magnetic layers are suitable for use in an application utilizing magnetic characteristics and for magnetic shielding purposes. The composite dielectric layers can have relatively high values of Q and $\in$ in the high-frequency band, so that the composite dielectric substrate is suited for use in an application where such properties are required, for example, such electronic parts as strip lines, impedance matching circuits, delay circuits, and antennas. Additionally, the composite dielectric substrate has a high strength.

When a substrate or multilayer electronic part is formed using the composite magnetic layers or composite dielectric layers, bonding and patterning of copper foil are possible without the aid of adhesive, and a multilayer structure can be realized. Such patterning and multiple layer stacking can be carried out by the same process as the conventional substrate manufacturing process, achieving a cost reduction and an improvement in working. The electronic part based on the substrate thus obtained has a high strength and improved high-frequency characteristics.

The polyvinylbenzyl ether compound used herein typically has the following general formula (1).

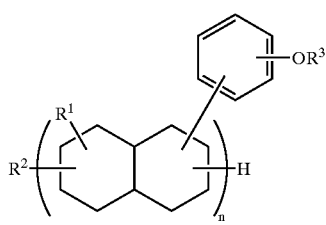

(1)

Herein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number of 2 to 4.

Also preferably, the polyvinylbenzyl ether compound of the formula (1) used herein is prepared by reacting a polyphenol of the following general formula (2):

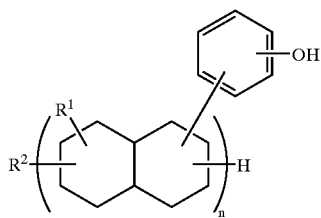

(2)

wherein $R^1$, $R^2$ and n are as defined above with a vinylbenzyl halide in the presence of an alkali metal hydroxide.

In formulas (1) and (2), $R^1$ is methyl or ethyl.

$R^2$ is hydrogen or a hydrocarbon group of 1 to 10 carbon atoms, examples of which include substituted or unsubstituted alkyl, aralkyl and aryl groups. Exemplary alkyl groups are methyl, ethyl, propyl and butyl, an exemplary aralkyl group is benzyl, and an exemplary aryl group is phenyl.

$R^3$ is hydrogen or a vinylbenzyl group. The hydrogen atom originates from the starting compound used in the synthesis of the compound of formula (1). The molar ratio of hydrogen to vinylbenzyl is from 60:40 to 0:100, and preferably from 40:60 to 0:100.

The letter n is a number of 2 to 4.

The molar ratio of hydrogen to vinylbenzyl in $R^3$ set within the above-defined range permits the curing reaction to proceed to a full extent in forming a dielectric, leading to satisfactory dielectric characteristics. As the unreacted compound wherein $R^3$ is hydrogen is left more, the curing reaction proceeds to a less extent, failing to achieve satisfactory dielectric characteristics.

Illustrative examples of the compound of formula (1) are shown below in terms of the combination of $R^1$, but not limited thereto.

Compound

| No. | $R^1$ | $R^2$ | $R^3$ | n |
|---|---|---|---|---|
| 1 | methyl | $C_{1-10}$ alkyl | 0:100 | 3 |
| 2 | methyl | $C_{1-10}$ alkyl | 5:95 | 3 |
| 3 | methyl | $C_{1-10}$ alkyl | 60:40 | 3 |
| 4 | methyl | $C_{1-10}$ alkyl | 40:60 | 3 |
| 5 | methyl | $C_{1-10}$ alkyl | 20:80 | 3 |

Note that $R^3$ is represented by a molar ratio of H/vinylbenzyl, and "$C_{1-10}$ alkyl" is a mixture of alkyl groups of 1 to 10 carbon atoms inclusive of aralkyl groups.

The polyvinylbenzyl ether compound of formula (1) can be synthesized, for example, by reacting a polyphenol of the general formula (2) with a vinylbenzyl halide as descried in JP-A 9-31006.

The reaction of a polyphenol with a vinylbenzyl halide may be effected in any desired manner. Typical methods are method I of reacting a polyphenol with a vinylbenzyl halide in a polar neutral solvent, using an alkali metal hydroxide as a dehydrochlorination agent, and method II of reacting a polyphenol with a vinylbenzyl halide in a water/organic solvent mixture in the presence of a phase transfer catalyst (e.g., quaternary ammonium salt) at a temperature of up to 100° C., using an alkali metal hydroxide as a dehydrochlorination agent.

The polyphenol of formula (2) is commercially available, for example, under the trade name of PP-700-300 and PP-1000-180 from Nippon Oil K.K.

Examples of the vinylbenzyl halide include p-vinylbenzyl chloride, m-vinylbenzyl chloride, a mixture of p-vinylbenzyl chloride and m-vinylbenzyl chloride, p-vinylbenzyl bromide, m-vinylbenzyl bromide, and a mixture of p-vinylbenzyl bromide and m-vinylbenzyl bromide. Of these, p-vinylbenzyl chloride, and a mixture of p-vinylbenzyl chloride and m-vinylbenzyl chloride are preferred. The use of p-vinylbenzyl chloride results in a polyvinylbenzyl ether compound having good symmetry, a high melting point and a high softening point. The use of a mixture of p-vinylbenzyl chloride and m-vinylbenzyl chloride results in a polyvinylbenzyl ether compound having a low melting point and a low softening point which is easy to work.

The proportion of polyphenol and vinylbenzyl halide may be selected as appropriate. For example, the polyphenol and vinylbenzyl halide are used in a molar ratio of from 100:40 to 100:120.

Examples of the polar neutral solvent include dimethylformamide, dimethylsulfoxide, dimethylacetamide, N-methylpyrrolidone, dioxane, acetonitrile, tetrahydrofuran, ethylene glycol dimethyl ether, 1,3-dimethoxypropane, 1,2-dimethoxypropane, tetramethylenesulfone, hexamethylphosphoramide, methyl ethyl ketone, methyl isobutyl ketone, and acetone, and mixtures thereof.

Examples of the alkali metal hydroxide are potassium hydroxide, sodium hydroxide and a mixture thereof. The alkali metal hydroxide is used in an amount of about 1.1 to 2.0 mol per mol of phenolic hydroxyl groups.

In either Method I or II, a reaction temperature of about 30 to 100° C. and a reaction time of about 0.5 to 20 hours are appropriate.

When the polyvinylbenzyl ether compound is prepared by either of the above methods, some blending formulations of polyphenol and vinylbenzyl halide will result in compounds in which all the phenolic hydroxyl groups on the polyphenol of formula (2) have not been replaced by vinylbenzyl groups. In this case, the reaction product is a mixture of the polyvinylbenzyl ether compound of formula (1) and the polyphenol of formula (2). In the practice of the invention, the presence of the polyphenol is acceptable as long as the content of the polyphenol is below a specific level, that is, below 60 mol % of the mixture. Inclusion of more than 60 mol % of the polyphenol is undesirable because subsequent curing reaction does not proceed to a full extent, failing to achieve satisfactory dielectric characteristics.

The percent substitution at which the phenolic hydroxyl groups on the polyphenol of formula (2) are replaced by vinylbenzyl groups is preferably 40 to 100 mol %, and especially 60 to 100 mol %. Of course, a higher percent substitution is desirable. The percent substitution can be adjusted as appropriate by controlling the blending formulation of polyphenol and vinylbenzyl halide.

Where the presence of polyphenol is not permissible, the blending formulation of polyphenol and vinylbenzyl halide is determined as appropriate, and the unreacted reactant is removed by suitable means such as a re-precipitation purification method using a combination of solvent and nonsolvent systems.

According to the invention, the polyvinylbenzyl ether compound is dissolved in a solvent for the purpose of solvent treatment. Any desired solvent may be used for dissolving the polyvinylbenzyl ether compound as long as the compound is soluble in that solvent. The preferred solvent has a solubility corresponding to at least 20 g of the polyvinylbenzyl ether compound in 100 g of the solvent. Those solvents having a dielectric constant $\in$ of 2 to 16 are especially preferred.

In general, the dielectric constant is used as one factor representing the ease of polarization of a solvent. The dielectric constant of a solvent is determined as $\in = E/E_0$ wherein E is a potential difference between a pair of electrodes with the solvent therebetween when an electric field is applied thereacross and $E_0$ is a potential difference between a pair of electrodes in vacuum. In general, the dielectric constant of a solvent corresponds to the solubility of a polar substance in that solvent.

Solvents which are commonly used and not limited to those used in the invention are listed below together with their dielectric constant and solubility of a polyvinylbenzyl ether compound.

TABLE 1

| Solvent | Dielectric constant | Solubility of polyvinylbenzyl ether |
| --- | --- | --- |
| hexane | 1.89 | insoluble |
| dioxane | 2.227 | good |
| toluene | 2.24 | good |
| benzene | 2.3 | good |
| o-xylene | 2.266 | good |
| m-xylene | 2.334 | good |
| p-xylene | 2.27 | good |
| tetrahydrofuran | 5.4 | good |
| methyl isobutyl ketone | 13.11 | good |
| methyl ethyl ketone | 15.45 | good |
| acetone | 21.45 | difficult |
| methanol | 32.35 | insoluble |

Those solvents listed nearer to the bottom of Table 1 are more polar. As seen from Table 1, the polyvinylbenzyl ether compound is soluble in the solvents having a dielectric constant of 2 to 16.

Polyvinylbenzyl ether compounds have a dielectric constant of 2.5 to 2.6 and are well soluble not only in solvents having a dielectric constant close thereto, but also in solvents having a relatively high dielectric constant because these solvents are polar solvents.

In Table 1, the level above which solubility is judged good is the solubility of 20 g of the polyvinylbenzyl ether compound in 100 g of the solvent. The difficultly soluble level corresponds to a solubility of more than 1 g to less than 20 g of the compound in 100 g of the solvent. The insoluble level corresponds to a solubility of up to 1 g of the compound in 100 g of the solvent.

Thus, in the practice of the invention, a choice may be made among those solvents in which the polyvinylbenzyl ether compound is judged soluble in Table 1.

In dissolving or dispersing the polyvinylbenzyl ether compound in a solvent, any method capable of agitating or rocking a solution or dispersion may be used. Heating or ultrasonic vibration may be used in combination in order to shorten the dissolving or dispersing time.

Thereafter, the solution or dispersion is dried for removing at least part of the solvent from the solution or dispersion. This yields the solvent-treated polyvinylbenzyl ether compound.

In one preferred embodiment of the invention, the composition contains the solvent-treated polyvinylbenzyl ether compound. It is most preferred that all the polyvinylbenzyl ether compound used be solvent-treated one. The co-presence of the untreated polyvinylbenzyl ether compound is acceptable as long as its content is less than 80% by weight of the entire polyvinylbenzyl ether compounds.

The polyvinylbenzyl ether compounds may be used alone or in admixture of two or more.

The polyvinylbenzyl ether compound may be used alone for polymerization to form a resin or in combination with another polymer for copolymerization to form a resin. Alternatively, it may be used in combination with another resin.

Copolymerizable monomers used herein include styrene, vinyltoluene, divinylbenzene, divinyl benzyl ether, allylphenol, allyloxybenzene, diallyl phthalate, acrylates, methacrylates, and vinyl pyrrolidone. An appropriate proportion of such monomer blended is about 2 to 50% by weight based on the polyvinylbenzyl ether compound.

The other resins which can be used in combination include thermosetting resins such as vinyl ester resins, unsaturated polyester resins, maleimide resins, polyphenol polycyanate resins, epoxy resins, phenolic resins, and vinylbenzyl compounds, and thermoplastic resins such as polyether imide, polyether sulfone, polyacetal and dicyclopentadiene resins. An appropriate proportion of such resin blended is about 5 to 90% by weight based on the polyvinylbenzyl ether compound. A choice may be preferably made among vinyl ester resins, unsaturated polyester resins, maleimide resins, polyphenol polycyanate resins, epoxy resins, and mixtures thereof.

The thermosetting resin composition comprising the polyvinylbenzyl ether compound alone or in combination with the other monomer or thermosetting resin can be polymerized and cured in a well-known manner. Curing may be done in the presence or absence of a curing agent. Typical curing agents are well-known radical polymerization initiators such as benzoyl peroxide, methyl ethyl ketone peroxide, dicumyl peroxide, and t-butyl perbenzoate. The curing agent is used in an amount of 0 to about 10 parts by weight per 100 parts by weight of the polyvinylbenzyl ether compound.

The curing temperature varies depending on the presence or absence of the curing agent and the type of curing agent. A temperature of about 20 to 250° C., and preferably about 50 to 250° C. is sufficient for full curing.

Also, hydroquinone, benzoquinone, copper salts or the like may be blended for cure adjustment purposes.

The ceramic powder used in the first embodiment should have a high Q and dielectric constant. Preferably the ceramic powder has a dielectric constant of 2.5 to 300 and a Q of 250 to 50,000 at a frequency of 1 to 15 GHz. By dispersing a ceramic powder having a high Q and dielectric constant in a resin resulting from a polyvinylbenzyl ether compound, a composite dielectric material having a high Q and dielectric constant is obtainable.

The ceramic powder used in the first embodiment may have a greater dielectric constant and Q in a high-frequency band than the resin serving as the dispersing medium. It is acceptable to use a mixture of two or more ceramic powders.

The ceramic powder may also be single crystal sapphire (or similar) powder or polycrystalline alumina powder. Preferred types of ceramic powder are powders of dielectrics based on the following compositions. The compositions are shown together with their dielectric constant ∈ and Q at a frequency of 1 to 15 GHz.

| Composition | ∈ | Q |
|---|---|---|
| $Mg_2SiO_4$ | 7 | 20,000 |
| $Al_2O_3$ | 9.8 | 40,000 |
| $MgTiO_3$ | 17 | 22,000 |
| $ZnTiO_3$ | 26 | 800 |
| $Zn_2TiO_4$ | 15 | 700 |
| $TiO_2$ | 104 | 15,000 |
| $CaTiO_3$ | 170 | 1,800 |
| $SrTiO_3$ | 255 | 700 |
| $SrZrO_3$ | 30 | 1,200 |
| $BaTi_2O_5$ | 42 | 5,700 |
| $BaTi_4O_9$ | 38 | 9,000 |
| $Ba_2Ti_9O_{20}$ | 39 | 9,000 |
| $Ba_2(Ti,Sn)_9O_{20}$ | 37 | 5,000 |
| $ZrTiO_4$ | 39 | 7,000 |
| $(Zr,Sn)TiO_4$ | 38 | 7,000 |
| $BaNd_2Ti_5O_{14}$ | 83 | 2,100 |
| $BaSm_2TiO_{14}$ | 74 | 2,400 |
| $Bi_2O_3$—$BaO$—$Nd_2O_3$—$TiO_2$ | 88 | 2,000 |
| $PbO$—$BaO$—$Nd_2O_3$—$TiO_2$ | 90 | 5,200 |
| $(Bi_2O_3,PbO)$—$BaO$—$Nd_2O_3$—$TiO_2$ | 105 | 2,500 |
| $La_2Ti_2O_7$ | 44 | 4,000 |
| $Nd_2Ti_2O_7$ | 37 | 1,100 |
| $(Li,Sm)TiO_3$ | 81 | 2,050 |
| $Ba(Mg_{1/3}Ta_{2/3})O_3$ | 25 | 35,000 |
| $Ba(Zn_{1/3}Ta_{2/3})O_3$ | 30 | 14,000 |
| $Ba(Zn_{1/3}Nb_{2/3})O_3$ | 41 | 9,200 |
| $Sr(Zn_{1/3}Nb_{2/3})O_3$ | 40 | 4,000 |

Preferred among others are those dielectrics based on the compositions: $TiO_2$, $CaTiO_3$, $SrTiO_3$, $BaO$—$Nd_2O_3$—$TiO_2$, $Bi_2O_3$—$BaO$—$Nd_2O_3$—$TiO_2$, $BaTi_4O_9$, $Ba_2Ti_9O_{20}$, $Ba_2(Ti,Sn)_9O_{20}$, $MgO$—$TiO_2$, $ZnO$—$TiO_2$, $MgO$—$SiO_2$, and $Al_2O_3$.

The ceramic powder may further contain Mn oxide, $Nb_2O_5$, $V_2O_5$, $SiO_2$, $B_2O_3$, and glass as an auxiliary component. Existing dielectric materials available in plenty may also be used as the ceramic powder. For example, used ceramics and ceramic capacitor-forming powder prior to sintering are available. In these ceramic powders, donors for oxides of alkaline earth metals such as Mg, Ca, Sr and Ba, oxides of transition metals such as Mn, Co and Ni, oxides of Nb, V, Mo and W, oxides of rare earth elements such as Y, Sc and La, $SiO_2$, $B_2O_3$, and glass are sometimes contained as an auxiliary component for the purposes of improving Q, sinterability and temperature properties.

The ceramic powder or particles should preferably have a mean particle size of about 0.2 to 100 μm so that ceramic particles are effectively milled with the resin. Particles with too small a particle size may be difficult to mill with the resin. Too large a particle size may interfere with uniform dispersion and mixing. Then a composition having a larger content of ceramic powder of such large particle size may fail to form a consolidated body when molded.

In the composite dielectric material of the first embodiment containing a resin resulting from a polyvinylbenzyl ether compound and a ceramic powder as main components, the content of ceramic powder is from 10% by volume to less than 70% by volume provided that the total of the resin and ceramic powder is 100% by volume. Preferably, the content of ceramic powder is 20 to 60% by volume. A ceramic powder content of 70 vol % or more obstructs the flow during press molding, failing to form a consolidated body. Then electric properties deteriorate due to easy entry of water. Such a greater ceramic powder content can also result in a substantial lowering of Q as compared with the composition having no ceramic powder added. At a content of less than 10 vol %, the ceramic powder fails to exert its effect.

By properly setting the contents of the respective components within the above range, the composite dielectric material of the first embodiment can have a greater dielectric constant and Q than those of the resin resulting from the polyvinylbenzyl ether compound and especially any desired dielectric constant and Q.

The ceramic powder used in the second embodiment should have a high dielectric constant. By dispersing a ceramic powder having a dielectric constant of at least 90 at a frequency of at least 100 kHz in a resin resulting from a polyvinylbenzyl ether compound, a composite dielectric material having a high dielectric constant is obtainable.

Any desired ceramic powder may be used in the second embodiment as long as it has a high dielectric constant. It is acceptable to use two or more ceramic powders. Preferred types of ceramic powder are powders of dielectrics based on the following compositions. The compositions are shown together with their dielectric constant ∈ at a frequency of 100 kHz to 10 MHz.

| Composition | ∈ |
|---|---|
| $BaTiO_3$ | 1,500 |
| $(Ba,Pb)TiO_3$ | 6,000 |
| $Ba(Ti,Zr)O_3$ | 9,000 |
| $(Ba,Sr)TiO_3$ | 7,000 |

Preferred among others are those dielectrics based on the compositions: $BaTiO_3$ and $Ba(Ti,Zr)O_3$.

The ceramic powder may also be a single crystal or polycrystalline powder.

The ceramic powder may further contain Mn oxide, $Nb_2O_5$, $V_2O_5$, $SiO_2$, $B_2O_3$, and glass as an auxiliary component. Existing dielectric materials available in plenty may also be used as the ceramic powder. For example, used ceramics and ceramic capacitor-forming powder prior to sintering are available. In these ceramic powders, donors for oxides of alkaline earth metals such as Mg, Ca, Sr and Ba, oxides of transition metals such as Mn, Co and Ni, oxides of Nb, V, Mo and W, oxides of rare earth elements such as Y, Sc and La, $SiO_2$, $B_2O_3$, and glass are sometimes contained as an auxiliary component for the purposes of improving Q, sinterability and temperature properties.

The ceramic powder used in the second embodiment should preferably have a dielectric constant of at least 90 and more preferably 90 to 100,000 at a frequency of at least 100 kHz, and preferably 100 kHz to 10 MHz.

Since it is quite difficult to measure the dielectric constant at a high frequency of a ceramic having a high dielectric constant and a high dissipation factor, the dielectric constant described herein is a measurement in capacitor form at a conventional frequency.

The ceramic powder or particles should preferably have a mean particle size of about 0.2 to 100 μm so that ceramic particles are effectively milled with the resin. Particles with too small a particle size may be difficult to mill with the resin. Too large a particle size may interfere with uniform dispersion and mixing. Then a composition having a larger content of ceramic powder of such large particle size may fail to form a consolidated body when molded.

In the composite dielectric material of the second embodiment containing a resin resulting from a polyvinylbenzyl ether compound and a ceramic powder as main components, the content of ceramic powder is from 30% by volume to less than 70% by volume provided that the total of the resin and ceramic powder is 100% by volume. Preferably, the content of ceramic powder is 40 to 60% by volume. A ceramic powder content of 70 vol % or more obstructs the flow during press molding, failing to form a consolidated body. Then electric properties deteriorate due to easy entry of water. A substantial lowering of dielectric constant is another disadvantage. At a content of less than 30 vol %, the ceramic powder fails to exert its effect.

By properly setting the contents of the respective components within the above range, the composite dielectric material of the second embodiment can have a greater dielectric constant.

The polymerized or cured product of the polyvinylbenzyl ether compound is a polymeric material having a low dielectric constant (typically $\in$=about 2.6 at 2 GHz) and a low dissipation factor (typically tan δ=0.01 to 0.0001 at 2 GHz) in a high-frequency region as well as improved insulating properties, heat resistance and low water absorption.

Regarding the polymerized or cured product of polyvinylbenzyl ether compound (VB), commercially available FR-4 and FR-5 (epoxy resin by Sumitomo Bakelite), BT resin (bismaleimide resin by Mitsubishi Gas Chemical K.K.), and polyphenylene ether (PPE), Table 2 shows their moisture pickup (85° C./RH 85% for 500 hours), glass transition temperature (Tg) by differential scanning calorimetry (DSC), and decomposition initiation temperature (Td) by thermogravimetry and differential thermal analysis (TG/DTA).

TABLE 2

|  | Moisture pickup | Tg | Td |
| --- | --- | --- | --- |
| VB | 0.07% | 192° C. | 435° C. |
| FR-4 | 0.67% | 135° C. | 330° C. |
| FR-5 | 0.17% | 140° C. | 360° C. |
| BT resin | 0.32% | 195° C. | 356° C. |
| PPE | 0.22% | 178° C. | 366° C. |

The dielectric ceramic material providing the dielectric ceramic powder used in the third embodiment should preferably have a dielectric constant ($\in$) of at least 10 and more preferably at least 20 at 2 GHz and a dissipation factor (tan δ) of up to 0.01 at 2 GHz though not limited thereto. The upper limit of dielectric constant is usually about 10,000 though not critical. The lower limit of dissipation factor is usually about 0.0001 though not critical. Preferred materials include titanium-barium-neodymium base ceramics, titanium-barium-tin base ceramics, lead-calcium base ceramics, titanium dioxide ($TiO_2$) base ceramics, barium titanate base ceramics (including $BaTiO_3$—$BaZrO_3$, BaO—$TiO_2$—$Nd_2O_3$ and BaO—$TiO_2$—$SnO_2$ systems), lead titanate base ceramics, strontium titanate ($SrTiO_3$) base ceramics, calcium titanate ($CaTiO_3$) ceramics, bismuth titanate base ceramics, and magnesium titanate ($MgTiO_3$) base ceramics. Also included are $CaWO_4$ base ceramics, $Ba(Mg, Nb)O_3$ base ceramics, $Ba(Mg,Ta)O_3$ base ceramics, $Ba(Co, Mg,Nb)O_3$ base ceramics, and $Ba(Co,Mg,Ta)O_3$ base ceramics. They may be used alone or in admixture of two or more.

The titanium dioxide base ceramics include one consisting of titanium dioxide and those ceramics containing minor amounts of additives in addition to titanium dioxide, while they should maintain the crystalline structure of titanium dioxide. The same applies to the remaining ceramics. While the titanium dioxide is represented by $TiO_2$ and has a variety of crystalline structures, those titanium dioxide species having the rutile structure are used as the dielectric ceramic.

For uniform dispersion and mixing and high loading, the dielectric ceramic powder or particles should preferably have a mean particle size of 0.1 to 150 μm, especially 0.5 to 100 μm. Too large a particle size may allow for substantial settlement in paste form and interfere with uniform dispersion and mixing. Too small a particle size corresponds to a greater surface area, which may obstruct high loading.

In the composite dielectric material of the third embodiment containing a polyvinylbenzyl ether compound and a dielectric ceramic powder as main components, the content of dielectric ceramic powder is 10 to 65% by volume provided that the total of the polyvinylbenzyl ether compound and dielectric ceramic powder is 100% by volume. This range of dielectric ceramic powder content leads to a higher dielectric constant and ensures effective mixing and dispersion of the dielectric ceramic powder in the polyvinylbenzyl ether compound. In contrast, if the content of polyvinylbenzyl ether compound is less than 35 vol % and the content of dielectric ceramic powder is more than 65 vol %, mixing and dispersion of the dielectric ceramic powder in the polyvinylbenzyl ether compound becomes difficult. In preparing a prepreg, application to cloth base such as glass cloth becomes difficult. Even when press molding and application to cloth base such as glass cloth become possible by viscosity adjustment with a solvent, the prepreg becomes unbondable due to poor bond and brittle molded products. If the content of polyvinylbenzyl ether compound is more than 90 vol % and the content of dielectric ceramic powder is less than 10 vol %, the resulting material has a dielectric constant of less than 4, failing to achieve the advantage of high dielectric constant.

Any desired magnetic powder may be used in the fourth embodiment although ferrite or ferromagnetic metal powder is typically used. Examples of the ferrite are Mn—Mg—Zn, Ni—Zn, and Mn—Zn base systems, with the Mn—Mg—Zn and Ni—Zn base systems being preferred.

Preferred ferromagnetic metals are iron carbonyl, iron-silicon base alloys, iron-aluminum-silicon base alloys (trade name: Sendust), iron-nickel base alloys (trade name: Permalloy), and amorphous alloys including iron and cobalt base alloys.

Means for dividing these materials into particles may be well-known techniques such as grinding and granulation.

The magnetic powder or particles should preferably have a particle size of 0.01 to 100 μm and a mean particle size of 1 to 50 μm. Magnetic particles with a size in this range are effectively dispersed, achieving a better effect. Too large a particle size may allow particles to settle in paste form, failing to achieve uniform dispersion. When a composition of such large particles is formed into thin-wall substrates or prepregs, few may have a smooth surface. Since it is practically difficult to divide the material into particles of an extremely small size, the lower limit of particle size is about 0.01 μm.

Preferably the magnetic powder has a uniform distribution of particle size. If desired, a fraction of particles having a uniform particle size is collected by sieving. The magnetic particles may have any desired shape including spherical, flat and elliptic shapes. A choice may be made depending on a particular application. If desired, magnetic particles may be subjected on their surface to such treatment as oxidation, coupling or coating of organic insulating material.

It is acceptable to use two or more magnetic powders which differ in type or particle size distribution. Such different magnetic powders may be mixed in any desired ratio. The type, particle size and mixing ratio of magnetic powder may be determined depending on a particular application.

The magnetic powder preferably has a magnetic permeability $\mu$ of 10 to 1,000,000. It is preferred that the magnetic powder in bulk form have greater insulation because substrates formed therefrom are improved in insulation.

The polyvinylbenzyl ether compound and magnetic powder are preferably mixed such that at the stage of a paste to be applied to glass cloth, the weight ratio of polyvinylbenzyl ether compound to magnetic powder may range from 100:100 to 100:900. That is, the preferred content of magnetic powder is 50 to 90% by weight. A magnetic powder content within this range ensures the benefits of the invention. Too large a magnetic powder content may make it difficult to form a slurry for coating and hence, to form a substrate or prepreg. Too small a magnetic powder content may fail to provide the desired magnetic permeability, detracting from magnetic characteristics.

The flame retardant used in the flame retardant substrate according to the fifth embodiment of the invention may be selected from a variety of flame retardants which are conventionally used in rendering substrates flame-proof. Exemplary flame retardants include halides such as halogenated phosphates and brominated epoxy resins, organic compounds such as phosphate amides, and inorganic substances such as antimony trioxide and aluminum hydride. Of these, halogenated phosphates and phosphate amides are preferred. Especially preferred are the halogenated phosphates, typically the following one.

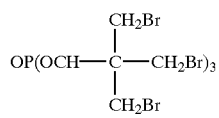

The polyvinylbenzyl ether compound and flame retardant are preferably mixed such that where the flame retardant is a halogenated phosphate, the weight ratio of polyvinylbenzyl ether compound to flame retardant may range from 100:100 to 100:900 at the stage of a paste to be applied to glass cloth. That is, the preferred content of halogenated phosphate is 40 to 60% by weight. A flame retardant content within this range ensures the benefits of the invention. At too large a flame retardant content, the properties, especially electrical properties of the resin may be exerted to a less extent. Too small a flame retardant content may fail to provide flame retardance or to satisfy the UL-94 V-0 rating of the UL standard.

The additive type flame retardant used in the sixth embodiment includes (1) halogenated flame retardants, (2) phosphorus flame retardants, (3) nitrogenous flame retardants, (4) metal salt flame retardants, (5) hydrated metal flame retardants, and (6) inorganic flame retardants. Of these, the halogenated flame retardants are preferred from the standpoint of dielectric properties, with brominated aromatic flame retardants being especially preferred for heat resistance and dielectric properties.

Typical examples of suitable brominated aromatic flame retardants include decabromodiphenyl oxide, octabromodiphenyl oxide, tetrabromobisphenol A, bis(tribromophenoxy)ethane, tetrabromobisphenol A epoxy oligomers, ethylenebis(tetrabromophthalimide), ethylenebis(pentabromodiphenyl), tris(tribromophenoxy)triazine, tetrabromobisphenol A-bis(2,3-dibromopropyl ether), poly(dibromophenylene ether), brominated polystyrene, hexabromobenzene, tetrabromobisphenol S, octabromotrimethylphenylindane, and brominated polyphenylene oxide. A choice may be made among these depending on the desired set of properties.

With respect to the heat resistance of electronic parts and circuit boards, a reflow resistance level of withstanding several (5 or 6) cycles of 260° C./10 sec at maximum and a solder dipping test level of withstanding 260 to 350° C./several seconds (10 to 3 seconds) are required from the standpoint of bonding with lead-free solder. The flame retardant must be unsusceptible to decomposition in this temperature range. Preferred examples of the flame retardant satisfying this requirement include decabromodiphenyl oxide, tetrabromobisphenol A epoxy oligomers, ethylenebis(tetrabromophthalimide), ethylenebis(pentabromodiphenyl), tris(tribromophenoxy)triazine, tribromoneopentyl alcohol, brominated polystyrene, octabromotrimethylphenylindane, and brominated polyphenylene oxide.

The amount of the brominated aromatic flame retardant blended may be suitably determined so as to meet the desired degree of flame retardance. Usually an appropriate amount of the brominated aromatic flame retardant blended is about 5 to 70% by weight based on the polyvinylbenzyl ether compound. Outside the range, a less amount of the flame retardant may fail to achieve improvements in flame retardant and dielectric properties whereas a larger amount may detract from the good physical properties (e.g., flexural strength) of the polyvinylbenzyl ether compound in the cured state and invite a viscosity rise in forming a paste, making it difficult to form a paste.

In the case of circuit boards, for example, the amount of the brominated aromatic flame retardant blended is preferably set to 20 to 50% by weight in order to clear the V-1 or V-0 rating of the UL-94 burning test.

If desired, a mixture of two or more of the above-mentioned flame retardants is used.

A flame retardant adjuvant may be used in combination with the flame retardant. The flame retardant adjuvant used herein, which is sometimes classified in the grouping of flame retardants, is a substance which provides a synergistic flame retardant effect when used in combination with a certain flame retardant. In the preferred embodiment wherein the flame retardants are brominated aromatic flame retardants, the preferred flame retardant adjuvants used herein are those compounds classified in the grouping of inorganic flame retardants. Such inorganic flame retardants act as a dehydrating agent for the resin upon burning, contributing to carbide coating formation. Illustrative examples of the inorganic flame retardants are aluminum hydroxide, magnesium hydroxide; metal oxides such as silica, aluminum oxide, iron oxide, titanium oxide, manganese oxide, magnesium oxide, zirconium oxide, zinc oxide, molybdenum oxide, cobalt oxide, bismuth oxide, chromium oxide, tin oxide, antimony oxide, nickel oxide, copper oxide, and tungsten oxide; metal powders such as aluminum, iron, titanium, manganese, zinc, molybdenum, cobalt, bismuth, chromium, nickel, copper, tungsten, tin and antimony; zinc borate, zinc metaborate, barium metaborate, zinc carbonate, magnesium carbonate, calcium carbonate, and barium carbonate.

Of these, antimony trioxide, aluminum hydroxide and magnesium hydroxide are suitable since they exert a greater synergistic effect when combined with the flame retardant. As the material that clears the above-mentioned heat resistance levels of reflow and solder dipping tests, antimony trioxide is best suited since it has high heat resistance due to a high melting point of 655° C., exerts a great synergistic flame retardant effect in cooperation with the brominated aromatic flame retardant, and satisfies insulating and other necessary properties.

If desired, the flame retardant adjuvants are used in admixture of two or more.

The inorganic flame retardant adjuvant is used in such amounts that the total amount of inorganic flame retardant adjuvant and brominated aromatic flame retardant may be about 5 to 70% by weight based on the weight of the polyvinylbenzyl ether compound. A proper amount is determined in accordance with the desired degree of flame retardance. If the total amount is below the range, little improvements are made in flame retardant and dielectric properties. If the total amount is above the range, the good physical properties of the polyvinylbenzyl ether compound in the cured state are more or less lost and the step of milling into a paste becomes difficult.

In the case of circuit boards, for example, the total amount of the flame retardant and flame retardant adjuvant is preferably set to 20 to 40% by weight in order to clear the V-1 or V-0 rating of the UL-94 burning test.

The ratio of the inorganic flame retardant to the polyvinylbenzyl ether compound blended is not critical and may be determined as appropriate for a particular purpose. Most often, this ratio is in the range from 5/95 to 95/5.

The flame retardant adjuvant may be surface treated for the purposes of improving dispersibility and the interfacial state with the polyvinylbenzyl ether compound. For example, silane compounds (e.g., chlorosilanes, alkoxysilanes, organic functional silanes, and silazanes), titanate and aluminum coupling agents are used for surface treatment. The surface treatment may be effected by dry, wet and integral blend methods, etc. A proper method may be selected in accordance with the desired properties and the step and installation required therefor. Any of such surface treatment methods may be conducted in a well-known manner.

As compared with the additive type flame retardant used alone, the use of the additive type flame retardant in combination with the flame retardant adjuvant enables to maintain the flame retardant effect unchanged even when the content of the polyvinylbenzyl ether compound in the inventive composition is increased.

The dielectric ceramic material providing the dielectric ceramic powder used in the eighth embodiment should preferably have a dielectric constant ($\in$) of 10 to 20,000 at 2 GHz and a dissipation factor (tan $\delta$) of up to 0.05 at 2 GHz though not limited thereto. The lower limit of dissipation factor is usually about 0.0001 though not critical. Preferred materials include titanium-barium-neodymium base ceramics, titanium-barium-tin base ceramics, lead-calcium base ceramics, titanium dioxide ($TiO_2$ system) base ceramics, barium titanate base ceramics (including $BaTiO_3$—$BaZrO_3$, $BaO$—$TiO_2$—$Nd_2O_3$ and $BaO$—$TiO_2$—$SnO_2$ systems), lead titanate base ceramics, strontium titanate ($SrTiO_3$) base ceramics, calcium titanate ($CaTiO_3$) ceramics, bismuth titanate base ceramics, magnesium titanate ($MgTiO_3$) base ceramics, zirconium titanate base ceramics, zinc titanate base ceramics, and strontium zirconate base ceramics. Also included are $CaWO_4$ base ceramics, $Ba(Mg,Nb)O_3$ base ceramics, $Ba(Mg,Ta)O_3$ base ceramics, $Ba(Co,Mg,Nb)O_3$ base ceramics, $Ba(Co,Mg,Ta)O_3$ base ceramics, $Sr(Zn, Nd)O_3$ base ceramics, $Ba(Zn,Nd)O_3$ base ceramics and $Ba(Zn,Ta)O_3$ base ceramics. They may be used alone or in admixture of two or more.

The titanium dioxide base ceramics include one consisting of titanium dioxide and those ceramics containing minor amounts of additives in addition to titanium dioxide, while they should maintain the crystalline structure of titanium dioxide. The same applies to the remaining ceramics. While the titanium dioxide is represented by $TiO_2$ and has a variety of crystalline structures, those titanium dioxide species having the rutile structure are used as the dielectric ceramic.

For uniform dispersion and mixing and high loading, the dielectric ceramic powder or particles should preferably have a mean particle size of 0.1 to 100 $\mu$m, especially 0.1 to 10 $\mu$m. Too large a particle size may interfere with uniform dispersion and mixing in the polyvinylbenzyl ether compound and allow for substantial settlement in paste form, failing to form a uniform material. Too small a particle size corresponds to a greater surface area, which may increase the viscosity and thixotropy upon dispersion and mixing, obstructing high loading of ceramic particles.

In the composite dielectric material of the eighth embodiment, the content of dielectric ceramic powder is 5 to 65% by volume provided that the total of the polyvinylbenzyl ether compound and dielectric ceramic powder is 100% by volume. This range of dielectric ceramic powder content leads to a higher dielectric constant and ensures effective mixing and dispersion of the dielectric ceramic powder in the polyvinylbenzyl ether compound. In contrast, if the content of dielectric ceramic powder becomes larger, mixing and dispersion may become difficult and physical properties of the cured product may deteriorate considerably. If the content of dielectric ceramic powder is less, the dielectric constant increases little, failing to achieve the advantage of dielectric properties.

The coupling agents used herein include silane coupling agents, titanate coupling agents, and aluminum coupling agents. The silane coupling agents are further divided into chlorosilane, alkoxysilane, organic functional and silazane coupling agents.

Those coupling agents having a pyrolysis initiation temperature of at least 220° C. are preferred. For use in electronic parts and circuit boards, passage of several (5 or 6) reflow cycles of 260° C. at the highest is often necessary for solder bonding. To meet this heat resistance requirement, a pyrolysis initiation temperature of at least 250° C. is preferred. The upper limit of pyrolysis initiation temperature is not critical although it is about 1,000° C. for commonly used compounds.

Examples of alkoxysilane coupling agents include methyldiethoxysilane, trimethylmethoxysilane, dimethylethoxysilane, trimethylethoxysilane, dimethylvinylethoxysilane, dimethyldimethoxysilane, dimethylvinylmethoxysilane, dimethyldiethoxysilane, methylvinyldimethoxysilane, methyltrimethoxysilane, methylvinyldimethoxysilane, tetramethoxysilane, diphenyldimethoxysilane, methyltriethoxysilane, phenyltrimethoxysilane, tetraethoxysilane, phenyltriethoxysilane, and methyldimethoxysilane. Examples of organic functional silane coupling agents include γ-aminopropyltriethoxysilane, N-(β-aminoethyl)-γ-aminopropyltrimethoxysilane, γ-glycidoxypropyltrimethoxysilane, γ-methacryloxypropyltrimethoxysilane, and γ-mercaptoxytrimethoxysilane.

The coupling agents may be used alone or in admixture of two or more in accordance with the desired properties.

The amount of coupling agent with which the dielectric powder is treated may be determined as appropriate in the range of 0.1 to 6% by weight. Best effects are achieved when the dielectric powder or filler is treated with such an amount of the coupling agent that a monomolecular film of coupling agent may be formed on the surface of dielectric particles. The amount of the coupling agent is determined by the following equation, for example.

Amount of coupling agent added=[(weight of dielectric powder)×(specific surface area of dielectric powder)]/(minimum coverage area of coupling agent)

Surface treatment may be carried out by any of the following four methods.
1) Dry method: While the dielectric powder is forcedly agitated in a V blender, etc., the coupling agent (which may take the form of aqueous solution) is sprayed with the aid of dry air or nitrogen gas.
2) Wet method: The dielectric powder is dispersed in water or solvent to form a slurry, to which the coupling agent (which may take the form of aqueous solution) is added. After thorough agitation, the dispersion is held for some time whereupon the precipitated dielectric powder is separated and dried.
3) Spray method: The coupling agent (which may take the form of aqueous solution) is sprayed over the dielectric powder immediately after exiting from the furnace and remaining hot.
4) Integral blend method: Before or after the dielectric powder is added to the polyvinylbenzyl ether compound, with stirring, the coupling agent is added to the blend directly, that is, without dilution.

As a result of surface treatment with the coupling agent, dielectric particles are covered with a coating of the coupling agent. The partial presence of uncovered dielectric particles is acceptable.

The electronic part according to the ninth embodiment of the invention preferably includes at least one first composite dielectric layer in which a dielectric powder having a dielectric constant of 20 to 10,000 and a dissipation factor of 0.01 to 0.0001 is dispersed in a polyvinylbenzyl ether compound such that the first composite dielectric layer as a whole may have a dielectric constant of 5 to 20 and a dissipation factor of 0.0025 to 0.0075. This construction provides an adequate dielectric constant and a high Q, and hence, a reduced transmission loss, and is especially suitable in forming electronic circuits such as balun (balanced-and-unbalanced) transformers, antennas and power amplifiers.

In another preferred embodiment, the electronic part includes at least one second composite dielectric layer in which a dielectric powder having a dielectric constant of 20 to 10,000 and a dielectric dissipation factor of 0.01 to 0.0001 is dispersed in the polyvinylbenzyl ether compound in an amount of 40 to 65% by volume such that the second composite dielectric layer as a whole may have a dielectric constant of 10 to 40 and a dielectric dissipation factor of 0.0075 to 0.025. This embodiment provides an adequate Q value and a high dielectric constant, and is suitable in forming such electronic circuits as capacitors, patch antennas, voltage controlled oscillators (VCO) and power amplifiers.

In a further preferred embodiment, the electronic part includes at least one composite magnetic layer in which a magnetic powder is dispersed in the polyvinylbenzyl ether compound in an amount of 25 to 65% by volume such that the composite magnetic layer as a whole may have a magnetic permeability of 3 to 20. This embodiment provides a low dielectric constant while keeping an adequate magnetic permeability, allowing the part to be used in the high-frequency region of at least 100 MHz, and especially 100 MHz to 10 GHz. These features, combined with the content of magnetic powder which can be increased, enable use as electronic parts utilizing magnetic characteristics and magnetic shields for electronic parts.

It is only required that at least one layer selected from the above-describes three types of constituent layers be included. Any of these layers are properly combined in accordance with the construction and function of the intended electronic part.

The ceramic powder used herein, especially the ceramic powder in the first composite dielectric layer should have a high Q and a relatively high dielectric constant. It preferably has a dielectric constant of 20 to 10,000 and a dissipation factor of 0.01 to 0.0001 at 2 GHz, and further a Q of 250 to 50,000. This selection enables to obtain a composite dielectric material having a high Q and dielectric constant.

The ceramic powder used herein may have a greater dielectric constant and Q in a high-frequency band than the resin serving as the dispersing medium. It is acceptable to use a mixture of two or more ceramic powders. The ceramic powder is contained in such amounts that the first composite dielectric layer as a whole may have a dielectric constant of 5 to 20 and a dissipation factor of 0.0025 to 0.0075.

The ceramic powder used herein may be selected from those described in connection with the first embodiment. The preferred range, particle size and other parameters are also the same.

In the first composite dielectric layer containing a resin resulting from a polyvinylbenzyl ether compound and the ceramic powder as main components, the content of ceramic powder is from 10% by volume to less than 70% by volume provided that the total of the resin and ceramic powder is 100% by volume. Preferably, the content of ceramic powder is 20 to 60% by volume. A ceramic powder content of 70 vol % or more fails to form a consolidated body. Such a greater ceramic powder content can also result in a substantial lowering of Q as compared with the composition having no ceramic powder added. At a content of less than 10 vol %, the ceramic powder fails to exert its effect.

By properly selecting the respective components within the above range, the first composite dielectric layer can have a greater dielectric constant than that of the resin (resulting from a polyvinylbenzyl ether compound) alone, that is, have a dielectric constant as desired and a high Q.

The ceramic powder used herein, especially the ceramic powder in the second composite dielectric layer should have a very high dielectric constant. The ceramic powder should preferably have a dielectric constant of 20 to 10,000 and a dielectric dissipation factor of 0.01 to 0.0001 and further a Q of 250 to 50,000. By dispersing such ceramic powder in the resin (resulting from a polyvinylbenzyl ether compound), a composite dielectric material having a higher dielectric constant is obtainable.

Any desired ceramic powder may be used in the second composite dielectric layer as long as the second composite dielectric layer in its entirety has a dielectric constant of 10 to 40 and a dielectric dissipation factor of 0.0075 to 0.025 in the high-frequency region, especially at 2 GHz. It is acceptable to use two or more ceramic powders. The ceramic powder used herein may be selected from those described in connection with the second embodiment. The preferred range, particle size and other parameters are also the same.

In the second composite dielectric layer containing a resin resulting from a polyvinylbenzyl ether compound and the ceramic powder as main components, the content of ceramic powder is from 40% by volume to less than 65% by volume, preferably 40 to 60% by volume, provided that the total of the resin and ceramic powder is 100% by volume.

The magnetic powder in the composite dielectric layer may be selected from the ferrite and ferromagnetic metals described in connection with the fourth embodiment. The preferred particle size and other parameters are also the same.

The magnetic powder and the polyvinylbenzyl ether compound are mixed in such amounts that the composite magnetic layer as a whole may have a magnetic permeability of 3 to 20. It is preferred that at the stage of a paste to be applied to glass cloth, the content of magnetic powder be 25 to 65% by volume, more preferably 50 to 90% by weight based on the resin and magnetic powder combined. A magnetic powder content within this range ensures that the composite magnetic layer as a whole has a magnetic permeability of 3 to 20, enhancing the benefits of the invention. Too large a magnetic powder content may make it difficult to form a slurry for coating and hence, to form a substrate or prepreg. Too small a magnetic powder content may fail to provide the desired magnetic permeability, detracting from magnetic characteristics.

The flame retardant used herein may be selected from a variety of flame retardants which are conventionally used in rendering substrates flame-proof. Exemplary flame retardants include halides such as halogenated phosphates and brominated epoxy resins, organic compounds such as phosphate amides, and inorganic substances such as antimony trioxide and aluminum hydride. Of these, halogenated phosphates and phosphate amides are preferred, with the halogenated phosphates being especially preferred.

The polyvinylbenzyl ether compound and flame retardant are preferably mixed such that where the flame retardant is a halogenated phosphate, the weight ratio of polyvinylbenzyl ether compound to flame retardant may range from 100:100 to 100:900 at the stage of a paste to be applied to glass cloth. That is, the preferred content of halogenated phosphate is 40 to 60% by weight. A flame retardant content within this range ensures the benefits of the invention. At too large a flame retardant content, the properties, especially electrical properties of the resin may be exerted to a less extent. Too small a flame retardant content may fail to provide flame retardance or to satisfy the UL-94 V-0 rating of the UL standard.

The reinforcing fibers used herein, typically in the form of glass cloth, may be selected from a variety of known reinforcements depending on a particular purpose and application. Commercially available reinforcements may be used without further treatment. Exemplary reinforcing fibers are E glass cloth ($\in=7$, tan $\delta=0.003$ at 1 GHz), D glass cloth ($\in=4$, tan $\delta=0.0013$ at 1 GHz) and H glass cloth ($\in=11$, tan $\delta=0.003$ at 1 GHz), from which a choice may be made depending on the desired electrical characteristics. Reinforcing fibers may be subject to coupling treatment in order to enhance interlayer adhesion. The glass cloth preferably has a thickness of up to 100 $\mu$m, more preferably 20 to 60 $\mu$m, and a weight of up to 120 g/m$^2$, especially 20 to 70 g/m$^2$.

Preferably the polyvinylbenzyl ether compound and glass cloth are mixed in a weight ratio of from 4/1 to 1/1. A mixing ratio within this range ensures to exert the desired effect. With a lower ratio or a smaller content of the resin, the resulting composite material may lose adhesion to copper foil and form a less flat substrate. Inversely, with a higher ratio or a larger content of the resin, the choice of glass cloth which can be used may become difficult and it may become difficult to ensure the strength of a thin-wall substrate.

The metal foil used herein may be selected from metals having good electrical conductivity such as gold, silver, copper and aluminum. Of these, copper is especially preferred.

The metal foil may be formed by well-known methods such as electrolysis and rolling. Electrolytic foil is preferably used where it is desired to provide a foil peel strength. Rolled foil which is least affected by the skin effect due to surface irregularities is preferably used where high-frequency characteristics are important.

The metal foil preferably has a gage of about 8 to 70 $\mu$m, especially about 12 to 35 $\mu$m.

The composite dielectric material is preferably prepared by the following method. First, predetermined amounts of the ceramic powder and the polyvinylbenzyl ether compound are mixed. Mixing may be dry mixing although it is desirable to fully mix the ingredients in an organic solvent such as toluene or xylene using a ball mill or agitator.

The resulting slurry is dried at 90 to 120° C., obtaining a mass of the ceramic powder/polyvinylbenzyl ether compound mixture. The mass is ground into a powder of the ceramic powder/polyvinylbenzyl ether compound mixture. For obtaining a powder from the slurry, a method using a granulator such as a spray dryer may be used. The mixture powder may have a mean particle size of about 50 to 1,000 $\mu$m.

The mixture powder is press molded into a desired shape at about 100 to 150° C. The molded body is then cured at about 100 to 200° C. for about 30 to 180 minutes. Step curing is employed if necessary. Additives including the curing agent may be incorporated upon curing.

Electrodes can be formed in various ways, for example, by sandwiching the powder between metal foils such as copper foils, followed by press curing. In another method, a metal foil such as copper foil are placed on one or both surfaces of a lamination pressed powder prior to complete cure, followed by press curing. In a further method, a metal foil is attached to the powder by pressing for partial curing, followed by a separate heat treatment to proceed curing. Alternatively, the powder is lamination pressed and cured, following which electrodes are formed by evaporating, sputtering or electroless plating a metal or by applying a conductive resin paste.

In preparing the composite dielectric material, it is preferred to mix the ceramic powder with the polyvinylbenzyl ether compound before polymerization or curing although the ceramic powder can be mixed after polymerization or curing. However, mixing of the ceramic powder after complete curing is undesired.

Prepreg sheets are prepared by mixing the ceramic powder, magnetic powder and optional flame retardant with the polyvinylbenzyl ether compound in a predetermined blend ratio, and milling the ingredients in a solvent into a slurry, followed by coating and drying to B stage. The solvent used herein for adjusting the viscosity of the paste for ease of coating is preferably a volatile solvent, especially a polar neutral solvent. Milling may be effected by well-known techniques such as ball milling and agitation. A prepreg sheet can be fabricated by coating the paste onto a metal foil or impregnating glass cloth with the paste.

Drying of the prepreg sheet to B stage may be appropriately adjusted depending on the contents of ceramic powder, magnetic powder, and optional flame retardant. Typical drying conditions include 100 to 120° C. and 0.5 to 3 hours. After drying, the B stage prepreg sheet preferably has a thickness of about 50 to 300 $\mu$m and can be adjusted to an optimum thickness depending on the intended application and required characteristics (including pattern width, precision and dc resistance).

Figure 94A:
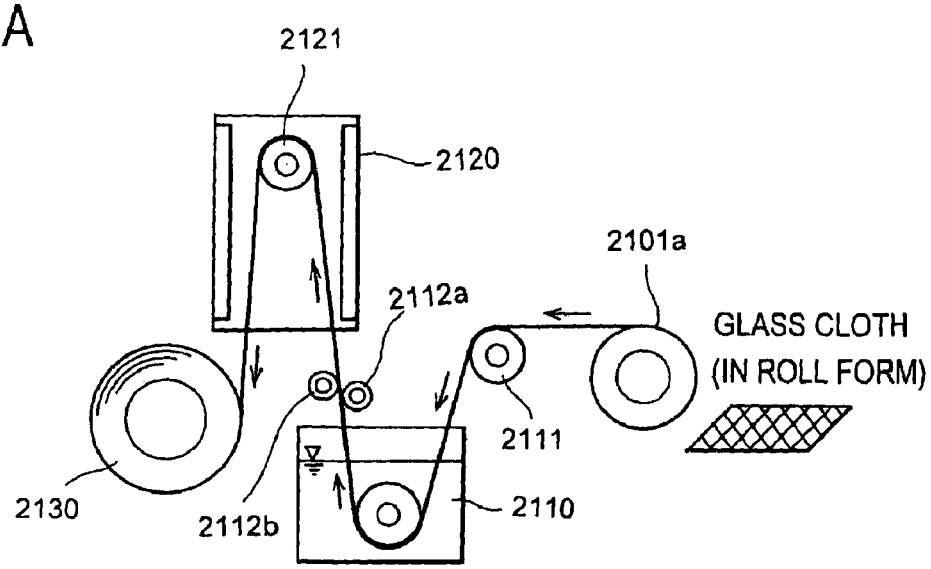
FIGS. 94A to 94D illustrate steps of a process for forming a copper foil-clad substrate.

The prepreg sheet can be fabricated by the method shown in FIGS. 94A to 94D or FIGS. 95A to 95D. The method of FIGS. 94A to 94D is rather suitable for mass manufacture whereas the method of FIGS. 95A to 95D is easy to control the film thickness and relatively easy to adjust the characteristics. In the method of FIGS. 94A to 94D, as shown in FIG. 94A, a glass cloth 2101a wound in roll form is unraveled from the roll 2101a and carried into a coating tank 2110 via a guide roller 2111. The coating tank 2110 contains a slurry having the polyvinylbenzyl ether compound, ceramic powder, magnetic powder and optional flame retardant dispersed in a solvent. As the glass cloth passes through the coating tank 2110, it is immersed in the slurry so that it is coated with the slurry while interstices are filled therewith.

Past the coating tank 2110, the glass cloth is carried into a drying furnace 2120 via guide rollers 2112a and 2112b. In the drying furnace 2120, the resin-impregnated glass cloth is dried at a predetermined temperature for a predetermined time whereby it is B-staged. After turning around a guide roller 2121, the glass cloth is wound on a take-up roll 2130.

Figure 94B:
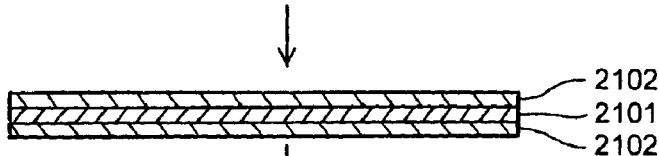

The glass cloth is then cut into sections of a predetermined size. As shown in FIG. 94B, there is obtained a prepreg sheet having the glass cloth 2101 sandwiched between the layers 2102 of the resin containing the ceramic powder, magnetic powder and optional flame retardant.

Figure 94C:
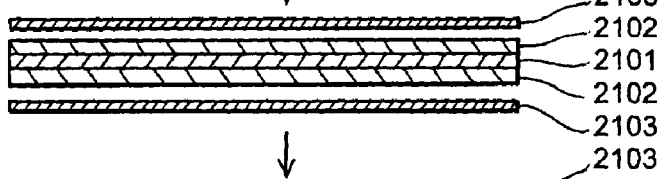
Figure 94D:
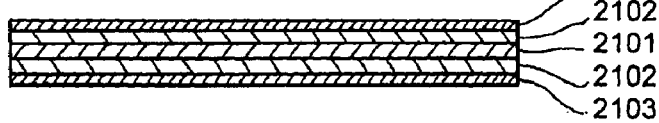

Then as shown in FIG. 94C, metal foils 2103 such as copper foils are placed on opposite surface of the prepreg sheet. Laminating press yields a double side metal foil-clad substrate as shown in FIG. 94D. The laminating press conditions include a temperature of 100 to 200° C. and a pressure of $9.8 \times 10^5$ to $7.84 \times 10^6$ Pa (10 to 80 kgf/cm$^2$). Molding is done for about 0.5 to 20 hours under such conditions. Laminating press may be effected in plural stages under different conditions. Where the metal foils are not attached, the sandwich structure of prepreg sheet may be lamination pressed without placing metal foils thereon.

Figure 95A:
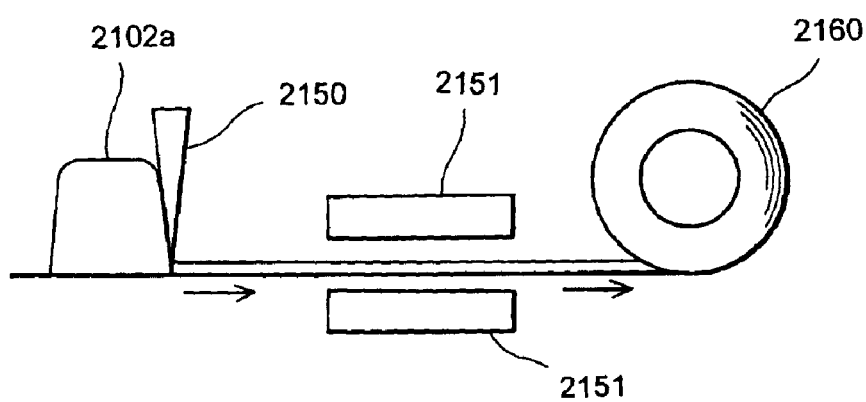
FIGS. 95A to 95D illustrate steps of another process for forming a copper foil-clad substrate.

Next, the method of FIGS. 95A to 95D is described. As shown in FIG. 95A, a slurry 2102a having the polyvinylbenzyl ether compound, ceramic powder, magnetic powder and optional flame retardant dispersed in a solvent is coated onto a metal foil such as a copper foil by means of a doctor blade 2150 which can maintain a constant clearance.

Figure 95B:
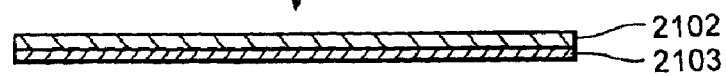

The coated foil is then cut into sections of a predetermined size. As shown in FIG. 95B, there is obtained a prepreg sheet in which the layer 2102 of the resin containing the ceramic powder, magnetic powder and optional flame retardant is disposed on one surface of the metal foil 2103.

Figure 95C:
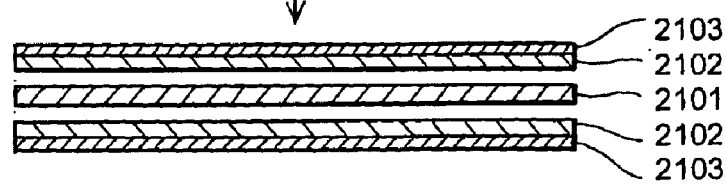
Figure 95D:
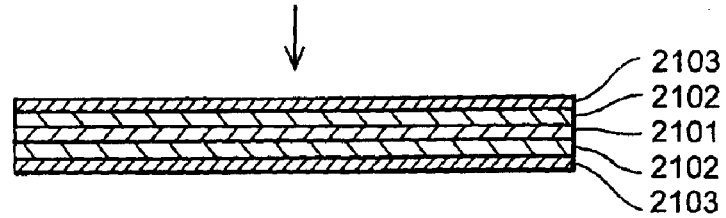

As shown in FIG. 95C, two such prepreg sheets (2102, 2103) are placed on opposite surfaces of a glass cloth 2101 such that the resin layers 2102 face inside. Laminating press yields a double side metal foil-clad substrate as shown in FIG. 95D. The laminating press conditions may be the same as above.

Besides the above-mentioned coating methods, the substrate or prepreg by which the electronic part is constructed may be prepared by another method, for example, by milling the ingredients and molding the solid mixture. This method using the solid mixture is easy to provide a thickness and suitable for forming relatively thick substrates or prepregs.

Milling must be effected above the melting point of the polyvinylbenzyl ether compound. Note that most polyvinylbenzyl ether compounds have a melting point of about 50 to 150° C. Milling may be effected by well-known techniques using ball mills, agitators and kneaders. A solvent may be used during the milling, if necessary. The mixture may be pelletized or powdered, if necessary.

The pelletized or powdered mixture is molded in a laminating press. The laminating press conditions include a temperature of 100 to 200° C., a time of 0.5 to 3 hours, and a pressure of $4.9 \times 10^5$ to $7.84 \times 10^6$ Pa (5 to 80 kgf/cm$^2$).

The prepreg sheet thus obtained generally has a thickness of about 0.05 to 5 mm. The thickness of the prepreg sheet may be determined as appropriate depending on the desired plate thickness and the contents of dielectric powder and magnetic powder.

As in the preceding methods, metal foils such as copper foils are placed on opposite surfaces of the resulting prepreg sheet, followed by laminating press. This yields a double side metal foil-clad substrate. The laminating press conditions include a temperature of 100 to 200° C. and a pressure of $9.8 \times 10^5$ to $7.84 \times 10^6$ Pa (10 to 80 kgf/cm$^2$). Laminating press is done for about 0.5 to 20 hours under such conditions. Laminating press may be effected in plural stages under different conditions. Where the metal foils are not attached, the prepreg sheet may be lamination pressed without placing metal foils thereon.

The thus obtained substrate or organic composite material serving as a laminating press material is improved in magnetic permeability and high-frequency characteristics of dielectric constant. It also has improved insulating properties to serve as an insulator. When it is processed into a copper foil-clad substrate, the bond strength of the substrate to the foil is high. It also has improved heat resistance as typified by solder heat resistance.

A copper foil-clad substrate can be formed by placing copper foils over the prepreg, followed by laminating press. The copper foils used herein typically have a thickness of about 12 to 35 μm. Such copper foil-clad substrates include double side patterned substrates and multilayer substrates.

Figure 96:
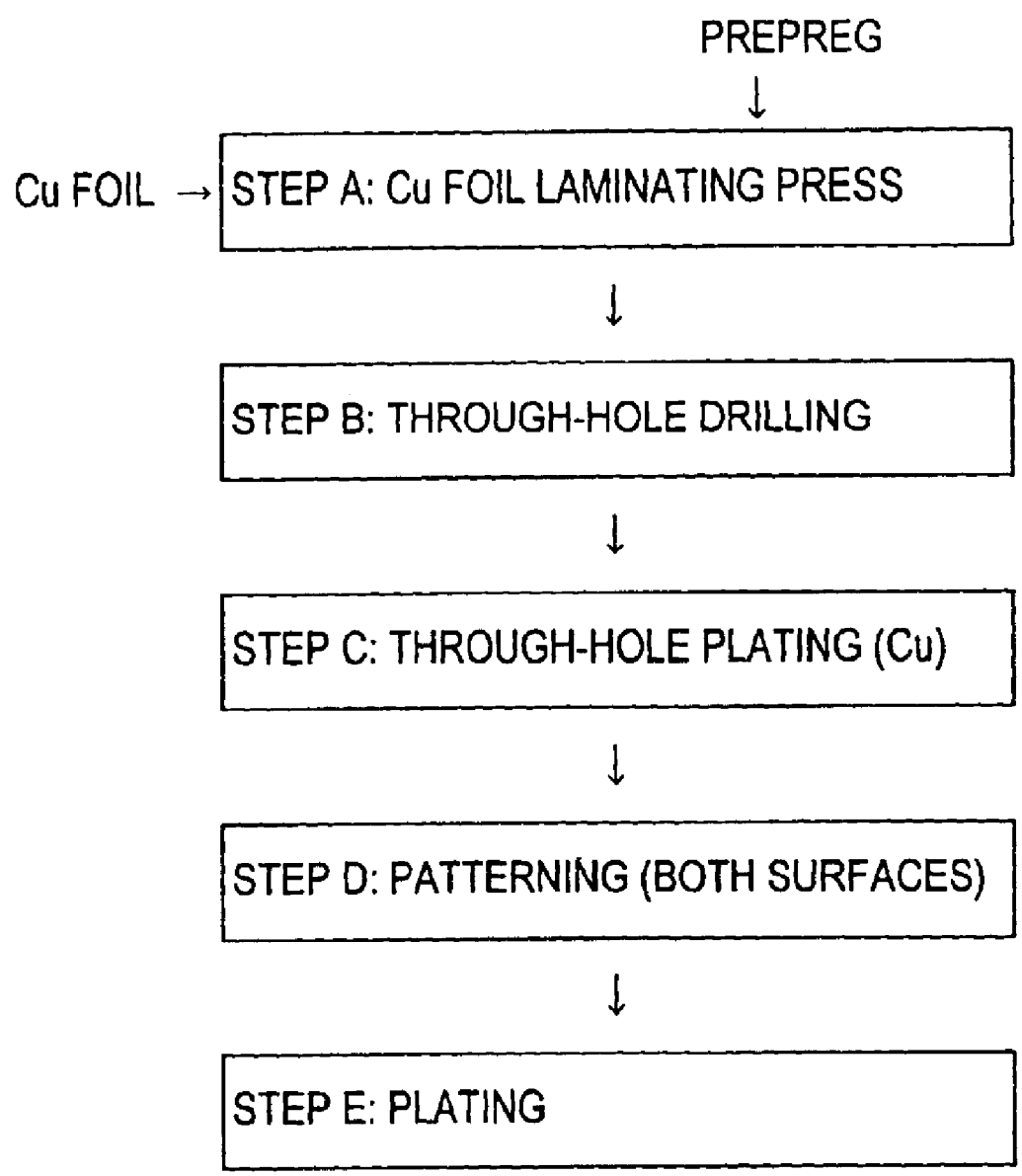
FIGS. 96 and 97 illustrate steps of a process for forming a copper foil-clad substrate.
Figure 97:
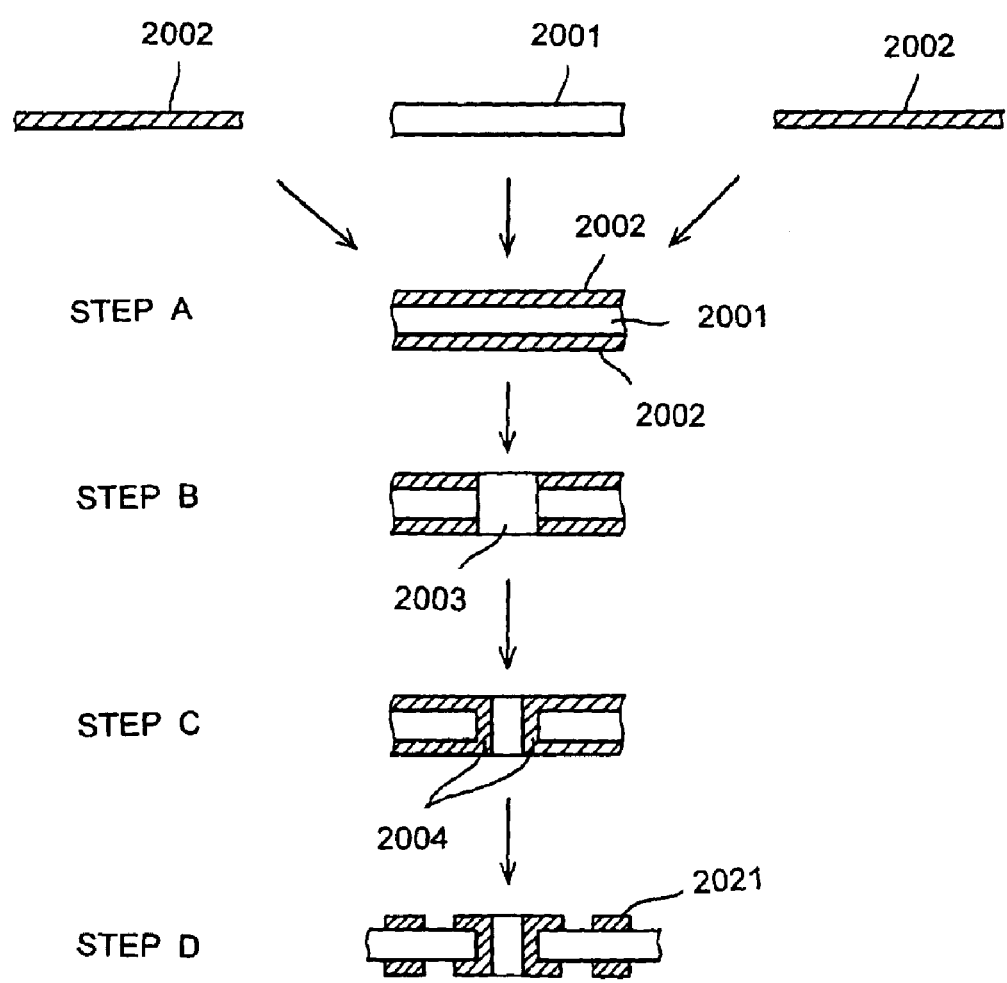

FIGS. 96 and 97 illustrate steps of an exemplary process of preparing a double side patterned substrate. As shown in FIGS. 96 and 97, in step A, a prepreg sheet 2001 of a predetermined thickness is sandwiched between a pair of copper (Cu) foils 2002 of a predetermined thickness and lamination press. In step B, through holes are drilled in the structure (only one through hole 2003 shown in FIG. 96). In step C, copper (Cu) is plated to the through hole 2003 to form a plating film 2004. Then in step D, both the copper foils 2002 are patterned to form conductor patterns 2021. Thereafter, in step E, plating is effected for connection to external terminals as shown in FIG. 96. The last-mentioned plating may be Ni plating followed by Pd plating, or Ni plating followed by Au plating (plating may be either electrolytic or electroless plating), or carried out using a solder leveler.

Figure 98:
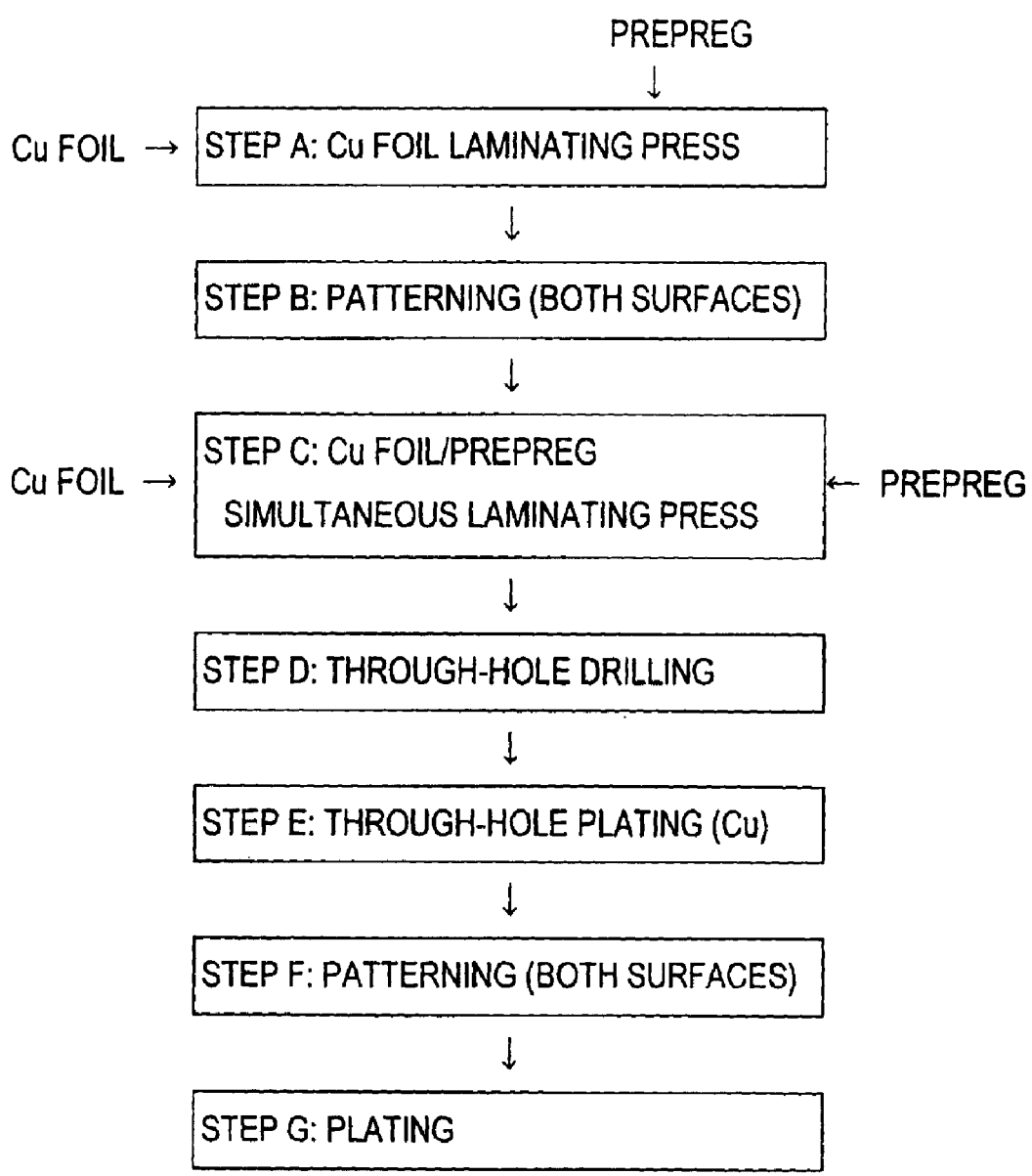

FIGS. 98 and 99 illustrate steps of an exemplary process of preparing a multilayer substrate in which four layers are stacked. As shown in FIGS. 98 and 99, in step A, a prepreg sheet 2001 of a predetermined thickness is sandwiched between a pair of copper (Cu) foils 2002 of a predetermined thickness and lamination press. Then in step B, both the copper foils 2002 are patterned to form conductor patterns 2021. In step C, on each of opposite surfaces of the double side patterned substrate thus obtained, a prepreg sheet 2001 of a predetermined thickness and a copper foil 2002 are placed, followed by simultaneous lamination press. In step D, through holes are drilled in the structure (only one through hole 2003 shown in FIG. 98). In step E, copper (Cu) is plated to the through hole 2003 to form a plating film 2004. Then in step F, both the outside copper foils 2002 are patterned to form conductor patterns 2021. Thereafter, in step G, plating is effected for connection to external terminals as shown in FIG. 98. The last-mentioned plating may be Ni plating followed by Pd plating, or Ni plating followed by Au plating (plating may be either electrolytic or electroless plating), or carried out using a solder leveler.

The laminating press conditions include a temperature of 100 to 200° C., a pressure of $9.8 \times 10^5$ to $7.84 \times 10^6$ Pa (10 to 80 kgf/cm$^2$), and a time of 0.5 to 20 hours.

The invention is not limited to the above-illustrated substrates, and a substrate of any desired structure can be formed. For example, using a substrate serving as a laminating press material, a copper foil-clad substrate and a prepreg, a multilayer structure can be formed while the prepreg serves as a bonding layer.

In the embodiment wherein a prepreg or a substrate serving as a laminating press material is bonded to a copper foil, a paste of composite dielectric material or composite magnetic material obtained by milling the ceramic powder, magnetic powder, optional flame retardant and polyvinylbenzyl ether compound in a high-boiling solvent such as butylcarbitol acetate may be applied onto a patterned substrate by a screen printing or similar technique. This procedure is effective for improving characteristics.

Multilayer electronic parts to be described later can be fabricated by combining the prepreg, copper foil-clad substrate and multilayer substrate with a device design pattern and other constituent materials.

The electronic parts of the invention find use as capacitors, coils (or inductors), filters, etc. Alternatively, by combining these elements with each other or with wiring patterns, amplifier devices or functional devices, the electronic parts can form antennas, and high-frequency electronic parts such as superposed modules for use in high-frequency electronic circuits such as RF modules (RF amplification stages), voltage controlled oscillators (VCO), and power amplifiers, as well as optical pickups.

EXAMPLE

Examples of the invention are given below by way of illustration and not by way of limitation.

Example 1-1

First, a ceramic powder and a polyvinylbenzyl ether compound were mixed in accordance with a formulation as shown in Tables 3 and 4, thoroughly milled in toluene and dried at 90 to 120° C. for about 2 hours. This was ground into a powder of the ceramic powder and polyvinylbenzyl ether compound mixture, having a mean particle size of 50 to 1,000 μm. The powder was placed in a mold of 6.5 cm×5 cm and cured at 120 to 200° C. for 2 hours, obtaining the end composition.

The ceramic powders used were $MgTiO_3$ (mean particle size 5 μm), $Ba_2(Ti,Sn)_9O_{20}$ base (mean particle size 10 μm), $Bi_2O_3$—$BaO$—$Nd_2O_3$—$TiO_2$ base (mean particle size 5 μm), $CaTiO_3$ (mean particle size 0.5 μm), and $SrTiO_3$ (mean particle size 0.5 μm) powders.

The polyvinylbenzyl ether compound (VB) used was of the formula (1) wherein $R^1$ is methyl, $R^2$ is benzyl, $R^3$ is a mixture of hydrogen and vinylbenzyl in a molar ratio of 0:100, and n=3.

From each of the compositions, a rod sample of about 1.0 mm square by about 6.5 mm long was formed and measured for dielectric constant at 2 GHz by the cavity resonator perturbation method using a test system 83620A/8757C by Hewlett Packard. The Q of the sample was also determined.

The denseness was evaluated by observing whether or not a few water droplets penetrated into a molded sample within about 1 minute after application. The sample into which water droplets did not readily penetrate was regarded to be consolidated.

The results are shown in Tables 3 and 4.

TABLE 3

| Sample No. | Ceramic powder | Ceramic powder content (vol %) | VB content (vol %) | Dielectric constant | Q | Denseness |
| --- | --- | --- | --- | --- | --- | --- |
| 1.(comparison) | — | — | 100 | 2.5 | 250 | consolidated |
| 2. | $MgTiO_3$ | 10 | 90 | 3.3 | 268 | consolidated |
| 3. | $MgTiO_3$ | 20 | 80 | 4.0 | 289 | consolidated |
| 4. | $MgTiO_3$ | 30 | 70 | 5.0 | 313 | consolidated |
| 5. | $MgTiO_3$ | 40 | 60 | 6.0 | 345 | consolidated |
| 6. | $MgTiO_3$ | 50 | 50 | 7.2 | 385 | consolidated |
| 7. | $MgTiO_3$ | 60 | 40 | 8.7 | 420 | consolidated |
| 8. | $MgTiO_3$ | 65 | 35 | 9.1 | 431 | consolidated |
| 9.(comparison) | $MgTiO_3$ | 70 | 30 | 8.5 | 367 | not consolidated |
| 10. | $Ba_2(Ti,Sn)_9O_{20}$ base | 10 | 90 | 4.0 | 264 | consolidated |
| 11. | $Ba_2(Ti,Sn)_9O_{20}$ base | 20 | 80 | 4.7 | 279 | consolidated |
| 12. | $Ba_2(Ti,Sn)_9O_{20}$ base | 30 | 70 | 6.3 | 304 | consolidated |
| 13. | $Ba_2(Ti,Sn)_9O_{20}$ base | 35 | 65 | 7.3 | 319 | consolidated |
| 14. | $Ba_2(Ti,Sn)_9O_{20}$ base | 40 | 60 | 8.2 | 329 | consolidated |
| 15. | $Ba_2(Ti,Sn)_9O_{20}$ base | 45 | 55 | 9.3 | 344 | consolidated |
| 16. | $Ba_2(Ti,Sn)_9O_{20}$ base | 50 | 50 | 9.8 | 380 | consolidated |
| 17. | $Ba_2(Ti,Sn)_9O_{20}$ base | 60 | 40 | 13.0 | 401 | consolidated |
| 18. | $Ba_2(Ti,Sn)_9O_{20}$ base | 65 | 35 | 15.0 | 426 | consolidated |
| 19.(comparison) | $Ba_2(Ti,Sn)_9O_{20}$ base | 70 | 30 | 14.6 | 320 | not consolidated |
| 20. | $Bi_2O_3$-$BaO$-$Nd_2O_3$-$TiO_2$ base | 10 | 90 | 3.5 | 263 | consolidated |
| 21. | $Bi_2O_3$-$BaO$-$Nd_2O_3$-$TiO_2$ base | 20 | 80 | 6.0 | 287 | consolidated |
| 22. | $Bi_2O_3$-$BaO$-$Nd_2O_3$-$TiO_2$ base | 25 | 75 | 7.1 | 295 | consolidated |
| 23. | $Bi_2O_3$-$BaO$-$Nd_2O_3$-$TiO_2$ base | 30 | 70 | 8.5 | 302 | consolidated |
| 24. | $Bi_2O_3$-$BaO$-$Nd_2O_3$-$TiO_2$ base | 35 | 65 | 9.9 | 313 | consolidated |
| 25. | $Bi_2O_3$-$BaO$-$Nd_2O_3$-$TiO_2$ base | 40 | 60 | 11.4 | 332 | consolidated |

TABLE 4

| Sample No. | Ceramic powder | Ceramic powder content (vol %) | VB content (vol %) | Dielectric constant | Q | Denseness |
|---|---|---|---|---|---|---|
| 26. | $Bi_2O_3$-BaO-$Nd_2O_3$-$TiO_2$ base | 50 | 50 | 14.9 | 381 | consolidated |
| 27. | $Bi_2O_3$-BaO-$Nd_2O_3$-$TiO_2$ base | 60 | 40 | 19.6 | 408 | consolidated |
| 28. | $Bi_2O_3$-BaO-$Nd_2O_3$-$TiO_2$ base | 65 | 35 | 17.7 | 334 | consolidated |
| 29.(comparison) | $Bi_2O_3$-BaO-$Nd_2O_3$-$TiO_2$ base | 70 | 30 | 16.9 | 263 | not consolidated |
| 30. | $CaTiO_3$ | 10 | 90 | 4.1 | 253 | consolidated |
| 31. | $CaTiO_3$ | 20 | 80 | 6.3 | 260 | consolidated |
| 32. | $CaTiO_3$ | 30 | 70 | 9.1 | 269 | consolidated |
| 33. | $CaTiO_3$ | 40 | 60 | 13.7 | 278 | consolidated |
| 34. | $CaTiO_3$ | 50 | 50 | 19.2 | 279 | consolidated |
| 35. | $CaTiO_3$ | 60 | 40 | 28.7 | 261 | consolidated |
| 36. | $CaTiO_3$ | 65 | 35 | 25.8 | 251 | consolidated |
| 37.(comparison) | $CaTiO_3$ | 70 | 30 | 24.4 | 198 | not consolidated |
| 38. | $SrTiO_3$ | 10 | 90 | 4.1 | 255 | consolidated |
| 39. | $SrTiO_3$ | 20 | 80 | 6.5 | 256 | consolidated |
| 40. | $SrTiO_3$ | 30 | 70 | 9.4 | 260 | consolidated |
| 41. | $SrTiO_3$ | 40 | 60 | 14.1 | 263 | consolidated |
| 42. | $SrTiO_3$ | 50 | 50 | 19.5 | 265 | consolidated |
| 43. | $SrTiO_3$ | 60 | 40 | 31.9 | 268 | consolidated |
| 44. | $SrTiO_3$ | 65 | 35 | 36.0 | 254 | consolidated |
| 45.(comparison) | $SrTiO_3$ | 70 | 30 | 31.7 | 188 | not consolidated |

Example 1-2

Compositions were prepared as in Example 1-1 by mixing the ceramic powder and the polyvinylbenzyl ether compound both used in Example 1-1 in the following combination.

$Ba_2(Ti,Sn)_9O_{20}$ base ceramic powder (60 vol %)+polyvinylbenzyl ether compound (40 volt) (the same as sample No. 17 in Example 1-1)

$Bi_2O_3$—BaO—$Nd_2O_3$—$TiO_2$ base ceramic powder (60 vol %)+polyvinylbenzyl ether compound (40 vol %) (the same as sample No. 27 in Example 1-1)

$SrTiO_3$ ceramic powder (60 vol %)+polyvinylbenzyl ether compound (40 vol %) (the same as sample No. 43 in Example 1-1)

Figure 2:
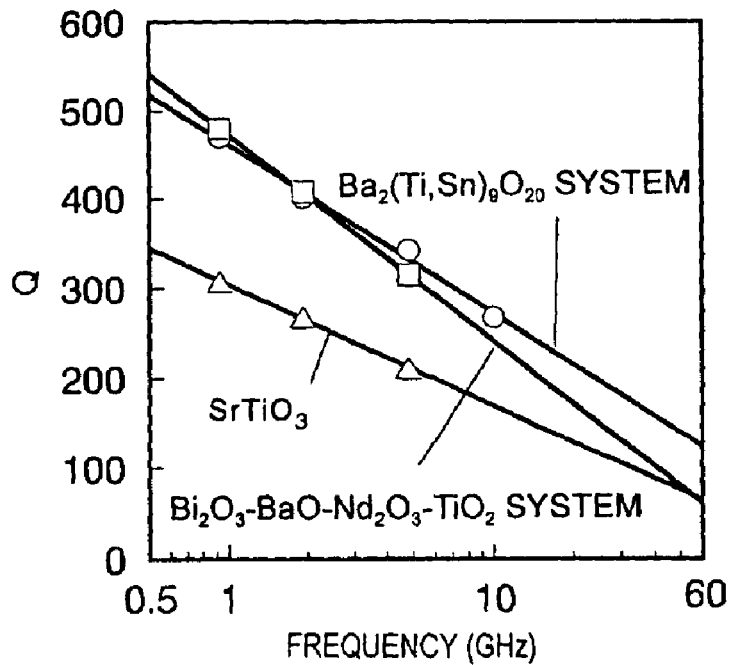
FIG. 2 is graph showing the Q versus frequency of the composite dielectric material according to the first embodiment.

These samples were measured for dielectric constant at a frequency of 0.01 to 10 GHz, with the results being plotted in the graph of FIG. 1. The Q of the samples at a frequency of 1 to 10 GHz is shown in FIG. 2. These measurements were the same as in Example 1-1. A dielectric constant at a frequency of less than 100 MHz (0.1 GHz) was measured using an impedance/material analyzer 4291A by Hewlett Packard. The sample for measurement at a frequency of less than 100 MHz was prepared by press molding the mixture powder at 100 to 150° C. into a plate, attaching copper foils of 18 μm thick to opposite surfaces of the plate, pressing at 100 to 200° C. for curing, and cutting into a section of 5 mm square.

It is seen from FIGS. 1 and 2 that the compositions shows a relatively high dielectric constant and a relatively high Q even in the high-frequency band of higher than 1 GHz. It is also seen that a specific composition can be selected for a particular set of characteristics.

Example 2-1

First, a ceramic powder and a polyvinylbenzyl ether compound were mixed in accordance with a formulation as shown in Table 5, thoroughly milled in toluene and dried at 90 to 120° C. for about 2 hours. This was ground into a powder of the ceramic powder and polyvinylbenzyl ether compound mixture, having a mean particle size of 50 to 1,000 μm. The mixture powder was placed in a mold of 6.5 cm×5 cm and cured at 120 to 200° C. for 2 hours, obtaining the end composition.

The ceramic powders used were $BaTiO_3$ (mean particle size 0.5 μm) and $Ba(Ti,Zr)O_3$ base (mean particle size 5 μm) powders.

The polyvinylbenzyl ether compound (VB) used was of the formula (1) wherein $R^1$ is methyl, $R^2$ is benzyl, $R^3$ is a mixture of hydrogen and vinylbenzyl in a molar ratio of 0:100, and n=3.

From each of the compositions, a rod sample of about 1.0 mm square by about 6.5 mm long was formed and measured for dielectric constant at 2 GHz by the cavity resonator perturbation method using a test system 83620A/8757C by Hewlett Packard.

The denseness was evaluated by observing whether or not a few water droplets penetrated into a molded sample within about 1 minute after application. The sample into which water droplets did not readily penetrate was regarded to be consolidated.

The results are shown in Table 5.

TABLE 5

| Sample No. | Ceramic powder | Ceramic powder content (vol %) | VB content (vol %) | Dielectric constant | Denseness |
|---|---|---|---|---|---|
| 201(comparison) | — | — | 100 | 2.5 | consolidated |
| 202 | BaTiO$_3$ | 30 | 70 | 10.4 | consolidated |
| 203 | BaTiO$_3$ | 40 | 60 | 15.0 | consolidated |
| 204 | BaTiO$_3$ | 45 | 55 | 16.6 | consolidated |
| 205 | BaTiO$_3$ | 50 | 50 | 20.5 | consolidated |
| 206 | BaTiO$_3$ | 60 | 40 | 35.1 | consolidated |
| 207 | BaTiO$_3$ | 65 | 35 | 47.0 | consolidated |
| 208(comparison) | BaTiO$_3$ | 70 | 30 | Unmeasurable | not consolidated |
| 209 | Ba(Ti,Zr)O$_3$ base | 30 | 70 | 11.2 | consolidated |
| 210 | Ba(Ti,Zr)O$_3$ base | 40 | 60 | 16.0 | consolidated |
| 211 | Ba(Ti,Zr)O$_3$ base | 45 | 55 | 19.0 | consolidated |
| 212 | Ba(Ti,Zr)O$_3$ base | 50 | 50 | 22.5 | consolidated |
| 213 | Ba(Ti,Zr)O$_3$ base | 60 | 40 | 39.2 | consolidated |
| 214 | Ba(Ti,Zr)O$_3$ base | 65 | 35 | 48.7 | consolidated |
| 215(comparison) | Ba(Ti,Zr)O$_3$ base | 70 | 30 | 42.2 | not consolidated |

Example 2-2

Compositions were prepared as in Example 2-1 by mixing the ceramic powder and the polyvinylbenzyl ether compound both used in Example 2-1 in the following combination.

Ba(Ti,Zr)O$_3$ base ceramic powder (60 vol %)+polyvinylbenzyl ether compound (40 vol %) (the same as sample No. 213 in Example 2-1)

BaTiO$_3$ ceramic powder (60 vol %)+polyvinylbenzyl ether compound (40 vol %) (the same as sample No. 206 in Example 2-1)

Figure 3:
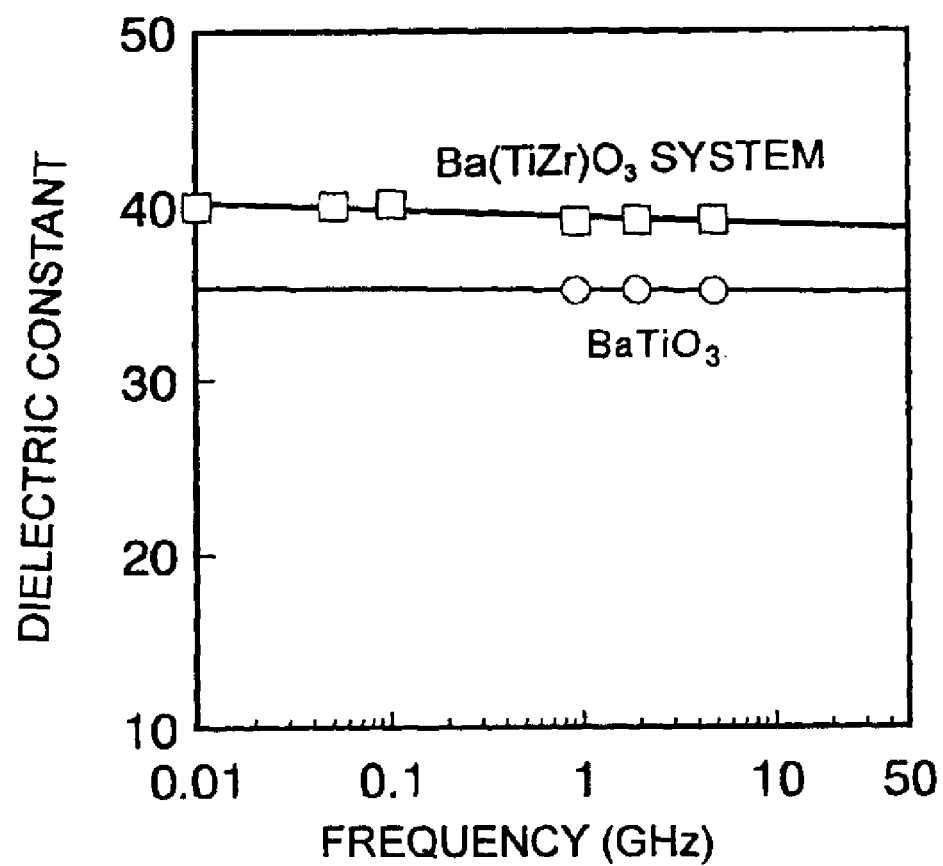
FIG. 3 is graph showing the dielectric constant versus frequency of a composite dielectric material according to a second embodiment of the invention.
Figure 4:
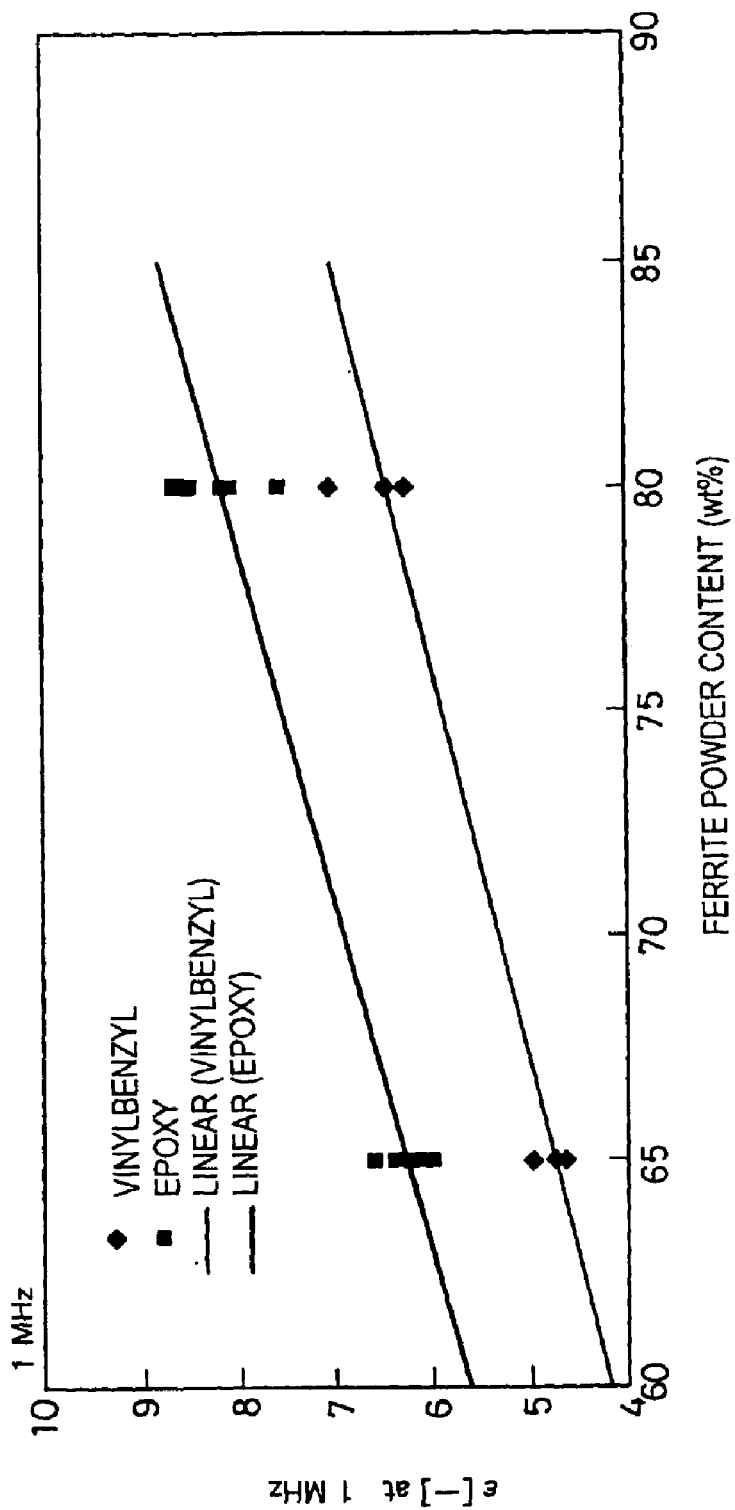
FIG. 4 is graph showing the dielectric constant at 1 MHz versus ferrite content of substrates (ferrite powder-containing molding materials) according to a fourth embodiment of the invention and a comparative example.
Figure 5:
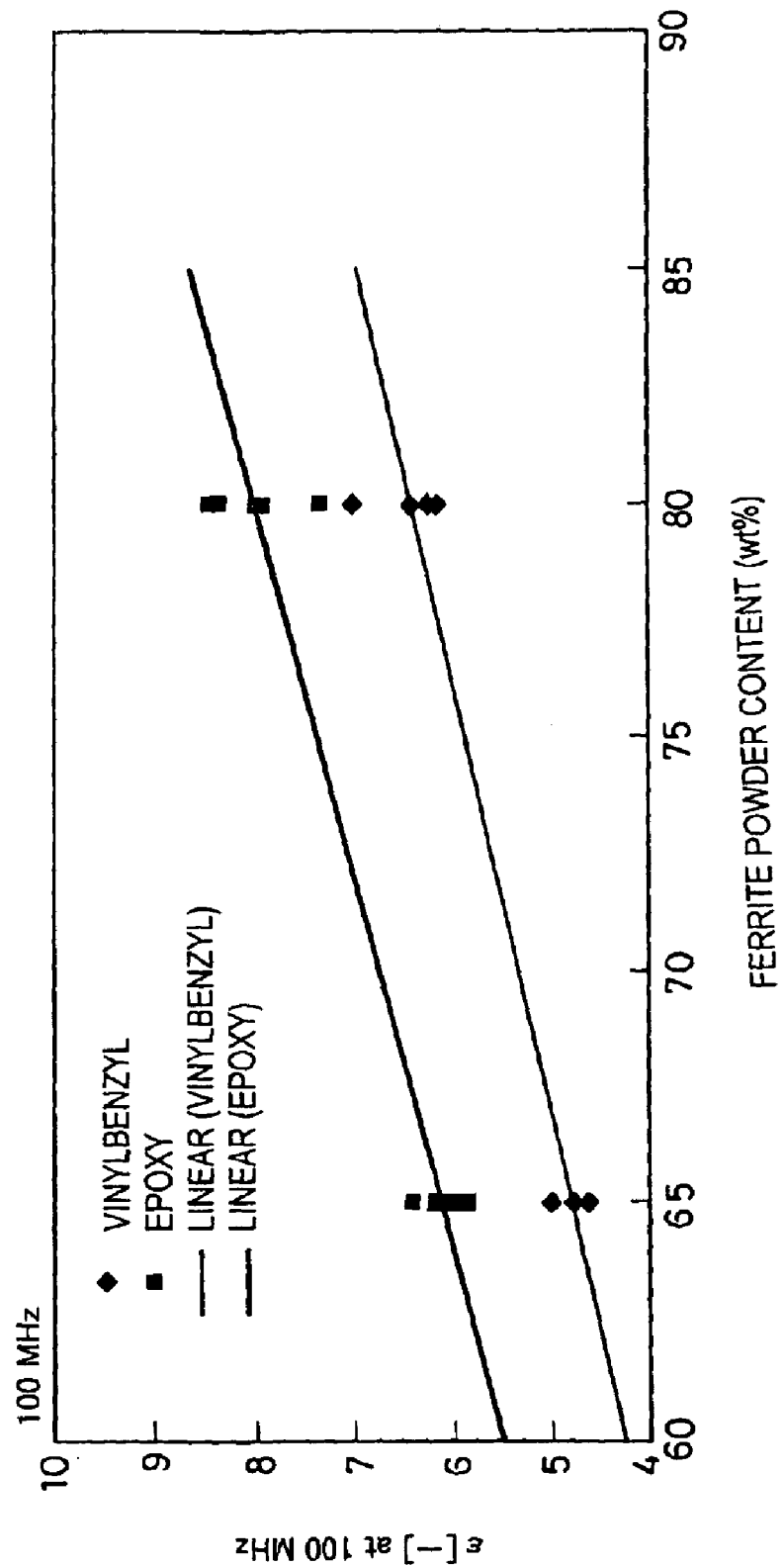
FIG. 5 is graph showing the dielectric constant at 100 MHz versus ferrite content of substrates (ferrite powder-containing molding materials) according to the fourth embodiment and the comparative example.
Figure 6:
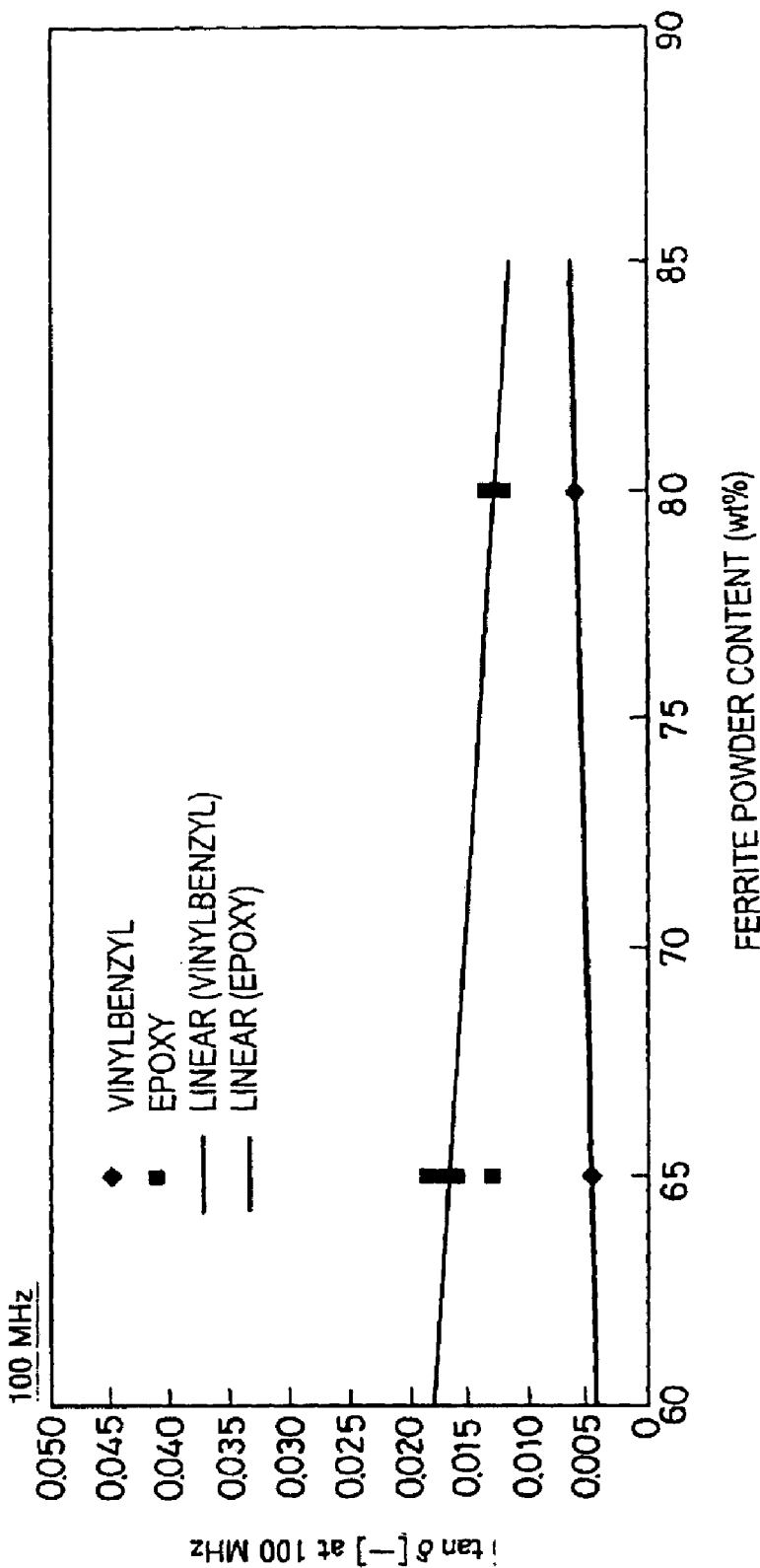
FIG. 6 is graph showing the dielectric dissipation factor at 100 MHz versus ferrite content of substrates (ferrite powder-containing molding materials) according to the fourth embodiment and the comparative example.
Figure 7:
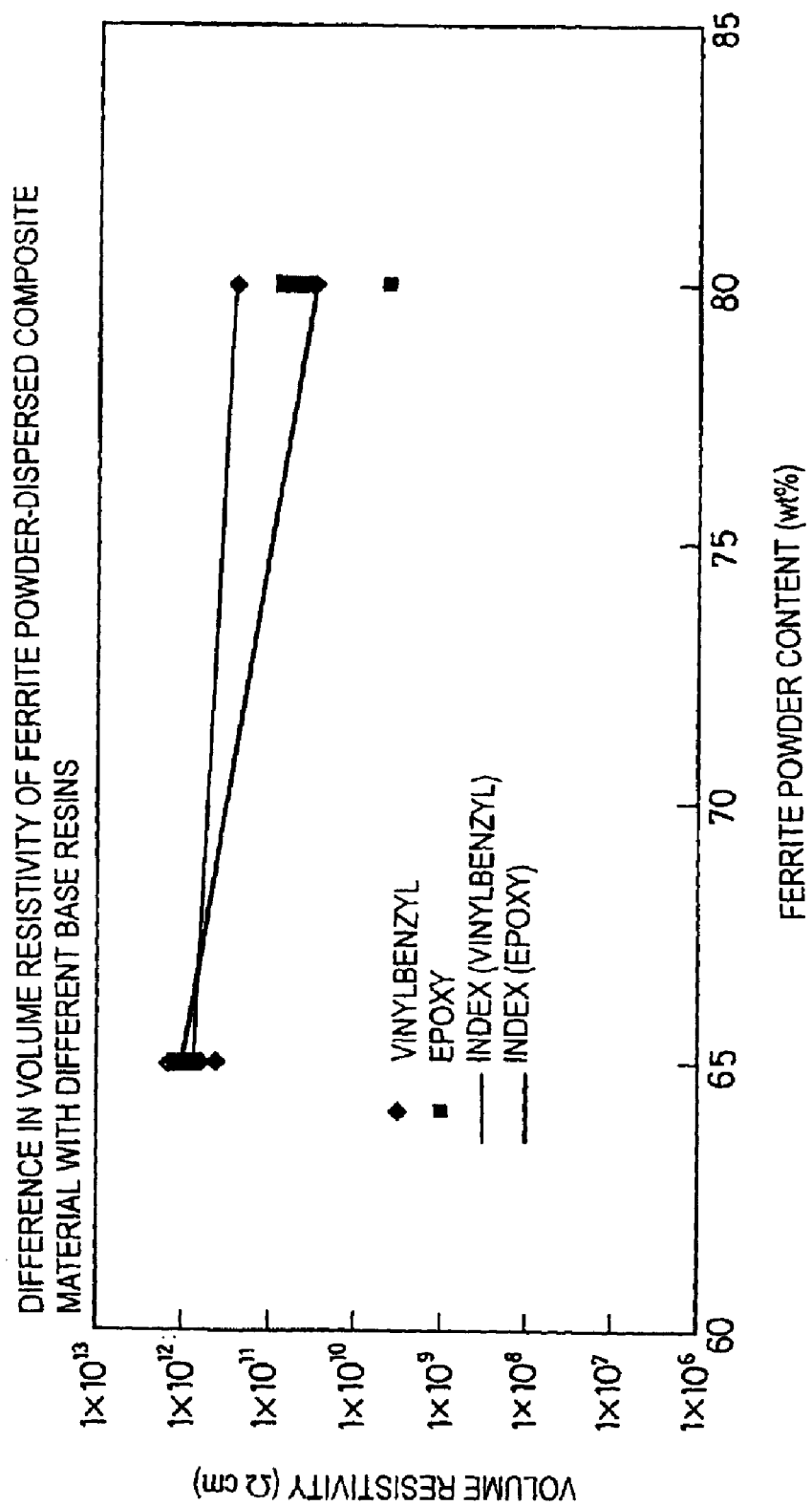
FIG. 7 is graph showing the volume resistivity versus ferrite content of substrates (ferrite powder-containing molding materials) according to the fourth embodiment and the comparative example.
Figure 8:
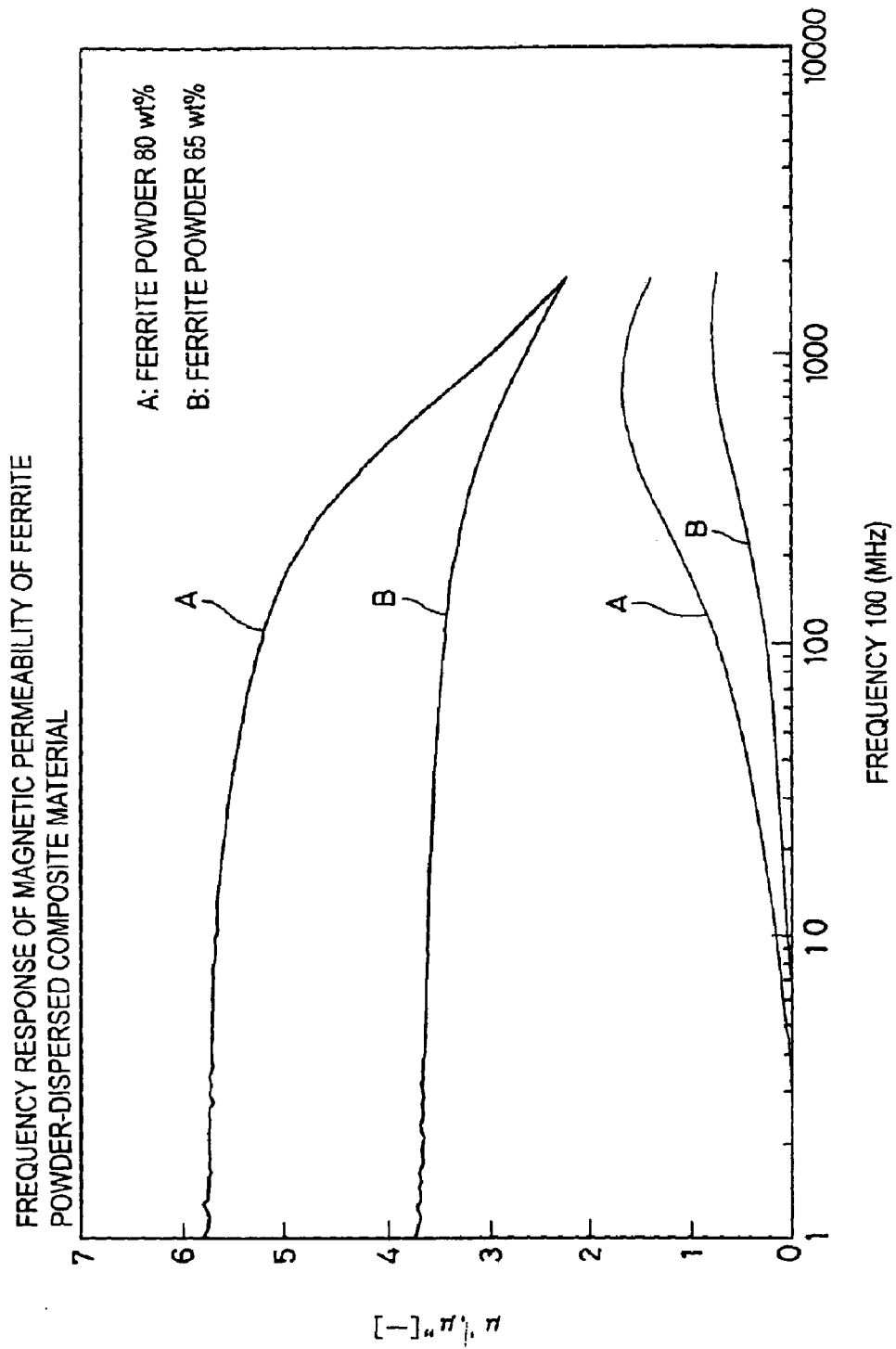
FIG. 8 is graph showing the magnetic permeability versus ferrite content of substrates (ferrite powder-containing molding materials) according to the fourth embodiment and the comparative example.

These samples were measured for dielectric constant at a frequency of 0.01 to 10 GHz, with the results being plotted in the graph of FIG. 3. The measurement was the same as in Example 2-1. A dielectric constant at a frequency of less than 100 MHz (0.1 GHz) was measured using an impedance/material analyzer 4291A by Hewlett Packard. The sample for measurement at a frequency of less than 100 MHz was prepared by press molding the mixture powder at 100 to 150° C. into a plate, attaching copper foils of 18 µm thick to opposite surfaces of the plate, pressing at 100 to 200° C. for curing, and cutting into a section of 5 mm square.

It is seen from FIG. 3 that the compositions show a relatively high dielectric constant even in the high-frequency band of higher than 1 GHz. It is also seen that a specific composition can be selected for a particular set of characteristics.

Example 3-1

A polyvinylbenzyl ether compound was dissolved in toluene so as to form a 55 wt % solution. A dielectric ceramic powder was added to the solution, which was milled for 24 hours in a ball mill. The polyvinylbenzyl ether compound (VB) used was of the formula (1) wherein R$^1$ is methyl, R$^2$ is benzyl, R$^3$ is a mixture of hydrogen and vinylbenzyl in a molar ratio of 0:100, and n=3. The dielectric ceramic powder used was BaO—TiO$_2$—Nd$_2$O$_3$ base ceramic having a dielectric constant $\in$ of 95 and a mean particle size of 5 µm. The content of the ceramic powder was 50, 55, 60, 65 and 70% by volume provided that the total of ceramic powder and VB was 100% by volume. The slurry was applied to a glass cloth of 50 µm thick (by Asahi Schwebel K.K.) by means of a suitable coater, and dried at 110° C. for 2 hours, obtaining a prepreg. After drying, the prepreg was 150 µm thick. A substrate was formed by stacking twelve prepreg sheets and press molding the stack. The press molding under a pressure of 2.0×10$^6$ Pa included three consecutive stages of 150° C. for 30 minutes, 180° C. for 30 minutes, and 200° C. for 30 minutes. The resulting substrate was 1.6 mm thick. Sample Nos. 301 to 305 were obtained in this way.

For comparison purposes, a phenol novolac type epoxy resin and a dielectric ceramic powder were dissolved in methyl ethyl ketone (MEK), which was milled for 24 hours in a ball mill to form a slurry. The dielectric ceramic powder used was BaO—TiO$_2$—Nd$_2$O$_3$ base ceramic having a dielectric constant $\in$ of 95 and a mean particle size of 5 µm. The content of the ceramic powder was 50% by volume of the mixture. The slurry was applied to a glass cloth of 50 µm thick (by Asahi Schwebel K.K.) by means of a suitable coater, and dried at 120° C. for 20 minutes, obtaining a prepreg. A substrate was formed by stacking twelve prepreg sheets and press molding the stack. The press molding under a pressure of 2.9×10$^6$ Pa included two consecutive stages of 110° C. for 30 minutes and 180° C. for 60 minutes. This is designated sample No. 306.

The substrates (sample Nos. 301 to 306) were cut into specimens of 100 mm×2 mm×1.6 mm thick. They were measured for dielectric constant and dissipation factor at 1 GHz by the perturbation method, from which Q was computed. The dielectric constant and Q are shown in Table 6.

TABLE 6

| Sample No. | Resin | Dielectric | Dielectric content (vol %) | Dielectric constant | Q | Remarks |
|---|---|---|---|---|---|---|
| 301 | VB | BaO-TiO$_2$-Nd$_2$O$_3$ | 50 | 11.7 | 365 | |
| 302 | VB | BaO-TiO$_2$-Nd$_2$O$_3$ | 55 | 13.92 | 395 | |
| 303 | VB | BaO-TiO$_2$-Nd$_2$O$_3$ | 60 | 14.7 | 457 | |

TABLE 6-continued

| Sample No. | Resin | Dielectric | Dielectric content (vol %) | Dielectric constant | Q | Remarks |
|---|---|---|---|---|---|---|
| 304 | VB | BaO-TiO$_2$-Nd$_2$O$_3$ | 65 | 15 | 446 | |
| 305(comparison) | VB | BaO-TiO$_2$-Nd$_2$O$_3$ | 70 | 14.3 | 351 | rejected because of separation between prepreg sheets |
| 306(comparison) | epoxy | BaO-TiO$_2$-Nd$_2$O$_3$ | 50 | 15.7 | 61 | |

For the application where a high dielectric constant and high Q are required, the samples within the invention are inferior in dielectric constant to the epoxy resin sample, but superior in Q due to the low dissipation factor of the base resin. The maintenance of a high Q at 1 GHz indicates the possible use in the high-frequency region.

Example 3-2

The polyvinylbenzyl ether compound (VB) used in Example 3-1 was dissolved in toluene so as to form a 55 wt % solution. A dielectric ceramic powder was added to the solution, which was milled for 24 hours in a ball mill. The dielectric ceramic powder used was BaTiO$_3$—BaZrO$_3$ base ceramic having a dielectric constant ∈ of 9,000 and a mean particle size of 1 μm. The content of the ceramic powder was 40, 50, 60, 65 and 70% by volume provided that the total of ceramic powder and VB was 100% by volume. The slurry was dried at 90° C. for 15 hours, obtaining a mass of the mixture. It was ground in a mortar, obtaining a powder of the mixture. An amount of the mixture powder was placed in a mold and press molded at 110° C. and 2.9×10$^6$ Pa for 2 hours into a plate of 1.6 mm thick. The plate was further molded at 180° C. and 2.9×10$^6$ Pa for 2 hours, obtaining a substrate. Sample Nos. 307 to 311 were obtained in this way.

For comparison purposes, a phenol novolac type epoxy resin and the BaTiO$_3$—BaZrO$_3$ base dielectric ceramic powder (dielectric constant ∈ 9,000 and mean particle size 1 μm) were dissolved in MEK, which was milled for 24 hours in a ball mill to form a slurry. The content of the ceramic powder was 50% by volume of the mixture. The slurry was dried at 50° C. for 10 hours, obtaining a mass of the mixture. It was ground in a mortar, obtaining a powder of the mixture. An amount of the mixture powder was placed in a mold and press molded at 120° C. and 2.9×10$^6$ Pa for 20 minutes into a plate of 1.6 mm thick. The plate was further cured under a pressure of 2.9×10$^6$ Pa in two steps of 110° C. for 30 minutes and 180° C. for 30 minutes, obtaining a substrate. This is designated sample No. 312.

The substrates (sample Nos. 307 to 312) were cut into specimens of 100 mm×2 mm×1.6 mm thick. They were measured for dielectric constant and dissipation factor at 1 GHz by the perturbation method, from which Q was computed. The dielectric constant and Q are shown in Table 7.

TABLE 7

| Sample No. | Resin | Dielectric | Dielectric content (vol %) | Dielectric constant | Q | Remarks |
|---|---|---|---|---|---|---|
| 307 | VB | BaTiO$_3$—BaZrO$_3$ | 40 | 16.5 | 135 | |
| 308 | VB | BaTiO$_3$—BaZrO$_3$ | 50 | 22.7 | 105 | |
| 309 | VB | BaTiO$_3$—BaZrO$_3$ | 60 | 40 | 69 | |
| 310 | VB | BaTiO$_3$—BaZrO$_3$ | 65 | 31.9 | 45 | |
| 311(comparison) | VB | BaTiO$_3$—BaZrO$_3$ | 70 | 30.5 | 30 | molded item is not consolidated |
| 312(comparison) | epoxy | BaTiO$_3$—BaZrO$_3$ | 50 | 20.5 | 62 | |

The samples within the invention are approximately equal in dielectric constant to the epoxy resin sample, but superior in Q due to the low dissipation factor of the base resin. The inventive samples are thus suited in the application where a relatively high dielectric constant and a not so high Q are required in the high-frequency region. When the samples having the same ceramic powder content are compared, the inventive sample has a higher Q than the epoxy resin sample.

Example 3-3

The polyvinylbenzyl ether compound (VB) used in Example 3-1 was dissolved in toluene so as to form a 55 wt % solution. A dielectric ceramic powder was added to the solution, which was milled for 24 hours in a ball mill. The dielectric ceramic powder used was BaO-4TiO$_2$ base ceramic having a dielectric constant ∈ of 45 and a mean particle size of 1 μm. The content of the ceramic powder was 10, 30, and 50% by volume provided that the total of ceramic powder and VB was 100% by volume. The slurry was dried at 90° C. for 15 hours, obtaining a mass of the mixture. It was ground in a mortar, obtaining a powder of the mixture. An amount of the mixture powder was placed in a mold and press molded at 110° C. and 2.9×10$^6$ Pa for 2 hours. into a plate of 1.6 mm thick. The plate was further molded at 180° C. and 2.9×10$^6$ Pa for 2 hours, obtaining a substrate. Sample Nos. 313 to 315 were obtained in this way.

For comparison purposes, a phenol novolac type epoxy resin and the BaO-4TiO$_2$ base dielectric ceramic powder (dielectric constant ∈ 45 and mean particle size 1 μm) were dissolved in MEK, which was milled for 24 hours in a ball mill to form a slurry. The content of the ceramic powder was 30% by volume of the mixture. The slurry was dried at 50° C. for 10 hours, obtaining a mass of the mixture. It was ground in a mortar, obtaining a powder of the mixture. An amount of the mixture powder was placed in a mold and press molded at 120° C. and 2.9×10$^6$ Pa for 20 minutes into a plate of 1.6 mm thick. The plate was further cured under a pressure of $2.9 \times 10^6$ Pa in two steps of 110° C. for 30 minutes and 180° C. for 30 minutes, obtaining a substrate. This is designated sample No. 316.

The substrates (sample Nos. 313 to 316) were cut into specimens of 100 mm×2 mm×1.6 mm thick. They were measured for dielectric constant and dissipation factor at 1 GHz by the perturbation method, from which Q was computed. The dielectric constant and Q are shown in Table 8.

TABLE 8

| Sample No. | Resin | Dielectric | Dielectric content (vol %) | Dielectric constant | Q |
|---|---|---|---|---|---|
| 313 | VB | BaO-4TiO$_2$ | 10 | 4 | 270 |
| 314 | VB | BaO-4TiO$_2$ | 30 | 6.5 | 309 |
| 315 | VB | BaO-4TiO$_2$ | 50 | 10.1 | 385 |
| 316 (comparison) | epoxy | BaO-4TiO$_2$ | 30 | 8.4 | 62 |

For the application where a not so high dielectric constant and a high Q are required, the samples within the invention are equal in dielectric constant to the epoxy resin sample, but superior in Q due to the low dissipation factor of the base resin. The maintenance of a high Q at 1 GHz indicates the possible use in the high-frequency region.

Example 4-1

Ferrite Composite Magnetic Material

The magnetic powder used was Mn—Mg—Zn base ferrite powder having a magnetic permeability $\mu$ of 320 and a mean particle size of 3 $\mu$m. The ferrite powder and a polyvinylbenzyl ether compound (VB) were dissolved in toluene and milled in a ball mill to form a slurry. The content of the ferrite powder was 65% and 80% by weight based on the VB.

The slurry was applied onto an electrolytic copper foil of 35 $\mu$m thick by means of a doctor blade, and dried at 110° C. for 2 hours, obtaining a prepreg. The composite magnetic material coating had a thickness of 150 $\mu$m at the end of drying.

There was furnished a glass cloth having a thickness of 38 $\mu$m and a weight of 24.8 g/m$^2$ (cloth No. 106, by Arisawa Mfg. K.K.). The prepreg sheets were placed on opposite surfaces of the glass cloth such that the metal sides were outside, and lamination pressed under a pressure of $3.43 \times 10^6$ Pa (35 kgf/cm$^2$) at 120° C. for 30 minutes, at 150° C. for 30 minutes, then at 180° C. for 30 minutes, and finally at 200° C. for 30 minutes. There was obtained a double side metal foil-clad substrate having a thickness of 0.30 mm.

The substrate was measured for a dielectric constant at 1 MHz and 100 MHz, dissipation factor at 100 MHz, volume resistivity and frequency response of magnetic permeability, with the results shown in FIGS. 4 to 8.

Comparative Example 4-1

In Example 4-1, a phenol novolac type epoxy resin was used instead of the polyvinylbenzyl ether compound (VB) and methyl ethyl ketone (MEK) was used as the solvent. The content of the ferrite powder was 65% and 80% by weight based on the epoxy resin. Otherwise by the same procedure as in Example 4-1, a slurry was prepared.

The slurry was applied onto an electrolytic copper foil of 35 $\mu$m thick by means of a doctor blade, and dried at 120° C. for 20 minutes, obtaining a prepreg. The composite magnetic material coating had a thickness of 150 $\mu$m at the end of drying.

There was furnished a glass cloth having a thickness of 38 $\mu$m and a weight of 24.8 g/m$^2$ (cloth No. 106, by Arisawa Mfg. K.K.). The prepreg sheets were placed on opposite surfaces of the glass cloth such that the metal sides were outside, and lamination pressed under a pressure of $3.92 \times 10^6$ Pa (40 kgf/cm$^2$) at 110° C. for 30 minutes, then at 180° C. for 60 minutes. There was obtained a double side metal foil-clad substrate having a thickness of 0.30 mm.

The substrate was measured for a dielectric constant at 1 MHz and 100 MHz, dissipation factor at 100 MHz, volume resistivity and frequency response of magnetic permeability, with the results shown in FIGS. 4 to 8.

It is evident from FIGS. 4 to 8 that the inventive samples show a 20 to 25% reduction of dielectric constant and a lower dissipation factor, probably because of the dielectric constant and dissipation factor of the VB as the base. The volume resistivity is at least equal to that of the epoxy resin sample. The magnetic permeability values are somewhat different because the content is expressed in % by weight. If the content is converted to % by volume, then the magnetic permeability values become very close. The frequency response of permeability curve shows the advantage of the composite magnetic material that the real part of magnetic permeability is maintained to the gigahertz band and the imaginary part of magnetic permeability has a peak in proximity to 1 GHz, which indicates the possible use in the high-frequency region as opposed to ferrite in bulk form.

Example 4-2

Ferromagnetic Metal Base Composite Magnetic Material

A slurry paste was prepared as in Example 4-1 except that flat Fe—Si—Cr base particles having a length of 50 $\mu$m and a thickness of 0.2–0.3 $\mu$m was used as the magnetic material. The content of the metal powder was 50% and 70% by weight.

The slurry was applied onto an electrolytic copper foil of 35 $\mu$m thick by means of a doctor blade, and dried at 110° C. for 2 hours, obtaining a prepreg. The composite magnetic material coating had a thickness of 150 $\mu$m at the end of drying.

There was furnished a glass cloth having a thickness of 38 $\mu$m and a weight of 24.8 g/m$^2$ (cloth No. 106, by Arisawa Mfg. K.K.),. The prepreg sheets were placed on opposite surfaces of the glass cloth such that the metal sides were outside, and lamination pressed under a pressure of $3.43 \times 10^6$ Pa (35 kgf/cm$^2$) at 120° C. for 30 minutes, at 150° C. for 30 minutes, then at 180° C. for 30 minutes, and finally at 200° C. for 30 minutes. There was obtained a double side metal foil-clad substrate having a thickness of 0.30 mm.

Figure 9:
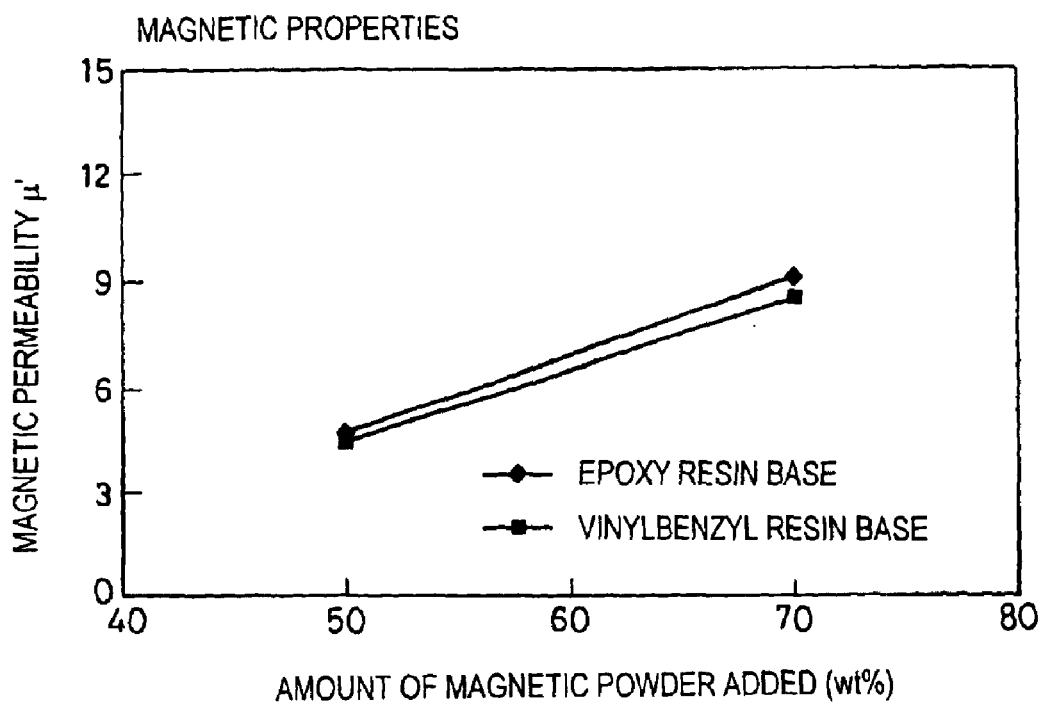
FIG. 9 is graph showing the magnetic permeability versus metal powder content of substrates (metal powder-containing molding materials) according to the fourth embodiment and the comparative example.
Figure 10:
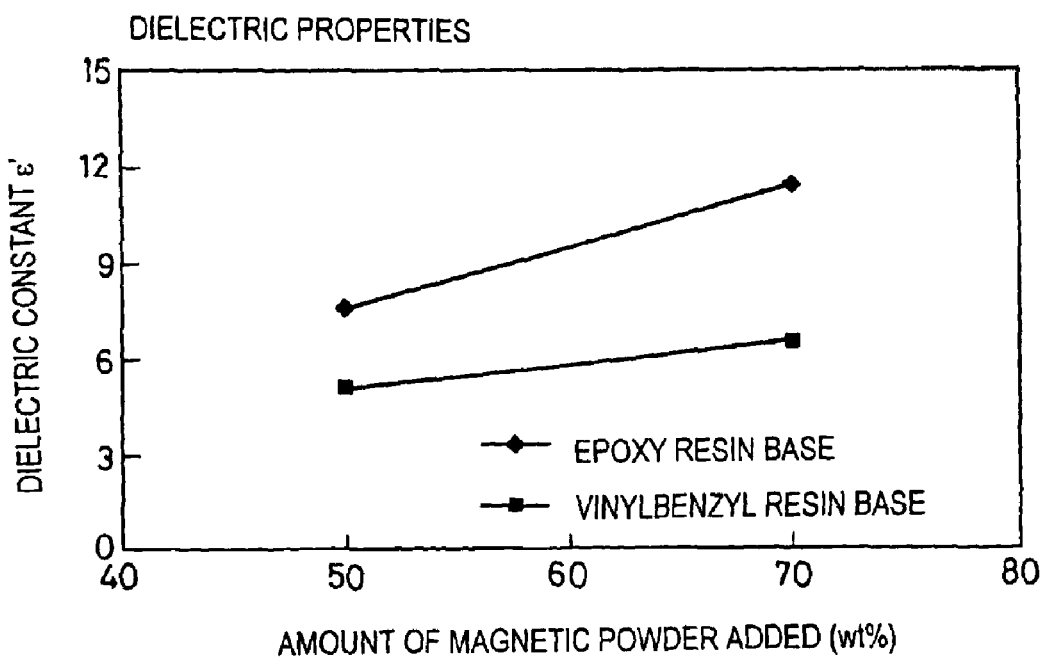
FIG. 10 is graph showing the dielectric constant versus metal powder content of substrates (metal powder-containing molding materials) according to the fourth embodiment and the comparative example.
Figure 11:
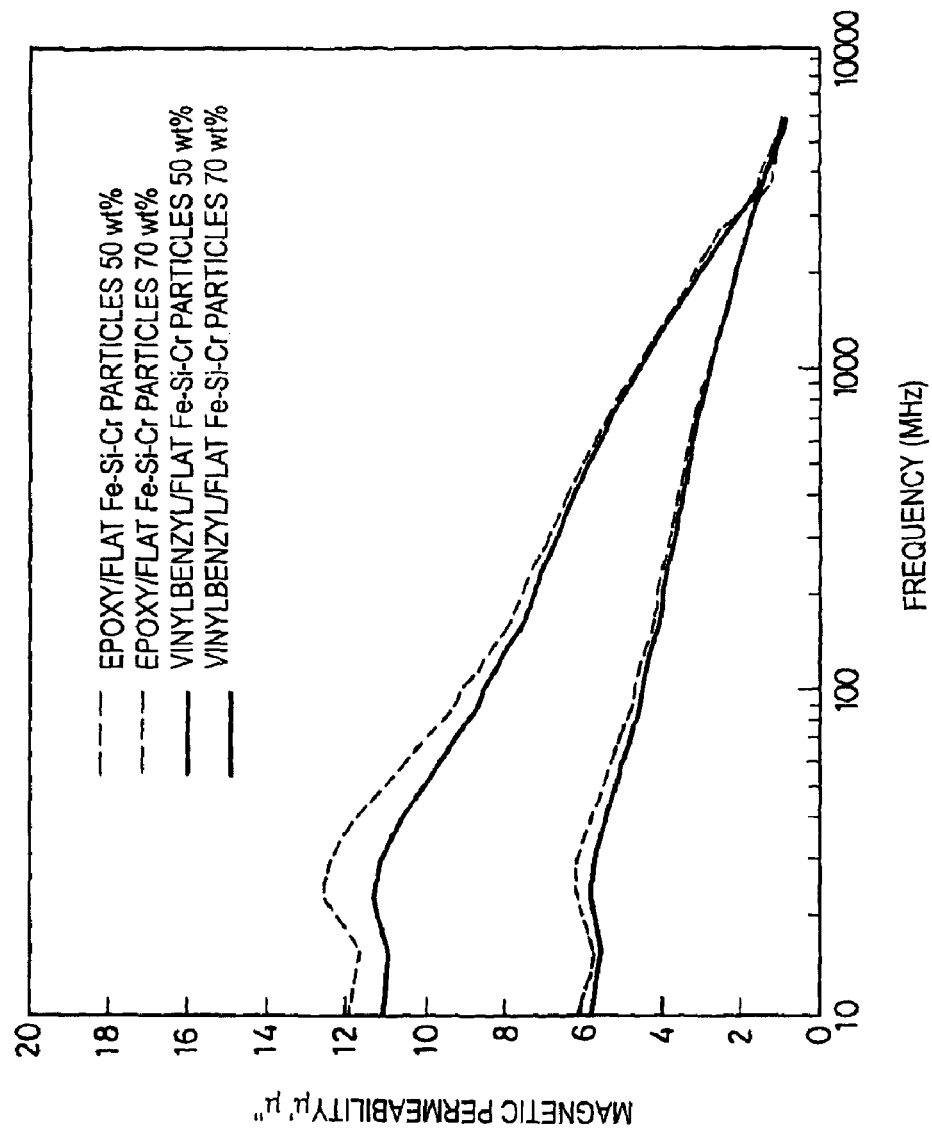
FIG. 11 is graph showing the magnetic permeability versus frequency at different metal powder contents of substrates (metal powder-containing molding materials) according to the fourth embodiment and the comparative example.

The substrate was measured for magnetic permeability, dielectric constant at 100 MHz and frequency response of magnetic permeability, with the results shown in FIGS. 9, 10 and 11.

Comparative Example 4-2

Ferromagnetic Metal Base Composite Magnetic Material

In Example 4-2, a phenol novolac type epoxy resin was used instead of the polyvinylbenzyl ether compound (VB) and methyl ethyl ketone (MEK) was used as the solvent. The content of the metal powder was 50% and 70% by weight based on the epoxy resin. Otherwise by the same procedure as in Example 4-2, a slurry was prepared.

The slurry was applied onto an electrolytic copper foil of 35 µm thick by means of a doctor blade, and dried at 120° C. for 20 minutes, obtaining a prepreg. The composite magnetic material coating had a thickness of 150 µm at the end of drying.

There was furnished a glass cloth having a thickness of 38 µm and a weight of 24.8 g/m² (cloth No. 106, by Arisawa Mfg. K.K.). The prepreg sheets were placed on opposite surfaces of the glass cloth such that the metal sides were outside, and lamination pressed under a pressure of 3.92×10⁶ Pa (40 kgf/cm²) at 110° C. for 30 minutes, then at 180° C. for 60 minutes. There was obtained a double side metal foil-clad substrate having a thickness of 0.30 mm.

The substrate was measured for magnetic permeability, dielectric constant at 100 MHz and frequency response of magnetic permeability, with the results shown in FIGS. 9, 10 and 11.

It is evident from FIGS. 9 to 11 that as compared with the ferrite powder sample in Example 4-1, the samples of Example 4-2 show a 30 to 45% reduction of dielectric constant. This is probably because the metal powder has a greater dielectric constant than ferrite and a flattened shape so that the dielectric constant manifests in a nearly series connection manner. In the composite material coating formed by means of a doctor blade or the like, metal particles are aligned in a direction, the proportion of the base resin becomes higher in the direction of alignment and its dielectric constant becomes more dominant. Therefore, at the same content, the use of metal powder gives a lower dielectric constant than the use of ferrite powder.

Example 4-3

Ferrite Composite Magnetic Material

The magnetic powder used was Mn—Mg—Zn base ferrite powder having a magnetic permeability µ of 320 and a mean particle size of 3 µm. The ferrite powder and a polyvinylbenzyl ether compound (VB) were dissolved in toluene and milled to form a slurry. The slurry was dried at 90° C. for 15 hours, obtaining a mass of the mixture. It was ground in a pulverizer, obtaining a powder mixture of the magnetic powder and VB. The content of the ferrite powder was 65% and 80% by weight based on the VB.

An amount of the mixture powder was placed in a mold and press molded at 120° C. and 2.94×10⁶ Pa (30 kgf/cm²) for 30 minutes into a prepreg sheet of 1 mm thick.

Copper foils of 18 µm thick were placed on opposite surfaces of the prepreg sheet, which was lamination pressed under a pressure of 3.43×10⁶ Pa (35 kgf/cm²) by step curing at 120° C. for 30 minutes, 150° C. for 30 minutes, then 180° C. for 30 minutes, and finally at 200° C. for 30 minutes. There was obtained a double side copper foil-clad substrate of 1.02 mm thick.

Figure 12:
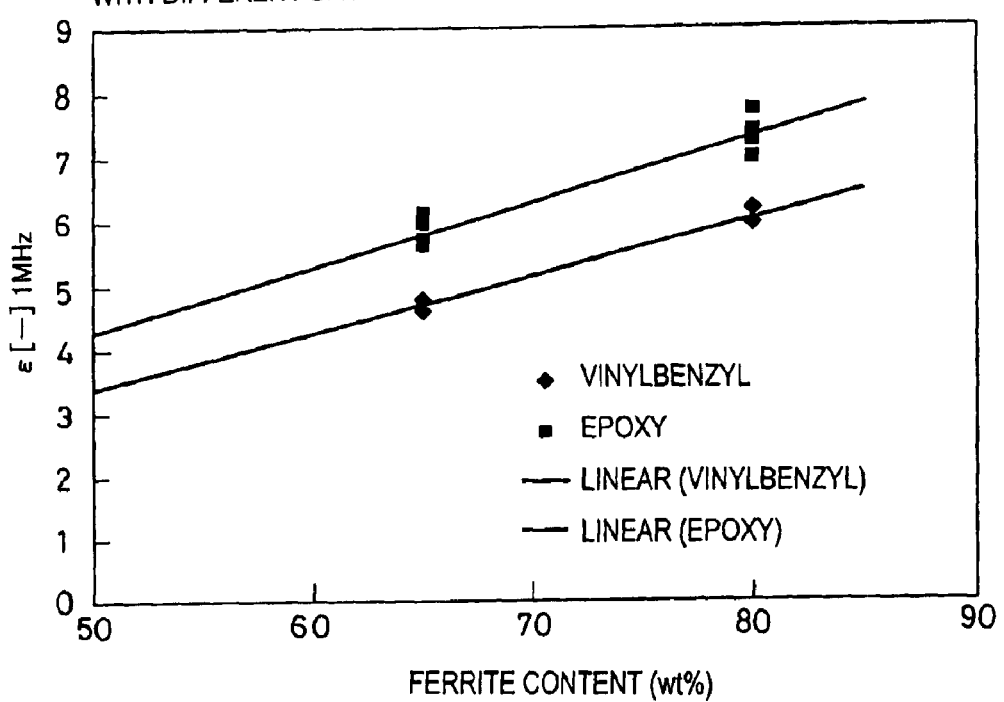
FIG. 12 is graph showing the dielectric constant versus ferrite content of substrates (double side metal foil-clad substrates) according to the fourth embodiment and the comparative example.

The samples thus obtained were measured for dielectric constant at 1 MHz, with the results shown in FIG. 12.

Comparative Example 4-3

In Example 4-3, a phenol novolac type epoxy resin was used instead of the polyvinylbenzyl ether compound (VB) and methyl ethyl ketone (MEK) was used as the solvent. The content of the ferrite powder was 65% and 80% by weight based on the epoxy resin. Otherwise by the same procedure as in Example 4-3, a mixture powder was prepared.

An amount of the mixture powder was placed in a mold and lamination pressed at 120° C. and 2.94×10⁶ Pa (30 kgf/cm²) for 30 minutes into a prepreg sheet of 1 mm thick.

Copper foils of 18 µm thick were placed on opposite surfaces of the prepreg sheet, which was lamination pressed under a pressure of 3.43×10⁶ Pa (35 kgf/cm²) by step curing at 120° C. for 30 minutes, 150° C. for 30 minutes, then 180° C. for 30 minutes, and finally at 200° C. for 30 minutes. There was obtained a double side copper foil-clad substrate of 1.02 mm thick.

The samples thus obtained were measured for dielectric constant at 1 MHz, with the results shown in FIG. 12.

It is seen from FIG. 12 that as compared with the epoxy resin samples, the inventive samples show a 20 to 25% reduction of dielectric constant, probably because of the dielectric constant of the base resin. As in Example 4-1, the samples of Example 4-3 and Comparative Example 4-3 were also measured for magnetic properties, obtaining approximately the same results as in Example 4-1 and Comparative Example 4-1.

Example 4-4

Coil Using Ferrite Composite Magnetic Material

Figure 13A:
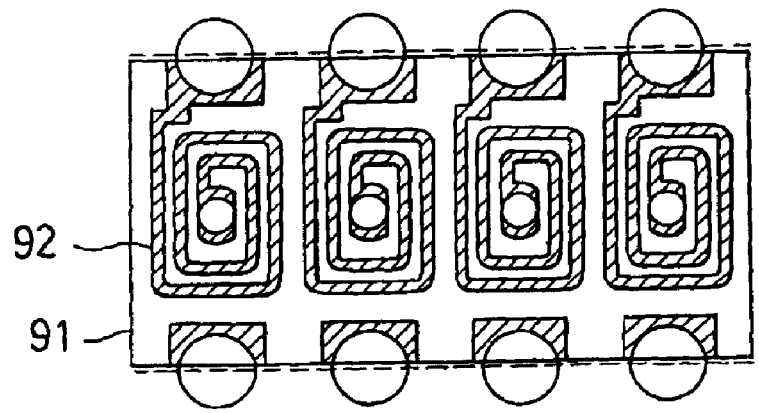
FIGS. 13A to 13C schematically illustrate conductor patterns on opposite sides of a substrate device (coil) according to the fourth embodiment of the invention, FIG. 13A illustrating a conductor pattern on a front side, FIG. 13B illustrating a conductor pattern on a rear side, and FIG. 13C illustrating a paste pattern formed thereon.
Figure 13B:
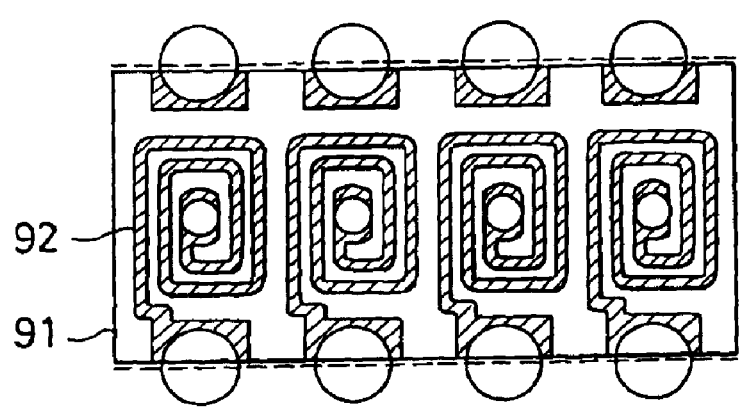
Figure 13C:
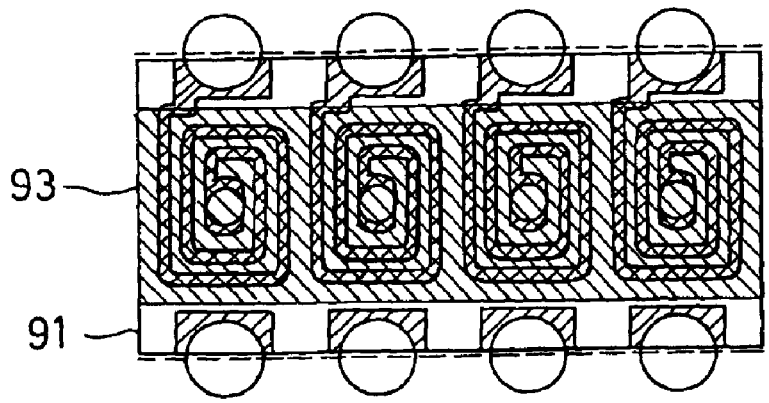

Using the samples (double side copper foil-clad substrates) prepared in Example 4-1 and Comparative Example 4-1, a 3.2×1.6 mm array of four juxtaposed coils was fabricated to a configuration as shown in FIGS. 13A to 13C. FIG. 13A is a plan view, FIG. 13B is a rear view, and FIG. 13C is a plan view after resin coating. In FIGS. 13A to 13C, a printed pattern 92 is formed on a substrate body 91 and coated with a base resin 93.

After a double side patterned substrate was formed, a paste of the composite magnetic material containing 65 wt % of the ferrite powder in Example 4-1 or Comparative Example 4-1 was screen printed as a base resin and heat cured to form coils. The coils thus formed had a thickness of 70 µm while the product has a height of 0.44 mm. The frequency response of the coil was measured, with the results shown in FIG. 14.

Figure 14:
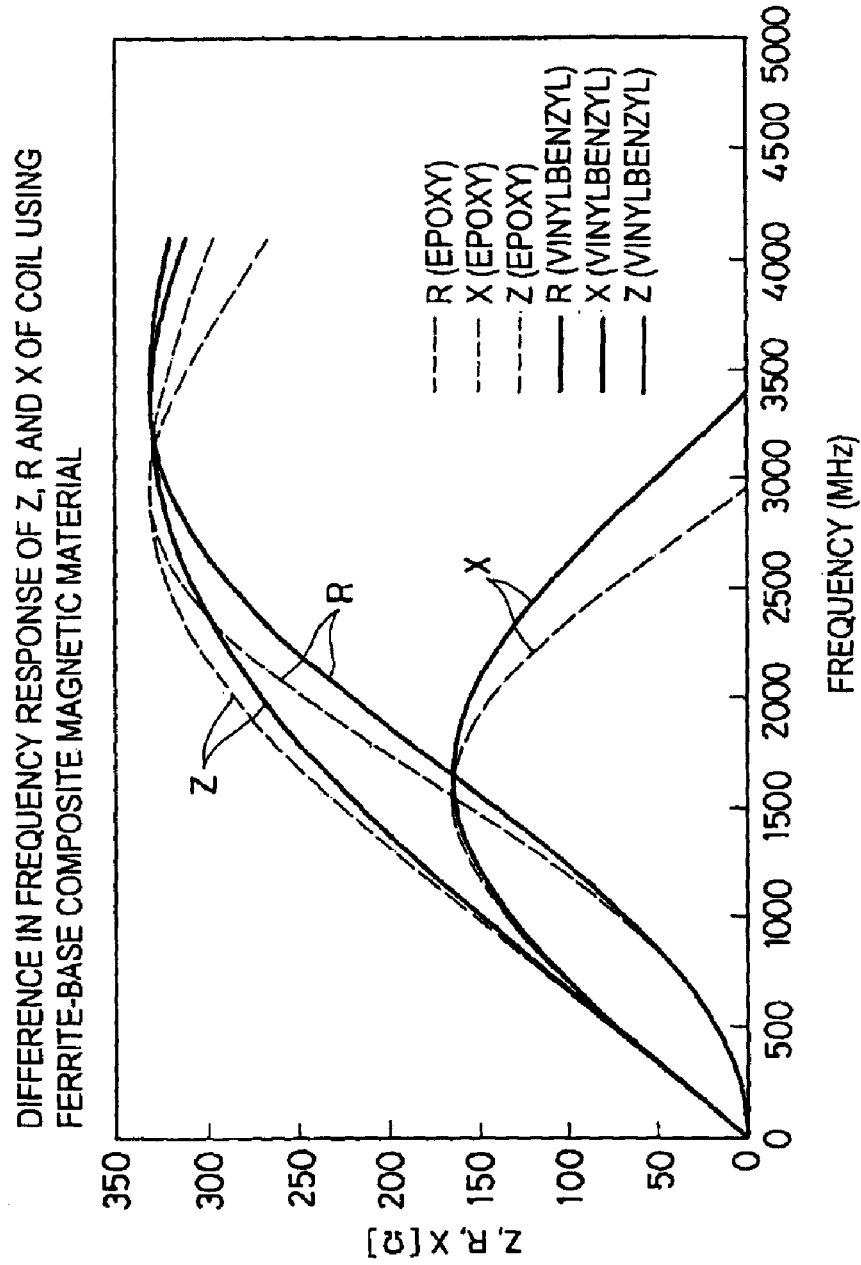
FIG. 14 is a graph showing the impedance and reactance versus frequency of substrate devices according to the fourth embodiment.

As seen from FIG. 14, the frequency response of impedance (the upper solid curves in the graph) and the frequency response of reactance (the lower broken line curve in the graph) of the vinylbenzyl sample show peaks which are expanded toward the higher frequency side by about 400 MHz. This is because the substrate material has a low dielectric constant so that the coil has a lower stray capacity. In fabricating coils so as to take more advantage of magnetic characteristics, there are achieved dielectric characteristics that allow for full utilization of the high-frequency characteristics of a composite material.

Example 5-1

Coating to Reinforcing Fibers

A polyvinylbenzyl ether compound was dissolved in toluene to a concentration of 55% by weight. A halogenated phosphate flame retardant (CR900 by Daihachi Chemical K.K.) was added to the resin solution, which was milled for 24 hours in a ball mill. There were prepared sample slurries having mixed therein 10%, 20%, 30%, 40%, 50%, 60% and 70% by weight of the flame retardant. A control slurry free of the flame retardant was also prepared.

Each slurry was applied to a glass cloth of 50 µm thick (by Asahi Schwebel K.K.) by means of a suitable coater, and dried at 110° C. for 2 hours, obtaining a flame retardant prepreg. After drying, the prepreg was 150 µm thick.

A substrate was formed by stacking twelve prepreg sheets and press molding the stack. The laminating press under a pressure of 1.96×10⁶ Pa (20 kgf/cm²) included three consecutive stages of 150° C. for 30 minutes, 180° C. for 30 minutes, and 200° C. for 30 minutes. The resulting flame retardant substrate was 1.6 mm thick.

These substrate samples were tested. In a flame retardant test, a specimen of 127 mm×12.7 mm×1.6 mm thick was cut out of each substrate and tested in accordance with the UL-94 standard. After a pressure cooker test (PCT) at 121° C. and 2 atm. for 50 hours, a volume resistivity was measured in accordance with JIS C-6481. As to electric properties, a specimen of 100 mm×1.5 mm×1.6 mm thick was cut out of each substrate and measured for dielectric constant (∈) and dissipation factor at 1 GHz by the perturbation method, from which a Q value was computed. The results are shown in Table 9.

TABLE 9

| Sample No. | Flame retardant (wt %) | UL-94 | ∈ | Q | Volume resistivity (Ω-cm) |
|---|---|---|---|---|---|
| 501* | 0* | HB | 3.20 | 220 | 10¹⁴ |
| 502* | 10* | HB | 3.21 | 220 | 10¹⁴ |
| 503* | 20* | HB | 3.22 | 222 | 10¹⁴ |
| 504* | 30* | HB | 3.28 | 223 | 10¹⁴ |
| 505 | 40 | V-0 | 3.32 | 230 | 10¹⁴ |
| 506 | 50 | V-0 | 3.40 | 220 | 10¹⁴ |
| 507 | 60 | V-0 | 3.45 | 200 | 10¹³ |
| 508* | 70* | V-0 | 3.49 | 152 | 10⁷ |

HB: clears HB, but not V-0 of UL-94.
V0: clears V-0 of UL-94
The asterisk (*) indicates outside the range of the invention or the preferred range of the invention.

As seen from Table 9, those samples containing 30% by weight or less of the flame retardant fail to satisfy the UL-94 V-0 rating. Those samples containing at least 40% by weight of the flame retardant satisfy the UL-94 V-0 rating, but the sample containing 70% by weight of the flame retardant shows an extreme drop of volume resistivity in the PCT test.

Example 5-2

Compression Molding of Solid Powder

A polyvinylbenzyl ether compound was dissolved in toluene to a concentration of 55% by weight. A halogenated phosphate flame retardant (CR900 by Daihachi Chemical K.K.) was added to the resin solution, which was milled for 24 hours in a ball mill. There were prepared sample slurries having mixed therein 10%, 20%, 30%, 40%, 50%, 60% and 70% by weight of the flame retardant. A control slurry free of the flame retardant was also prepared.

The slurry was dried at 90° C. for 15 hours, obtaining a solid mass of the resin/flame retardant mixture. It was ground in a mortar, obtaining a powder of the mixture. An amount of the mixture powder was placed in a mold and press molded at 120° C. and 2.94×10⁶ Pa (30 kgf/cm²) for 20 minutes into a prepreg plate of 1.8 mm thick. The plate was further lamination pressed under a pressure of 2.94×10⁶ Pa (30 kgf/cm²) by step curing at 110° C. for 30 minutes and at 180° C. for 30 minutes, obtaining a flame retardant substrate of 1.6 mm thick.

The thus obtained substrate samples were tested. In a flame retardant test, a specimen of 127 mm×12.7 mm×1.6 mm thick was cut out of each substrate and tested in accordance with the UL-94 standard. After a PCT at 121° C. and 2 atm. for 50 hours, a volume resistivity was measured in accordance with JIS C-6481. As to electric properties, a specimen of 100 mm×1.5 mm×1.6 mm thick was cut out of each substrate and measured for dielectric constant (∈) and dissipation factor at 1 GHz by the perturbation method, from which a Q value was computed. The results are shown in Table 10.

TABLE 10

| Sample No. | Flame retardant (wt %) | UL-94 | ∈ | Q | Volume resistivity (Ω-cm) |
|---|---|---|---|---|---|
| 511* | 0* | HB | 2.65 | 260 | 10¹⁴ |
| 512* | 10* | HB | 2.67 | 261 | 10¹⁴ |
| 513* | 20* | HB | 2.66 | 259 | 10¹⁴ |
| 514* | 30* | HB | 2.72 | 260 | 10¹⁴ |
| 515 | 40 | V-0 | 2.81 | 257 | 10¹⁴ |
| 516 | 50 | V-0 | 2.86 | 262 | 10¹⁴ |
| 517 | 60 | V-0 | 2.91 | 241 | 10¹³ |
| 518* | 70* | V-0 | 2.99 | 198 | 10⁷ |

HB: clears HB, but not V-0 of UL-94.
V0: clears V-0 of UL-94
The asterisk (*) indicates outside the range of the invention or the preferred range of the invention.

As seen from Table 10, those samples containing 30% by weight or less of the flame retardant fail to satisfy the UL-94 V-0 rating. Those samples containing at least 40% by weight of the flame retardant satisfy the UL-94 V-0 rating, but the sample containing 70% by weight of the flame retardant shows an extreme drop of volume resistivity in the PCT test. As compared with the sample on glass cloth in Example 5-1, the samples of this example have a somewhat lower dielectric constant and a somewhat higher Q value. This is because the electrical properties of glass cloth have an influence on the prepreg.

Example 6-1

In a common vessel, 55 g of a polyvinylbenzyl ether compound and 45 g of toluene were agitated until the compound was completely dissolved, obtaining a solution containing 55% by weight of solids. The polyvinylbenzyl ether compound (VB) used was of the formula (1) wherein $R^1$ is methyl, $R^2$ is a mixture of $C_{1-10}$ alkyl groups (inclusive of aralkyl groups such as benzyl), $R^3$ is a mixture of hydrogen and vinylbenzyl in a molar ratio of 0:100, and n=3.

A slurry was prepared by mixing the 55% solution, an additive type flame retardant and a flame retardant adjuvant in a formulation as shown in Table 11, and agitating them until a uniform dispersion free of agglomeration was obtained.

Specifically, a slurry corresponding to sample No. 602 was prepared by mixing 100 g of a 55 wt % toluene solution of the polyvinylbenzyl ether compound with 13.75 g of additive type flame retardant Cytech BT-93 (ethylenebis (tetrabromophthalimide), by Albemare). Glass cloth (Type 1080, Asahi Schwebel K.K.) was coated and impregnated with the slurry, which was cured at 110° C. for 2 hours, obtaining a glass cloth-embedded prepreg of 100 μm thick. A substrate was formed by stacking ten prepreg sheets and lamination pressing the stack. The laminating press under a pressure of 300 MPa included four consecutive stages of 120° C. for 30 minutes, 150° C. for 30 minutes, 180° C. for 30 minutes, and 200° C. for 30 minutes. The resulting glass cloth-embedded laminate was 800 μm thick.

In this way, sample Nos. 601 to 616 were obtained as shown in Tables 11 and 12. Note that sample No. 601 was a glass cloth-embedded laminate free of the flame retardant.

Figure 15:
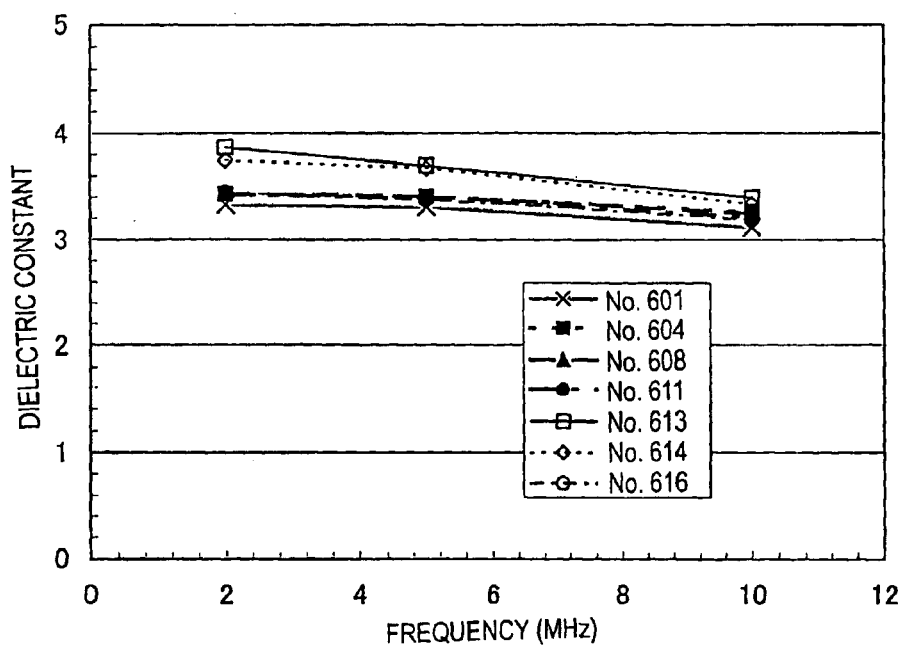
FIG. 15 is a graph showing the dielectric constant versus frequency of a multilayer plate obtained from a composition according to a sixth embodiment of the invention.

These laminate samples were tested as follows after they were cut to the shape prescribed in each test. The results are shown in Tables 11 and 12. The dielectric constant and Q value are also shown in Tables 13 and 14 and FIGS. 15 and 16.

i) UL-94 Burning Test

According to the test procedure set forth in Underwriters' Laboratories, Inc. Bulletin 94, Burning Test for Classifying Materials (referred to as UL-94), a specimen of 127 mm×12.7 mm×0.8 mm (1/32 inch) thick was tested by the UL-94 HB burning test and UL-94 V-0, V-1 and V-2 burning test.

ii) Dielectric Constant and Q

A specimen of 90 mm×1.5 mm×0.8 mm thick was measured for dielectric constant (∈) at a frequency of 2 GHz, 5 GHz and 10 GHz by the perturbation method, from which a Q value was computed.

iii) Volume Resistivity

Measured in accordance with JIS C-6481. A specimen included an electrode portion having a diameter of 50 mm and a thickness of 0.8 mm.

iv) Moisture Pickup (%)

A sample of 50 mm×50 mm×0.8 mm thick was tested by holding at 60° C. and RH 90% for 48 hours.

v) Coefficient of Linear Expansion

Using a thermal analyzer TMA-50 by Shimadzu Mfg. K.K., a sample of 10 mm×10 mm×0.8 mm thick was heated in air from room temperature (18° C.) to 250° C. at a rate of 10° C./min. Measurement was made in the thickness direction of the sample.

vi) Flexural Strength

Using a universal load tester AGS1000D by Shimadzu Mgf. K.K., a sample of 40 mm×25 mm×0.8 mm was tested in accordance with JIS C-6481.

vii) Copper Foil Peel Strength

Using a universal load tester AGS1000D by Shimadzu Mgf. K.K., a sample of 100 mm×25 mm×0.8 mm including a copper foil portion of 100 mm×10 mm was tested in accordance with JIS C-6481.

viii) Decomposition Initiation Temperature (°C.)

Using a thermal analyzer DTG-50 by Shimadzu Mfg. K.K., a sample of 5 mm×5 mm×0.8 mm thick was heated in air from room temperature (18° C.) to 800° C. at a rate of 20° C./min.

ix) Corrosion Test

With a sample of 30 mm×10 mm×0.8 mm kept in an atmosphere of 40° C. and RH 90%, a dc voltage of 250 volts was applied across a 0.06 mm diameter copper conductor for 1,000 hours. It was examined whether or not the copper conductor was broken and corroded with impurity ions. The sample was rated "Passed" when neither breakage nor corrosion was found and "Rejected" when either breakage or corrosion occurred.

TABLE 11

| Sample No. | | 601 (com.) | 602 | 603 | 604 | 605 | 606 | 607 | 608 |
|---|---|---|---|---|---|---|---|---|---|
| Formulation (weight ratio) | VB | 100 | 80 | 70 | 60 | 50 | 100 | 100 | 100 |
| | EBTBPI | | 20 | 30 | 40 | 50 | 13 | 17 | 20 |
| | TBA | | | | | | | | |
| | C60 | | | | | | | | |
| | MPP-A | | | | | | | | |
| | CR900 | | | | | | | | |
| | Sb$_2$O$_3$ | | | | | | 7 | 8 | 10 |
| | Flame retardant content (wt %) | 0 | 20.0 | 30.0 | 40.0 | 50.0 | 16.7 | 20.0 | 23.1 |
| Flame retardance | UL-94 burning test | HB | V-1 | V-0 | V-0 | V-0 | HB | V-1 | V-0 |
| Electric properties | Dielectric constant @2 GHz | 3.33 | 3.38 | 3.42 | 3.43 | 3.45 | 3.46 | 3.44 | 3.44 |
| | Q @2 GHz | 220 | 235 | 243 | 252 | 254 | 237 | 240 | 242 |
| | Volume resistivity (Ω-cm) | 3.00 × 10$^{14}$ | 3.10 × 10$^{14}$ | 2.50 × 10$^{14}$ | 2.60 × 10$^{14}$ | 2.40 × 10$^{14}$ | 3.20 × 10$^{14}$ | 2.90 × 10$^{14}$ | 2.30 × 10$^{14}$ |
| Physical properties | Moisture pickup (%) | 0.14 | 0.14 | 0.14 | 0.15 | 0.15 | 0.14 | 0.14 | 0.15 |
| Mechanical properties | Coefficient of linear expansion (ppm) | 112 | 103 | 89 | 78 | 74 | 102 | 90 | 77 |
| | Flexural strength (MPa) | 513 | 425 | 420 | 430 | 450 | 460 | 445 | 432 |
| | Flexural modulus (GPa) | 15.0 | 14.2 | 14.6 | 14.9 | 14.8 | 14.8 | 15.1 | 15.2 |
| | Cu foil peel strength (N/m) | 479 | 510 | 530 | 510 | 500 | 520 | 540 | 560 |
| Thermal properties | Decomposition temperature (° C.) | 441 | 376 | 378 | 375 | 379 | 365 | 363 | 360 |
| Impurity ions | Corrosion test | Passed | Passed | Passed | Passed | Passed | Passed | Passed | Passed |

EBTBPI: Cytech BT-93 (by Albemare), ethylenebis(tetrabromophthalimide)
TBA: Flamecut 120G (by Tosoh K.K.), tetrabromobisphenol A
C60: Terraju C30 (by Chisso K.K.), coated poly(ammonium phosphate)
MPP-A: MPP-A (by Sanwa Chemical K.K.), poly(melamine phosphate)
CR900: CR900 (by Daihachi Chemical K.K.), tris(tribromoneopentyl) phosphate
Sb$_2$O$_3$: Flamecut 610R (by Chisso K.K.), antimony trioxide

TABLE 12

| Sample No. | | 609 (com.) | 610 | 611 | 612 | 613 | 614 | 615 | 616 |
|---|---|---|---|---|---|---|---|---|---|
| Formulation (weight ratio) | VB | 100 | 100 | 100 | 100 | 100 | 100 | 60 | 50 |
| | EBTBPI | 30 | | | | | | | |
| | TBA | | | 17 | 20 | 30 | | | |
| | C60 | | | | | | 40 | | |
| | MPP-A | | | | | | | 40 | |

TABLE 12-continued

| Sample No. | | 609 (com.) | 610 | 611 | 612 | 613 | 614 | 615 | 616 |
|---|---|---|---|---|---|---|---|---|---|
| | CR900 | | | | | | | 40 | 50 |
| | $Sb_2O_3$ | 15 | 8 | 10 | 15 | | | | |
| | Flame retardant content (wt %) | 31.0 | 20.0 | 23.1 | 31.0 | 28.6 | 28.6 | 40.0 | 50.0 |
| Flame retardance | UL-94 burning test | V-0 | HB | V-0 | V-0 | V-1 | V-1 | V-1 | V-0 |
| Electric properties | Dielectric constant @2 GHz | 3.50 | 3.45 | 3.43 | 3.38 | 3.87 | 3.75 | 3.46 | 3.45 |
| | Q @2 GHz | 241 | 245 | 245 | 251 | 218 | 152 | 212 | 210 |
| | Volume resistivity (Ω-cm) | $2.50 \times 10^{14}$ | $2.80 \times 10^{14}$ | $2.30 \times 10^{14}$ | $2.50 \times 10^{14}$ | $7.50 \times 10^{13}$ | $6.50 \times 10^{13}$ | $5.80 \times 10^{13}$ | $5.40 \times 10^{13}$ |
| Physical properties | Moisture pickup (%) | 0.15 | 0.14 | 0.15 | 0.14 | 0.20 | 0.21 | 0.14 | 0.15 |
| Mechanical properties | Coefficient of linear expansion (ppm) | 69 | 103 | 90 | 73 | 76 | 79 | 130 | 145 |
| | Flexural strength (MPa) | 418 | 465 | 472 | 445 | 410 | 420 | 470 | 440 |
| | Flexural modulus (GPa) | 15.5 | 14.7 | 14.5 | 14.2 | 13.5 | 13.2 | 14.3 | 13.8 |
| | Cu foil peel strength (N/m) | 530 | 460 | 480 | 490 | 470 | 440 | 490 | 520 |
| Thermal properties | Decomposition temperature (° C.) | 362 | 340 | 337 | 333 | 313 | 327 | 307 | 305 |
| Impurity ions | Corrosion test | Passed | Passed | Passed | Passed | Rejected | Rejected | Passed | Passed |

EBTBPI: Cytech BT-93 (by Albemare), ethylenebis(tetrabromophthalimide)
TBA: Flamecut 120G (by Tosoh K.K.), tetrabromobisphenol A
C60: Terraju C30 (by Chisso K.K.), coated poly(ammoniumphosphate)
MPP-A: MPP-A (by Sanwa Chemical K.K.), poly(melamine phosphate)
CR900: CR900 (by Daihachi Chemical K.K.), tris(tribromoneopentyl) phosphate
$Sb_2O_3$: Flamecut 610R (by Chisso K.K.), antimony trioxide

TABLE 13

| | Dielectric constant | | |
|---|---|---|---|
| Sample No. | 2 GHz | 5 GHz | 10 GHz |
| 601 (comparison) | 3.33 | 3.31 | 3.12 |
| 604 (preferred) | 3.43 | 3.41 | 3.26 |
| 608 (preferred) | 3.44 | 3.41 | 3.25 |
| 611 (preferred) | 3.43 | 3.39 | 3.21 |
| 613 | 3.87 | 3.7 | 3.4 |
| 614 | 3.75 | 3.68 | 3.34 |
| 616 | 3.45 | 3.38 | 3.19 |

TABLE 14

| | Q | | |
|---|---|---|---|
| Sample No. | 2 GHz | 5 GHz | 10 GHz |
| 601 (comparison) | 220 | 183 | 163 |
| 604 (preferred) | 252 | 210 | 190 |
| 608 (preferred) | 242 | 200 | 180 |
| 611 (preferred) | 245 | 199 | 181 |
| 613 | 218 | 175 | 158 |
| 614 | 152 | 128 | 115 |
| 616 | 210 | 174 | 157 |

As seen from Tables 11 and 12, the addition of the additive type flame retardant achieves an improvement in flame retardent level. Sample Nos. 606 and 610 have the same HB rating as comparative sample No. 601, but a reduced burning, time indicating an apparent improvement. In these sample, the amounts of flame retardant and flame retardant adjuvant added are relatively small. By controlling these amounts, a shift to the V-1 or V-0 rating is possible. Particularly when the brominated aromatic flame retardant on which the invention places a favor is used, the resin can be flame retarded without detracting from dielectric properties. Other properties including mechanical properties, thermal properties and corrosion are satisfactory as well.

More specifically, in the flame retardant test, the brominated aromatic flame retardant can achieve flame retardance to the UL-94 V-1 rating at a content of 20 wt % and to the UL-94 V-0 rating at a content of 30 wt %, both at the thickness of 0.8 mm (1/32 inch). The combination of the brominated aromatic flame retardant with the antimony trioxide flame retardant adjuvant can achieve flame retardance to the UL-94 V-1 rating at a content of 20 wt % and to the UL-94 V-0 rating at a content of 23 wt %, both at the thickness of 0.8 mm (1/32 inch).

Figure 16:
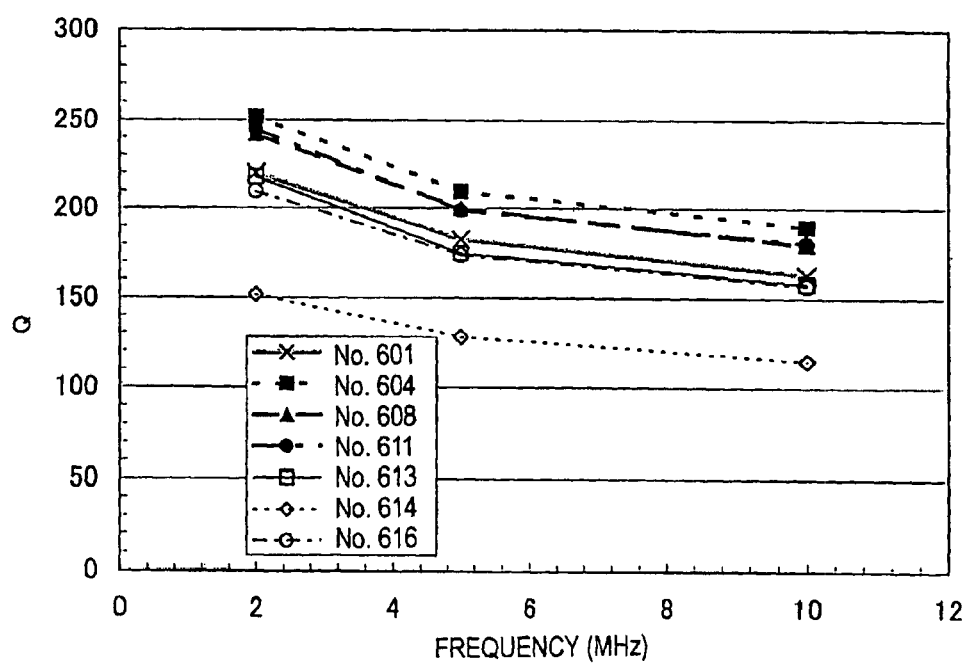
FIG. 16 is a graph showing the Q versus frequency of the multilayer plate obtained from a composition according to the sixth embodiment.
Figure 17:
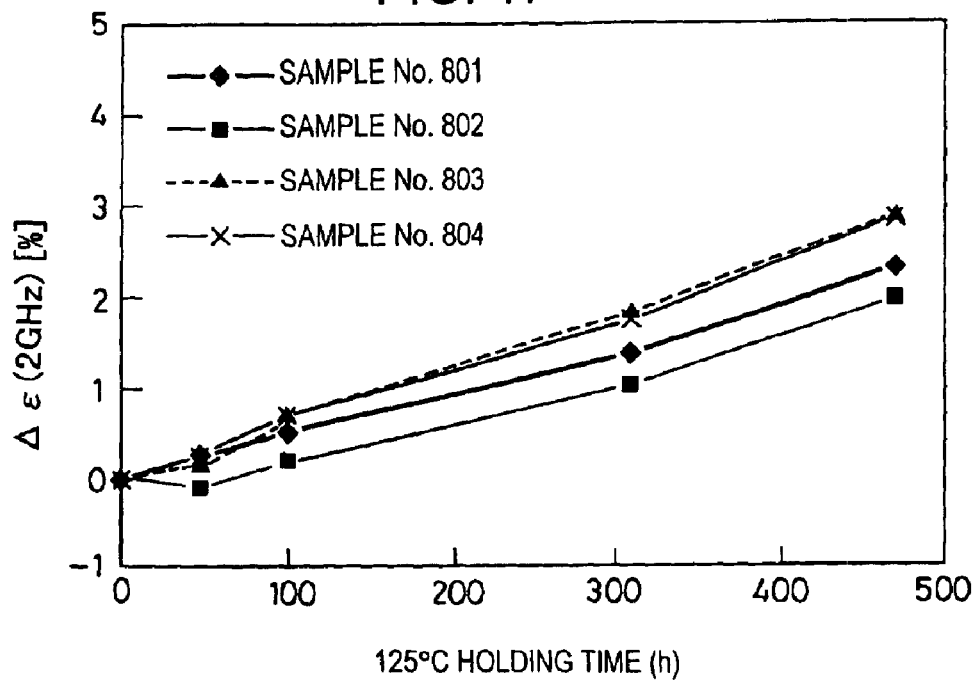
FIG. 17 is a graph showing the dielectric constant $\in$ of samples according to an eighth embodiment of the invention when aged at high temperature.
Figure 18:
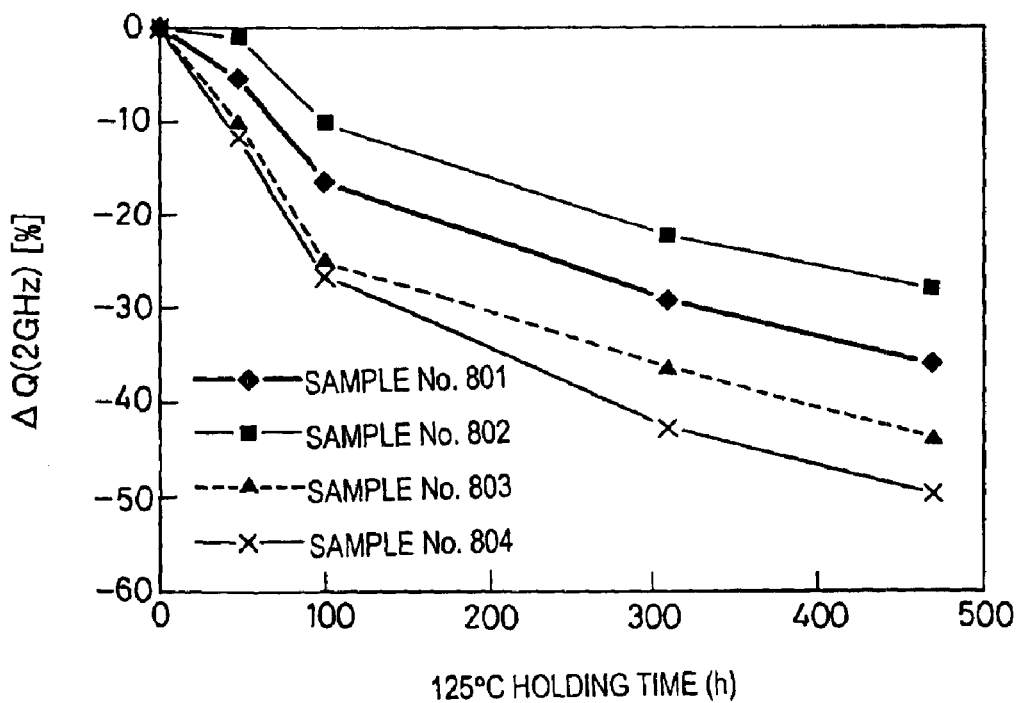
FIG. 18 is a graph showing the Q of the samples according to the eighth embodiment when aged at high temperature.
Figure 19:
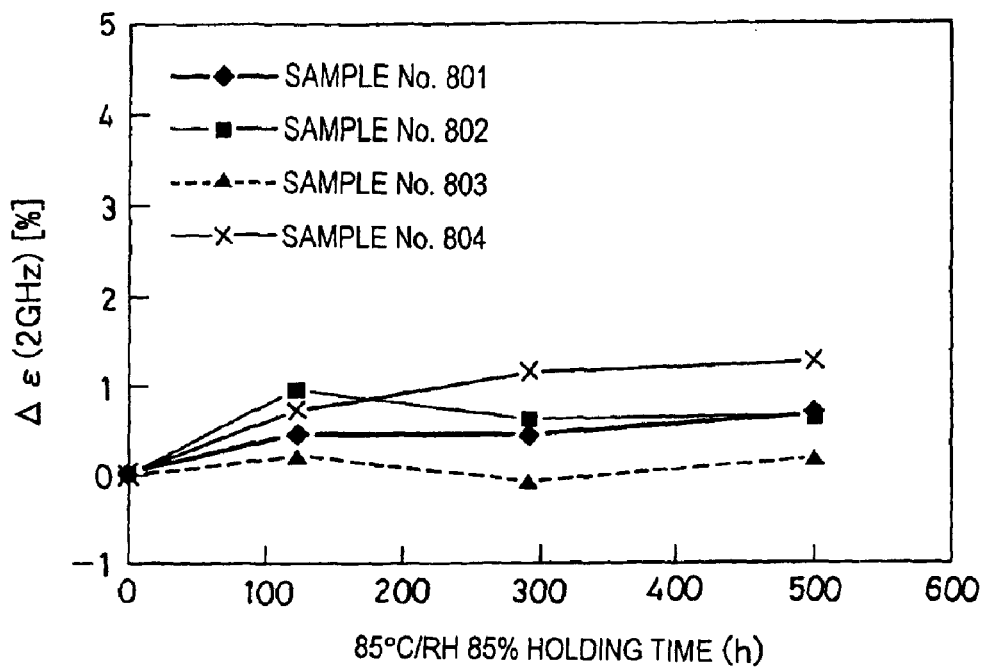
FIG. 19 is a graph showing the dielectric constant $\in$ of the samples according to the eighth embodiment when aged at high temperature and high humidity.
Figure 20:
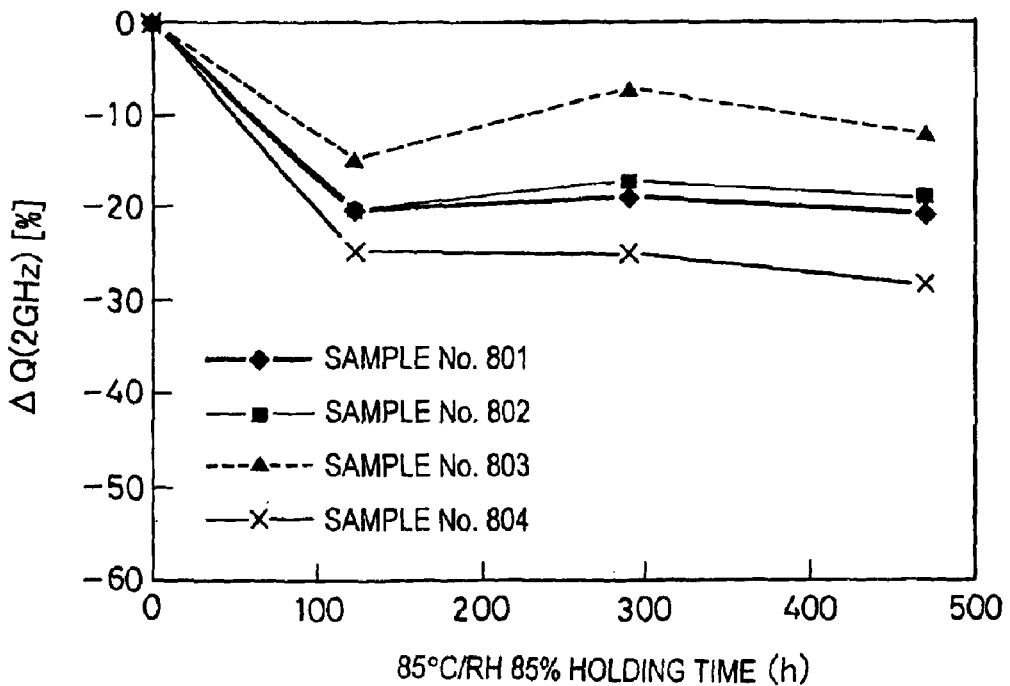
FIG. 20 is a graph showing the Q of the samples according to the eighth embodiment when aged at high temperature and high humidity.
Figure 21:
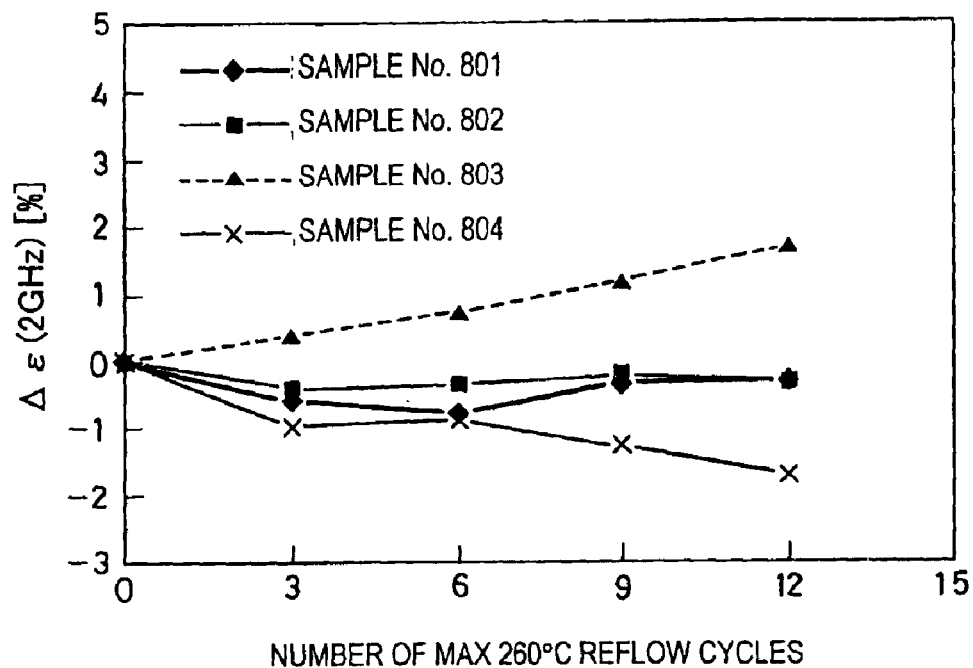
FIG. 21 is a graph showing the dielectric constant $\in$ of the samples according to the eighth embodiment under reflow conditions.
Figure 22:
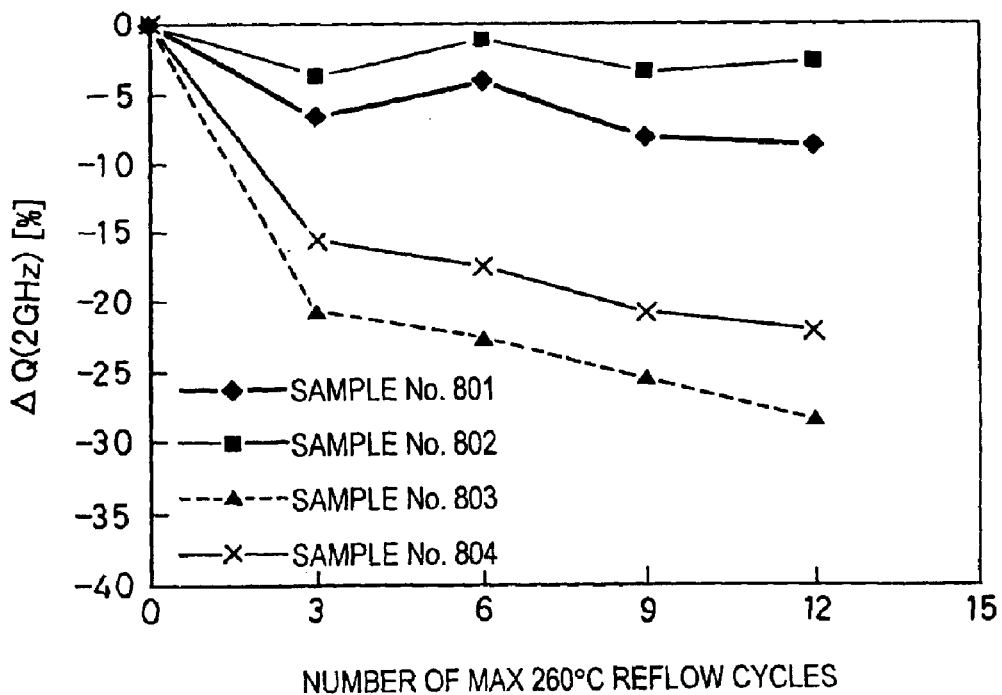
FIG. 22 is a graph showing the Q of the samples according to the eighth embodiment under reflow conditions.

With respect to the high-frequency response of dielectric properties, as compared with the non-flame-retarded polyvinylbenzyl ether compound (sample No. 601), the flame retardant formulations based on the brominated aromatic flame retardant and the brominated aromatic flame retardant/antimony trioxide flame retardant adjuvant combination show an improvement of 10 to 15% in Q over the high-frequency region of 2 to 10 GHz (see Table 14 and FIG. 16). Their dielectric constant is little increased as compared with the non-flame-retarded polyvinylbenzyl ether compound (sample No. 601) (see Table 13 and FIG. 15). The flame retardant formulations based on other flame retardants sometimes develop a phenomenon of increasing dielectric constant or lowering Q, which is undesirable as compared with the brominated aromatic flame retardant. Consequently, the formulations based on the brominated aromatic flame retardant achieve flame retardance without degradation of dielectric properties or rather with an improvement in Q and are thus suited as the high-frequency material.

With respect to the thermal properties, as compared with the non-flame-retarded polyvinylbenzyl ether compound (sample No. 601), the flame retardant formulations based on the brominated aromatic flame retardant and the brominated aromatic flame retardant/antimony trioxide flame retardant adjuvant combination show a low decomposition initiation temperature. This low decomposition temperature, however, is rather effective because in practice, decomposition must start at a lower temperature than the base resin in order to achieve effective flame retardance.

However, the use of the brominated aromatic flame retardant is advantageous because it does not decompose up to a higher temperature than other flame retardants and clears the heat resistance level (of withstanding several seconds at 260 to 350° C.) which is required for electronic parts and wiring boards.

With respect to the mechanical properties, the flame retardant formulations based on the brominated aromatic flame retardant show a 10 to 50% reduction in coefficient of linear expansion in the cured state although the coefficient varies with the amount of the flame retardant. This advantageously leads to a longer lifetime in the reliability and heat resistance tests.

With respect to the corrosion resistance, the brominated aromatic flame retardant imparts flame retardance without degrading the corrosion of the material.

Example 7-1

A 1-liter four-necked flask equipped with a thermostat, stirrer, cooling condenser and dropping funnel was charged with 79.3 g (0.25 equivalent) of a polyphenol PP-700-300 (Nippon Oil K.K.), 42.7 g (0.28 equivalent) of vinylbenzyl chloride CMS-AM (m-/p-isomers 30/70 wt % mixture, Seimi Chemical K.K.), 2.4 g of tetra-n-butylammonium bromide, 0.038 g of 2,4-dinitrophenol, and 200 g of methyl ethyl ketone. The contents were stirred for dissolution and kept at 75° C. To the solution, 20 g (0.5 equivalent) of sodium hydroxide in 20 g of water was added dropwise over 20 minutes, followed by 4 hours of agitation at 75° C. The solution was neutralized with a 10% aqueous solution of hydrochloric acid, and 100 g of toluene was added thereto. The organic layer was washed three times with 300 ml of water. The methyl ethyl ketone and toluene were distilled off in vacuum, and the reaction product was poured into 300 ml of methanol for precipitation. A polyvinylbenzyl ether compound having a softening point of 87° C. was collected in a yield of 95%.

This compound corresponds to formula (1) wherein $R^1$ is methyl, $R^2$ is a mixture of $C_{1-10}$ alkyl groups (inclusive of aralkyl groups such as benzyl), $R^3$ is a mixture of hydrogen and vinylbenzyl in a molar ratio of 0:100, and n=3. The product was identified by liquid chromatography (LC), infrared absorption spectroscopy (IR), and proton nuclear magnetic resonance spectroscopy ($^1$H-NMR). The presence of phenolic hydroxyl groups was examined by the hydroxyl equivalent measurement according to the neutralization titration procedure of JIS K-0070.

The polyvinylbenzyl ether compound, 55 g, was ground and dissolved in 45 g of toluene (a solvent in which the compound is soluble), forming a 55 wt % paste. The paste was placed in a vessel and dried at 90° C. for 20 hours until the toluene was completely removed. That is, the polyvinylbenzyl ether compound had a toluene content of substantially 0% by weight at the end of drying.

The dry solid was ground, placed in a mold of 100 mm×50 mm×1.5 mm, and cured under heat and pressure, that is, under a pressure of 2.94×10$^6$ Pa (30 kgf/cm$^2$) in four stages of 120° C. for 30 minutes, 150° C. for 30 minutes, 180° C. for 30 minutes and 200° C. for 30 minutes. The cured product is designated sample No. 701.

Sample No. 702 was prepared as was sample No. 701 except that m-xylene (a solvent in which the compound is soluble) was used instead of toluene as the solvent. The polyvinylbenzyl ether compound had a m-xylene content of substantially 0% by weight at the end of drying.

Sample No. 703 was prepared as was sample No. 701 except that methyl ethyl ketone (a solvent in which the compound is soluble) was used instead of toluene. The polyvinylbenzyl ether compound had a methyl ethyl ketone content of substantially 0% by weight at the end of drying.

Sample No. 704 was prepared as was sample No. 701 except that acetone (a solvent in which the compound is difficultly soluble) was used instead of toluene. The polyvinylbenzyl ether compound had an acetone content of substantially 0% by weight at the end of drying.

Sample No. 705 was prepared as was sample No. 701 except that the polyvinylbenzyl ether compound was used without the solvent treatment with toluene.

From each of these cured samples, Nos. 701 to 705, a specimen of 100 mm×1.5 mm×1.5 mm was cut out and measured for dielectric constant ($\in$) and dissipation factor (tan δ), from which a Q value was computed. Measurement was effected at a frequency of 2 GHz by the perturbation method. The results are shown in Table 15.

TABLE 15

| Sample No. | Treating solvent | Solvent's ∈ | Solubility | ∈ | tanδ | Q |
|---|---|---|---|---|---|---|
| 701 (invention) | toluene | 2.240 | good | 2.552 | 0.00379 | 264 |
| 702 (invention) | m-xylene | 2.334 | good | 2.549 | 0.00361 | 277 |
| 703 (invention) | MEK | 15.45 | good | 2.494 | 0.00383 | 261 |
| 704 (comparison) | acetone | 21.45 | difficult | 2.554 | 0.00442 | 226 |
| 705 (comparison) | — | — | — | 2.556 | 0.00625 | 160 |

As compared with the cured product (sample No. 705) obtained using the polyvinylbenzyl ether compound as synthesized, the cured products (sample Nos. 701 to 703) obtained using the polyvinylbenzyl ether compound treated with the solvent in which the compound is well soluble show an increase in Q of about 63 to 73%. On the other hand, the cured product (sample No. 704) obtained using the polyvinylbenzyl ether compound treated with the solvent in which the compound is difficultly soluble shows a lower Q than sample Nos. 701 to 703. Therefore, the treatment of the polyvinylbenzyl ether compound with the solvent in which the compound is well soluble is effective in improving dielectric properties such as Q.

Example 8-1

To 500 g of water in a 1-liter vessel was added 400 g of a dielectric powder (BaO—TiO$_2$—Nd$_2$O base ceramic, ∈ (2 GHz)=95, tan δ (2 GHz)=0.00077, mean particle size 0.3 μm). The contents were agitated by an agitator. Then 8 g of an alkoxysilane coupling agent TSL-8113 (methyltrimethoxysilane by Toshiba Silicone K.K.) was added to the dispersion which was agitated for 1 hour. The dispersion was allowed to stand for 1 hour. The dielectric powder was separated and dried at 110° C. for 16 hours. The coupling agent had a pyrolysis initiation temperature of about 450 to 510° C. as analyzed by thermogravimetry (TG) and DSC.

In a common vessel, 55 g of a polyvinylbenzyl ether compound and 45 g of toluene were agitated until the compound was completely dissolved, obtaining a solution containing 55% by weight of solids. The polyvinylbenzyl ether compound (VB) used was of the formula (1) wherein $R^1$ is methyl, $R^2$ is a mixture of $C_{1-10}$ alkyl groups (inclusive of aralkyl groups such as benzyl), $R^3$ is a mixture of hydrogen and vinylbenzyl in a molar ratio of 0:100, and n=3.

A slurry was prepared by adding 368.2 g of the surface treated dielectric powder to the VB solution, and agitating the mixture until thorough dispersion. Glass cloth (Type 1080, thickness 50 µm, Asahi Schwebel K.K.) was coated and impregnated with the slurry, which was pre-cured at 110° C. for 2 hours, obtaining a glass cloth-embedded prepreg of 100 µm thick.

A substrate was formed by stacking four prepreg sheets and lamination pressing the stack. The laminating press under a pressure of 300 MPa included three consecutive stages of 120° C. for 30 minutes, 150° C. for 30 minutes, and 180° C. for 6.5 hours. The resulting glass cloth-embedded laminate was 400 µm thick. This is designated sample No. 801.

Sample No. 802 was prepared as was sample No. 801 except that the coupling agent was changed to an organic functional silane coupling agent TSL-8370 (γ-methacryloxypropyltrimethoxysilane by Toshiba Silicone K.K.). The coupling agent had a pyrolysis initiation temperature of about 260 to 350° C. as analyzed by TG and DSC.

Sample No. 803 was prepared as was sample No. 801 except that the coupling agent was changed to a titanate coupling agent Plainact KR-46B (by Ajinomoto K.K.). The coupling agent had a pyrolysis initiation temperature of about 220 to 230° C. as analyzed by TG and DSC.

Sample No. 804 was prepared as was sample No. 801 except that the dielectric powder which had not been surface treated with the coupling agent was used.

From each of these glass cloth-embedded laminate samples, Nos. 801 to 804, a specimen of 90 mm×0.7 mm×0.4 mm thick was cut out and measured for dielectric constant ($\in$) and dissipation factor (tan δ) at a frequency of 2 GHz by the perturbation method, from which a Q value was computed.

The samples were aged under the following three sets of hot or humid conditions. Changes of dielectric constant and Q from their initial values were determined.

1) 85° C., RH 85%, 500 hr.

2) 125° C., 470 hr.

3) 3, 6, 9 or 12 reflow cycles at a maximum temperature of 260° C.

The initial values of dielectric constant ($\in$) and Q are shown in Table 16 together with the composition. Changes Δ$\in$ and ΔQ, expressed in percents, of dielectric constant ($\in$) and Q from their initial values are shown in FIGS. 17 to 22.

TABLE 16

| Sample No. | 801 | 802 | 803 | 804 |
|---|---|---|---|---|
| VB (g) | 55 | 55 | 55 | 55 |
| Toluene (g) | 45 | 45 | 45 | 45 |
| BaO—TiO$_2$—Nd$_2$O base dielectric powder (g) | 361 | 361 | 361 | 361 |
| Coupling agent TSL-8113 (g) | 7.2 | — | — | — |
| Coupling agent TSL-8370 (g) | — | 7.2 | — | — |
| Coupling agent KR-46B (g) | — | — | 7.2 | — |
| $\epsilon$ @ 2 GHz | 15.01 | 13.88 | 13.88 | 14.98 |
| Q @ 2 GHz | 359 | 300 | 325 | 347 |

TSL-8113: alkoxysilane coupling agent, methyltrimethoxysilane, Toshiba Silicone K. K.
TSL-8370: organic functional silane coupling agent, γ-methacryloxypropyltrimethoxysilane, Toshiba Silicone K. K.
KR-46B: titanate coupling agent Plainact KR-46B, Ajinomoto K. K.

It is evident from Table 16 that as compared with the sample using the untreated dielectric powder, the samples using the dielectric powder surface treated with a coupling agent experience little changes of $\in$ and Q during aging under 125° C. (high temperature holding) and 85° C./RH 85% (steady humid holding). Especially when the alkoxysilane and organofunctional silane coupling agents having a pyrolysis initiation temperature of at least 250° C. are used, the changes of $\in$ and Q can be advantageously suppressed not only under the above two sets of conditions, but also under the reflow conditions. When the titanate coupling agent is used, little changes of $\in$ and Q occur during the 85° C./RH 85% aging, suggesting that the titanate coupling agent is effective under such conditions. Therefore, a choice among different coupling agents is made in accordance with the intended aging conditions.

Example 8-2

A glass cloth-embedded laminate, sample No. 821, was prepared as was sample No. 802 except that additive type flame retardant Cytech BT-93 (ethylenebis (tetrabromophthalimide), by Albemare) was added to the toluene solution of the polyvinylbenzyl ether compound. The amount of additive type flame retardant added was 20% by weight based on the polyvinylbenzyl ether compound.

A specimen of 127 mm×12.7 mm×0.8 mm of this sample No. 821 was subjected to the UL-94 burning test. It was classified in the V-0 rating, indicating good flame retardance. No loss of dielectric properties by flame retarding was found.

Example 8-3

A glass cloth-embedded laminate, sample No. 822, was prepared as was sample No. 802 except that instead of the toluene solution of the polyvinylbenzyl ether compound, a 55 wt % toluene solution of a polyvinylbenzyl ether compound of reactive type flame retardant tetrabromobisphenol-A was used, and 30 wt % of a polyvinylbenzyl ether compound of tetrabromobisphenol-A with 0.3 wt % of phenothiazine (polymerization inhibitor) added was used. It is noted that the polyvinylbenzyl ether compound of tetrabromobisphenol-A was obtained from tetrabromobisphenol-A and vinylbenzyl chloride (m-/p-isomers 50/50 weight ratio mixture by Seimi Chemical K.K.).

A specimen of 127 mm×12.7 mm×0.8 mm of this sample No. 822 was subjected to the UL-94 burning test. It was classified in the V-0 rating, indicating good flame retardance. No loss of dielectric properties by flame retarding was found.

Example 9-1

Figure 23:
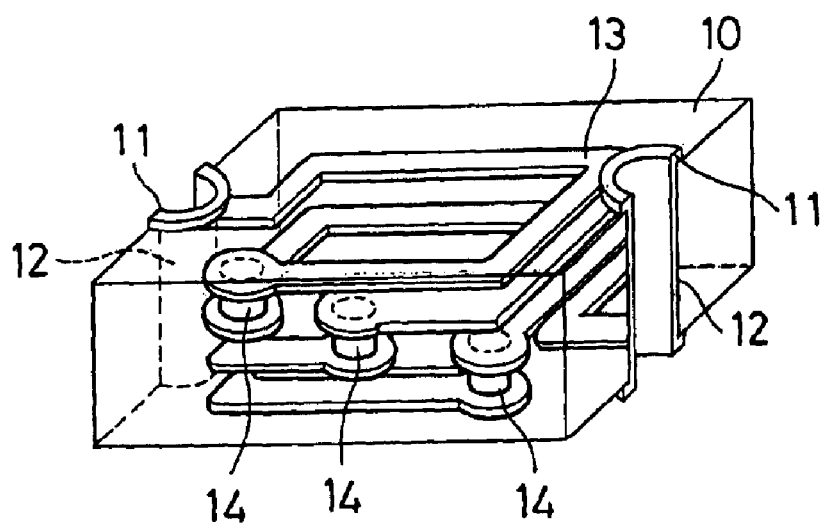
FIGS. 23 and 24 illustrate an inductor as one exemplary electronic part of the invention.
Figure 24:
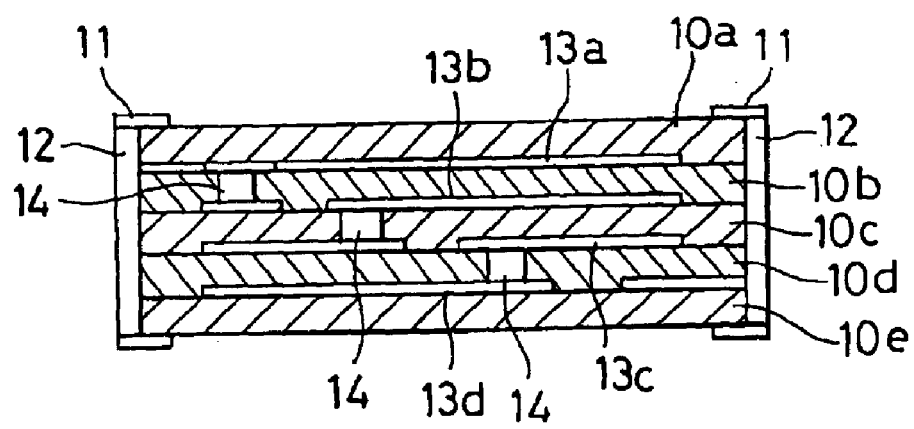

FIGS. 23 and 24 illustrate an inductor according to a further embodiment of the invention. FIG. 23 is a see-through perspective view and FIG. 24 is a cross-sectional view.

In FIGS. 23 and 24, the inductor 10 includes constituent layers (prepregs or substrates) 10a to 10e containing the inventive resin, internal conductors (coil patterns) 13 formed on the constituent layers 10b to 10e, and via holes 14 for providing electrical connection to the internal conductors 13. Via holes 14 can be formed by drilling, laser machining, etching or the like. The ends of each coil formed are connected to through-vias 12 formed along end surfaces of the inductor 10 and land patterns 11 formed slightly above or below the through-vias 12. Through-via 12 has a half-cut structure by dicing or V-cutting. This is because a plurality of devices are formed in a collective substrate which is eventually cut into discrete chips along lines at the centers of through-vias 12.

The constituent layers 10a to 10e of the inductor 10 should preferably have a dielectric constant of 2.6 to 3.5 because the distributed capacitance must be minimized for the potential application as a high-frequency chip inductor. Use of the above-mentioned organic dielectric layers is thus preferred. Separately, for an inductor constructing a resonance circuit, the distributed capacitance is sometimes positively utilized. In such application, the constituent layers should preferably have a dielectric constant of 5 to 40. Use of the above-mentioned first and second composite dielectric layers is thus preferred. In this way, it becomes possible to reduce the device size and eliminate capacitive elements. Also in these inductors the material loss should be minimized. By setting the dielectric dissipation factor (tan δ) in the range of 0.0025 to 0.0075, an inductor having a minimized material loss and a high Q is obtainable. Further where a noise removing application is under consideration, the impedance must be maximized at the frequency of noise to be removed. For such application, a magnetic permeability of 3 to 20 is appropriate, and use of the above-mentioned composite magnetic layers is preferred. This drastically improves the effect of removing high-frequency noise. The respective constituent layers may be identical or different, and an optimum combination thereof may be selected.

Figure 32A:
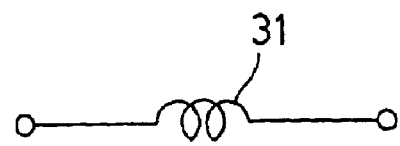
FIG. 32 is equivalent circuit diagrams of the inductors.

The equivalent circuit is shown in FIG. 32A. As seen from FIG. 32A, an electronic part (inductor) having a coil 31 is illustrated in the equivalent circuit.

Example 9-2

Figure 25:
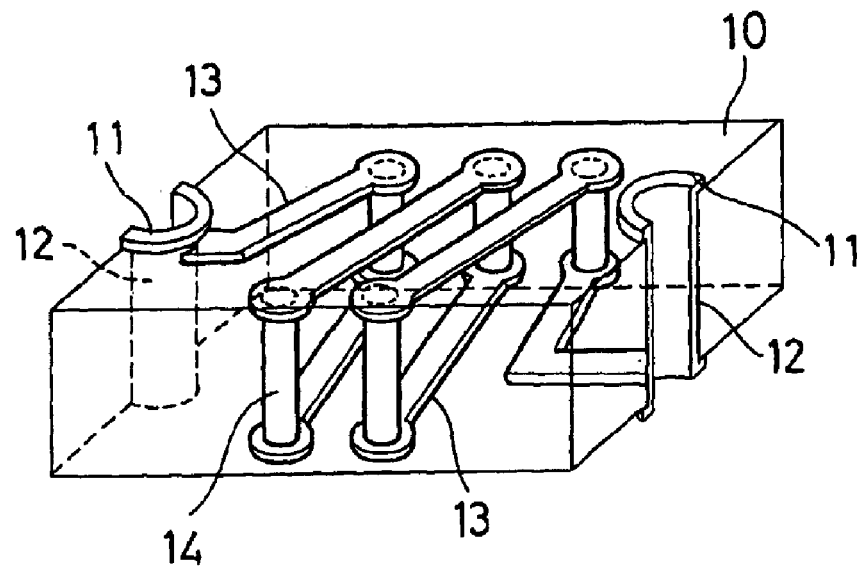
FIGS. 25 and 26 illustrate an inductor as another exemplary electronic part of the invention.
Figure 26:
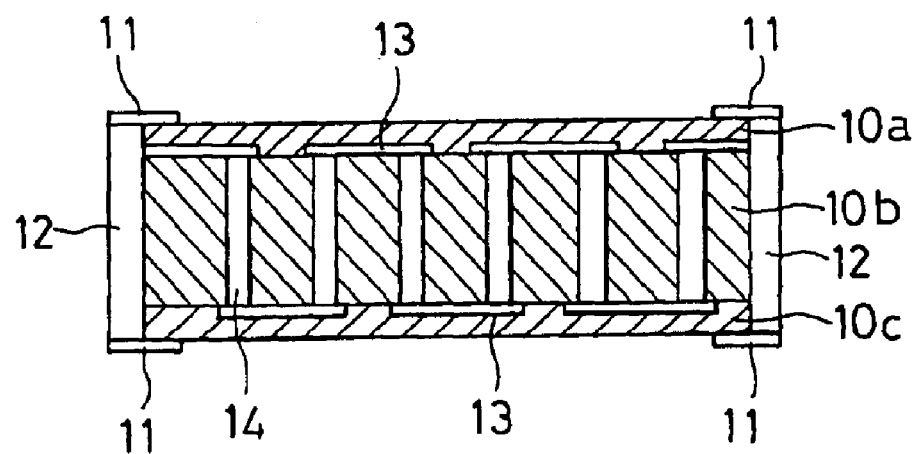

FIGS. 25 and 26 illustrate an inductor according to a further embodiment of the invention. FIG. 25 is a see-through perspective view and FIG. 26 is a cross-sectional view.

In this example, the coil pattern which is wound and stacked in a vertical direction in Example 9-1 is changed to a helical coil which is wound in a lateral direction. The remaining components are the same as in Example 9-1. The same components are designated by like numerals and their description is omitted.

Example 9-3

Figure 27:
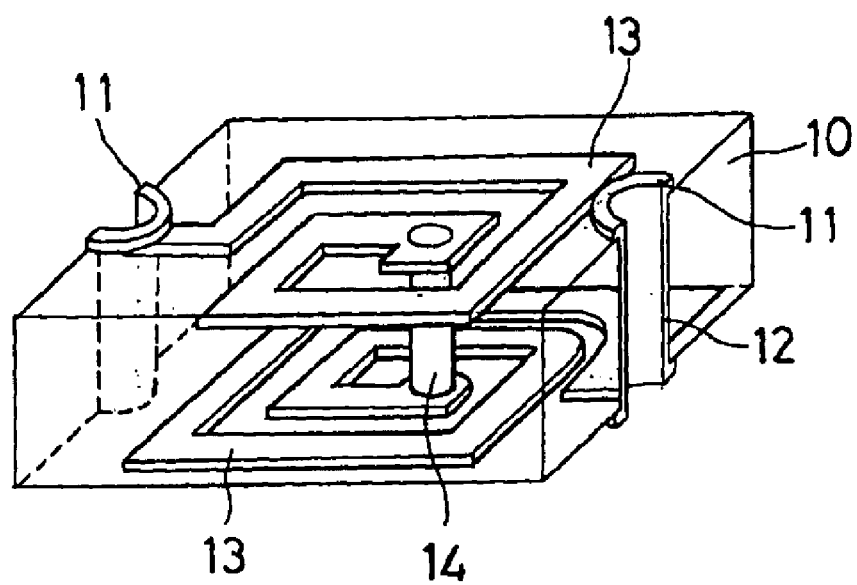
FIGS. 27 and 28 illustrate an inductor as a further exemplary electronic part of the invention.
Figure 28:
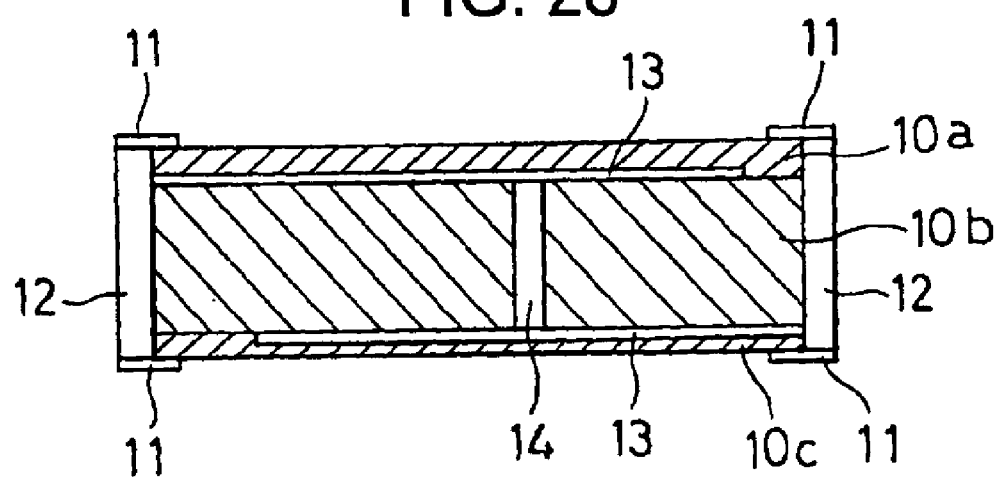

FIGS. 27 and 28 illustrate an inductor according to a further embodiment of the invention. FIG. 27 is a see-through perspective view and FIG. 28 is a cross-sectional view.

In this example, the coil pattern which is wound and stacked in a vertical direction in Example 9-1 is changed such that upper and lower spiral coils are connected. The remaining components are the same as in Example 9-1. The same components are designated by like numerals and their description is omitted.

Example 9-4

Figure 29:
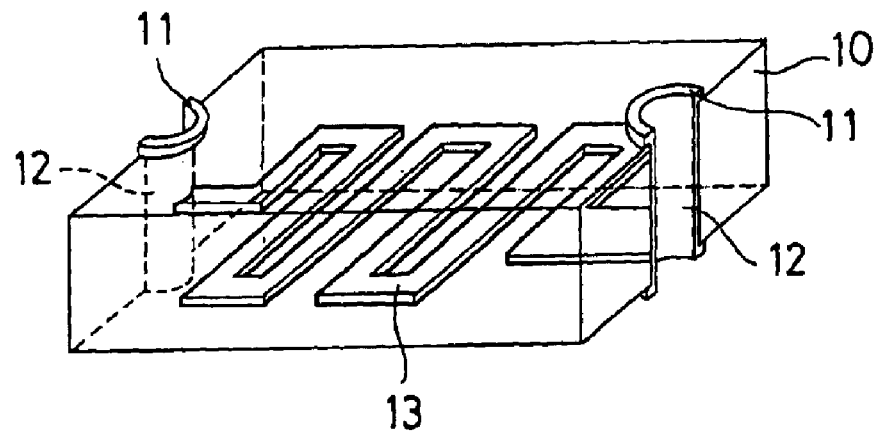
FIGS. 29 and 30 illustrate an inductor as a still further exemplary electronic part of the invention.
Figure 30:
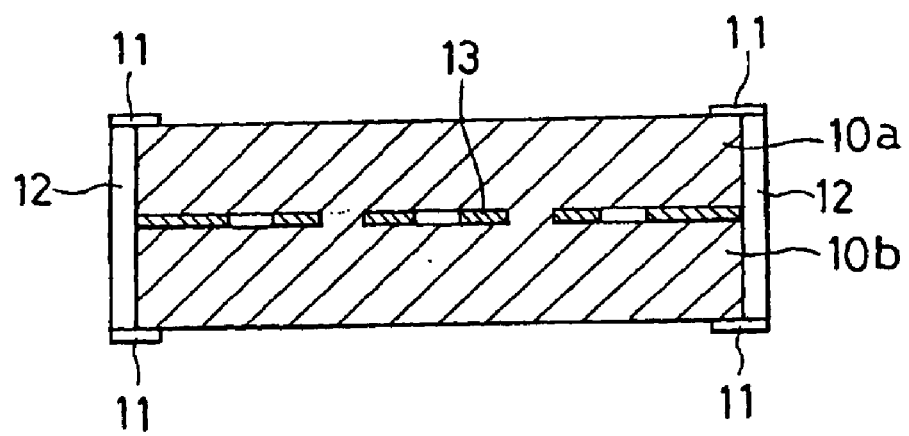

FIGS. 29 and 30 illustrate an inductor according to a further embodiment of the invention. FIG. 29 is a see-through perspective view and FIG. 30 is a cross-sectional view.

In this example, the coil pattern which is wound and stacked in a vertical direction in Example 9-1 is changed to an internal meander coil. The remaining components are the same as in Example 9-1. The same components are designated by like numerals and their description is omitted.

Example 9-5

Figure 31:
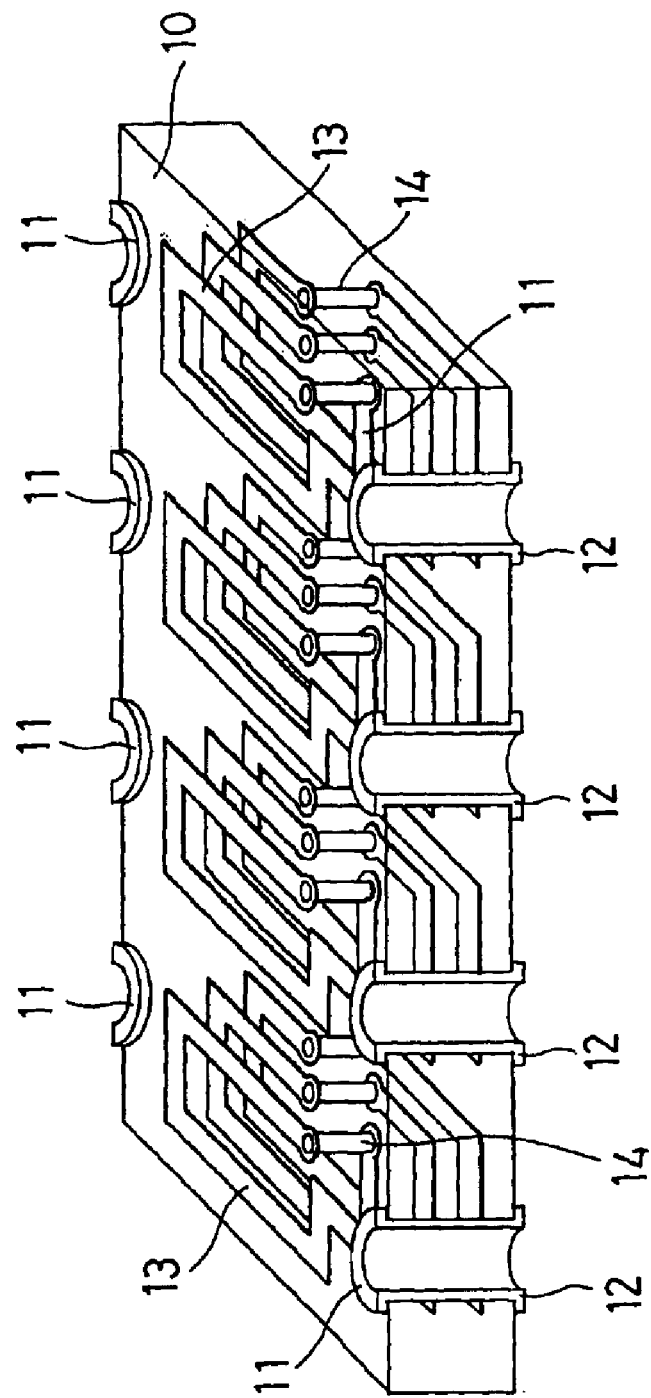
FIG. 31 illustrates an inductor as a yet further exemplary electronic part of the invention.

FIG. 31 is a see-through perspective view of an inductor according to a further embodiment of the invention.

Figure 32B:
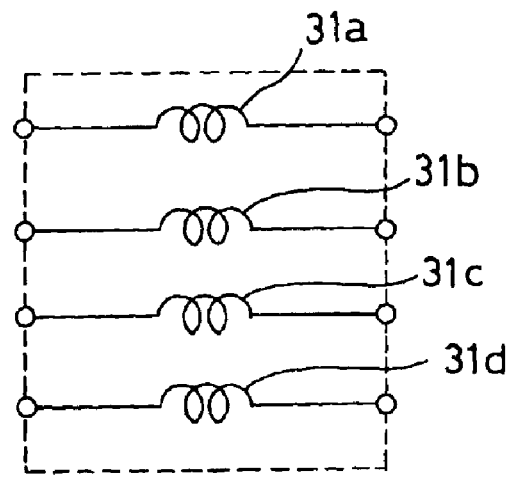

In this example, the single coil in Example 9-1 is changed to an array of four juxtaposed coils. This array achieves a space saving. The remaining components are the same as in Example 9-1. The same components are designated by like numerals and their description is omitted. The equivalent circuit is shown in FIG. 32B. As shown in FIG. 32B, an electronic part (inductor array) having four coils 31a to 31d is illustrated in the equivalent circuit.

Example 9-6

Figure 33:
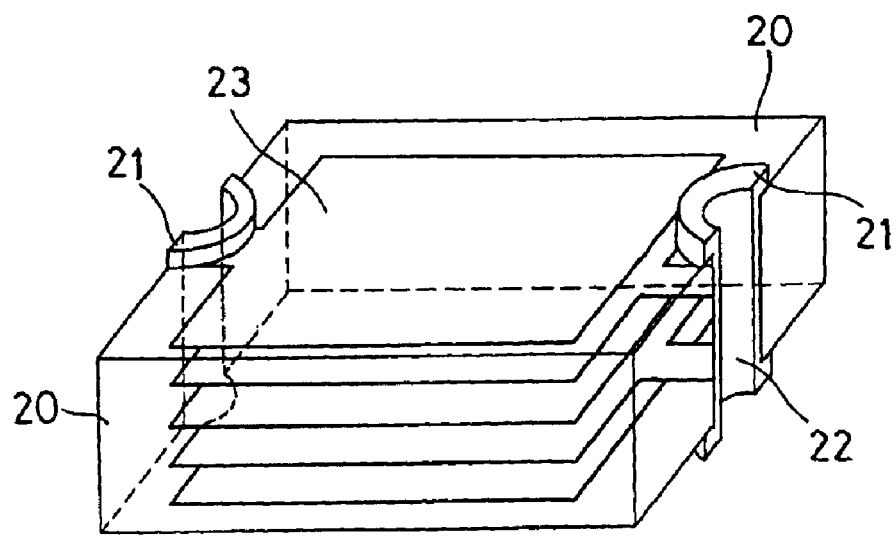
FIGS. 33 and 34 illustrate a capacitor as one exemplary electronic part of the invention.
Figure 34:
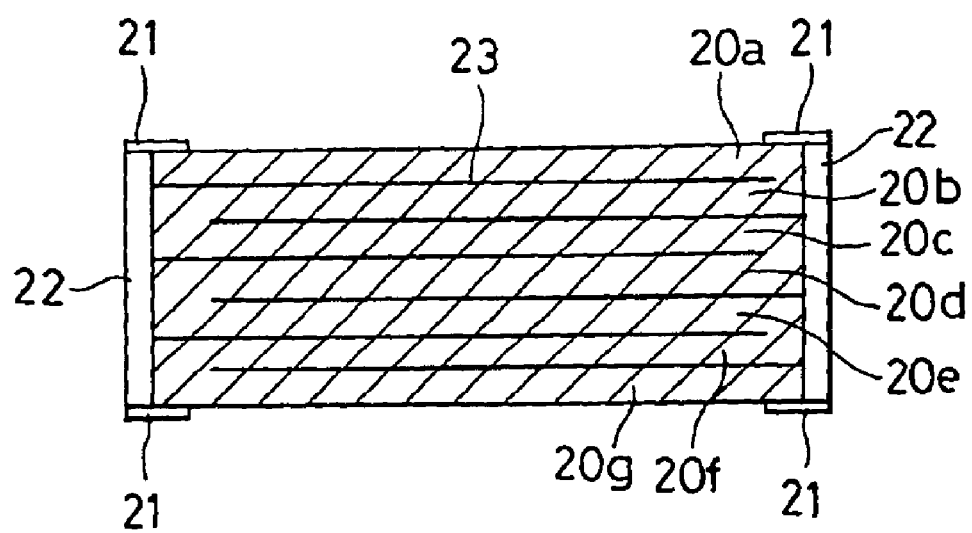

FIGS. 33 and 34 illustrate a capacitor according to a further embodiment of the invention. FIG. 33 is a see-through perspective view and FIG. 34 is a cross-sectional view.

In FIGS. 33 and 34, the capacitor 20 includes constituent layers (prepregs or substrates) 20a to 20g containing the inventive resin, internal conductors (internal electrode patterns) 23 formed on the constituent layers 20b to 20g, through-vias 22 formed along end surfaces of the capacitor 20 and alternately connected to the internal conductors 23, and land patterns 21 formed slightly above or below the through-vias 22.

The constituent layers 20a to 20g of the capacitor 20 should preferably have a dielectric constant of 2.6 to 40 and a dielectric dissipation factor of 0.0025 to 0.0075 when the diversity and precision of capacitance are considered. Then a choice may be made among the above-mentioned organic dielectric layers or the above-mentioned first and second composite dielectric layers. This enables to provide a wider range of capacitance and afford even a low capacitance at a high precision. It is also required that the material loss be minimized. By setting the dielectric dissipation factor (tan δ) in the range of 0.0075 to 0.025, a capacitor having a minimized material loss is obtainable. The respective constituent layers may be identical or different and an optimum combination thereof may be selected.

The equivalent circuit is shown in FIG. 36A. As shown in FIG. 36A, an electronic part (capacitor) having a capacitance 32 is illustrated in the equivalent circuit.

Example 9-7

Figure 35:
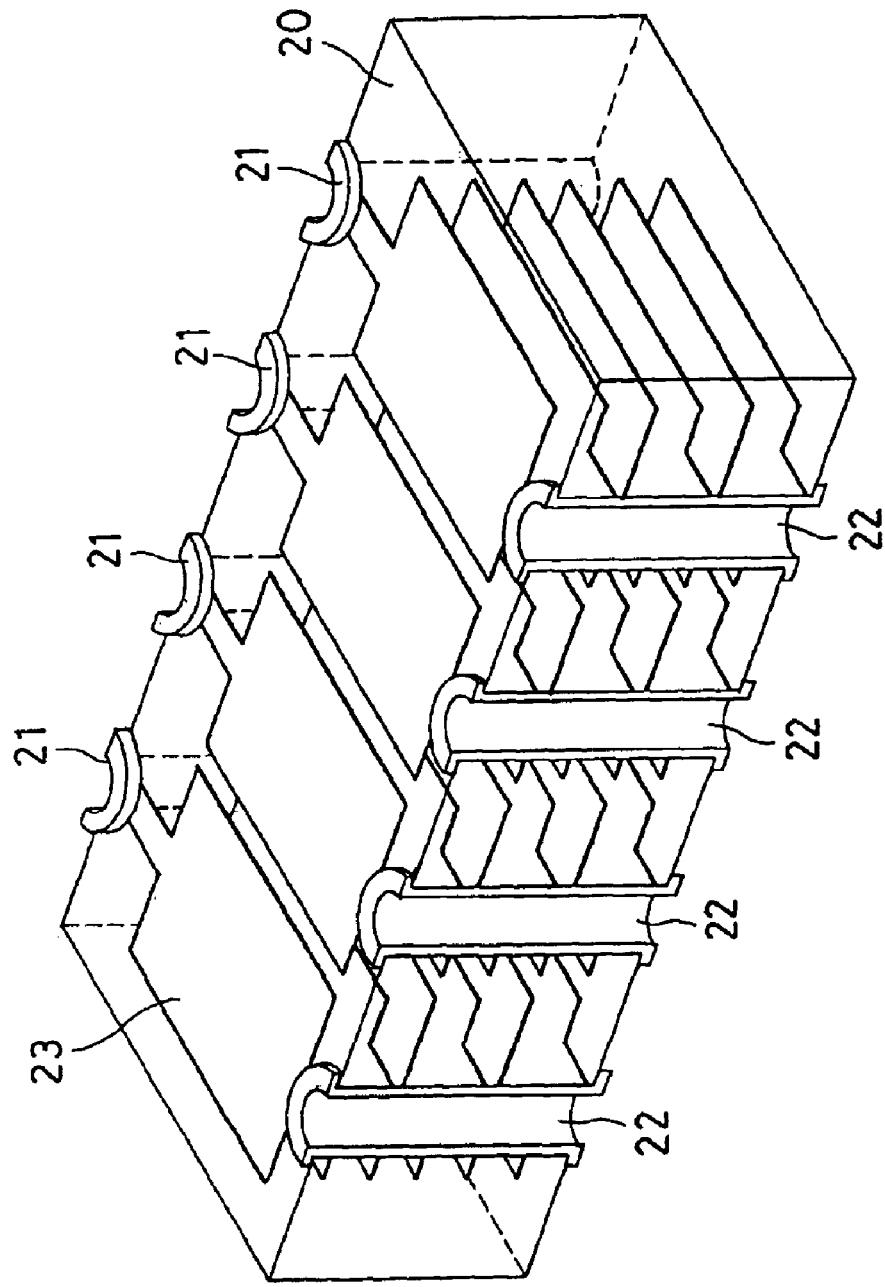
FIG. 35 illustrates a capacitor as another exemplary electronic part of the invention.

FIG. 35 is a see-through perspective view of a capacitor according to a further embodiment of the invention.

In this example, the single capacitor in Example 9-6 is changed to an array of four juxtaposed capacitors. When capacitors are formed in an array, it sometimes occurs to provide different capacitances at a high precision. To this end, the above-mentioned ranges of dielectric constant and dielectric dissipation factor are preferable. The remaining components are the same as in Example 9-6. The same components are designated by like numerals and their description is omitted. The equivalent circuit is shown in FIG. 36B. As shown in FIG. 36B, an electronic part (capacitor array) having four capacitors 32a to 32d is illustrated in the equivalent circuit.

Example 9-8

Figure 38:
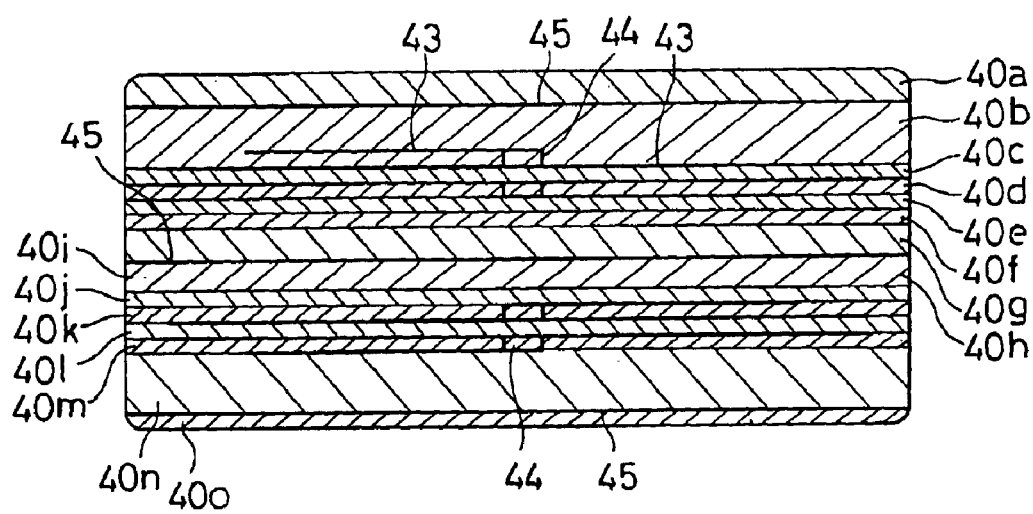
Figure 39:
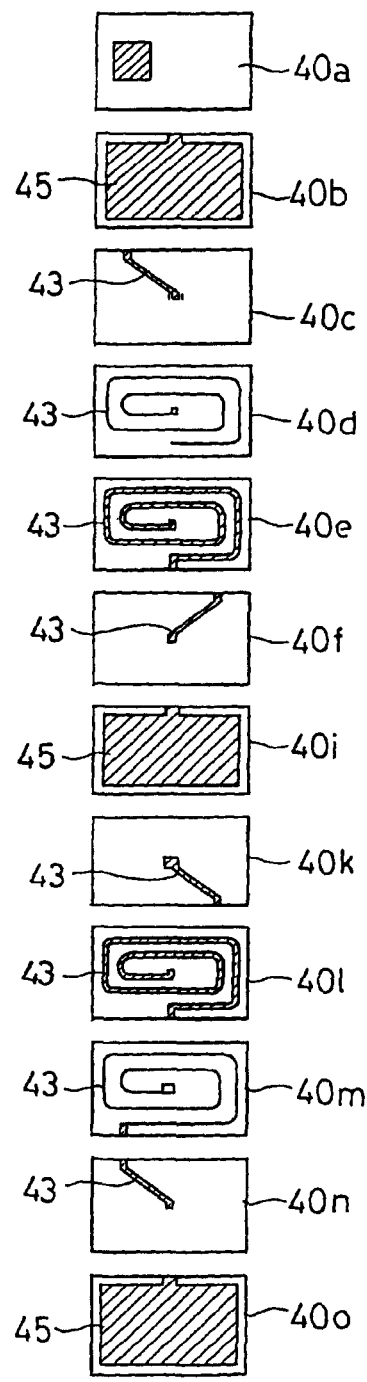
Figure 40:
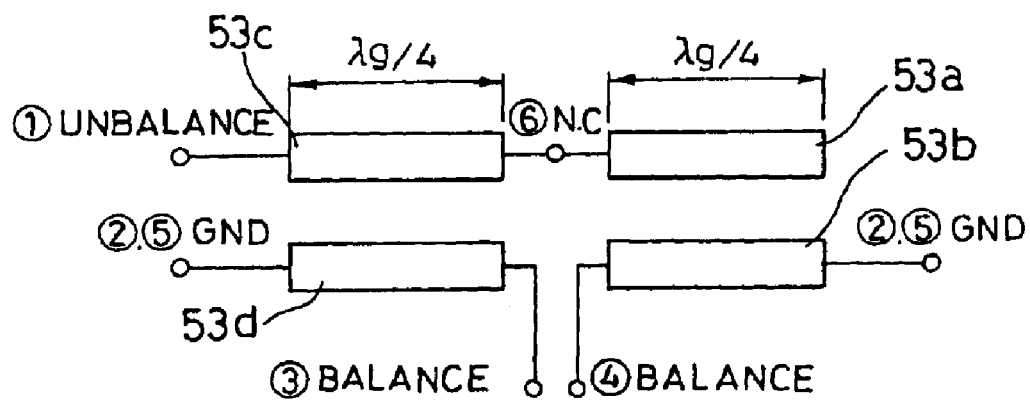
FIG. 40 is an equivalent circuit diagram of the balun transformer.

FIGS. 37 to 40 illustrate a balun transformer according to a further embodiment of the invention. FIG. 37 is a see-through perspective view, FIG. 38 is a cross-sectional view, FIG. 39 is an exploded plan view of respective constituent layers, and FIG. 40 is an equivalent circuit diagram.

In FIGS. 37 to 40, the balun transformer 40 includes a stack of constituent layers 40a to 40o, internal GND conductors 45 disposed above, below and intermediate the stack, and internal conductors 43 formed between the internal GND conductors 45. The internal conductors 43 are spiral conductor sections 43 having a length of $\lambda g/4$ which are connected by via holes 44 so as to construct coupling lines 53a to 53d as shown in the equivalent circuit of FIG. 40.

The constituent layers 40a to 40o of the balun transformer 40 should preferably have a dielectric constant of 2.6 to 40 and a dielectric dissipation factor (tan δ) of 0.0075 to 0.025. Then a choice may be made among the above-mentioned organic dielectric layers or the above-mentioned first and second composite dielectric layers. In some applications wherein a magnetic permeability of 3 to 20 is appropriate, use of the above-mentioned composite magnetic layers is preferred. The respective constituent layers may be identical or different and an optimum combination thereof may be selected.

Example 9-9

Figure 41:
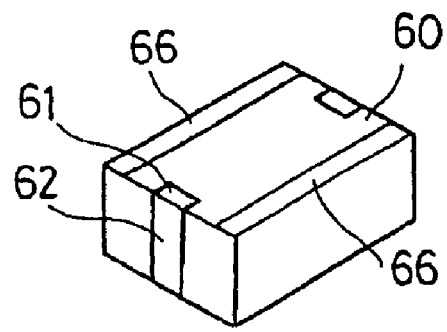
FIGS. 41 and 42 illustrate a multilayer filter as one exemplary electronic part of the invention.
Figure 42:
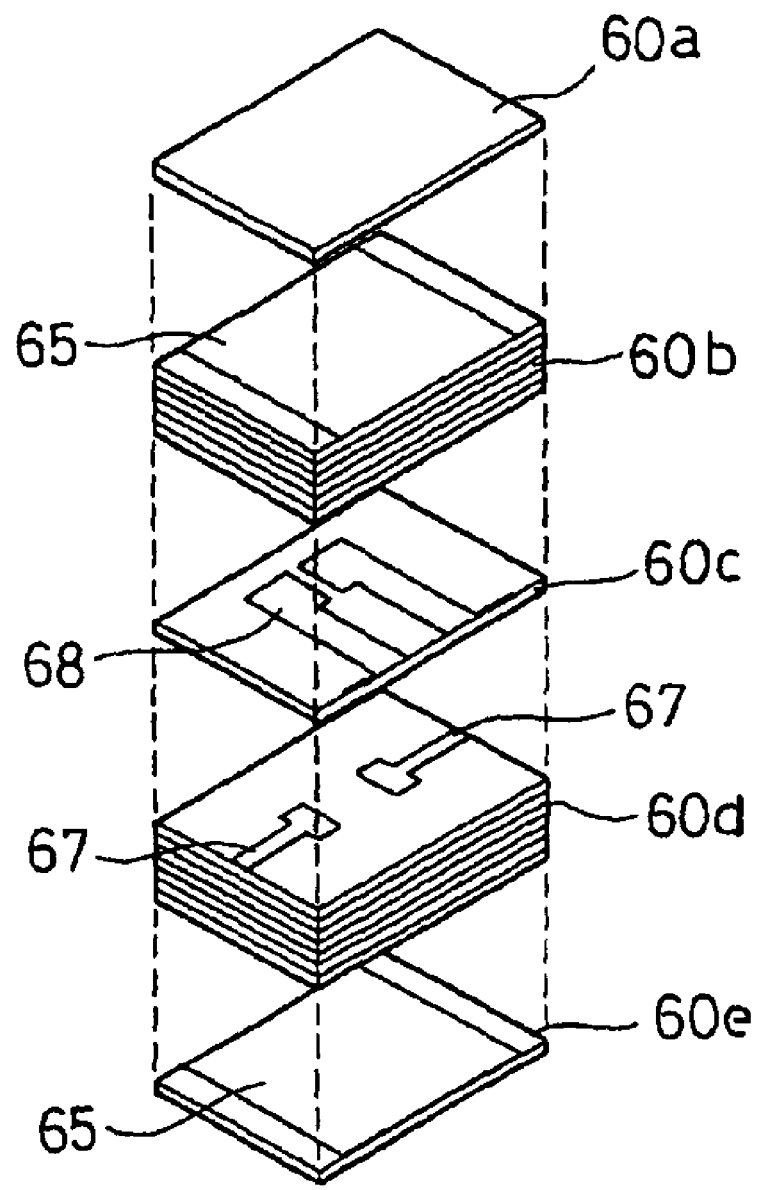
Figure 43:
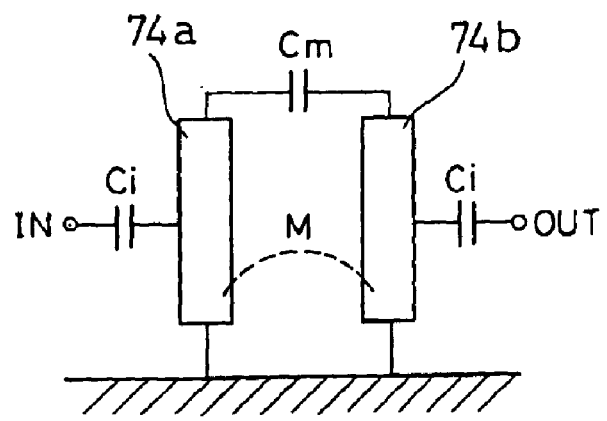
FIG. 43 is an equivalent circuit diagram of the multilayer filter.
Figure 44:
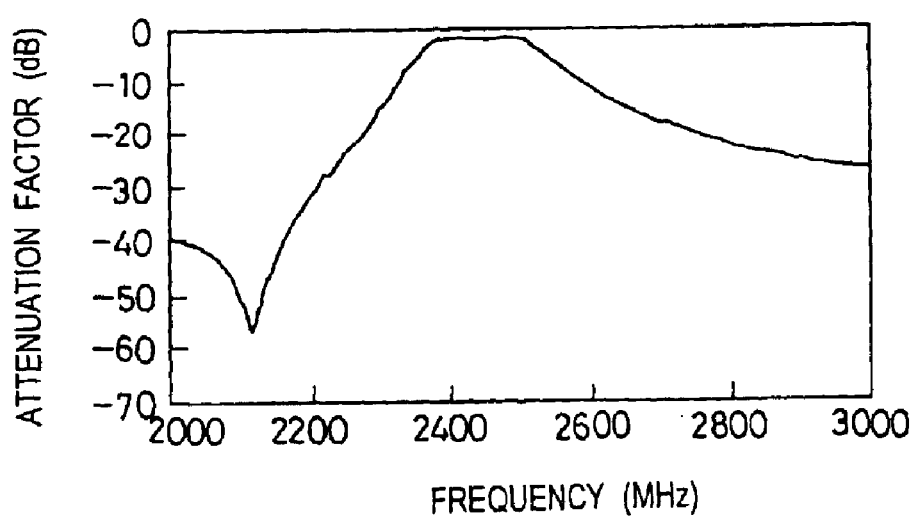
FIG. 44 is a graph showing transmission characteristics of the multilayer filter.

FIGS. 41 to 44 illustrate a multilayer filter according to a further embodiment of the invention. FIG. 41 is a perspective view, FIG. 42 is an exploded perspective view, FIG. 43 is an equivalent circuit diagram, and FIG. 44 is a transmission diagram. The multilayer filter is constructed as having two poles.

In FIGS. 41 to 44, the multilayer filter 60 includes a stack of constituent layers 60a to 60e, a pair of strip lines 68 and a pair of capacitor conductors 67 both disposed approximately at the center of the stack. The capacitor conductors 67 are formed on a lower constituent layer group 60d, and the strip lines 68 are formed on a constituent layer 60c thereon. GND conductors 65 are formed on upper and lower end surfaces of the constituent layers 60a to 60e so that the strip lines 68 and capacitor conductors 67 are interleaved therebetween. The strip lines 68, capacitor conductors 67 and GND conductors 65 are connected to end electrodes (external terminals) 62 formed on end sides and land patterns 61 formed slightly above or below the end electrodes 62. GND patterns 66 which are formed on opposite sides and slightly above or below therefrom are connected to GND conductors 65.

The strip lines 68 are strip lines 74a, 74b having a length of $\lambda g/4$ or shorter as shown in the equivalent circuit of FIG. 43. Each capacitor conductor 67 constitutes an input or output coupling capacitance Ci. The strip lines 74a and 74b are coupled by a coupling capacitance Cm and a coupling coefficient M. Such an equivalent circuit indicates the implementation of a multilayer filter having transmission characteristics of the two pole type as shown in FIG. 44.

The multilayer filter 60 exhibits desired transmission characteristics in a frequency band of several hundreds of megahertz to several gigahertz when the constituent layers 60a to 60e have a dielectric constant of 2.6 to 40. It is desired to minimize the material loss of the strip line resonator, and hence, setting a dielectric dissipation factor (tan δ) in the range of 0.0025 to 0.0075 is preferable. Then a choice may be made among the above-mentioned organic dielectric layers or the above-mentioned first and second composite dielectric layers. The respective constituent layers may be identical or different and an optimum combination thereof may be selected.

Example 9-10

Figure 45:
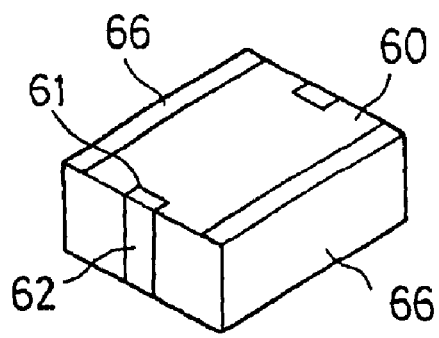
FIGS. 45 and 46 illustrate a multilayer filter as another exemplary electronic part of the invention.
Figure 46:
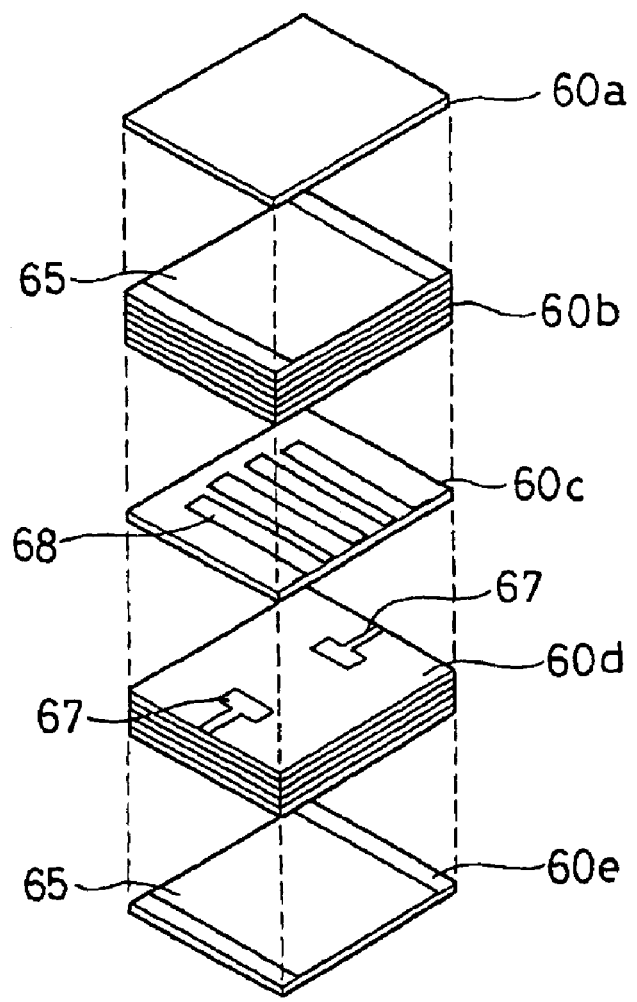
Figure 47:
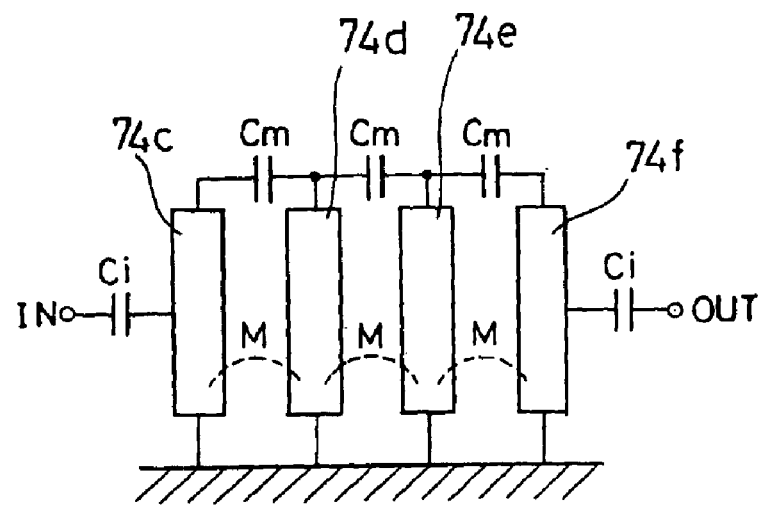
FIG. 47 is an equivalent circuit diagram of the multilayer filter.
Figure 48:
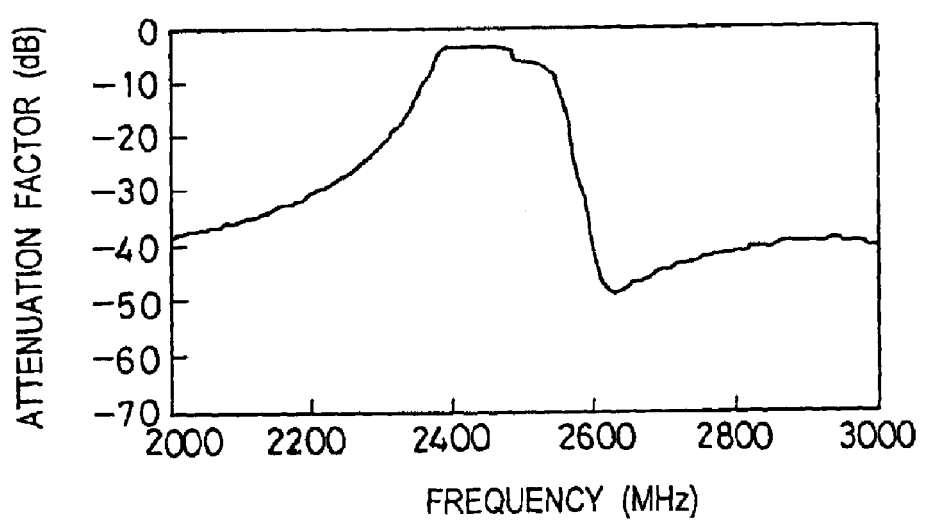
FIG. 48 is a graph showing transmission characteristics of the multilayer filter.

FIGS. 45 to 48 illustrate a multilayer filter according to a further embodiment of the invention. FIG. 45 is a perspective view, FIG. 46 is an exploded perspective view, FIG. 47 is an equivalent circuit diagram, and FIG. 48 is a transmission diagram. The multilayer filter is constructed as having four poles.

In FIGS. 45 to 48, the multilayer filter 60 includes a stack of constituent layers 60a to 60e, four strip lines 68 and a pair of capacitor conductors 67 both disposed approximately at the center of the stack. The remaining components are the same as in Example 9-9. The same components are designated by like numerals and their description is omitted.

Example 9-11

Figure 49:
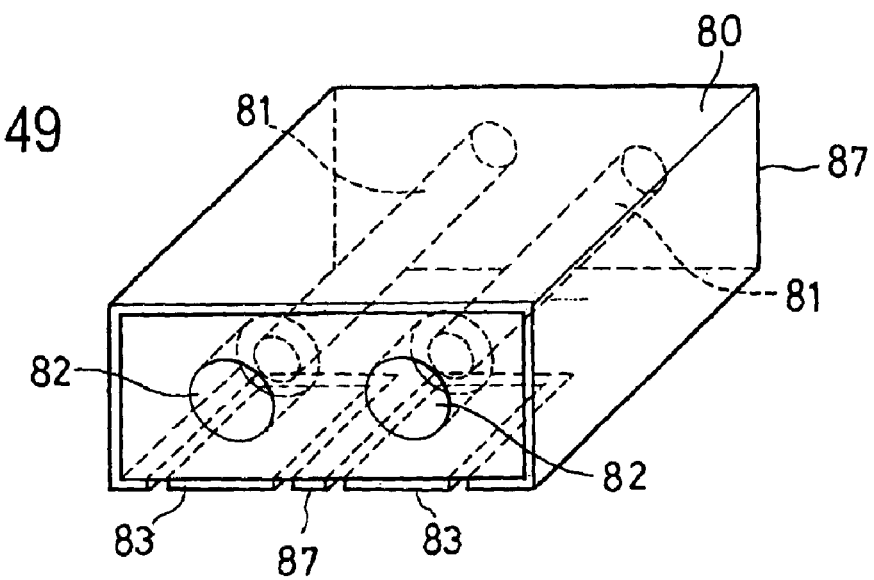
FIGS. 49 to 52 illustrate a block filter as another exemplary multilayer electronic part of the invention.
Figure 50:
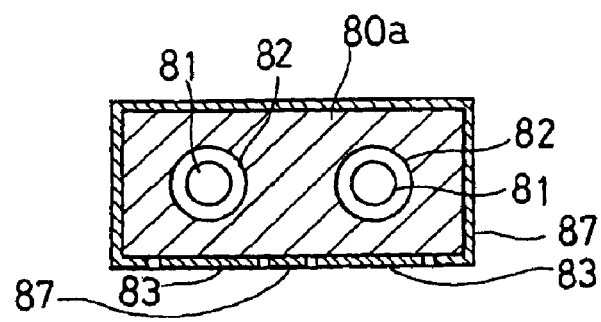
Figure 51:
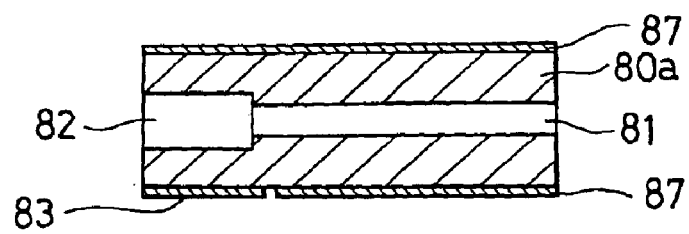
Figure 52:
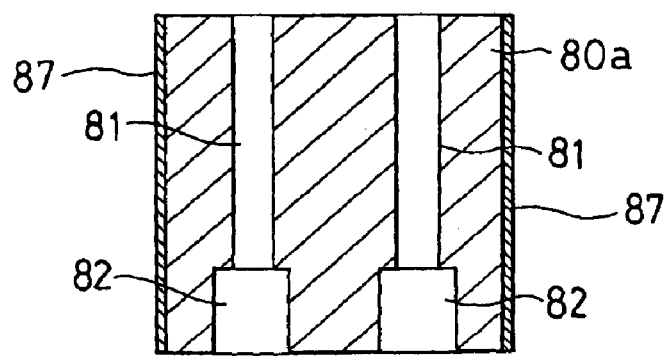
Figure 53:
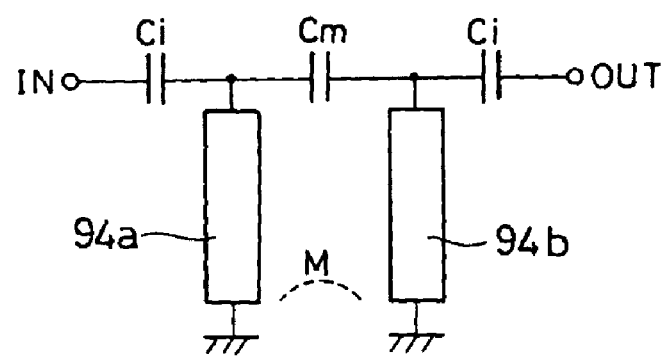
FIG. 53 is an equivalent circuit diagram of the block filter.
Figure 54:
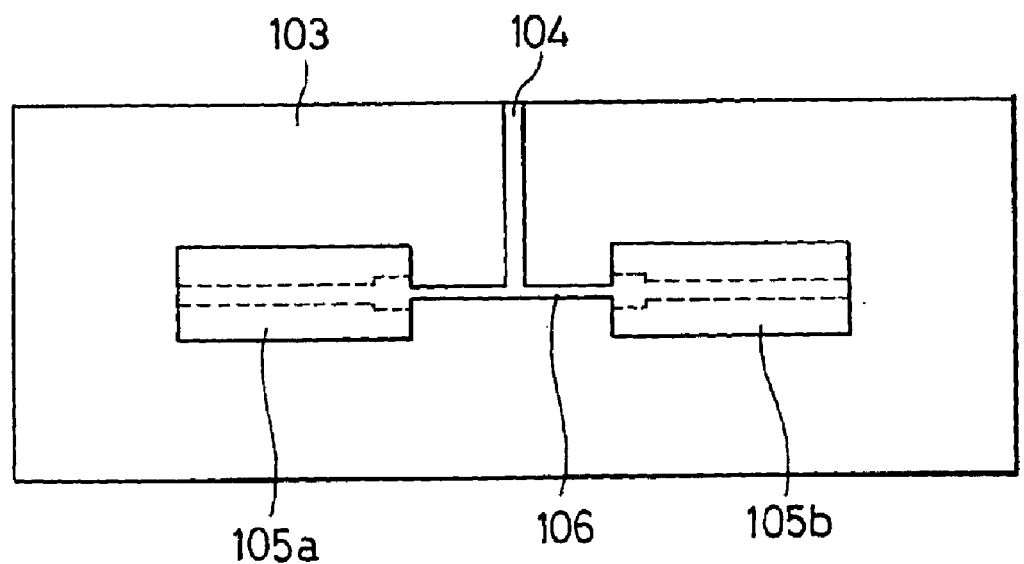
FIG. 54 is a schematic view of a mold for forming the block filter.

FIGS. 49 to 54 illustrate a block filter according to a further embodiment of the invention. FIG. 49 is a see-through perspective view, FIG. 50 is a front elevational view, FIG. 51 is a cross-sectional side view, FIG. 52 is a cross-sectional plan view, FIG. 53 is an equivalent circuit diagram of the block filter, and FIG. 54 is a see-through side view of a mold. The block filter is constructed as having two poles.

In FIGS. 49 to 54, the block filter 80 includes a constituent block 80a, a pair of coaxial conductors 81 and a pair of capacitor coaxial conductors 82 formed in the block 80a. The coaxial conductors 81 and capacitor coaxial conductors 82 are constructed by hollow conductors extending through the constituent block 80a. A surface GND conductor 87 is formed around the constituent block 80a so as to cover the block 80a. Capacitor conductors 83 are formed on the areas corresponding to the capacitor conductors 82. The capacitor conductors 83 and surface GND conductor 87 also serve as input/output terminals and part attachment terminals. It is to be noted that the coaxial conductors 81 and capacitor coaxial conductors 82 are formed by drilling bores through the constituent block 80a and applying a conductive material to the inside surface of the bores by electroless plating or evaporation.

The coaxial conductors 81 are coaxial lines 94a and 94b having a length of $\lambda g/4$ or shorter as shown in the equivalent circuit diagram of FIG. 53. The GND conductor 87 is formed so as to surround the coaxial conductors 81. The capacitor coaxial conductor 82 forms an input or output coupling capacitance Ci with the capacitor conductor 83. The coaxial conductors 81 are coupled with each other through a coupling capacitance Cm and a coupling coefficient M. This construction leads to an equivalent circuit as shown in FIG. 53, realizing a block filter having transfer characteristics of the two pole type.

FIG. 54 is a schematic cross section showing one exemplary mold for forming the constituent block 80a of the block filter 80. In the figure, the mold include a metal base 103 of iron or the like which is formed with a resin inlet sprue 104 and a runner 106. The composite dielectric material of which the constituent block 80a is formed is admitted in liquid state through the inlet sprue 104 and runner 106 to part-forming cavities 105a and 105b. With the mold internally filled with the composite dielectric material, cooling or heating treatment is carried out. After the composite dielectric material is solidified, it is taken out of the mold. Unnecessary portions which have cured in the runner and the like are cut off. In this way, the constituent block 80a as shown in FIGS. 49 to 52 is formed.

On the thus formed constituent block 80a, the surface GND conductor 87, coaxial conductors 81 and capacitor coaxial conductors 82 are formed from copper, gold, palladium, platinum or aluminum by carrying out suitable treatments such as plating, etching, printing, sputtering and evaporation.

The block filter 80 exhibits desired transmission characteristics in the band of several hundreds of megahertz to several gigahertz when the constituent block 80a has a dielectric constant of 2.6 to 40. It is also desired to minimize the material loss of a coaxial resonator and hence, setting a dielectric dissipation factor (tan δ) in the range of 0.0025 to 0.0075 is preferable. Then a choice may be made among the above-mentioned organic dielectric layers or the above-mentioned first and second composite dielectric layers.

Example 9-12

Figure 55:
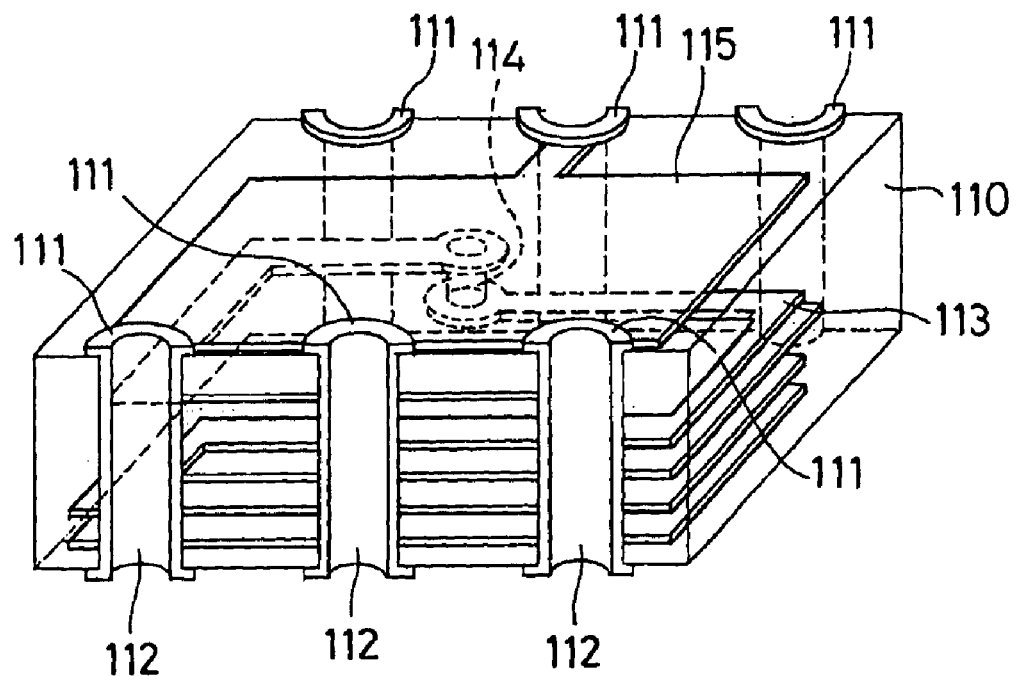
FIGS. 55 to 57 illustrate a coupler as one exemplary electronic part of the invention.
Figure 56:
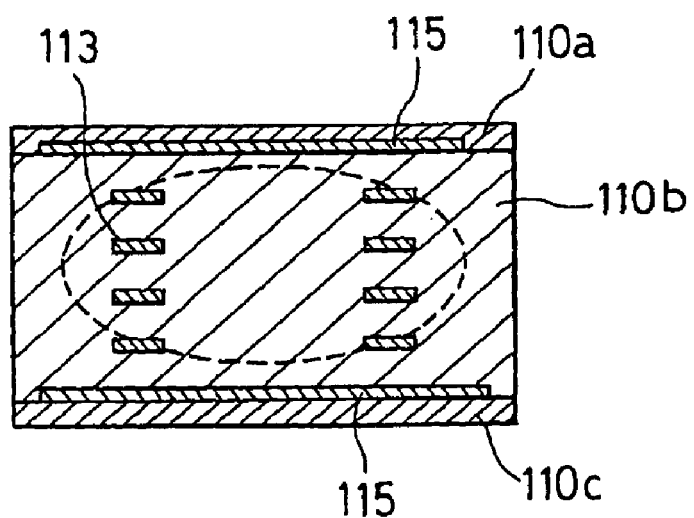
Figure 57:
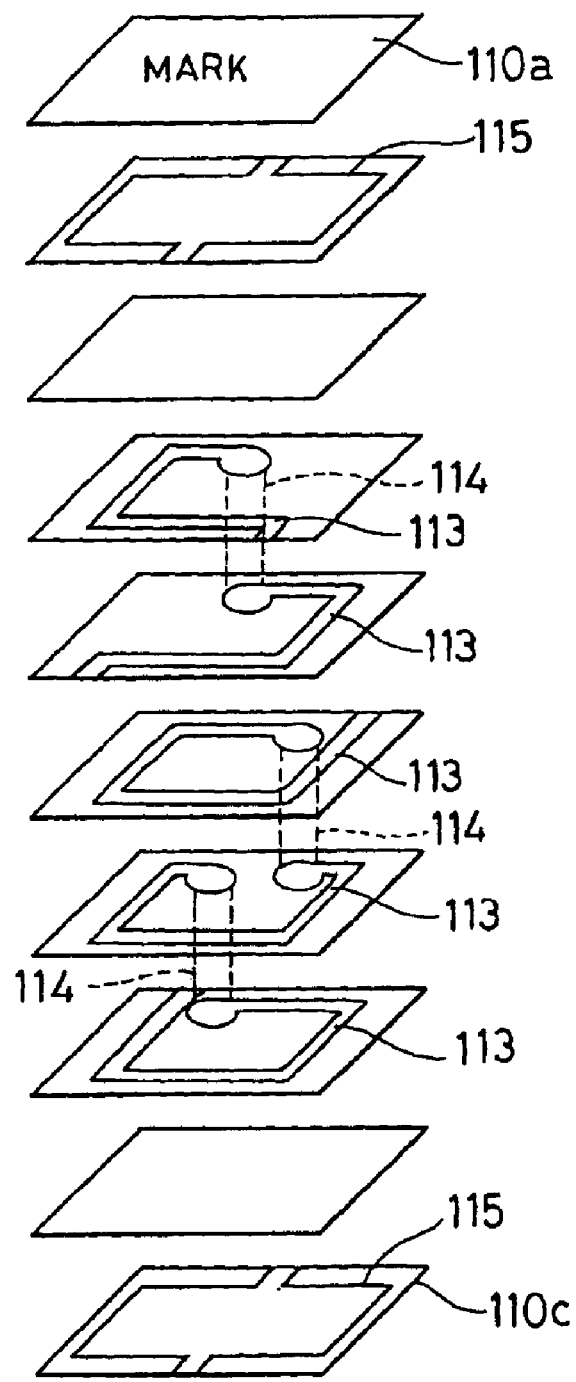
Figure 58:
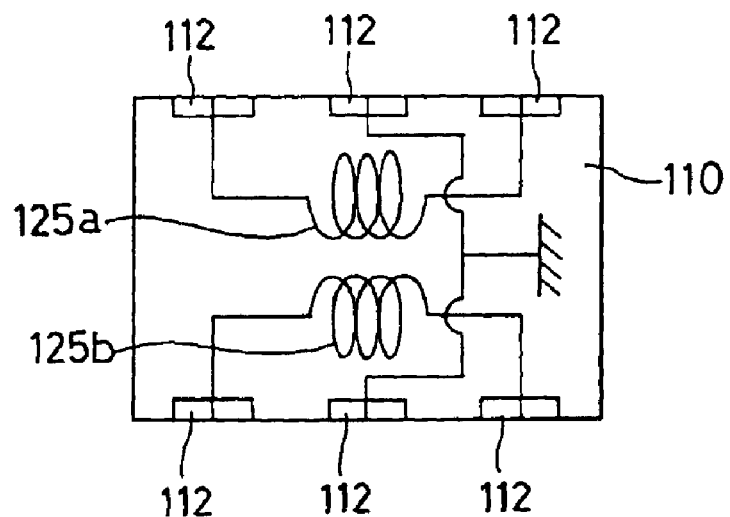
FIG. 58 illustrates the internal connections of the coupler.
Figure 59:
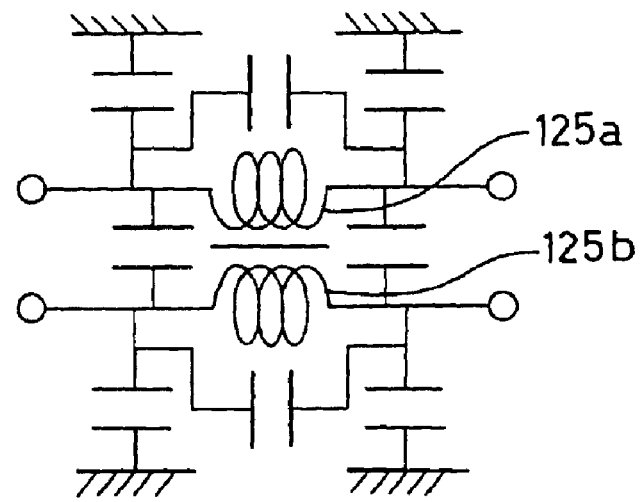
FIG. 59 is an equivalent circuit diagram of the coupler.

FIGS. 55 to 59 illustrate a coupler according to an further embodiment of the invention. FIG. 55 is a perspective view, FIG. 56 is a cross-sectional view, FIG. 57 is an exploded perspective view of respective constituent layers, FIG. 58 is a diagram of internal connection, and FIG. 59 is an equivalent circuit diagram.

In FIGS. 55 to 59, the coupler 110 includes a stack of constituent layers 110a to 110c, internal GND conductors 115 formed and disposed on the top and bottom of the stack, and internal conductors 113 formed between the internal GND conductors 115. The internal conductors 113 are connected by via holes 114 in a spiral fashion so that two coils construct a transformer. Ends of the thus formed coils and internal GND conductors 115 are connected to through-vias 112 formed on end sides and land patterns 111 formed slightly above or below the through-vias 112 as shown in FIG. 58. With the above construction, a coupler 110 having two coils 125a and 125b coupled is obtained as shown in the equivalent circuit diagram of FIG. 59.

Where a wide band is to be realized, the constituent layers 110a to 110c of the coupler 110 should preferably have a minimized dielectric constant. For size reduction, on the other hand, a higher dielectric constant is desirable. Therefore, depending on the intended application, required performance and specifications, a material having an appropriate dielectric constant may be used. In most cases, setting a dielectric constant in the range of 2.6 to 40 ensures desired transmission characteristics in a band of several hundreds of megahertz to several gigahertz. For increasing the Q value of an internal inductor, a dielectric dissipation factor (tan δ) of 0.0025 to 0.0075 is preferable. This choice enables to form an inductor having a minimized material loss and a high Q value, leading to a high performance coupler. Then a choice may be made among the above-mentioned organic dielectric layers or the above-mentioned first and second composite dielectric layers. The respective constituent layers may be identical or different and an optimum combination thereof may be selected.

Example 9-13

Figure 62:
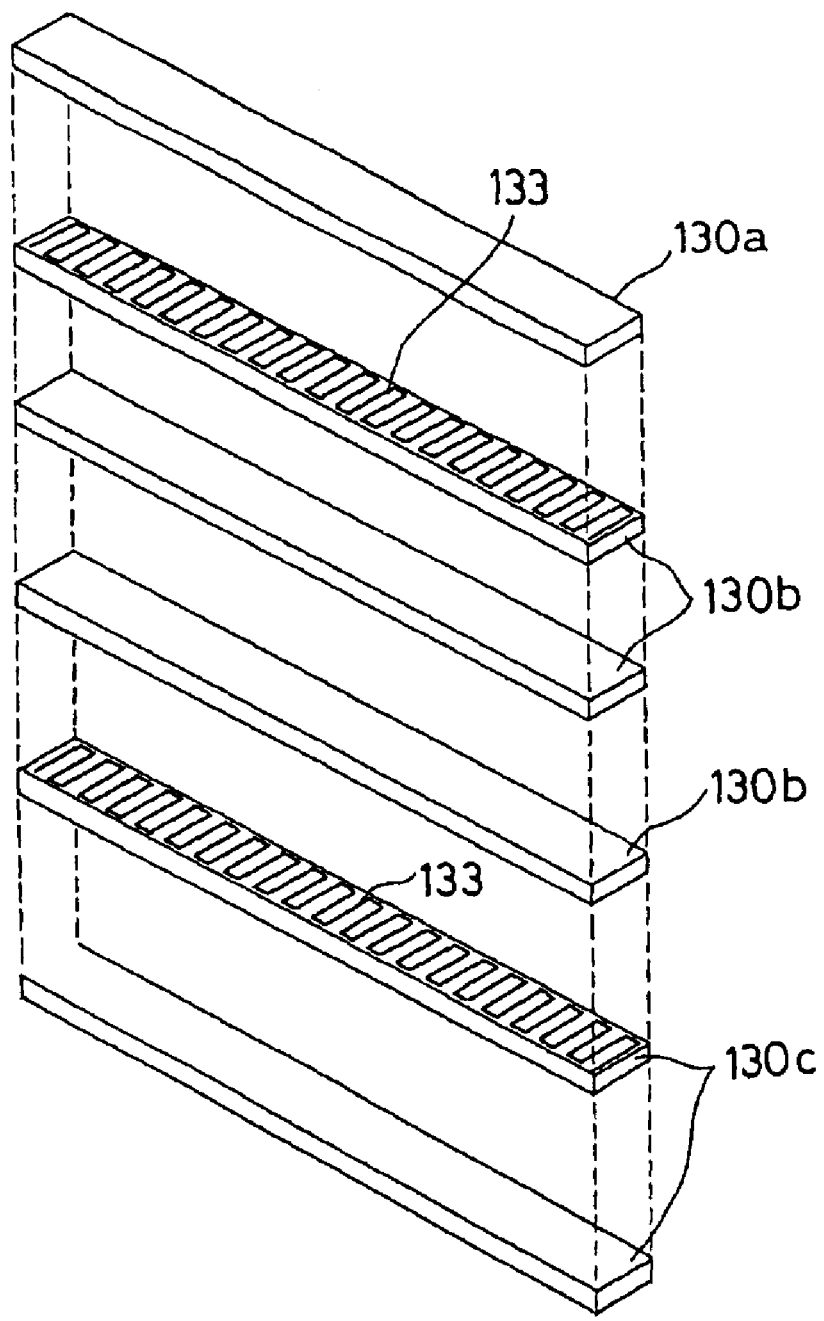

FIGS. 60 to 62 illustrate an antenna according to a further embodiment of the invention. FIG. 60 is a see-through perspective view, FIG. 61A is a plan view, FIG. 61B is a cross-sectional elevational view, FIG. 61C is a cross-sectional end view, and FIG. 62 is an exploded perspective view of respective constituent layers.

In FIGS. 60 to 62, the antenna 130 includes a stack of constituent layers (prepregs or substrates) 130a to 130c containing the inventive resin, and internal conductors (antenna patterns) 133 formed on constituent layers 130b and 130c. Ends of the internal conductors 133 are connected to through-vias 132 formed at end sides of the antenna and land patterns 131 formed slightly above and below the through-vias 132. In this example, the internal conductor 133 is constructed as a reactance element having a length of about λg/4 at the operating frequency and formed in a meander fashion.

Where a wide band is to be realized, the constituent layers 130a to 130c of the antenna 130 should preferably have a minimized dielectric constant. For size reduction, on the other hand, a higher dielectric constant is desirable. Therefore, depending on the intended application, required performance and specifications, a material having an appropriate dielectric constant may be used. In most cases, a dielectric constant in the range of 2.6 to 40 and a dielectric dissipation factor (tan δ) of 0.0075 to 0.025 are preferable. Then a choice may be made among the above-mentioned organic dielectric layers or the above-mentioned first and second composite dielectric layers. This choice enables to spread the frequency range and increase the precision of formation. It is also necessary to minimize the material loss. By setting a dielectric dissipation factor (tan δ) of 0.0025 to 0.0075, an antenna having a minimum material loss is achievable. In another application, it is preferable to have a magnetic permeability of 3 to 20, and a choice may be made of the above-mentioned composite magnetic layers. The respective constituent layers may be identical or different and an optimum combination thereof may be selected.

Example 9-14

Figure 63:
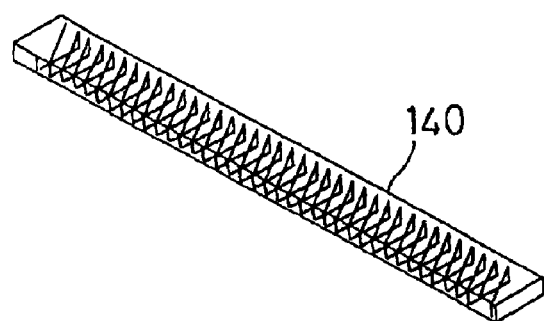
FIGS. 63 and 64 illustrate an antenna as another exemplary electronic part of the invention.
Figure 64:
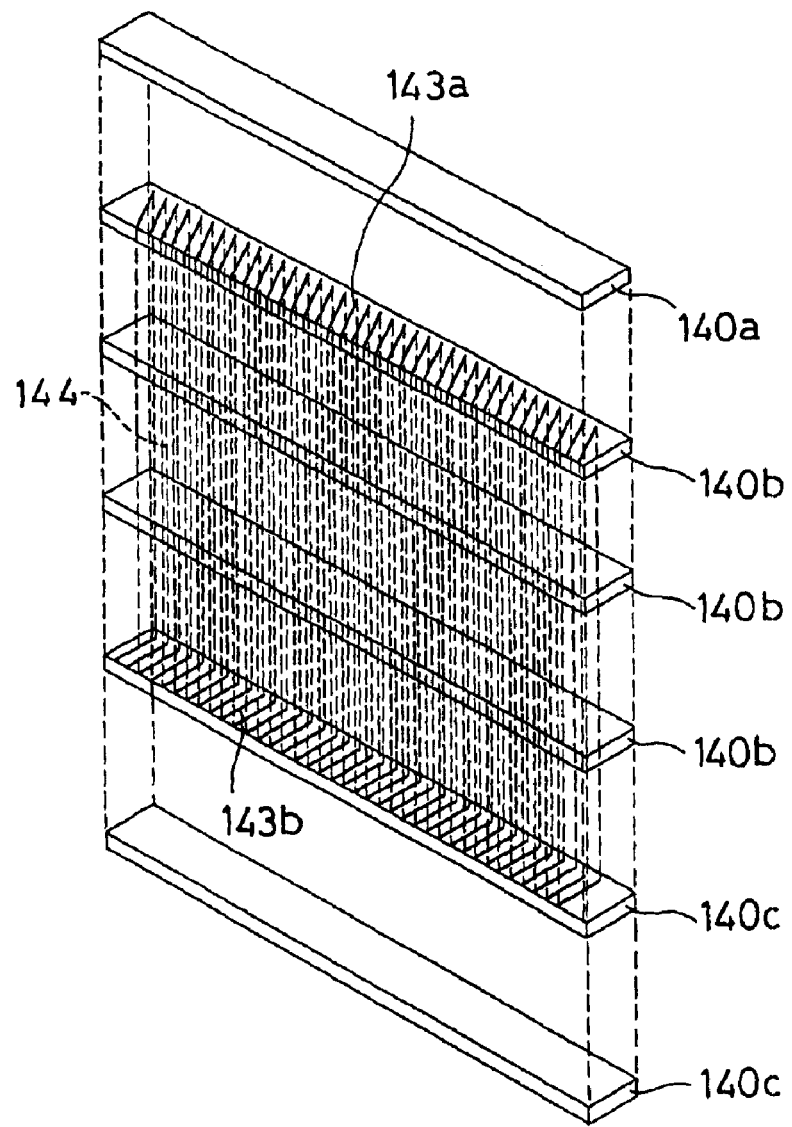

FIGS. 63 and 64 illustrate an antenna according to a further embodiment of the invention. FIG. 63 is a see-through perspective view, and FIG. 64 is an exploded perspective view of respective constituent layers. The antenna in this example is constructed as an antenna having a helical internal electrode.

In FIGS. 63 and 64, the antenna 140 includes a stack of constituent layers (prepregs or substrates) 140a to 140c containing the inventive resin, and internal conductors (antenna patterns) 143a, 143b formed on constituent layers 140b and 140c. The upper and lower internal conductors 143a and 143b are connected by via holes 144 to form a helical inductance device. The remaining components are the same as in Example 9-13. The same components are designated by like numerals and their description is omitted.

Example 9-15

Figure 65:
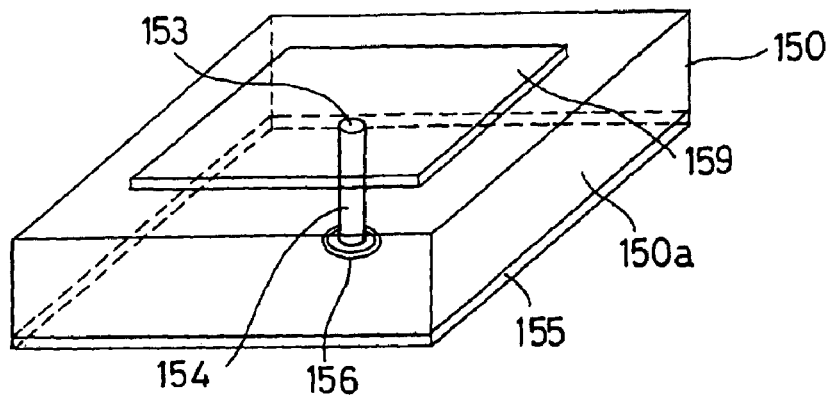
FIGS. 65 and 66 illustrate a patch antenna as one exemplary electronic part of the invention.
Figure 66:
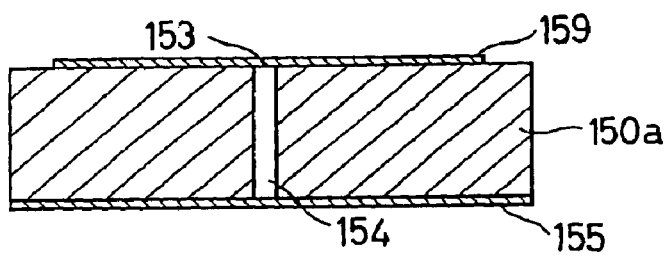

FIGS. 65 and 66 illustrate a patch antenna according to a further embodiment of the invention. FIG. 65 is a see-through perspective view, and FIG. 66 is a cross-sectional view.

In FIGS. 65 and 66, the patch antenna 150 includes a constituent layer (prepreg or substrate) 150a of the inventive composite resin, a patch conductor (antenna pattern) 159 formed on the top of constituent layer 150a, and a GND conductor 155 formed on the bottom of constituent layer 150a so as to oppose to the patch conductor 159. A power supply through conductor 154 is connected to the patch conductor 159 at a power supply site 153. An annular gap 156 is provided between the through conductor 154 and the GND conductor 155 so that the through conductor 154 may not be connected to the GND conductor 155. Then power supply is provided from below the GND conductor 155 via the through conductor 154.

Where a wide band is to be realized, the constituent layer 150a of the patch antenna 150 should preferably have a minimized dielectric constant. For size reduction, on the other hand, a higher dielectric constant is desirable. Therefore, depending on the intended application, required performance and specifications, a material having an appropriate dielectric constant may be used. In most cases, a dielectric constant in the range of 2.6 to 40 and a dielectric dissipation factor (tan δ) of 0.0075 to 0.025 are preferable. Then a choice may be made among the above-mentioned organic dielectric layers or the above-mentioned first and second composite dielectric layers. This choice enables to spread the frequency range and increase the precision of formation. It is also necessary to minimize the material loss. By setting a dielectric dissipation factor (tan δ) of 0.0025 to 0.0075, an antenna having a minimum material loss and a high radiation efficiency is achievable.

In a frequency band of less than several hundreds of megahertz, a magnetic material exerts a wavelength reducing effect as a dielectric material does, which enables to increase the inductance of a radiation element. By matching the frequency peak of Q, a high Q value is available even at a relatively low frequency. Then a magnetic permeability of 3 to 20 is preferable in some applications and use of the above-mentioned composite magnetic layers is preferred. This enables performance improvement and size reduction in a frequency band of less than several hundreds of megahertz. The respective constituent layers may be identical or different and an optimum combination thereof may be selected.

Example 9-16

Figure 67:
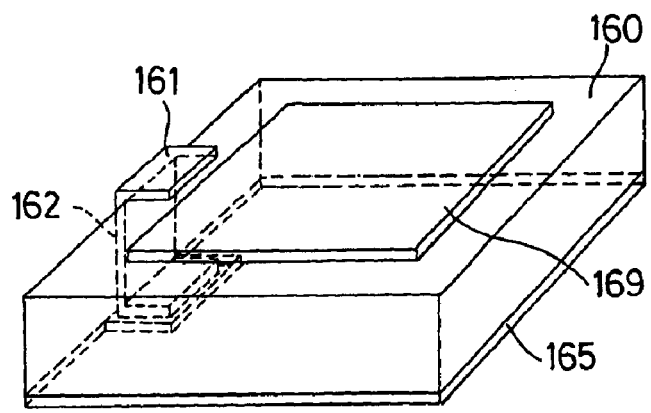
FIGS. 67 and 68 illustrate a patch antenna as another exemplary electronic part of the invention.
Figure 68:
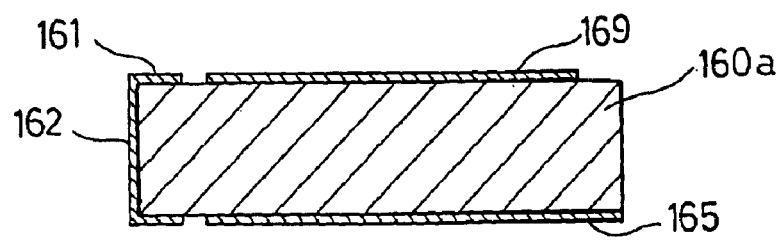

FIGS. 67 and 68 illustrate a patch antenna according to a further embodiment of the invention. FIG. 67 is a see-through perspective view, and FIG. 68 is a cross-sectional view.

In FIGS. 67 and 68, the patch antenna 160 includes a constituent layer (prepreg or substrate) 160a of the inventive composite resin, a patch conductor (antenna pattern) 169 formed on the top of constituent layer 160a, and a GND conductor 165 formed on the bottom of constituent layer 160a so as to oppose to the patch conductor 169. A power supply conductor 161 is provided near the patch conductor 169, but spaced therefrom. Power supply is provided to the power supply conductor 161 via a power supply terminal 162. The power supply terminal 162 may be formed from copper, gold, palladium, platinum, aluminum or the like by effecting suitable treatment such as plating, termination, printing, sputtering or evaporation. The remaining components are the same as in Example 9-15. The same components are designated by like numerals and their description is omitted.

Example 9-17

Figure 69:
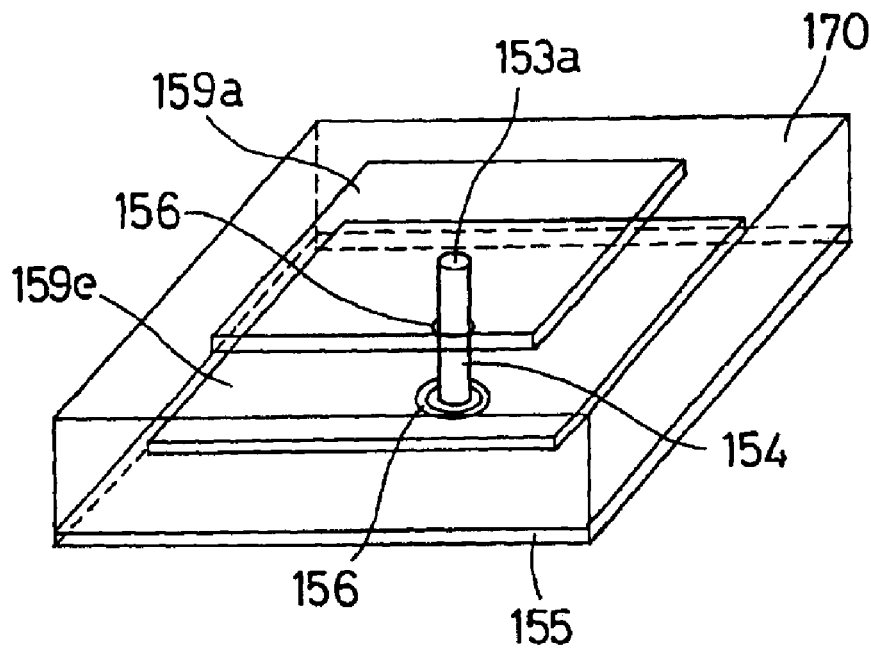
FIGS. 69 and 70 illustrate a patch antenna as a further exemplary electronic part of the invention.
Figure 70:
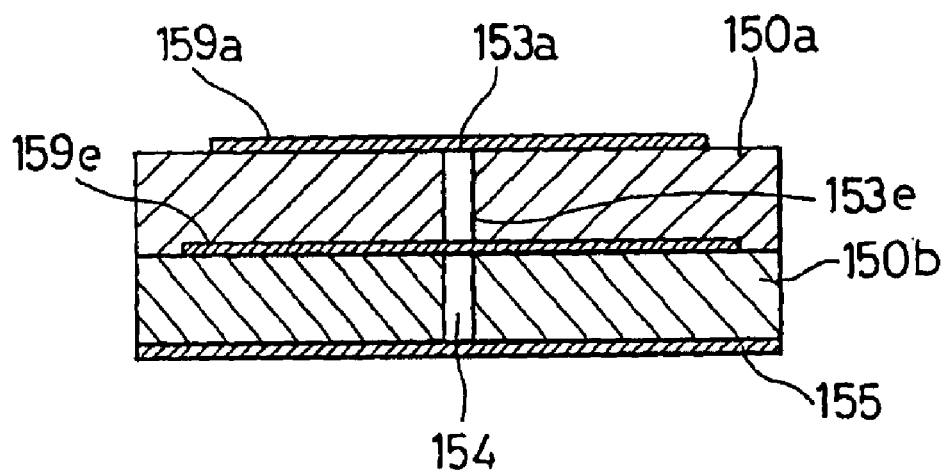

FIGS. 69 and 70 illustrate a multilayer patch antenna according to a further embodiment of the invention. FIG. 69 is a see-through perspective view, and FIG. 70 is a cross-sectional view.

In FIGS. 69 and 70, the patch antenna 170 includes constituent layers (prepregs or substrates) 150a, 150b of the inventive composite resin, patch conductors 159a, 159e formed on the constituent layers 150a, 150b, and a GND conductor 155 formed on the bottom of constituent layer 150b so as to oppose to the patch conductors 159a, 159e. A power supply through conductor 154 is connected to the patch conductor 159a at a power supply site 153a. A gap 156 is provided between the through conductor 154 and the GND conductor 155 and patch conductor 159e so that the through conductor 154 may not be connected to the GND conductor 155 and patch conductor 159e. Then power supply is provided to the patch conductor 159a from below the GND conductor 155 via the through conductor 154. At this point, power supply is provided to the patch conductor 159e by the capacitive coupling with the patch conductor 159a and the capacitance due to the gap with the through conductor 154. The remaining components are the same as in Example 9-15. The same components are designated by like numerals and their description is omitted.

Example 9-18

Figure 71:
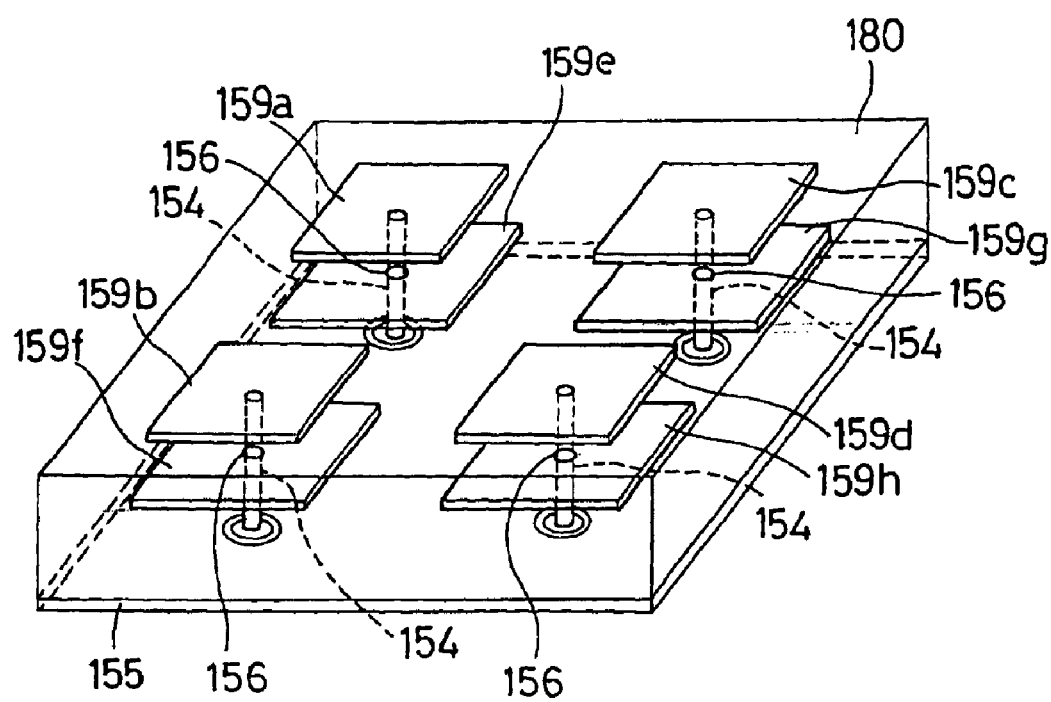
FIGS. 71 and 72 illustrate a patch antenna as a still further exemplary electronic part of the invention.
Figure 72:
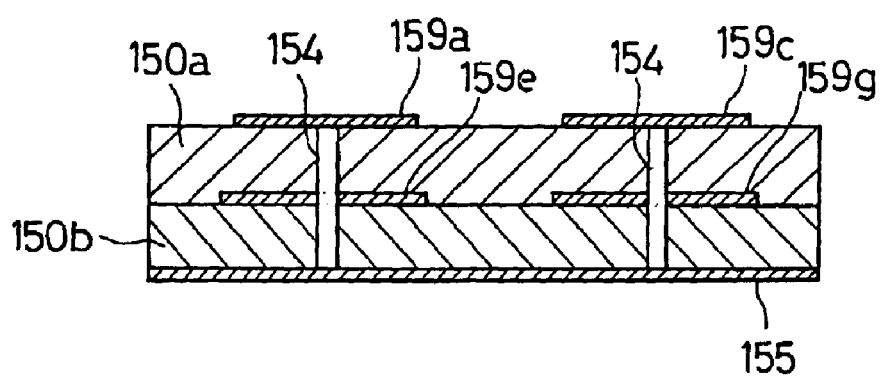

FIGS. 71 and 72 illustrate a multi-array patch antenna according to a further embodiment of the invention. FIG. 71 is a see-through perspective view, and FIG. 72 is a cross-sectional view.

As opposed to Example 9-17 in which the patch antenna is constructed singly, four patch antennas are arranged in an array in this example. In FIGS. 71 and 72, the array includes constituent layers 150a, 150b of the inventive composite resin materials, patch conductors 159a, 159b, 159c, 159d formed on the constituent layer 150a, patch conductors 159e, 159f, 159g, 159h formed on the constituent layer 150b, and a GND conductor 155 formed on the bottom of the constituent layer 150b so as to oppose to the patch conductors 159a, 159e. The remaining components are the same as in Example 9-17. The same components are designated by like numerals and their description is omitted.

The array formation enables to reduce the size of a set and the number of parts.

Example 9-19

Figure 73:
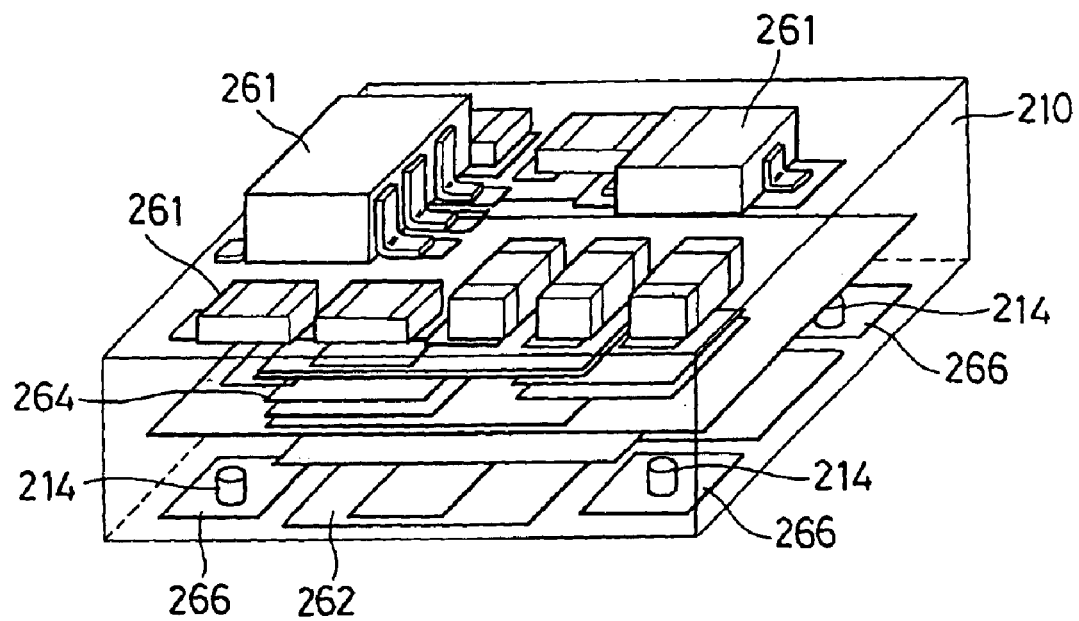
FIGS. 73 and 74 illustrate a VCO as one exemplary electronic part of the invention.
Figure 74:
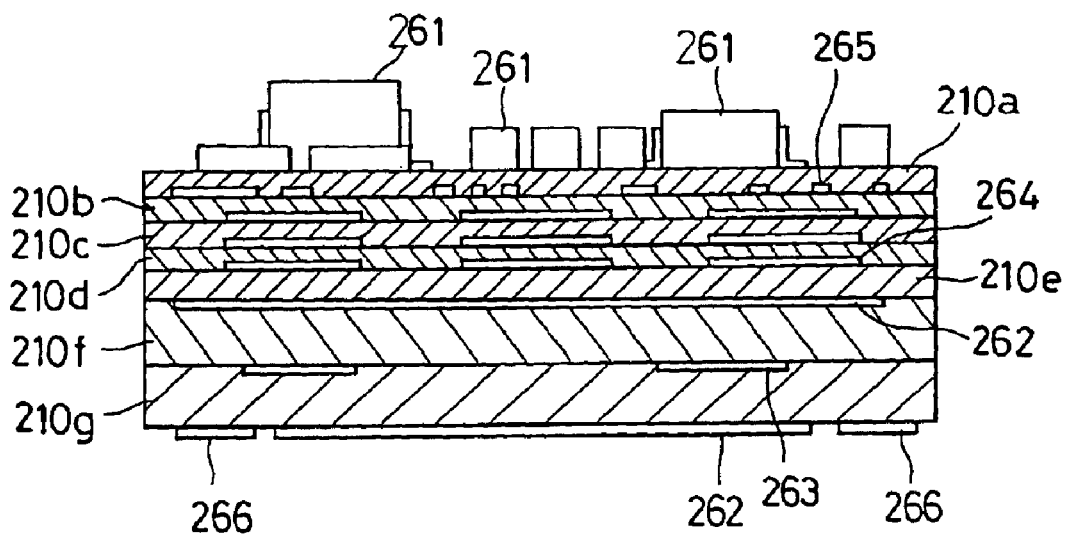
Figure 75:
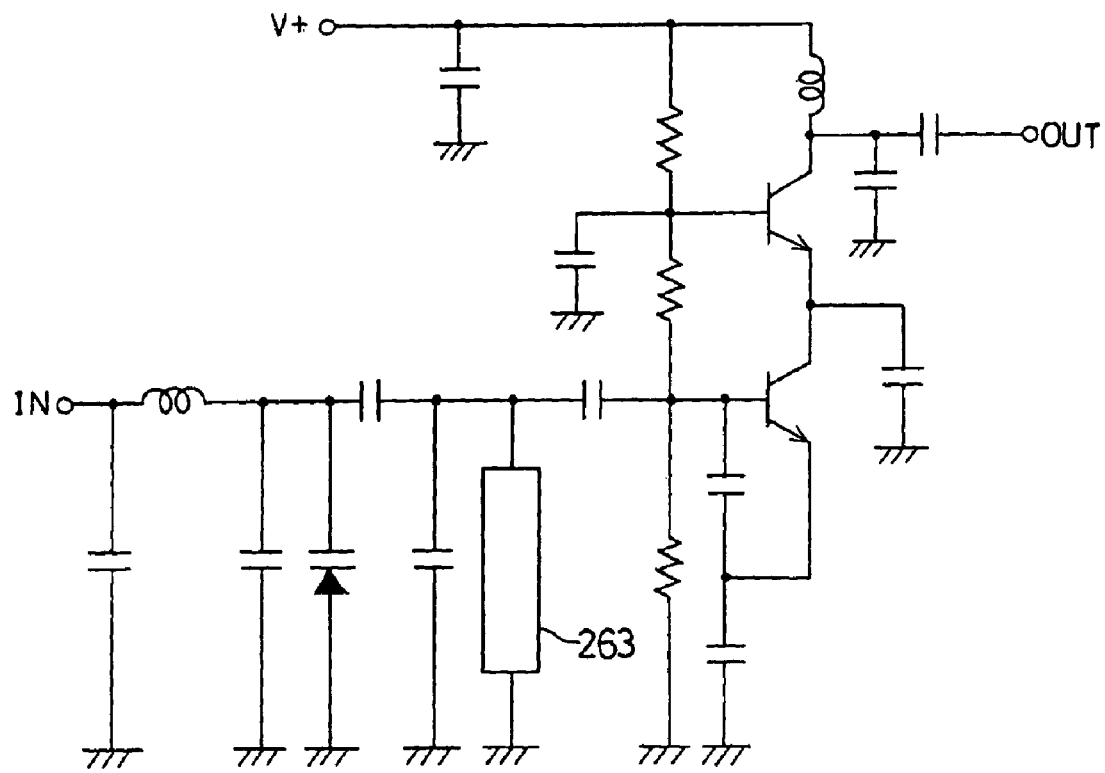
FIG. 75 is an equivalent circuit diagram of the VCO.

FIGS. 73 to 75 illustrate a voltage controlled oscillator (VCO) according to a further embodiment of the invention. FIG. 73 is a see-through perspective view, FIG. 74 is a cross-sectional view, and FIG. 75 is an equivalent circuit diagram.

In FIGS. 73 to 75, the VCO includes a stack of constituent layers 210a to 210g of composite resin materials, electronic parts 261 disposed and formed on the stack including capacitors, inductors, semiconductors and registers, and conductor patterns 262, 263, 264 formed above, below and intermediate the constituent layers 210a to 210g. Since the VCO is constructed to an equivalent circuit as shown in FIG. 75, it further includes strip lines 263, capacitors, signal lines, semiconductors and power supply lines. It is advantageous to form the respective constituent layers from materials selected appropriate for their function.

For the constituent layers 210f, 210g constructing a resonator in this example, it is preferred to use organic dielectric layers or first or second composite dielectric layers having a dielectric dissipation factor of 0.0025 to 0.0075. For the constituent layers 210c to 210e constructing a capacitor, it is preferred to use first or second composite dielectric layers so as to give a dielectric dissipation factor of 0.0075 to 0.025 and a dielectric constant of 5 to 40. For the constituent layers 210a, 210b constructing wiring and an inductor, it is preferred to use organic dielectric layers having a dielectric dissipation factor of 0.0025 to 0.0075 and a dielectric constant of 2.6 to 3.5.

On the surface of constituent layers 210a to 210g, there are provided internal conductors including strip line 263, GND conductor 262, capacitor conductor 264, wiring inductor conductor 265 and terminal conductor 266. Upper and lower internal conductors are connected by via holes 214. Electronic parts 261 are mounted on the surface, completing a VCO corresponding to the equivalent circuit of FIG. 75.

This construction enables to provide an appropriate dielectric constant, Q and dielectric dissipation factor for a distinct function, arriving at a high performance, small size, and thin part.

Example 9-20

Figure 76:
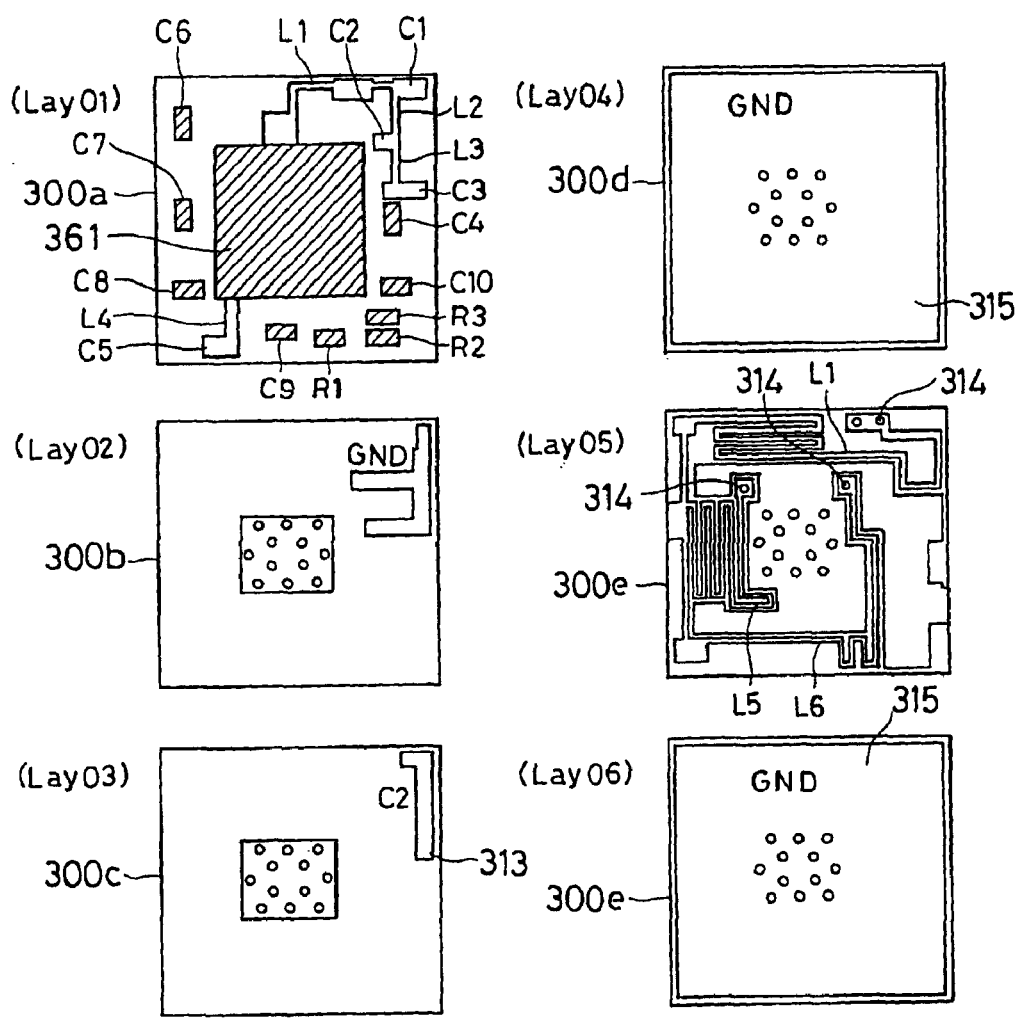
FIGS. 76 and 77 illustrate a power amplifier as one exemplary electronic part of the invention.
Figure 77:
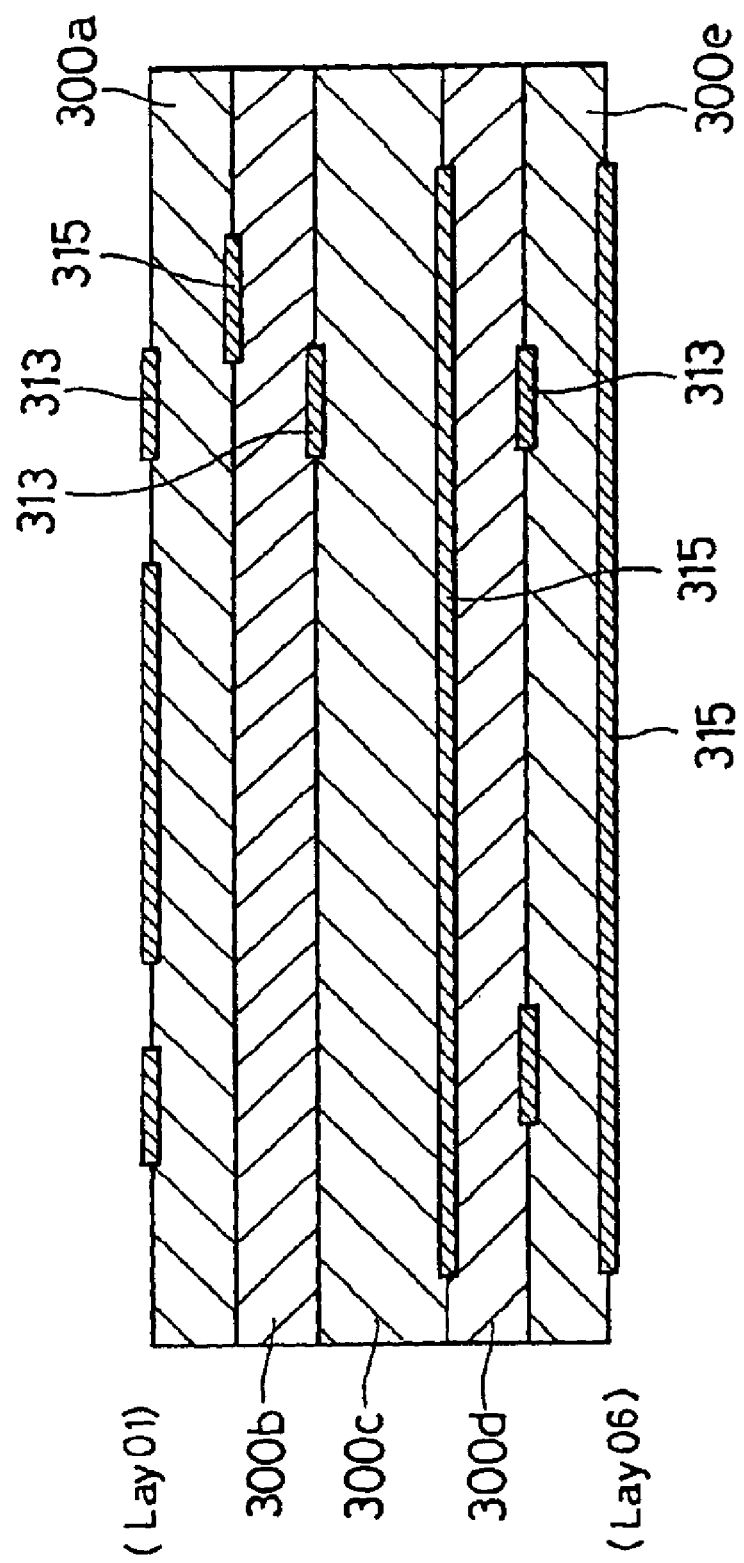
Figure 78:
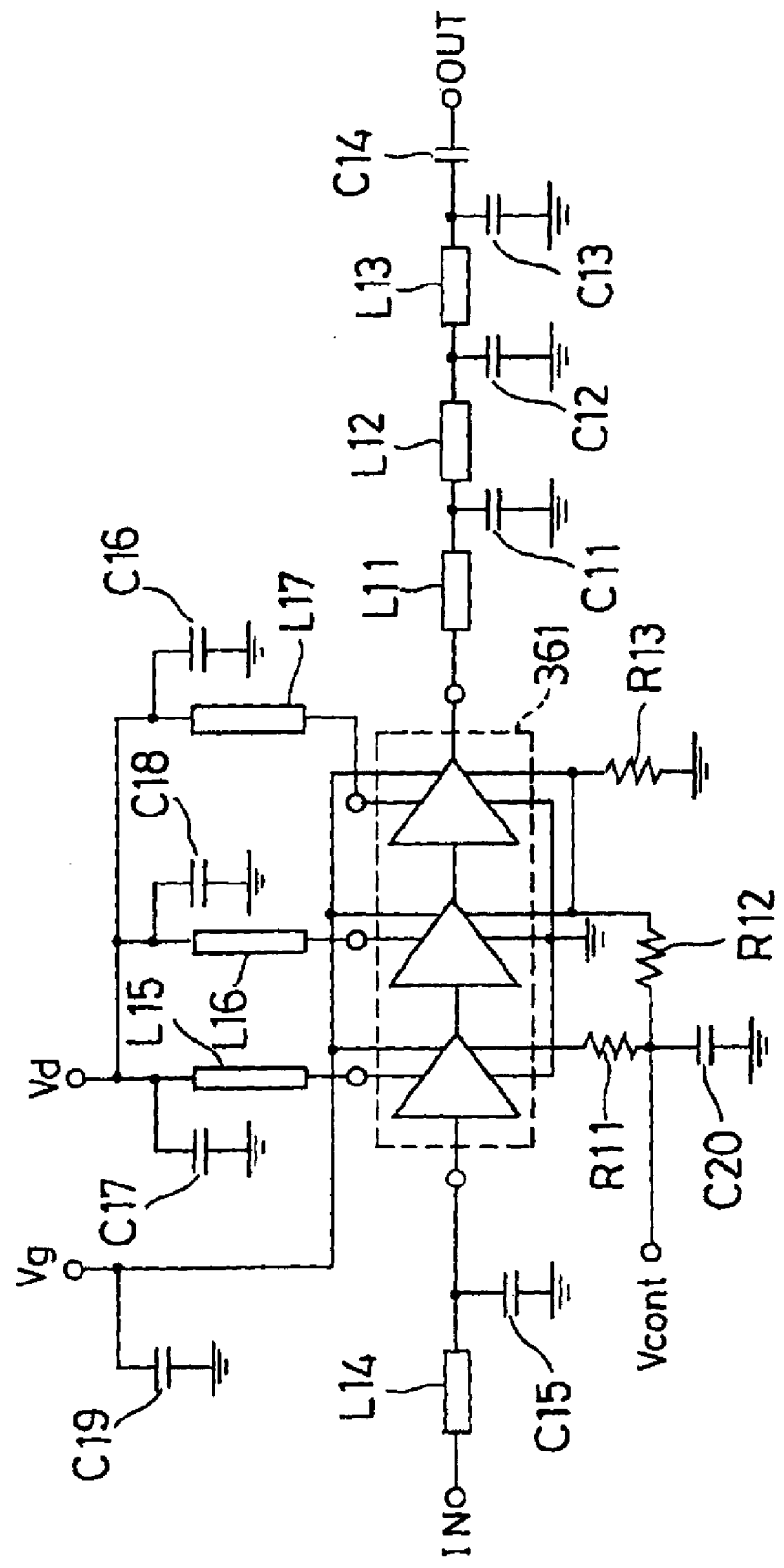
FIG. 78 is an equivalent circuit diagram of the power amplifier.

FIGS. 76 to 78 illustrate a power amplifier according to a further embodiment of the invention. FIG. 76 is an exploded plan view of respective constituent layers, FIG. 77 is a cross-sectional view, and FIG. 78 is an equivalent circuit diagram.

In FIGS. 76 to 78, the power amplifier includes a stack of constituent layers 300a to 300e, electronic parts 361 formed thereon including capacitors, inductors, semiconductors and registers, and conductor patterns 313, 315 formed above, below and intermediate the constituent layers 300a to 300e. Since the power amplifier is constructed to an equivalent circuit as shown in FIG. 78, it further includes strip lines L11 to L17, capacitors C11 to C20, signal lines, and power supply lines to semiconductor devices. It is advantageous to form the respective constituent layers from materials selected appropriate for their function.

For the constituent layers 300d, 300e constructing strip lines in this example, it is preferred to use organic dielectric layers or first or second composite dielectric layers having a dielectric dissipation factor of 0.0075 to 0.025 and a dielectric constant of 2.6 to 40. For the constituent layers 300a to 300c constructing a capacitor, it is preferred to use first or second composite dielectric layers so as to give a dielectric dissipation factor of 0.0075 to 0.025 and a dielectric constant of 5 to 40.

On the surface of constituent layers 300a to 300e, there are provided internal conductors 313, GND conductors 315, and the like. Upper and lower internal conductors are connected by via holes 314. Electronic parts 361 are mounted on the surface, completing a power amplifier corresponding to the equivalent circuit of FIG. 78.

This construction enables to provide an appropriate dielectric constant, Q and dielectric dissipation factor for a distinct function, arriving at a high performance, small size, and thin part.

Example 9-21

Figure 79:
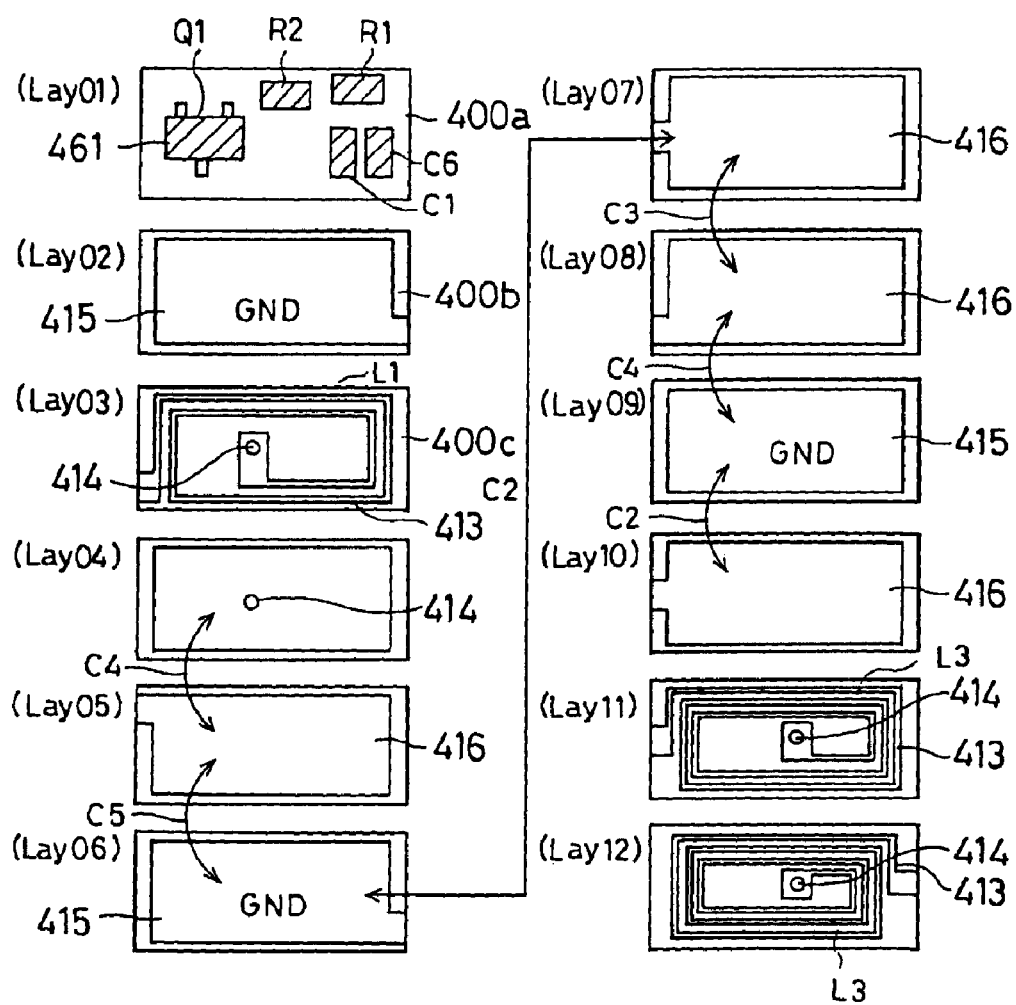
FIGS. 79 and 80 illustrate a superposed module as one exemplary electronic part of the invention.
Figure 80:
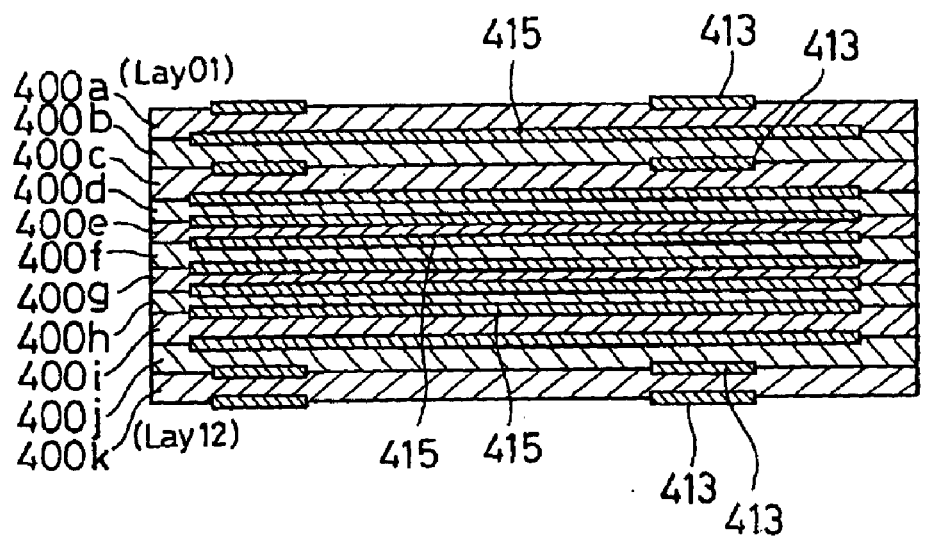
Figure 81:
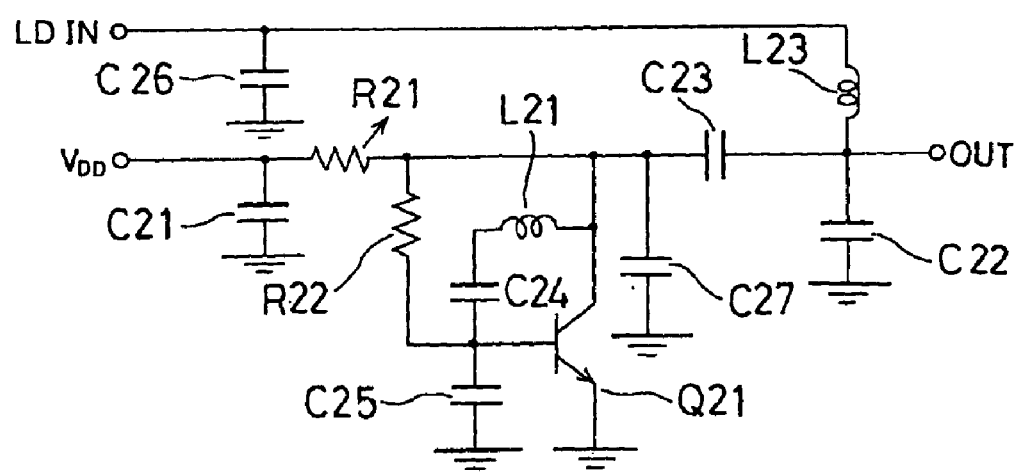
FIG. 81 is an equivalent circuit diagram of the superposed module.

FIGS. 79 to 81 illustrate a superposed module according to a further embodiment of the invention, the module finding use as an optical pickup or the like. FIG. 79 is an exploded plan view of respective constituent layers, FIG. 80 is a cross-sectional view, and FIG. 81 is an equivalent circuit diagram.

In FIGS. 79 to 81, the superposed module includes a stack of constituent layers 400a to 400k, electronic parts 461 formed thereon including capacitors, inductors, semiconductors and registers, and conductor patterns 413, 415 formed above, below and intermediate the constituent layers 400a to 400k. Since the superposed module is constructed to an equivalent circuit as shown in FIG. 81, it further includes inductors L21, L23, capacitors C21 to C27, signal lines, and power supply lines to semiconductor devices. It is advantageous to form the respective constituent layers from materials selected appropriate for their function.

For the constituent layers 400d to 400h constructing capacitors in this example, it is preferred to use second composite dielectric layers so as to give a dielectric dissipation factor of 0.0075 to 0.025 and a dielectric constant of 10 to 40. For the constituent layers 400a to 400c, 400j to 400k constructing inductors, it is preferred to use organic dielectric layers having a dielectric dissipation factor of 0.0025 to 0.0075 and a dielectric constant of 2.6 to 3.5.

On the surface of constituent layers 400a to 400k, there are provided internal conductors 413, GND conductors 415, and the like. Upper and lower internal conductors are connected by via holes 414. Electronic parts 461 are mounted on the surface, completing a superposed module corresponding to the equivalent circuit of FIG. 81.

This construction enables to provide an appropriate dielectric constant, Q and dielectric dissipation factor for a distinct function, arriving at a high performance, small size, and thin part.

Example 9-22

Figure 82:
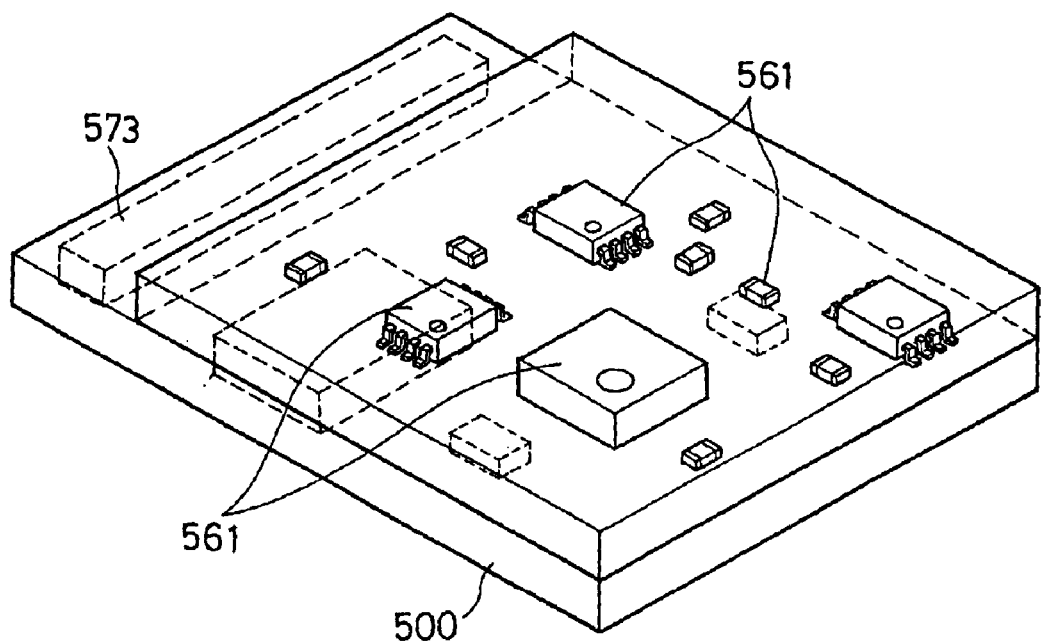
FIGS. 82 and 83 illustrate a RF module as one exemplary electronic part of the invention.
Figure 83:
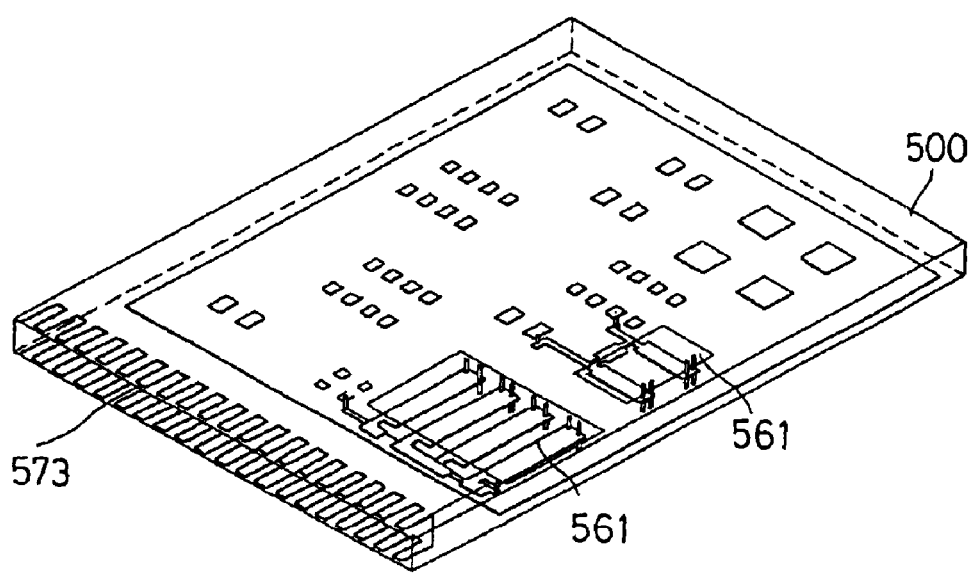
Figure 84:
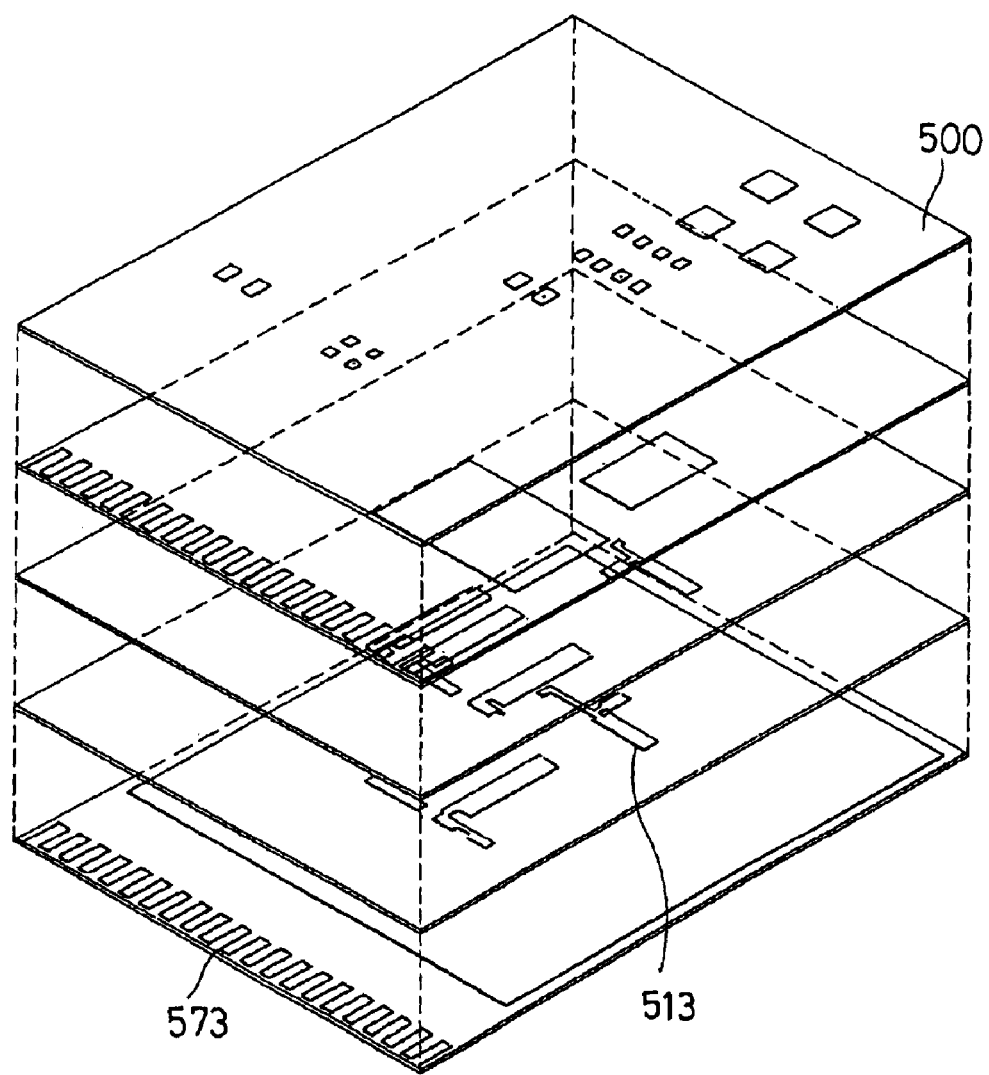
FIGS. 84 and 85 illustrate a RF module as another exemplary electronic part of the invention.
Figure 85:
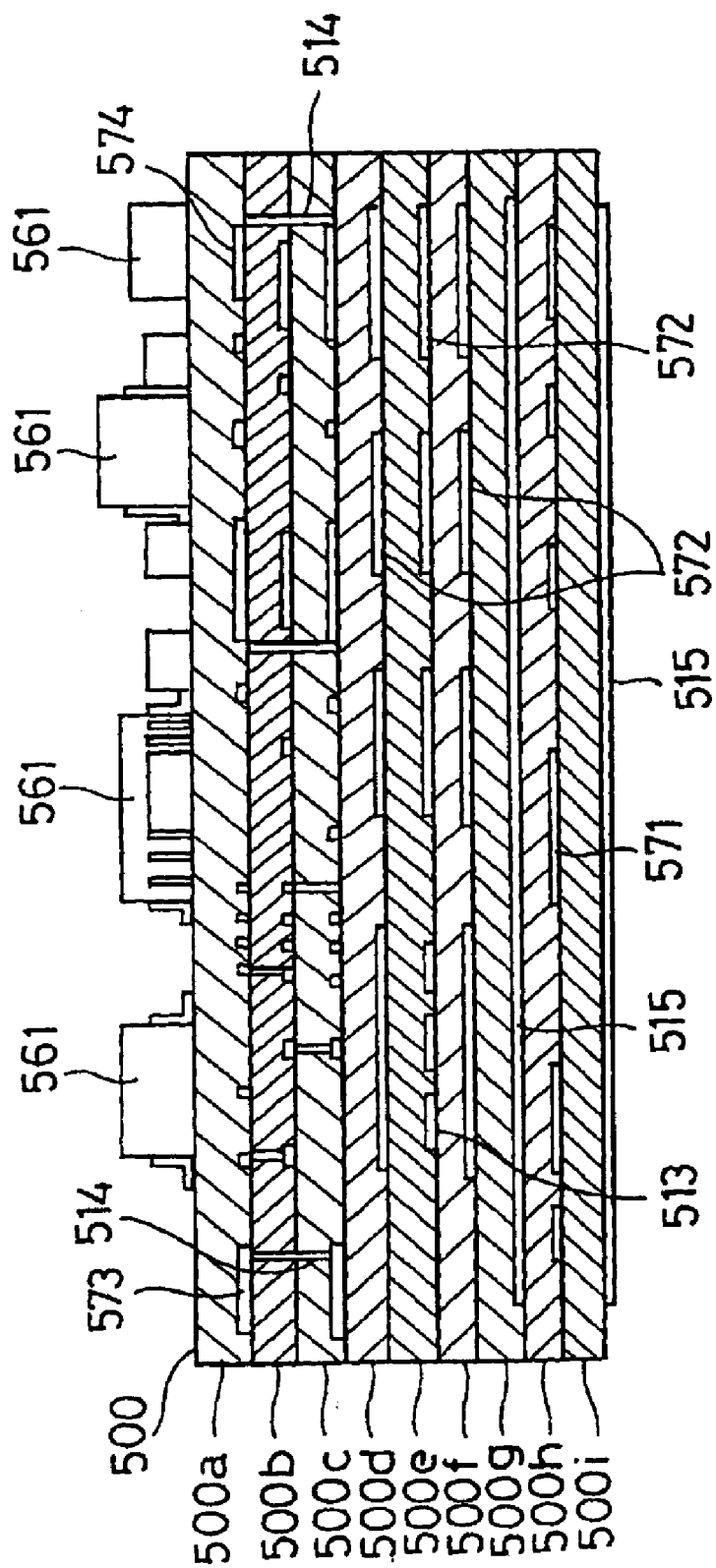

FIGS. 82 to 85 illustrate a RF module according to a further embodiment of the invention. FIG. 82 is a perspective view, FIG. 83 is a perspective view with an outer housing removed, FIG. 84 is an exploded perspective view of respective constituent layers, and FIG. 85 is a cross-sectional view.

In FIGS. 82 to 85, the RF module includes a stack of constituent layers 500a to 500i, electronic parts 561 formed and disposed thereon including capacitors, inductors, semiconductors and registers, conductor patterns 513, 515, 572 formed above, below and intermediate the constituent layers 500a to 500i, and an antenna pattern 573. As mentioned just above, the RF module includes inductors, capacitors, signal lines, and power supply lines to semiconductor devices. It is advantageous to form the respective constituent layers from materials selected appropriate for their function.

For the constituent layers 500a to 500d, 500g constructing the antenna, strip lines and wiring in this example, it is preferred to use organic dielectric layers having a dielectric dissipation factor of 0.0025 to 0.0075 and a dielectric constant of 2.6 to 3.5. For the constituent layers 500e to 500f constructing capacitors, it is preferred to use second composite dielectric layers so as to give a dielectric dissipation factor of 0.0075 to 0.025 and a dielectric constant of 10 to 40. For the constituent layers 500h to 500i constructing the power supply line, it is preferred to use composite magnetic layers having a magnetic permeability of 3 to 20.

On the surface of constituent layers 500a to 500i, there are provided internal conductors 513, GND conductors 515, antenna conductors 573, and the like. Upper and lower internal conductors are connected by via holes 514. Electronic parts 561 are mounted on the surface, completing a RF module.

This construction enables to provide an appropriate dielectric constant, Q and dielectric dissipation factor for a distinct function, arriving at a high performance, small size, and thin part.

Example 9-23

Figure 86:
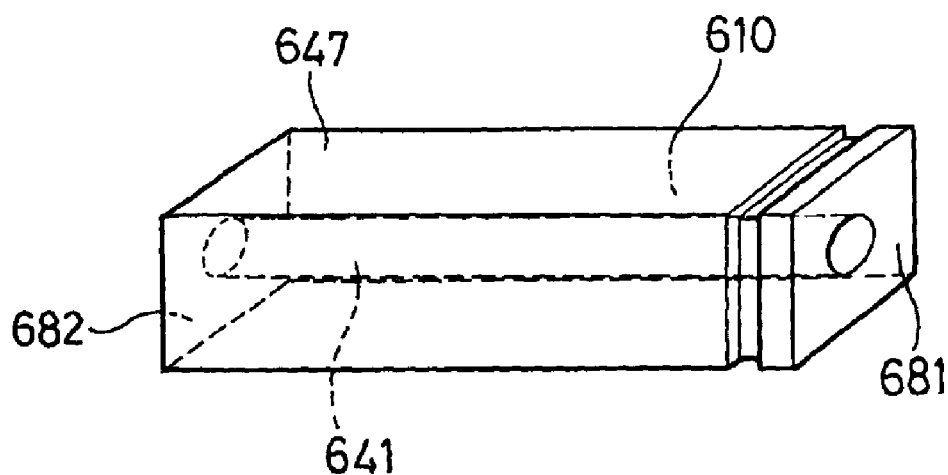
FIGS. 86 and 87 illustrate a resonator as one exemplary electronic part of the invention.
Figure 87:
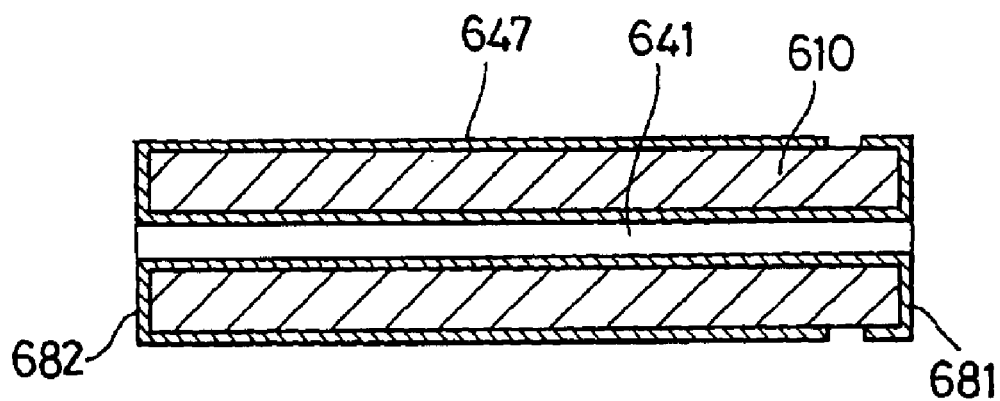

FIGS. 86 and 87 illustrate a resonator according to a further embodiment of the invention. FIG. 86 is a see-through perspective view, and FIG. 87 is a cross-sectional view.

In FIGS. 86 and 87, the resonator includes a base body 610 and a coaxial conductor 641 in the form of a through hole formed in the base body. This resonator is formed by the same method as the block filter of Example 9-11. Specifically, on the base body 610 formed in a mold, a surface GND conductor 647, a coaxial conductor 641 connected to the surface GND conductor 647 through an edge electrode 682, and a resonator HOT terminal 681 connected to the coaxial conductor 641 are formed from copper, gold, palladium, platinum or aluminum by carrying out suitable treatments such as plating, etching, printing, sputtering and evaporation. The coaxial conductor 641 is a coaxial line having a specific impedance, and the surface GND conductor 647 is formed so as to surround it.

The resonator exhibits desired resonant characteristics in the band of several hundreds of megahertz to several gigahertz when the base body 610 has a dielectric constant of 2.6 to 40. It is also desired to minimize the material loss of a resonator and hence, setting a dielectric dissipation factor (tan δ) in the range of 0.0025 to 0.0075 is preferable. Then a choice may be made among the above-mentioned organic dielectric layers or the above-mentioned first and second composite dielectric layers.

Example 9-24

Figure 88:
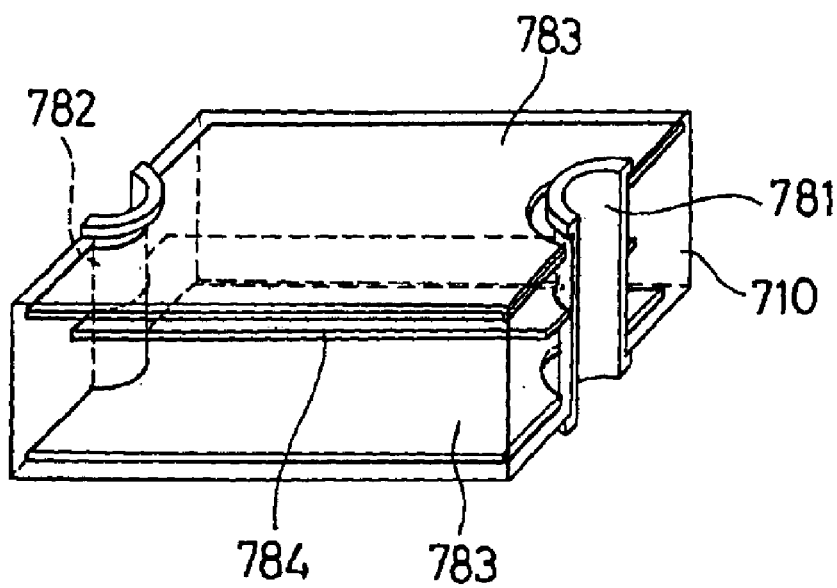
FIGS. 88 and 89 illustrate a resonator as another exemplary electronic part of the invention.
Figure 89:
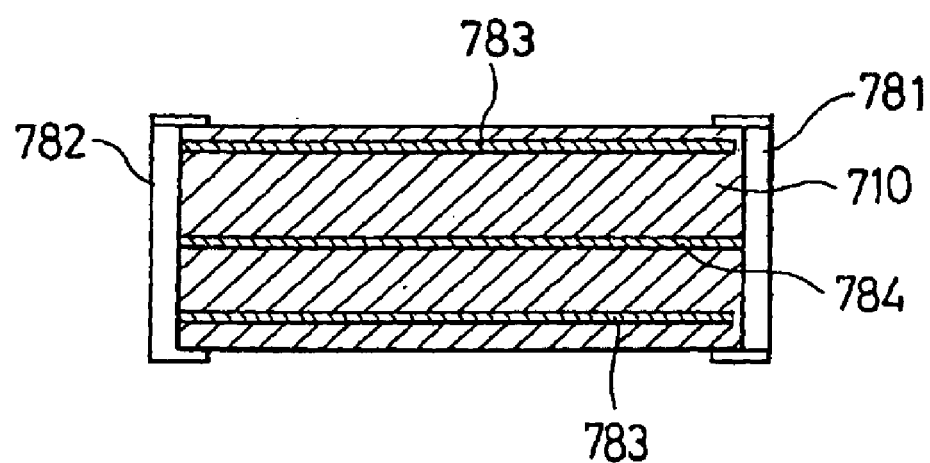

FIGS. 88 and 89 illustrate a strip resonator according to a further embodiment of the invention. FIG. 88 is a see-through perspective view, and FIG. 89 is a cross-sectional view.

In FIGS. 88 and 89, the strip resonator includes an intermediate rectangular strip conductor 784, upper and lower rectangular GND conductors 783, and constituent layers 710 sandwiched therebetween. To the opposite ends of the strip conductor 784, a HOT terminal 781 and a GND terminal 782 for a resonator are formed and connected. The method of forming the remaining components is the same as in the inductor of Example 9-1.

With respect to the material of the constituent layers 710 of the resonator, desired resonant characteristics are available in a band of several hundreds of megahertz to several gigahertz when the dielectric constant is in the range of 2.6 to 40. Since it is desired to minimize the material loss of the resonator, a dielectric dissipation factor (tan δ) of 0.0025 to 0.0075 is preferred. Then a choice is preferably made of the above-mentioned organic dielectric layers or first or second composite dielectric layers.

Example 9-25

Figure 90:
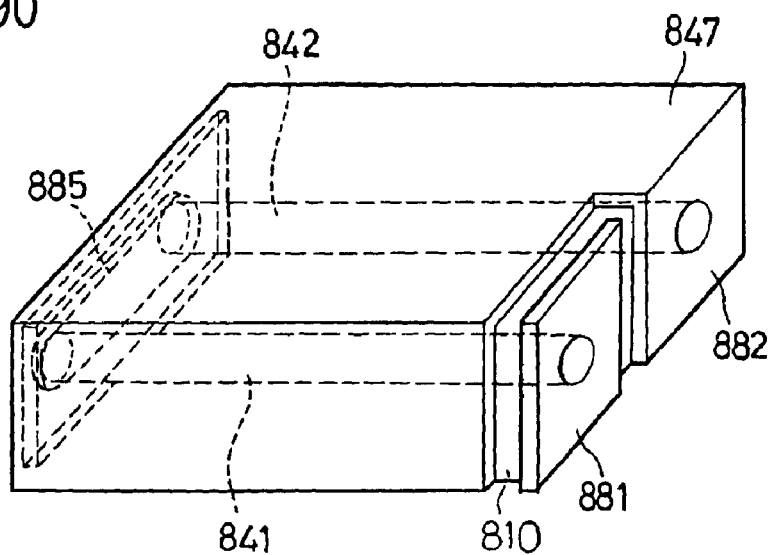
FIGS. 90 and 91 illustrate a resonator as a further exemplary electronic part of the invention.

FIG. 90 is a see-through perspective view of a resonator according to a further embodiment of the invention.

Like Example 9-23, the resonator shown in FIG. 90 includes a base body 810 and a pair of coaxial conductors 841, 842 in the form of through holes formed in the base body. Formed on the base body 810 are a surface GND conductor 847, a coaxial conductor 842 connected to the surface GND conductor 847 through an edge electrode 882, a coaxial conductor 841 connected to the coaxial conductor 842 through a connecting electrode 885, and a resonator HOT terminal 881 connected to the coaxial conductor 841. The coaxial conductors 841 and 842 each are a coaxial line having a specific impedance, and the surface GND conductor 847 is formed so as to surround them.

The resonator exhibits desired resonant characteristics in a band of several hundreds of megahertz to several gigahertz when the material of the base body 810 has a dielectric constant in the range of 2.6 to 40. Since it is desired to minimize the material loss of the resonator, a dielectric dissipation factor (tan δ) of 0.0025 to 0.0075 is preferred. Then a choice is preferably made of the above-mentioned organic dielectric layers or first or second composite dielectric layers.

Example 9-26

Figure 91:
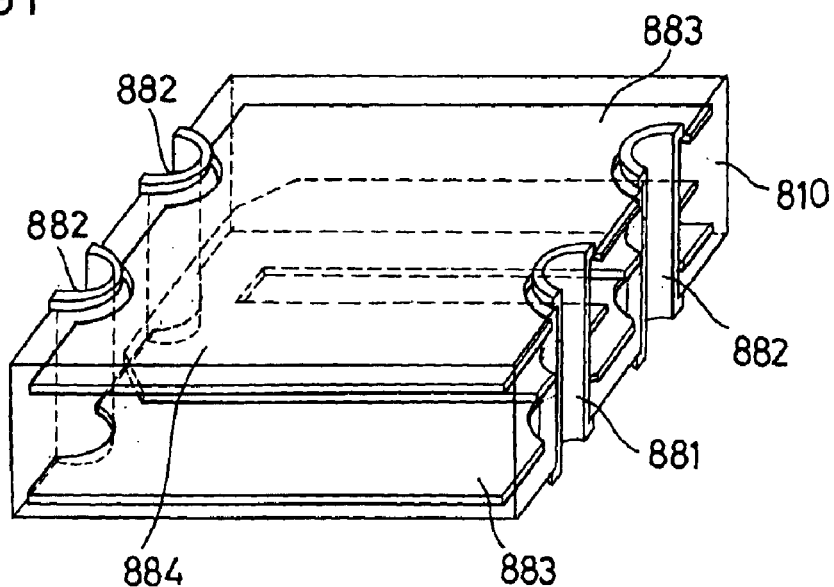

FIG. 91 is a see-through perspective view of a strip resonator according to a further embodiment of the invention.

Like Example 9-24, the strip resonator in FIG. 91 includes an intermediate U-shaped strip conductor 884, upper and lower rectangular GND conductors 883, and constituent layers 810 sandwiched therebetween. To the opposite ends of the strip conductor 884, a HOT terminal 881 and a GND terminal 882 for a resonator are formed and connected. The method of forming the remaining components is the same as in the inductor of Example 9-1.

The resonator exhibits desired resonant characteristics in a band of several hundreds of megahertz to several gigahertz when the material of the constituent layers 810 has a dielectric constant in the range of 2.6 to 40. Since it is desired to minimize the material loss of the resonator, a dielectric dissipation factor (tan δ) of 0.0025 to 0.0075 is preferred. Then a choice is preferably made of the above-mentioned organic dielectric layers or first or second composite dielectric layers.

Figure 92:
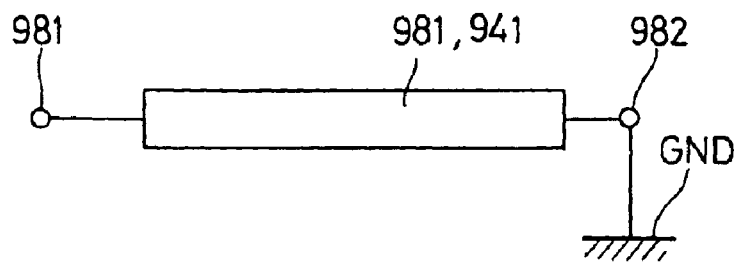
FIG. 92 is an equivalent circuit diagram of the resonator.

FIG. 92 is an equivalent circuit diagram of the resonators in the foregoing Examples 9-23 to 9-26. In the diagram, a HOT terminal 981 for the resonator is connected to one end of a resonator 984, 941 constructed by a coaxial path or strip line, and a GND terminal 982 is connected to the other end thereof.

Example 9-27

Figure 93:
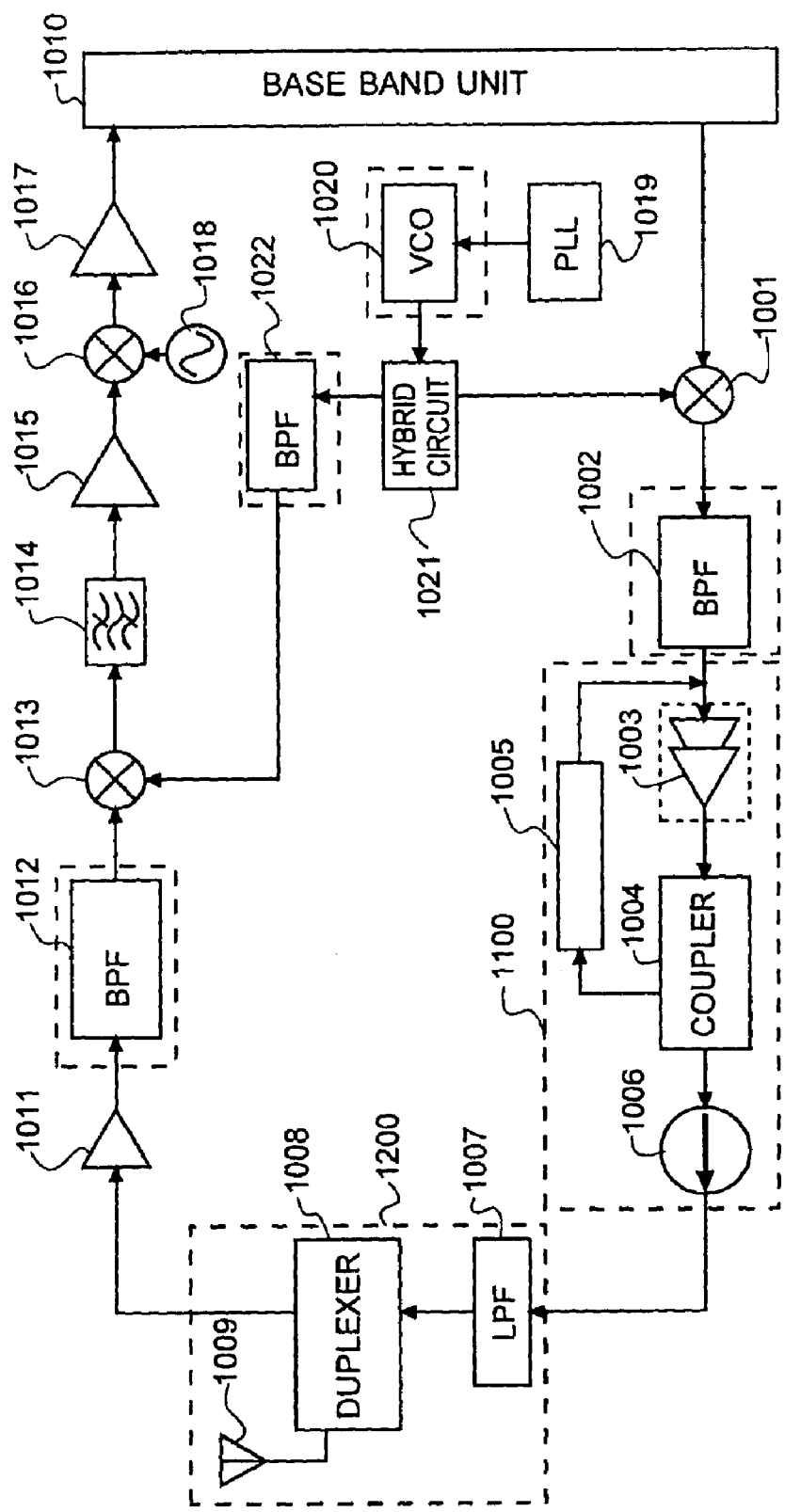
FIG. 93 is a block diagram showing a high-frequency portion of a portable equipment as one exemplary electronic part of the invention.

FIG. 93 is a block diagram showing a high-frequency portion of a portable terminal equipment according to a further embodiment of the invention.

In FIG. 93, a base band unit 1010 delivers a transmission signal to a mixer 1001 where the signal is mixed with an RF signal from a hybrid circuit 1021. A voltage controlled oscillator (VCO) 1020 is connected to the hybrid circuit 1021 to construct a synthesizer circuit with a phase lock loop circuit 1019 so that the hybrid circuit 1021 may deliver an RF signal of a predetermined frequency.

The transmission signal which has been RF modulated by the mixer 1001 is passed through a band-pass filter (BPF) 1002 and amplified by a power amplifier 1003. An output of the power amplifier 1003 is partially taken out of a coupler 1004, adjusted to a predetermined level by an attenuator 1005, and fed back to the power amplifier 1003 for adjusting so that the power amplifier may have a constant gain. The coupler 1004 delivers a transmission signal to a duplexer 1008 through an isolator 1006 for precluding reverse current and a low-pass filter 1007. The signal is transmitted from an antenna 1009 connected to the duplexer 1008.

An input signal received by the antenna 1009 is fed from the duplexer 1008 to an amplifier 1011 and amplified to a predetermined level. The received signal delivered from the amplifier 1011 is fed to a mixer 1013 through a band-pass filter 1012. The mixer 1013 receives an RF signal from the hybrid circuit 1021 whereby the RF signal component is removed to effect demodulation. The received signal delivered from the mixer 1013 is passed through a SAW filter 1014, amplified by an amplifier 1015, and fed to a mixer 1016. The mixer 1016 also receives a local transmission signal of a predetermined frequency from a local transmitter circuit 1018. The received signal is converted to a desired frequency, amplified to a predetermined level by an amplifier 1017 and sent to the base band unit 1010.

According to the invention, an antenna front end module 1200 including the antenna 1009, duplexer 1008, and low-pass filter 1007, and an isolator power amplifier module 1100 including the isolator 1006, coupler 1004, attenuator 1005 and power amplifier 1003 can be constructed as a hybrid module by the same procedure as above. Further, a unit including other components can be constructed as an RF unit as demonstrated in Example 9-22. BPF, VCO, etc. can be constructed in accordance with the procedures shown in Examples 9-9 to 9-12 and 9-19.

In addition to the above-exemplified electronic parts, the invention is also applicable by a similar procedure to coil cores, toroidal cores, disk capacitors, lead-through capacitors, clamp filters, common mode filters, EMC filters, power supply filters, pulse transformers, deflection coils, choke coils, DC-DC converters, delay lines, electromagnetic wave absorbing sheets, thin-walled electromagnetic wave absorbers, electromagnetic wave shields, diplexers, duplexers, antenna switch modules, antenna front end modules, isolator/power amplifier modules, PLL modules, front end modules, tuner units, directional couplers, double balanced mixers (DBM), power synthesizers, power distributors, toner sensors, current sensors, actuators, sounders (piezoelectric sound generators), microphones, receivers, buzzers, PTC thermistors, temperature fuses, ferrite magnets, etc.

In each of the foregoing Examples, any of flame retardants, for example, halides such as halogenated phosphates and brominated epoxy resins, organic compounds such as phosphate amides, and inorganic materials such as antimony trioxide and aluminum hydride may be added to the constituent layers.

Benefits of the Invention

In the first aspect of the invention, the consolidated composite dielectric material has a relatively high Q and relatively high dielectric constant, is used in an application where such properties are required, for example, such electronic parts as strip lines, impedance matching circuits, delay circuits, and antennas, and can be adapted so as to meet the required properties.

In the second aspect of the invention, the consolidated composite dielectric material has a high dielectric constant, is used in an application where such properties are required, for example, such electronic parts as capacitor-built-in circuit boards, hybrid parts and capacitors, and can be adapted so as to meet the required properties.

In the third aspect of the invention, the composite dielectric substrate is suitable for use in the high-frequency region, exhibits dielectric characteristics for the intended purpose as typified by a high dielectric constant and a low dissipation factor in the high-frequency region. Also provided are a prepreg, coated copper foil and molded sheet for use in preparing the composite dielectric substrate.

In the fourth aspect of the invention, there are provided (1) a composite magnetic substrate and a prepreg having a low dielectric constant and low dissipation factor; (2) a composite magnetic substrate and a prepreg having high heat resistance, typically a high glass transition temperature and high decomposition initiation temperature; (3) a composite magnetic substrate and a prepreg having a low water pickup and a minimized change of dielectric constant and dissipation factor; (4) a composite magnetic substrate and a prepreg which have close adhesion to a metal foil such as copper foil and a reduced thickness, and can be manufactured by a conventional substrate manufacturing process; (5) a composite magnetic substrate and a prepreg having a constant dielectric constant and dissipation factor up to a frequency band of the order of gigahertz; and (6) a composite magnetic substrate and a prepreg having minimized temperature dependency of dielectric constant and dissipation factor.

In the fifth aspect of the invention, the flame retardant substrate and prepreg have improved flame retardance, and good electrical characteristics at high frequencies for use in electronic parts and circuit substrates.

In the sixth aspect of the invention, the thermosetting polyvinylbenzyl ether resin composition in the cured state exhibits dielectric characteristics which are satisfactory and constant over a wide frequency region and less dependent on temperature and moisture pickup, and maintains unchanged the physical properties of the polyvinylbenzyl ether compound featuring heat resistance. Using an addition type flame retardant to be post added, the composition can be made flame retardant without considerations on reaction conditions and cure stresses. In addition, the thermosetting polyvinylbenzyl ether resin composition has improved high-frequency dielectric characteristics in that the Q value is increased, without increasing the dielectric constant, in a high-frequency region of 100 MHz to 10 GHz.

The method is provided in the seventh aspect of the invention for preparing the thermosetting polyvinylbenzyl ether resin composition which in the cured state exhibits dielectric characteristics which are satisfactory and constant over a wide frequency region and less dependent on temperature and moisture pickup, and maintains unchanged the physical properties of the polyvinylbenzyl ether compound featuring heat resistance. In addition, the dielectric dissipation factor can be significantly reduced (to give a high Q value), and the composition can be used at a low loss in a high-frequency region of 100 MHz to 10 GHz.

In the eighth aspect of the invention, the thermosetting polyvinylbenzyl ether resin composition in the cured state exhibits dielectric characteristics which are satisfactory and constant over a wide frequency region and less dependent on temperature and moisture pickup. The composition yields a composite dielectric material which takes advantage of the properties of dielectric powder and the polyvinylbenzyl ether compound featuring heat resistance, and when aged under high-temperature conditions or high-temperature, high-humidity conditions, experiences a minimized change of dielectric constant and dissipation factor (i.e., Q). The composite dielectric material experiences a minimized change of dielectric constant and dissipation factor (i.e., Q) even under high-temperature conditions as encountered during reflow. Also provided is a thermosetting polyvinylbenzyl ether resin composition from which the composite dielectric material is obtained.

In the ninth aspect of the invention, using any one of resin substrates having improved high-frequency characteristics, magnetic substrates having improved high-frequency characteristics, and dielectric substrates having improved high-frequency characteristics, there are provided high-frequency electronic parts having improved high-frequency characteristics and hence, improved overall electrical characteristics.

Japanese Patent Application Nos. 11-373804, 11-373805, 11-373806, 11-373353, 11-375732, 2000-68364, 2000-68366, 2000-121629, 2000-147591, and 11-375753 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A double side metal-clad composite dielectric substrate, prepared by placing a prepreg between a pair of metal foils, followed by laminating press, and wherein the prepreg is prepared by dispersing a polyvinylbenzyl ether compound and a dielectric ceramic powder in a solvent to form a slurry, applying the slurry to a cloth base, and drying, and wherein the content of the dielectric ceramic powder is from 10 to 65 vol %, based on the dielectric ceramic powder and the polyvinylbenzyl ether compound combined, and wherein the polyvinylbenzyl ether compound has the following formula (1):

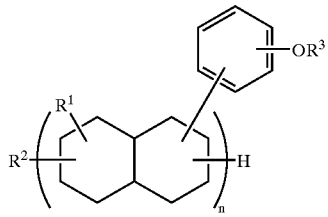

(1)

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

2. A double side metal-clad composite dielectric substrate prepared by dispersing a polyvinylbenzyl ether compound and a dielectric ceramic powder in a solvent to form a slurry, applying the slurry onto a metal foil to form a coating, drying the coating to form a coated metal foil, and placing a cloth base between a pair of the coated metal foils, such that the coating is in contact with the cloth base, followed by laminating press, and wherein the content of the dielectric ceramic powder is from 10 to 65 vol %, based on the dielectric ceramic powder and the polyvinylbenzyl ether compound combined, and wherein the polyvinylbenzyl ether compound has the following formula (1):

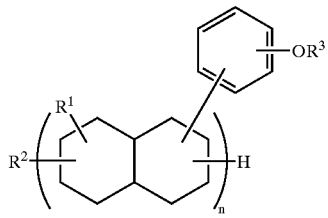

(1)

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

3. The substrate of claim 2, wherein the cloth base is glass cloth.

4. The substrate of claim 2, wherein the dielectric ceramic powder has a mean particle size of 0.5 to 100 μm.

5. A coated metal foil, comprising a metal foil having thereon a dielectric substrate prepared from a polyvinylbenzyl ether compound and a dielectric ceramic power, and wherein the content of the dielectric ceramic powder is from 10 to 65 vol %, based on the dielectric ceramic powder and the polyvinylbenzyl ether compound combined, and wherein the polyvinylbenzyl ether compound has the following formula (1):

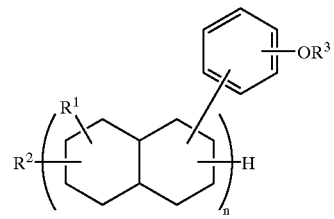

(1)

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

6. The coated metal foil of claim 5, wherein the metal foil is copper foil.

7. A double side metal-clad composite dielectric substrate, prepared by dispersing a polyvinylbenzyl ether compound and a dielectric ceramic powder in a solvent to form a slurry, drying and molding the slurry into a molded sheet, and placing the molded sheet between a pair of metal foils, followed by laminating press, wherein the content of the dielectric ceramic powder is from 10 to 65 vol % based on the dielectric ceramic powder and the polyvinylbenzyl ether compound combined, and wherein the polyvinylbenzyl ether compound has the following formula (1):

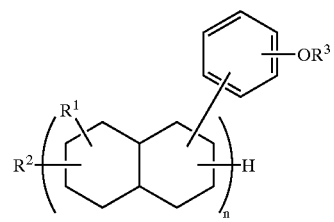

(1)

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

8. The composite dielectric substrate of claim 1, wherein the metal foil is copper foil.

9. A composite dielectric substrate of multilayer construction, prepared by laminating press the coated metal foil of claim 5.

10. The composite dielectric substrate of claim 1, wherein the substrate maintains its dielectric constant in a high-frequency region of at least 100 MHz.

11. A prepreg prepared by dispersing a polyvinylbenzyl ether compound and a magnetic powder in a solvent to form a slurry, applying the slurry to a metal foil, and drying, and wherein the polyvinylbenzyl ether compound has the following formula (1):

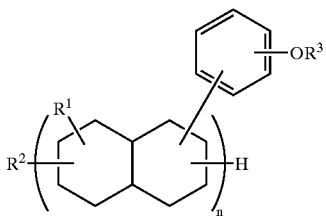

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

12. A substrate prepared by laminating press a prepreg prepared by dispersing a polyvinylbenzyl ether compound and a magnetic powder in a solvent to form a slurry, applying the slurry to a glass cloth, and drying, and wherein the polyvinylbenzyl ether compound has the following formula (1):

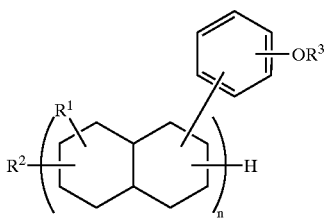

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

13. A double side metal foil-clad substrate, prepared by placing metal foils on opposite surfaces of a prepreg, followed by laminating press, wherein the prepreg is prepared by dispersing a polyvinylbenzyl ether compound and a magnetic powder in a solvent to form a slurry, applying the slurry to a glass cloth, and drying, and wherein the polyvinylbenzyl ether compound has the following formula (1):

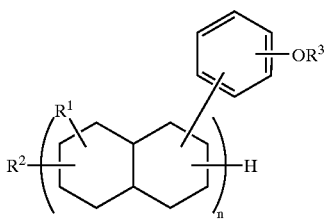

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

14. A double side metal foil-clad substrate prepared by placing two plies of the prepreg of claim 11 on opposite surfaces of a glass cloth, such that the metal foils are positioned outside, followed by laminating press.

15. A substrate prepared by laminating press a prepreg, prepared by mixing a polyvinylbenzyl ether compound and a magnetic powder at a temperature of not lower than the melting point of the polyvinylbenzyl ether compound, and molding the resulting solid mixture under pressure, and wherein the polyvinylbenzyl ether compound has the following formula (1):

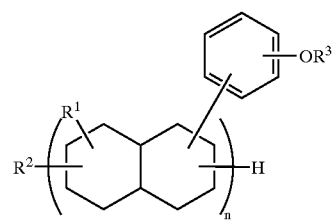

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

16. A double side metal foil-clad substrate, prepared by placing metal foils on opposite surfaces of a prepreg, followed by laminating press, and wherein the prepreg is prepared by mixing a polyvinylbenzyl ether compound and a magnetic powder at a temperature of not lower than the melting point of the polyvinylbenzyl ether compound, and molding the resulting solid mixture under pressure, and wherein the polyvinylbenzyl ether compound has the following formula (1):

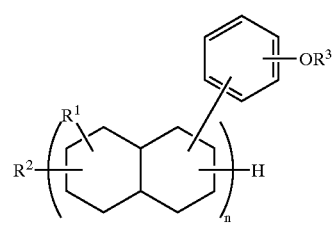

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

17. A multilayer substrate, prepared by stacking at least two plies of a prepreg, followed by laminating press, and wherein the prepreg is prepared by mixing a polyvinylbenzyl ether compound and a magnetic powder at a temperature of not lower than the melting point of the polyvinylbenzyl ether compound, and molding the resulting solid mixture under pressure, and wherein the polyvinylbenzyl ether compound has the following formula (1):

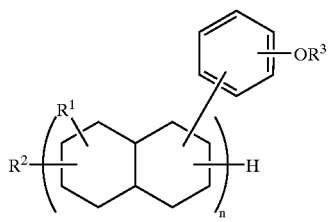

(1)

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

18. A prepreg prepared by dispersing a polyvinylbenzyl ether compound and a flame retardant in a solvent to form a slurry, applying the slurry to a metal foil, and drying, and
wherein the polyvinylbenzyl ether compound has the following formula (1):

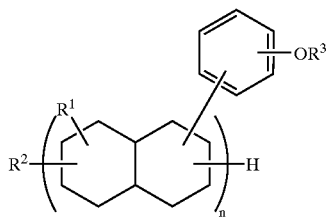

(1)

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

19. A substrate, prepared by laminating press a prepreg, prepared by dispersing a polyvinylbenzyl ether compound and a flame retardant in a solvent to form a slurry, applying the slurry to a glass cloth, and drying, and
wherein the polyvinylbenzyl ether compound has the following formula (1):

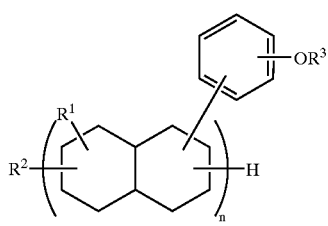

(1)

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

20. A double side metal foil-clad composite dielectric substrate, prepared by placing metal foils on opposite surfaces of a prepreg, followed by laminating press, and
wherein the prepreg is prepared by dispersing a polyvinylbenzyl ether compound and a flame retardant in a solvent to form a slurry, applying the slurry to a glass cloth, and drying, and wherein the polyvinylbenzyl ether compound has the following formula (1):

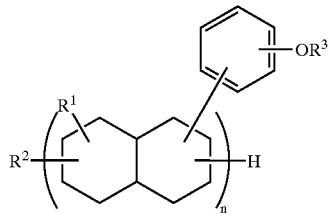

(1)

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

21. A double side metal foil-clad substrate, prepared by placing two plies of the prepreg of claim 18 on opposite surfaces of a glass cloth, such that the metal foils are positioned outside, followed by laminating press.

22. A prepreg prepared by mixing a polyvinylbenzyl ether compound and a flame retardant at a temperature of not lower than the melting point of the polyvinylbenzyl ether compound, and molding the resulting solid mixture under pressure, and
wherein the polyvinylbenzyl ether compound has the following formula (1):

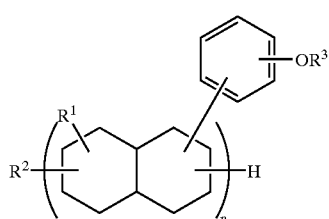

(1)

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

23. A substrate which is prepared by laminating press the prepreg of claim 22.

24. A double side metal foil-clad substrate which is prepared by placing metal foils on opposite surfaces of the prepreg of claim 22, followed by laminating press.

25. A multilayer substrate, prepared by stacking at least two plies of a prepreg, followed by laminating press, and
wherein the prepreg is prepared by dispersing a polyvinylbenzyl ether compound and a flame retardant in a solvent to form a slurry, applying the slurry to a glass cloth, and drying, and wherein the polyvinylbenzyl ether compound has the following formula (1):

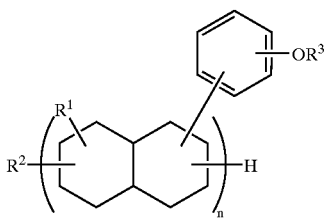

(1)

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

26. An electronic part comprising at least one organic dielectric layer containing at least a polyvinylbenzyl ether compound, at least one composite magnetic layer having a magnetic powder dispersed in a polyvinylbenzyl ether compound, or at least one composite dielectric layer having a dielectric powder dispersed in a polyvinylbenzyl ether compound, and wherein the polyvinylbenzyl ether compound has the following formula (1):

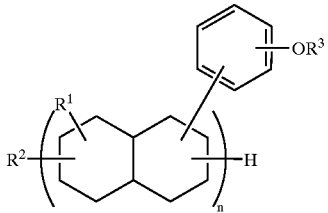

(1)

wherein $R^1$ denotes methyl or ethyl, $R^2$ denotes hydrogen or a hydrocarbon group of 1 to 10 carbon atoms, $R^3$ denotes hydrogen or a vinylbenzyl group in a molar ratio of hydrogen to vinylbenzyl of from 60:40 to 0:100, and n is a number from 2 to 4.

27. The electronic part of claim 26, further comprising at least one layer containing at least reinforcing fibers.

28. The electronic part of claim 26 comprising the at least one organic dielectric layer containing the polyvinylbenzyl ether compound, and having a dielectric constant of 2.6 to 3.5 and a dielectric dissipation factor of 0.0025 to 0.005.

29. The electronic part of claim 26, comprising the at least one composite dielectric layer having a dielectric powder dispersed in a polyvinylbenzyl ether compound, and said dielectric powder having a dielectric constant of 20 to 10,000 and a dielectric dissipation factor of 0.01 to 0.001, and said composite dielectric layer having a dielectric constant of 5 to 20 and a dielectric dissipation factor of 0.0025 to 0.0075.

30. The electronic part of claim 26, further comprising at least one second composite dielectric layer, having a dielectric powder dispersed in a polyvinylbenzyl ether compound, and said dielectric powder having a dielectric constant of 20 to 10,000 and a dielectric dissipation factor of 0.01 to 0.0001 and being present in an amount of 40 to 65 vol %, and said second composite dielectric layer having a dielectric constant of 10 to 40 and a dielectric dissipation factor of 0.0075 to 0.025.

31. The electronic part of claim 26, comprising the at least one composite magnetic layer, having a magnetic powder dispersed in a polyvinylbenzyl ether compound, and said magnetic powder being present in an amount of 25 to 65 vol %, and said composite magnetic layer having a magnetic permeability of 3 to 20.

32. The electronic part of claim 26, wherein at least any one layer contains at least one flame retardant.

* * * * *

UNITED STATES PATENT AND TRADEMARK OFFICE
CERTIFICATE OF CORRECTION

PATENT NO. : 6,908,960 B2
DATED : June 21, 2005
INVENTOR(S) : Minoru Takaya et al.

It is certified that error appears in the above-identified patent and that said Letters Patent is hereby corrected as shown below:

Title page, Item [54] and Column 1, lines 1-9,
Title, "THERMOSETTIN" should read -- THERMOSETTING POLYVINYLBENZYL ETHER RESIN COMPOSITION, AND METHOD FOR PREPARING THERMOSETTING POLYVINYLBENZYL ETHER RESIN COMPOSITION --.

Column 18,
Line 3, "descried" should read -- described --.

Column 37,
Line 34, "volt" should read -- vol% --.

Column 50,
Line 40, "3.1O" should read -- 3.10 --.

Column 51,
Line 22, "ammoniumphosphate" should read -- ammonium phosphate --.

Column 71,
Line 64, "power" should read -- powder --.

Signed and Sealed this

Seventh Day of February, 2006

JON W. DUDAS
*Director of the United States Patent and Trademark Office*